United States Patent [19]

Yanagisawa et al.

[11] Patent Number: 5,150,325

[45] Date of Patent: Sep. 22, 1992

[54] BI-CMOS SEMICONDUCTOR MEMORY DEVICE, INCLUDING IMPROVED LAYOUT STRUCTURE AND TESTING METHOD

[75] Inventors: Kazumasa Yanagisawa, Kokubunji; Tatsuyuki Ohta, Ohme; Tetsu Udagawa, Iruma; Kyoko Ishii, Tokyo; Hitoshi Miwa, Ohme; Atsushi Nozoe, Ohme; Masayuki Nakamura, Ohme; Tetsurou Matsumoto, Higashiyamato; Yoshitaka Kinoshita, Kokubunji; Yoshiaki Ouchi, Fussa; Hiromi Tsukada, Kokubunji; Shoji Wada, Tokyo; Kazuo Mihashi, Sakaiminato; Yutaka Kobayashi, Katsuta; Goro Kitsukawa, Hinode, all of Japan

[73] Assignees: Hitachi, Ltd.; Hitachi VLSI Engineering Corp, both of Tokyo, Japan

[21] Appl. No.: 496,227

[22] Filed: Mar. 20, 1990

[30] Foreign Application Priority Data

Mar. 20, 1989 [JP] Japan .................... 1-65841

[51] Int. Cl.⁵ ............................................. G11C 13/00
[52] U.S. Cl. ........................................ 365/177; 365/208
[58] Field of Search ................. 365/148, 177, 189.01, 365/208, 207

[56] References Cited

U.S. PATENT DOCUMENTS 4,961,170 10/1990 Fujitsu et al. ................... 365/208

Primary Examiner—Terrell W. Fears
Attorney, Agent, or Firm—Antonelli, Terry Stout & Kraus

[57] ABSTRACT

A Bi.CMOS semiconductor memory device is provided which includes an arrangement to simultaneously select a plurality of memory cells, followed by using a 3 bit Z addressing arrangement to determine a read or write operation for the simultaneously selected memory cells. To speed up the word line selection, a static selection type operation is used with the word line selecting voltage being greater than signal amplitude of the data lines during the write operation. Also, to speed up the read operation, separate common I/O lines are provided for the read and write operations. Read signals are transmitted as curent signals, and then converted to voltage signals for improving reading speed. Also, improved arrangements are provided for resistance structure, logic circuitry, input circuitry, fuse cutting circuitry, drive circuitry, power circuitry, electrostatic protection circuitry, layout structure and testing methods for the semiconductor device.

26 Claims, 71 Drawing Sheets

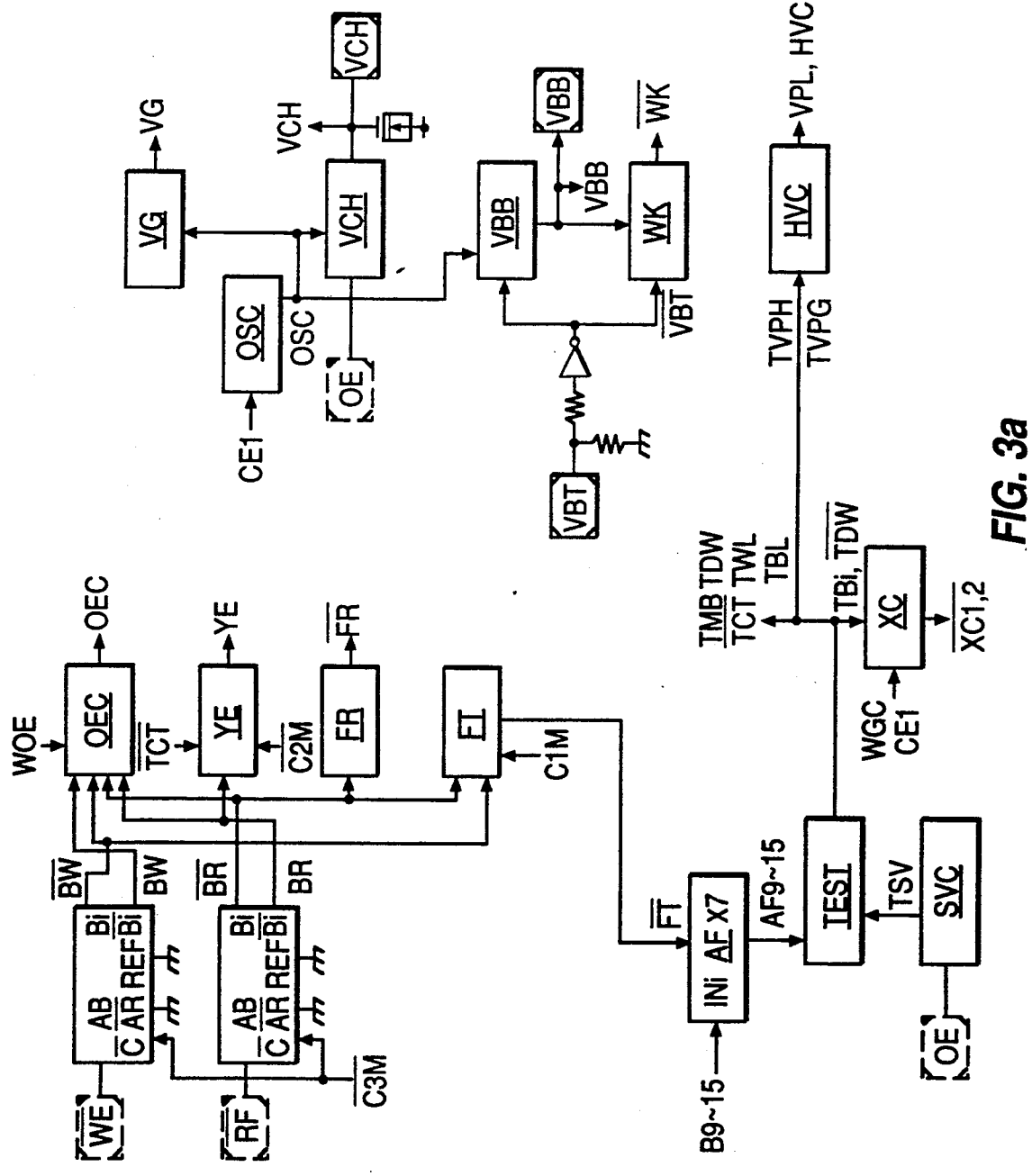

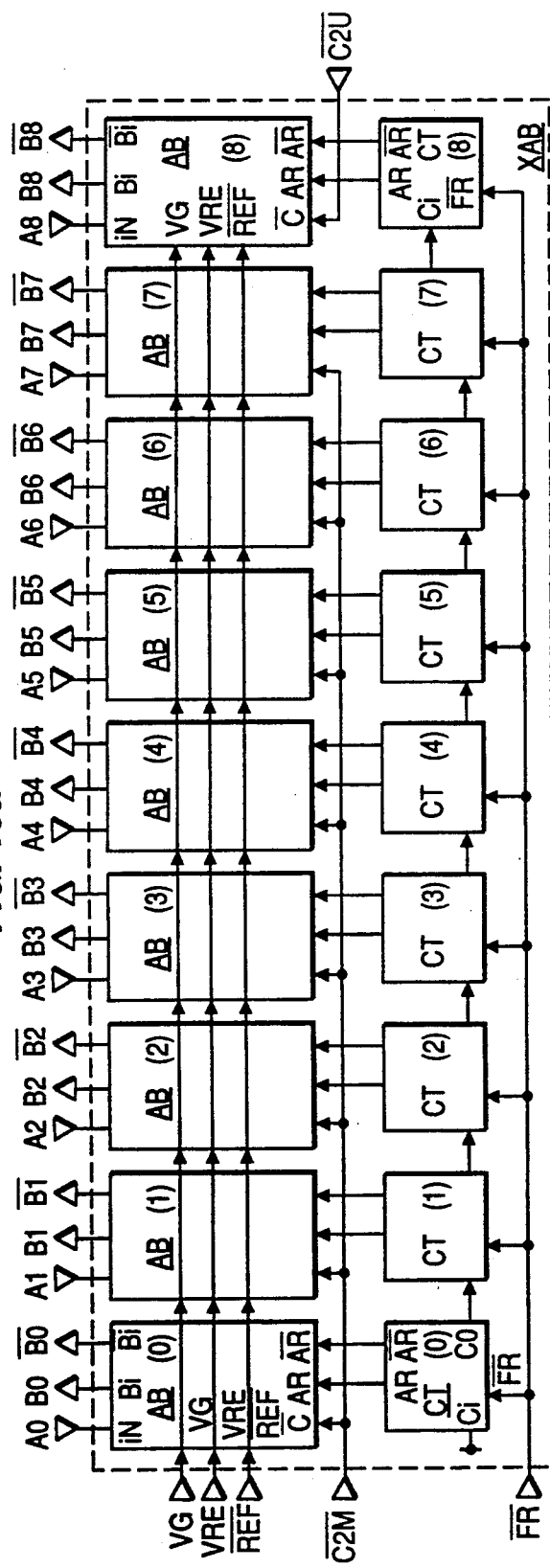
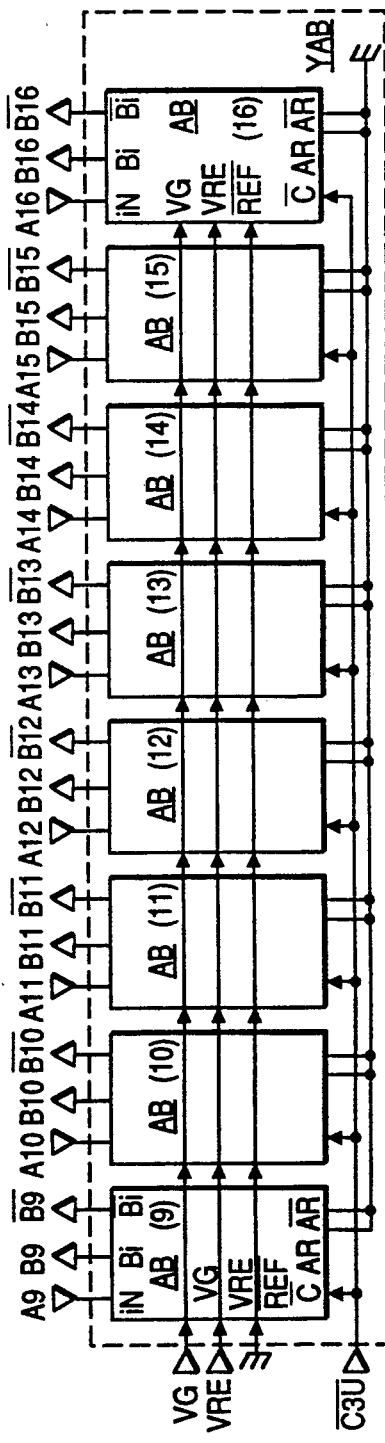
FIG. 19a
FIG. 19b

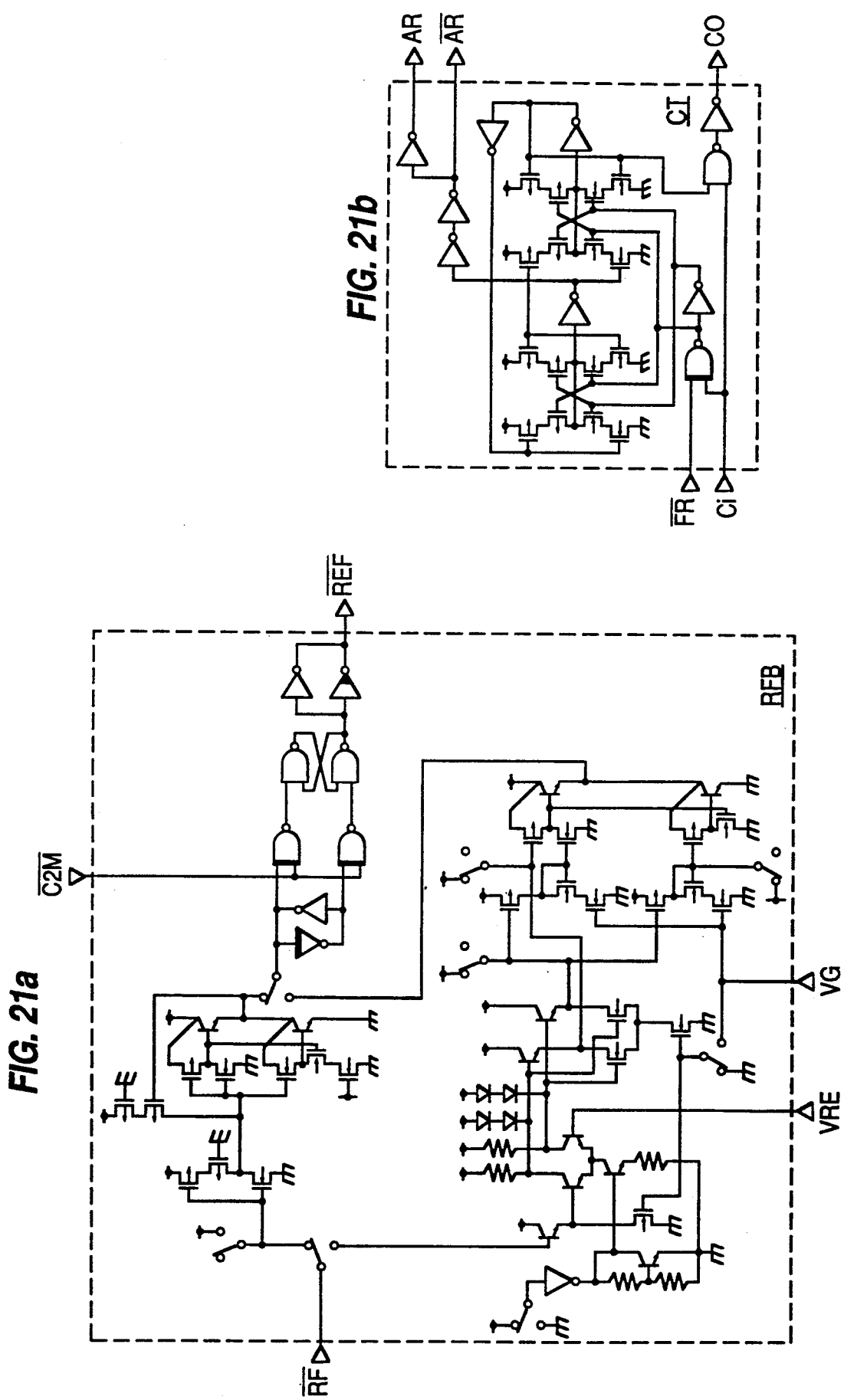

FIG. 22a
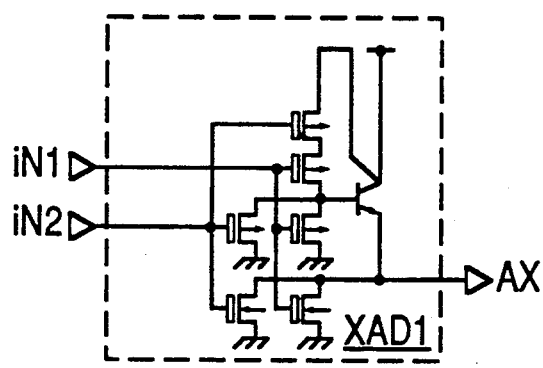
FIG. 22b
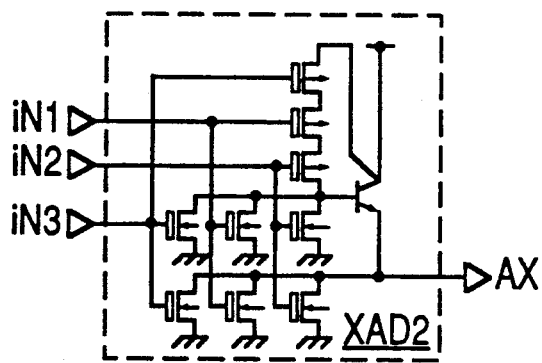
FIG. 22c
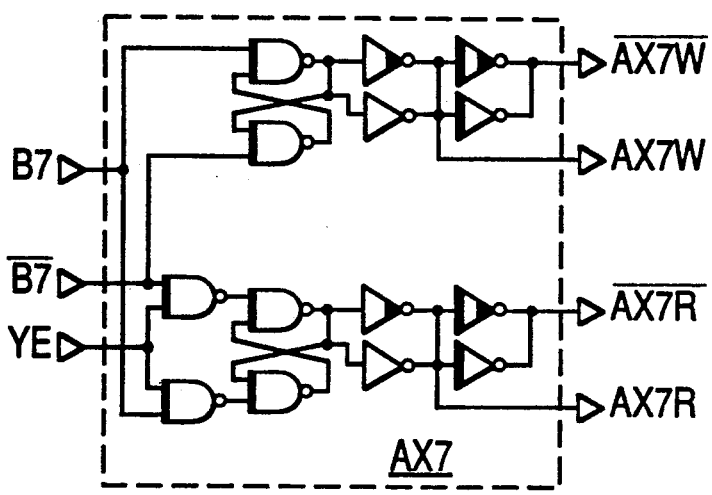
FIG. 22d
| iN1 | iN2 | AX |
|---|---|---|
| B5 | B6 | AX50 |
| $\overline{B5}$ | B6 | AX51 |
| B5 | $\overline{B6}$ | AX52 |
| $\overline{B5}$ | $\overline{B6}$ | AX53 |
| B7 | B8 | AS0L |
| $\overline{B7}$ | B8 | AS0R |
| B7 | $\overline{B8}$ | AS1L |
| $\overline{B7}$ | $\overline{B8}$ | AS1R |

FIG. 22g

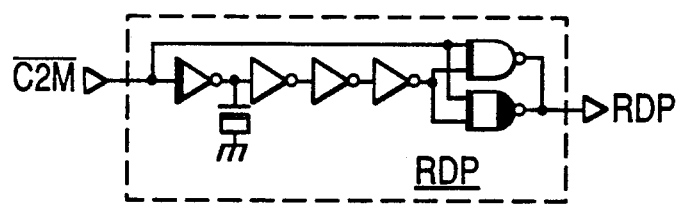

FIG. 22e

| iN1 | iN2 | iN3 | AX |
|---|---|---|---|
| B2 | B3 | B4 | AX20 |
| $\overline{B2}$ | B3 | B4 | AX21 |
| B2 | $\overline{B3}$ | B4 | AX22 |
| $\overline{B2}$ | $\overline{B3}$ | B4 | AX23 |
| B2 | B3 | $\overline{B4}$ | AX24 |
| $\overline{B2}$ | B3 | $\overline{B4}$ | AX25 |
| B2 | $\overline{B3}$ | $\overline{B4}$ | AX26 |
| $\overline{B2}$ | $\overline{B3}$ | $\overline{B4}$ | AX27 |

FIG. 22f

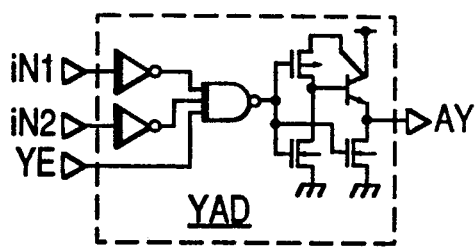

FIG. 22h

| iN1 | iN2 | AY |
|---|---|---|
| B9 | B10 | AY00 |
| $\overline{B9}$ | B10 | AY01 |
| B9 | $\overline{B10}$ | AY02 |
| $\overline{B9}$ | $\overline{B10}$ | AY03 |
| B11 | B12 | AY20 |
| $\overline{B11}$ | B12 | AY21 |
| B11 | $\overline{B12}$ | AY22 |
| $\overline{B11}$ | $\overline{B12}$ | AY23 |
| B13 | B14 | AY40 |
| $\overline{B13}$ | B14 | AY41 |
| B13 | $\overline{B14}$ | AY42 |
| $\overline{B13}$ | $\overline{B14}$ | AY43 |
| B15 | B16 | AY60 |
| $\overline{B15}$ | B16 | AY61 |
| B15 | $\overline{B16}$ | AY62 |
| $\overline{B15}$ | $\overline{B16}$ | AY63 |

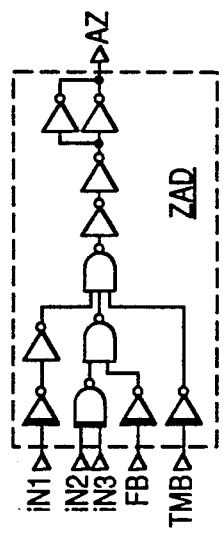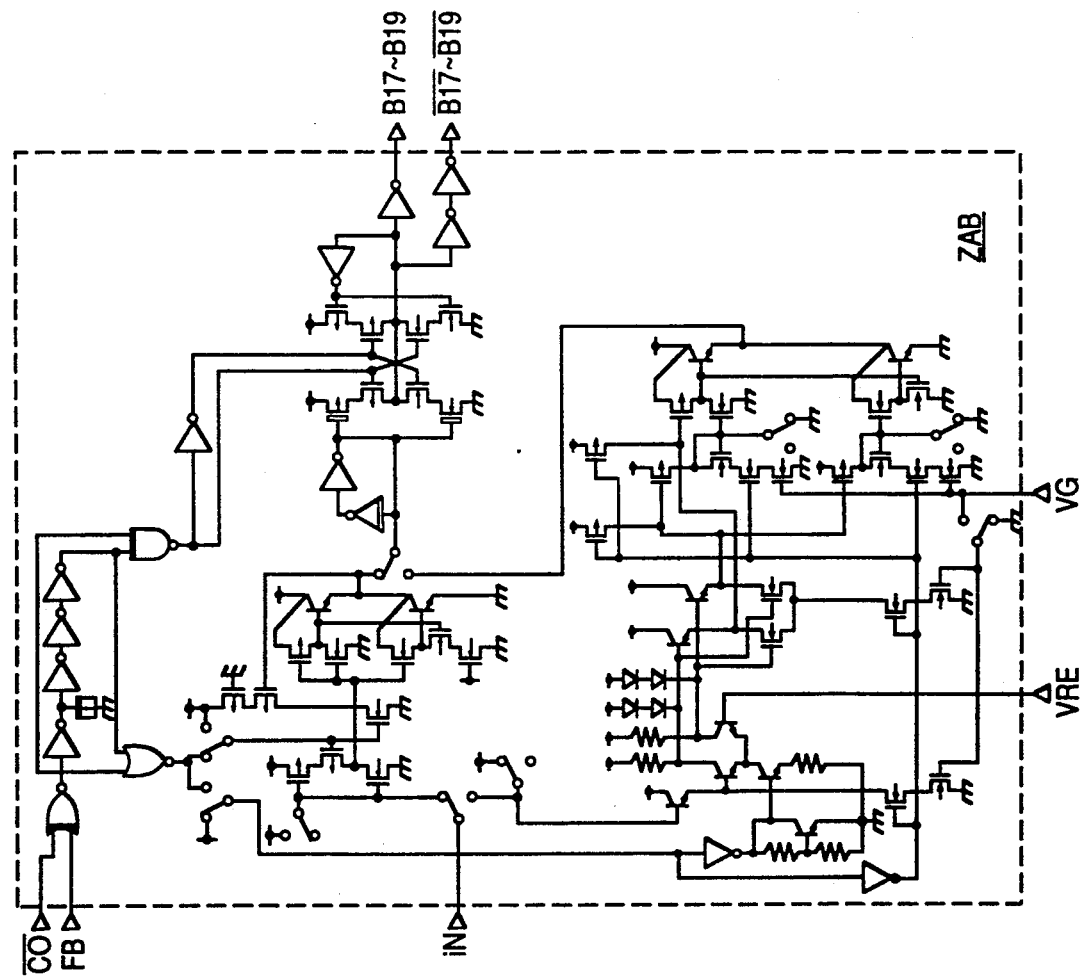

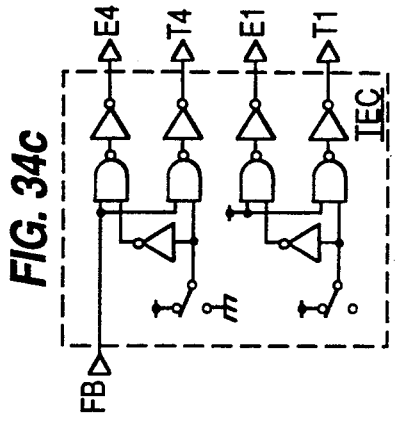
FIG. 34c
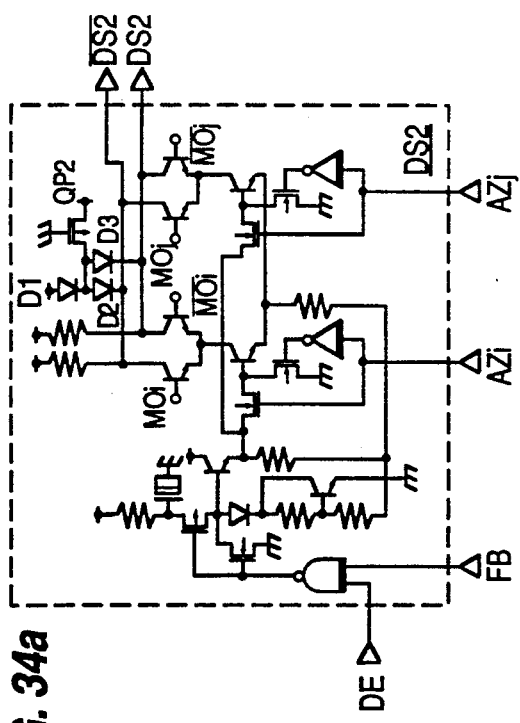
FIG. 34a
FIG. 34b

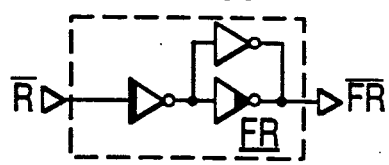
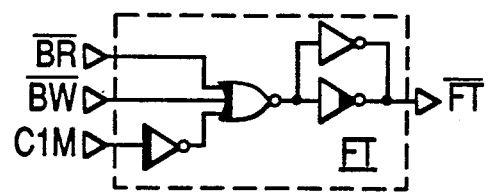
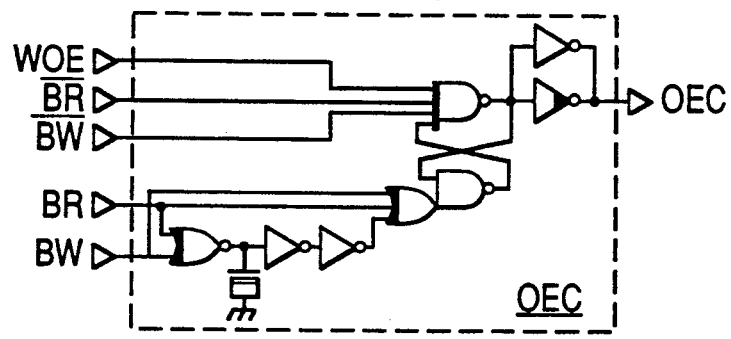
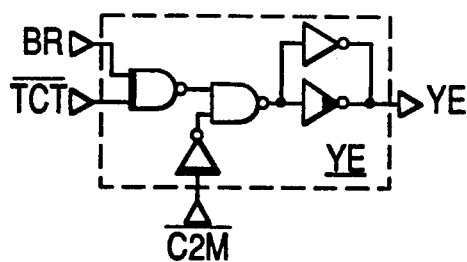
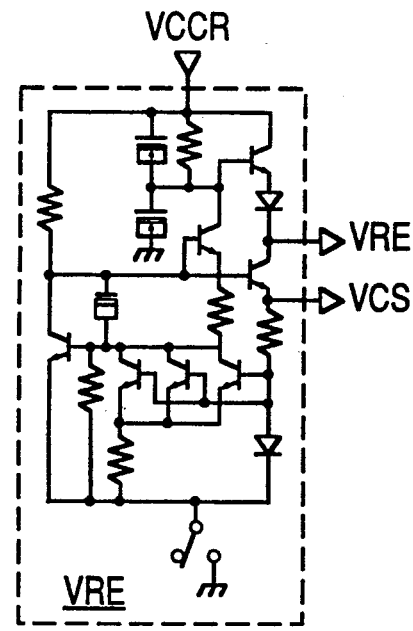

FIG. 41a
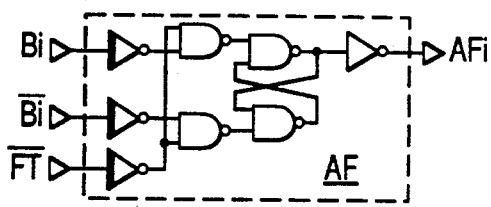
FIG. 41c
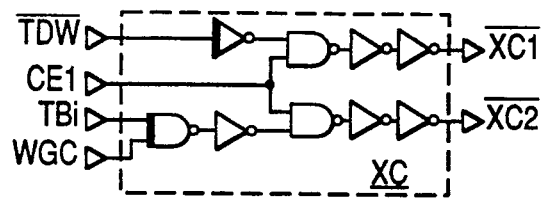
FIG. 41b
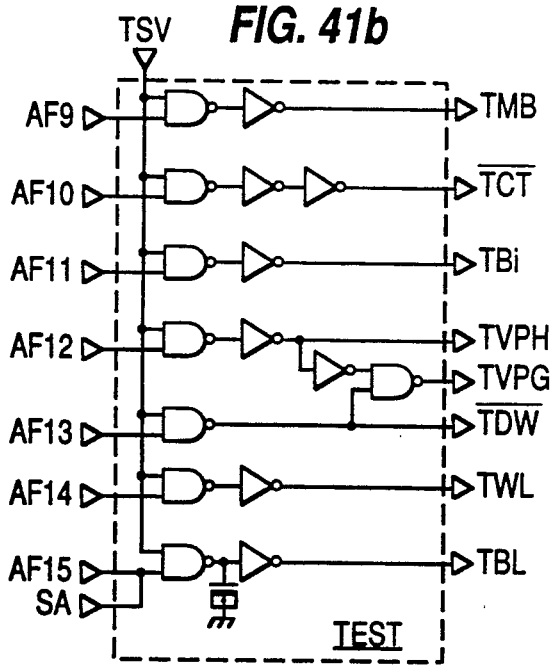
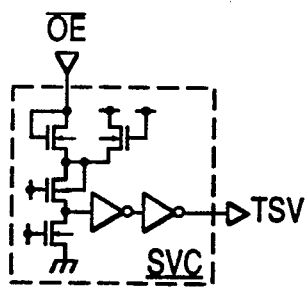
FIG. 41d

CONCENTRATED ARRANGEMENT

DISPERSED ARRANGEMENT

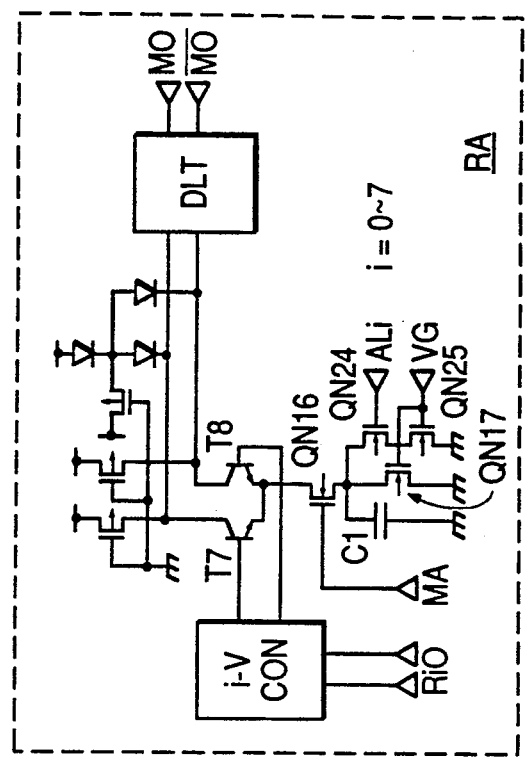
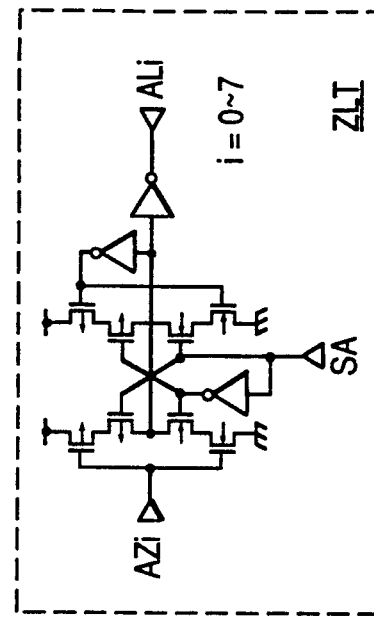
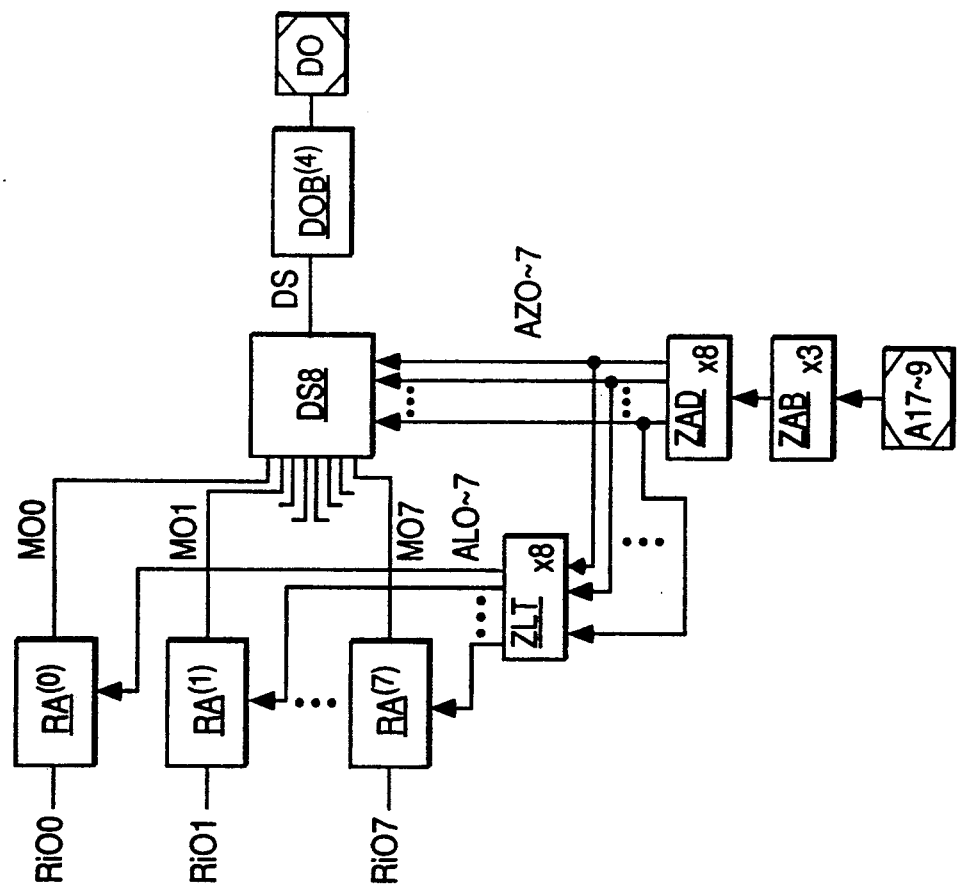
FIG. 77b
FIG. 77c
FIG. 77a

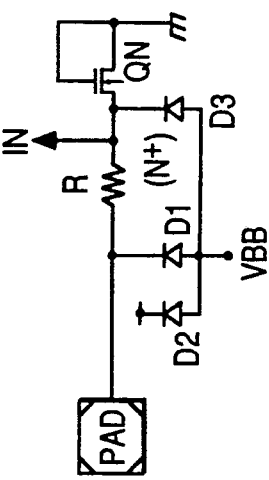
FIG. 78c
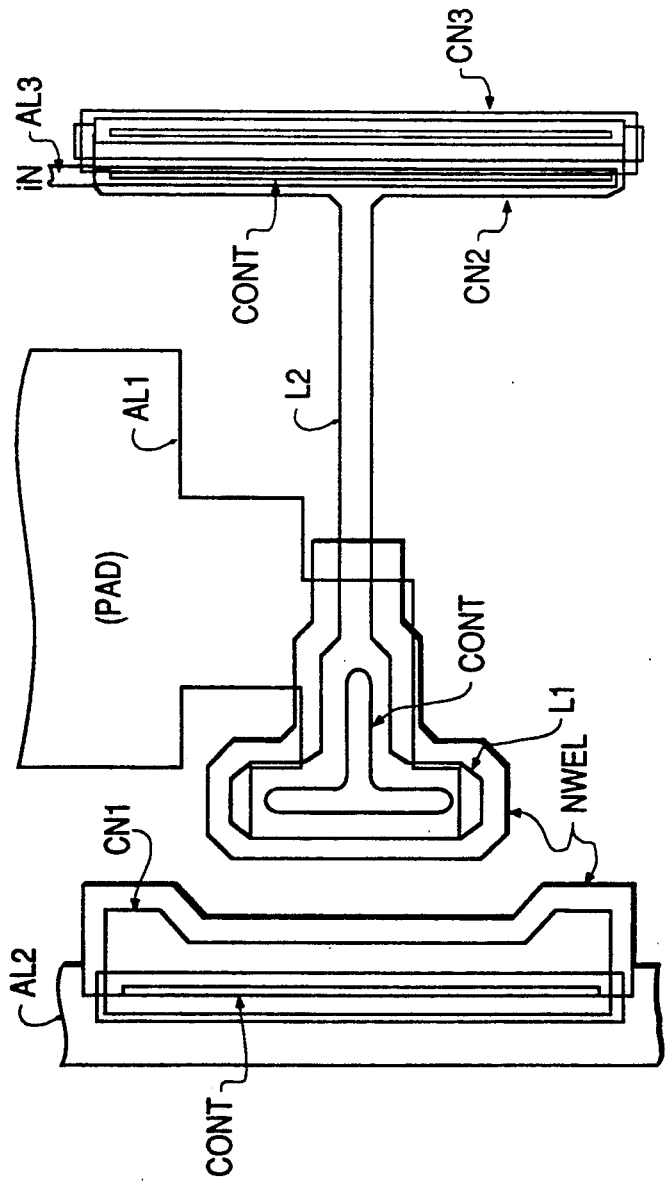
FIG. 78a
FIG. 78b

BI-CMOS SEMICONDUCTOR MEMORY DEVICE, INCLUDING IMPROVED LAYOUT STRUCTURE AND TESTING METHOD

BACKGROUND OF THE INVENTION

The present invention relates generally to an improved Bi.CMOS DRAM, and, more particularly, to particular arrangements including resistance means a logical circuit, an input circuit, a fuse cutting circuit, a drive circuit, a power circuit, an electrostatic protection circuit, a semiconductor memory device including the foregoing components, a layout structure, and a testing method of the same, which are especially effective (although not limited) if applied to such a Bi.CMOS dynamic RAM which includes a memory array composed basically of dynamic memory cells and peripheral circuit composed basically of a Bi.CMOS logical gate circuit.

Static RAMs are known which include a memory array, in which are arranged in a lattice form static memory cells composed basically of MOSFETs, (i.e., Metal Oxide Semiconductor Field Effect Transistor, which is intended in this specification to cover all types of insulated gate transistors), and a peripheral circuit, which is composed basically of a Bi.CMOS logical gate circuit having a bipolar transistor and a CMOS logical gate circuit (i.e., Complementary MOSFET) in combination.

Such a Bi.CMOS static RAM is disclosed on pages 199 to 217 of "Nikkei Electronics" issued on Mar. 10, 1986 by Nikkei Mc-Graw Hill.

In the Bi.CMOS static RAM thus previously disclosed, it is intended to increase the degree of integration and reduce the power consumption by constructing the memory array of static memory cells, and it is also intended to speed up the operations by construction the peripheral circuit of the Bi.CMOS logical gate circuit. Since, however, the static memory cell requires at least four MOSFETs, the increase in the high integration and capacity of the Bi.CMOS static RAM is restricted of itself. Therefore, we have developed the so-called Bi.CMOS dynamic RAM which comprises: a memory array composed of dynamic memory cells to be integrated more highly; and a peripheral circuit composed basically of the Bi.CMOS logical gate circuit. However, the mere application of the structure of the peripheral circuit such as the selections of the dynamic RAM or the peripheral circuit of the Bi.CMOS static RAM of the prior art to the Bi.CMOS logical gate circuit will not always provide an optimum solution, thus causing a problem that various performance characteristics of the Bi.CMOS dynamic RAM cannot be sufficiently enhanced.

OBJECTS AND SUMMARY OF THE INVENTION

A major object of the present invention is to increase the speed and storage capacity and drop the power consumption of a semiconductor memory device such as the Bi.CMOS dynamic RAM by giving it the optimum structure.

Another object of the present invention is to provide resistance means, a logical circuit, an input circuit, a fuse cutting circuit, a drive circuit, a power circuit, an electrostatic protection circuit, a semiconductor memory device including the foregoing components, a layout structure, and a testing method of the same, which are suitable for the semiconductor memory device such as the Bi.CMOS dynamic RAM.

The foregoing and other objects and novel features of the present invention will become apparent from the following description taken with reference to the accompanying drawings.

The invention to be disclosed hereinafter will be representatively summarized in the following. The so-called Bi.CMOS dynamic RAM structure is made by composing the memory array of the semiconductor memory device basically of dynamic memory cells and by composing the peripheral circuit basically of the Bi.CMOS logical gate circuit. At this time, the word line selections are of the so-called static selection type, in which a word line selection voltage having an absolute value larger than the signal amplitude of the data line in the writing operation is selectively transmitted to a designated word line. As the common I/O lines, moreover, there are provided: a writing common I/O line, to which is directly connected a designated data line through a corresponding switch MOSFET, and a reading common I/O line to which is indirectly connected a designated data line through the gate of a corresponding switch MOSFET. At the same time, the read signals transmitted from the selected memory cell through the aforementioned data line and reading common I/O line are current signals, which are converted into voltage signals and amplified by a read amplifier which is composed basically of differential bipolar transistors. There are also provided a plurality of memory mats which include paired memory arrays and their directly peripheral circuits for performing a series of selections under self-control in accordance with corresponding array selection signals and which are arranged symmetrically and in tandem across an X-selector arranged along a center line parallel with the shorter side of a semiconductor substrate. Incidentally, throughout the description, the term "self-control" will mean that internal operations will occur sequentially in accordance with a predetermined order once input signals (either address or data, depending on the circumstances) have been applied to the circuit being discussed (in a sense, a Domino Effect).

According to the means thus far described, the signal transmission delay time of the peripheral circuit can be shortened while increasing the degree of integration of the memory arrays. Moreover, the reading operations can be speeded up by separating the common I/O lines in accordance with their amplifications and by transmitting the read signals as current signals. Furthermore, the selections of the word lines and the data lines can be speeded up by making the word line selections of the so-called static type and by arranging the memory mats in tandem across the X-selector. As a result, it is possible to provide a semiconductor memory device which can have a high speed, a large storage capacity and a low power consumption.

BRIEF DESCRIPTION OF THE DRAWINGS

FIGS. 1 to 3 are block diagrams showing the whole structure of one embodiment of the Bi.CMOS dynamic RAM according to the present invention.

FIGS. 18 to 43 are circuit diagrams showing one embodiment each of individual units of the Bi.CMOS dynamic RAM shown in FIGS. 1 to 4.

FIGS. 54 to 79 are conceptional, characteristic, arrangement and modified circuit diagrams for explaining the invention at the individual portions of the Bi.CMOS dynamic RAM according to the present invention.

DETAILED DESCRIPTION

1.1. Fundamental Structure or System and Its Features

1.1.1. Product Type and Kind Developing Method

Table 1 enumerates the product types of one embodiment of the Bi.CMOS dynamic RAM according to the present invention. The Bi.CMOS dynamic RAM of this embodiment can be classified into four kinds of products, although not especially limitative thereto, in accordance with the bit structures and the input/output signal levels. Specifically, the Bi.CMOS dynamic RAM can be classified into either the so-called structure of $\times 1$ bit, in which the storage data are inputted or outputted at the unit of 1 bit, or the so-called structure of $\times 4$ bits, in which the storage data are simultaneously inputted or outputted at the unit of 4 bits, as enumerated in Table 1. In accordance with the input/output signal levels, moreover, the Bi.CMOS dynamic RAM is classified into either a structure in which the start control signal, the write data and the address signal are inputted or outputted at the TTL (i.e., Transistor Transistor Logic) level, or a structure in which those signals are inputted at the ECL (i.e., Emitter Coupled Logic) level. The Bi.CMOS dynamic RAM for this embodiment is prepared with a semiconductor substrate (or base chip) arranged with the basic elements necessary to permit formation of any one of the above-specified four kinds of products, although not especially limitative thereto. The aforementioned bit structures and input signal modes of the Bi.CMOS dynamic RAM are interchanged by changing a portion of a photo-mask of the aforementioned common semiconductor substrate to develop the respective kinds, although not especially limitative thereto.

Incidentally, the package mode to be prepared for the Bi.CMOS dynamic RAM of this embodiment can be an SOJ (i.e., Small Outline J-lead) package, although not especially limitative thereto.

TABLE 1

| No. | Bit Structure | Input Signal Mode | Package |
| --- | --- | --- | --- |
| 1 | ×1 | TTL | SOJ |

TABLE 1-continued

| No. | Bit Structure | Input Signal Mode | Package |
| --- | --- | --- | --- |
| 2 | ×1 | ECL | |
| 3 | ×4 | TTL | |
| 4 | ×4 | ECL | |

1.1.2. External Terminals

Figure 7:
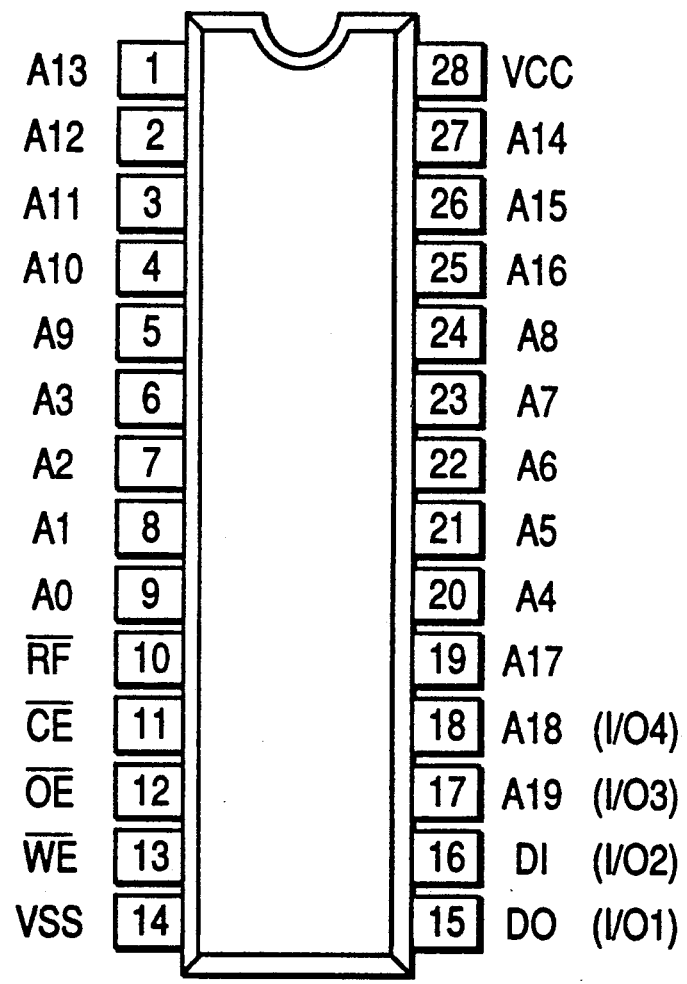
FIG. 7 is a diagram showing the arrangement of the external terminals of the embodiment.

FIG. 7 is a diagram showing a terminal arrangement of one embodiment of the Bi.CMOS dynamic RAM according to the present invention. On the other hand, Table 2 enumerates the names and functions of the external terminals to be arranged in the diagram of FIG. 7, the Table 3 enumerates both such one of the external terminals tabulated in Table 2 as having different functions according to the bit structures of the Bi.CMOS dynamic RAM and the correspondences. Incidentally, the specification and its accompanying drawings are based upon the case, in which the Bi.CMOS dynamic RAM has the structure of $\times 1$ bit, and the case of the structure of $\times 4$ bits will be supplementally described, if necessary, in a parenthesized form. Moreover, the Bi.CMOS dynamic RAM of this embodiment has address signals of 20 bits for the structure of $\times 1$ bit so that it is given the storage capacity of 1 megabits.

TABLE 2

| Terminal Name | Function |
| --- | --- |
| A0 to A8 | X-Address Inputs |
| A9 to A16 | Y-Address Inputs |
| A17 to A19 | Z-Address Inputs (×1) |
| A17 | Z-Address Inputs (×4) |
| D1 | Data Input (×1) |
| D0 | Data Output (×1) |
| I/O1 to I/O4 | Data Input/Output (×4) |
| $\overline{CE}$ | Chip Enable Signal |
| $\overline{WE}$ | Write Enable Signal |
| $\overline{OE}$ | Output Enable Signal |
| $\overline{RF}$ | Refresh Control Signal |
| VCC | Power Voltage (+5V) |
| VSS | Ground Potential |

TABLE 3

| Bit Structure | |
| --- | --- |
| ×1 | ×4 |
| D0 | I/O1 |
| D1 | I/O2 |
| A18 | I/O3 |
| A19 | I/O4 |

1.1.3. Operation Cycle

Table 4 enumerates the operation cycle of one embodiment of the dynamic RAM according to the present invention. On the other hand, FIGS. 8 to 17 are timing charts showing the operation cycles of the embodiment enumerated in Table 4. The summary and features of the individual operation cycles of the Bi.CMOS dynamic RAM of this embodiment will be described in the following with reference those Tables and Figures.

TABLE 4

| Cycle No. | Operation Cycle |
| --- | --- |
| 1 | Read Cycle |
| 2 | Early Write Cycle |
| 3 | Write Cycle |

TABLE 4-continued

| Cycle No. | Operation Cycle |
| --- | --- |
| 4 | Read Modify Write Cycle |
| 5 | SC Read Cycle |
| 6 | SC Write Cycle |
| 7 | $\overline{CE}$ Refresh Cycle |
| 8 | Auto-Refresh Cycle |
| 9 | Test Mode Set Cycle |
| 10 | Test Cycle |

(1) Read Cycle

Figure 8:
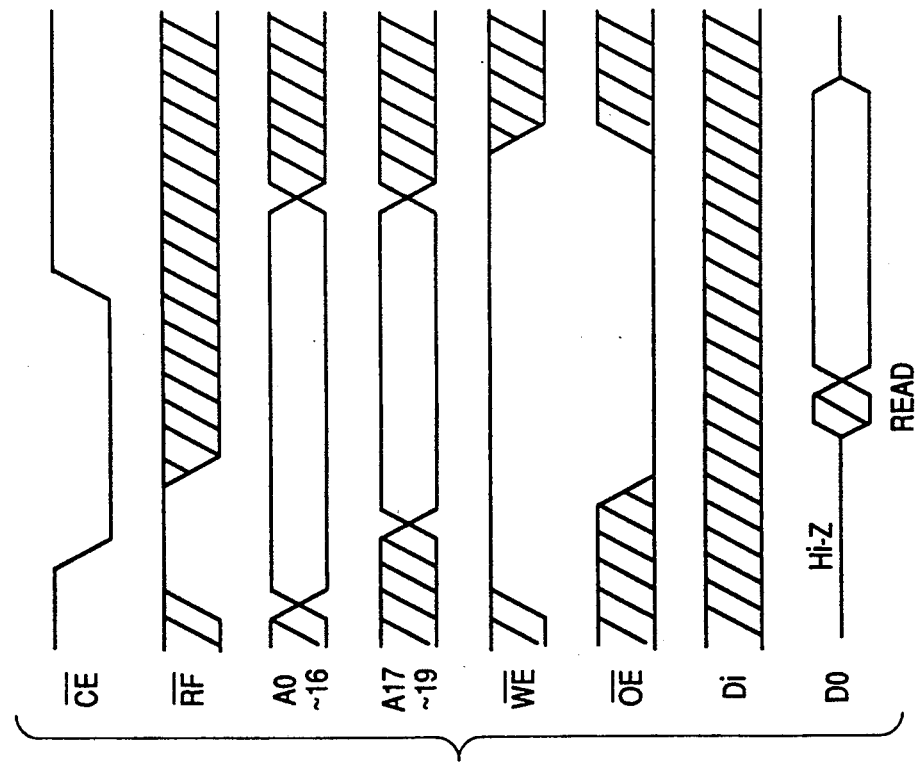

The Bi.CMOS dynamic RAM is set in the read cycle on condition that the refresh control signal $\overline{RF}$ is at the high level at the breaking edge of the chip enable signal $\overline{CE}$ while the write enable signals $\overline{WE}$ is at the high level, a seen from FIG. 8. The output enable signal $\overline{OE}$ is set at the low level prior to the chip enable signal $\overline{CE}$ or at a predetermined timing without any delay in the data output. The address input terminals A0 to A16 are fed, prior to the break of the chip enable signal $\overline{CE}$, with X-address signals of 9 bits and Y-address signals of 8 bits. Z-address signals of 3 bits are also fed to the address input terminals A17 to A19 simultaneously with the aforementioned X-address signals and Y-address signals or at a predetermined timing without any delay in the data output. The data output terminal DO is usually at the high-impedance state to output the read data of a designated address at an instant after a predetermined access time has elapsed.

(2) Early Write Cycle

Figure 9:
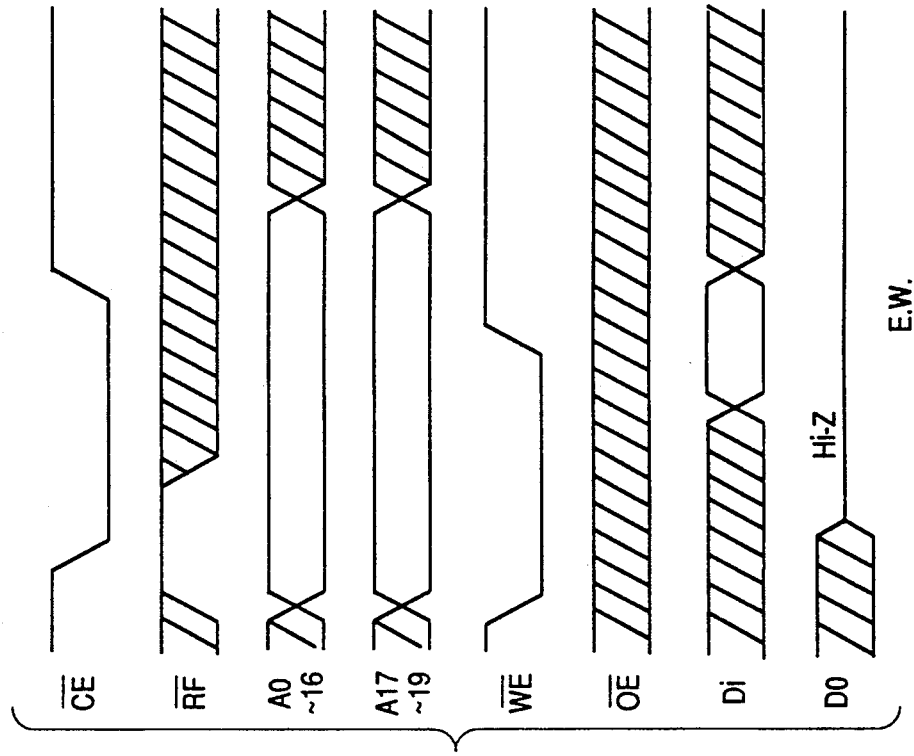
FIGS. 8 to 17 are timing charts showing one embodiment of the individual operation cycles of the Bi.CMOS dynamic RAM according to the present invention.

The Bi.CMOS dynamic RAM is set in the early write cycle on condition that the refresh control signal $\overline{RF}$ is at the high level whereas the write enable signal $\overline{WE}$ is at the low level at the breaking edge of the chip enable signal $\overline{CE}$ as shown in FIG. 9. The address input terminals A0 to A16 and A17 to A19 are simultaneously fed with the X- and Y-address signals and the Z-address signals prior to the breaking change of the chip enable signal $\overline{CE}$, and the data input terminal DI is fed with the write data at a predetermined timing without any delay in the write operation. The data output terminal DO is brought into a high-impedance state.

(3) Write Cycle

Figure 10:
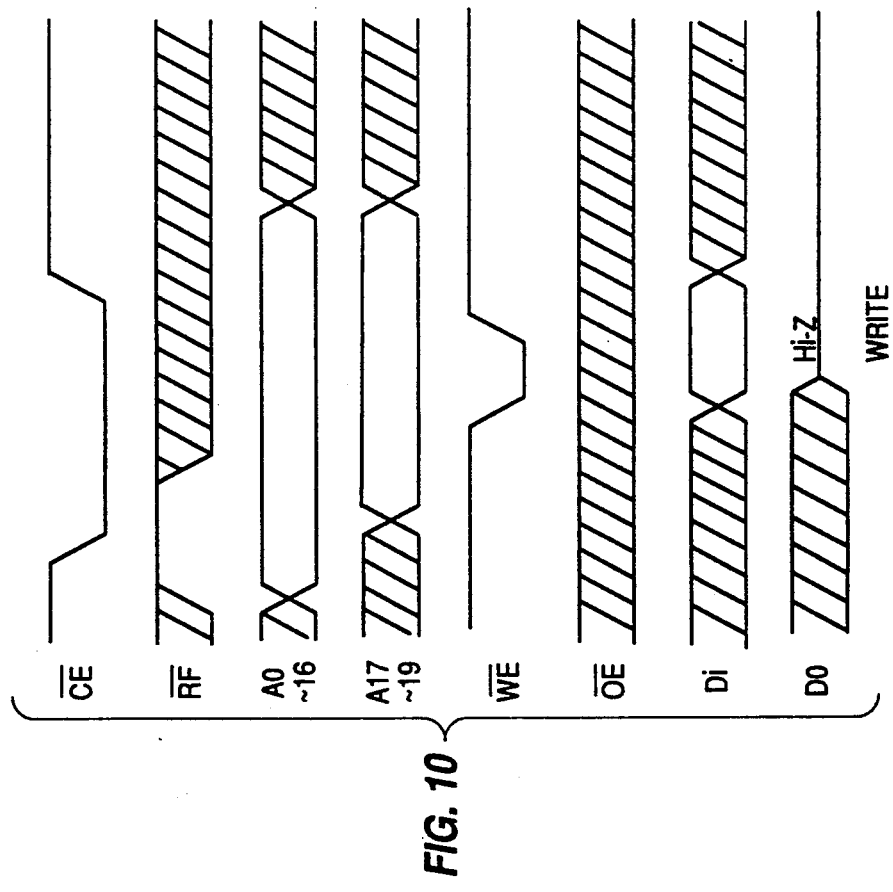

The Bi.CMOS dynamic RAM starts the selection operations like those of the aforementioned read cycle because the refresh control signal $\overline{RF}$ and the write enable signal $\overline{WE}$ are at the high level at the breaking edge of the chip enable signal $\overline{CE}$, as shown in FIG. 10. The Bi.CMOS dynamic RAM execute the write operations when the write enable signal $\overline{WE}$ is dropped temporarily to the low level with a delay. The data input terminal DI is fed with the write data prior to the rise of the write enable signal e,ovs/WE/ . The data output terminal DO is fed with insignificant output data, till the write enable signal $\overline{WE}$ is dropped to the low level, but is brought into the high-impedance state when the write enable signal $\overline{WE}$ is dropped to the low level.

(4) Read Modify Write Cycle

Figure 11:
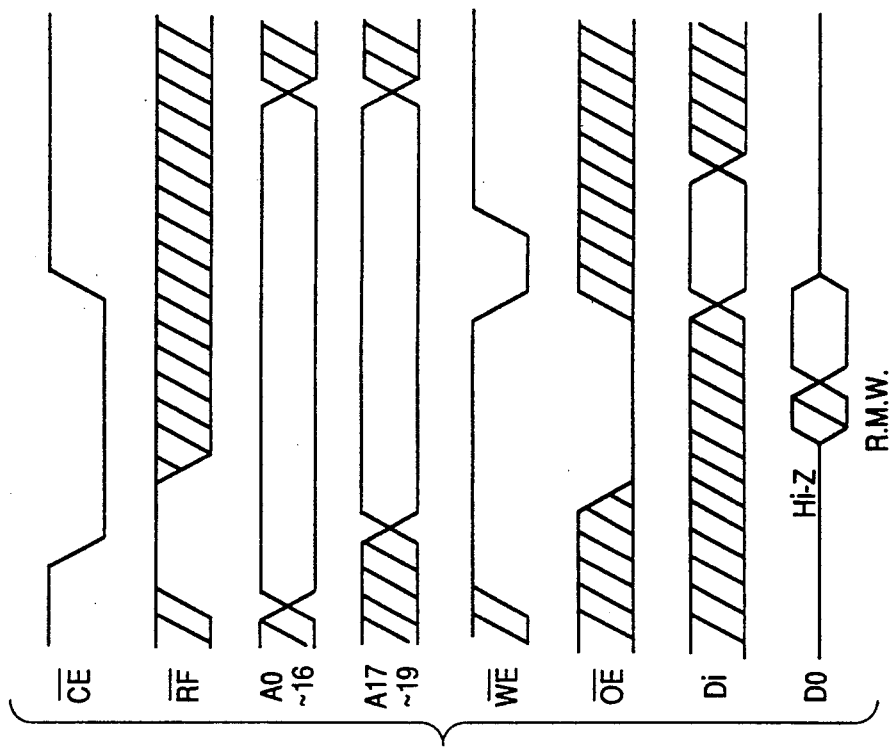

This operation cycle is, so to speak, the combination of the aforementioned read cycle and a delayed write cycle. The Bi.CMOS dynamic RAM first starts the read cycle because the refresh control signal $\overline{RF}$ and the write enable signal $\overline{WE}$ are at the high level at the breaking edge of the chip enable signal $\overline{CE}$, as shown in FIG. 11. At an instant when the write enable signal $\overline{WE}$ is temporarily dropped to the low level after the read data of the designated address have been outputted from the data output terminal DO, the Bi.CMOS dynamic RAM writes the write data, which are fed from the data input terminal DI, in the aforementioned address.

(5) SC Read Cycle

Figure 12:
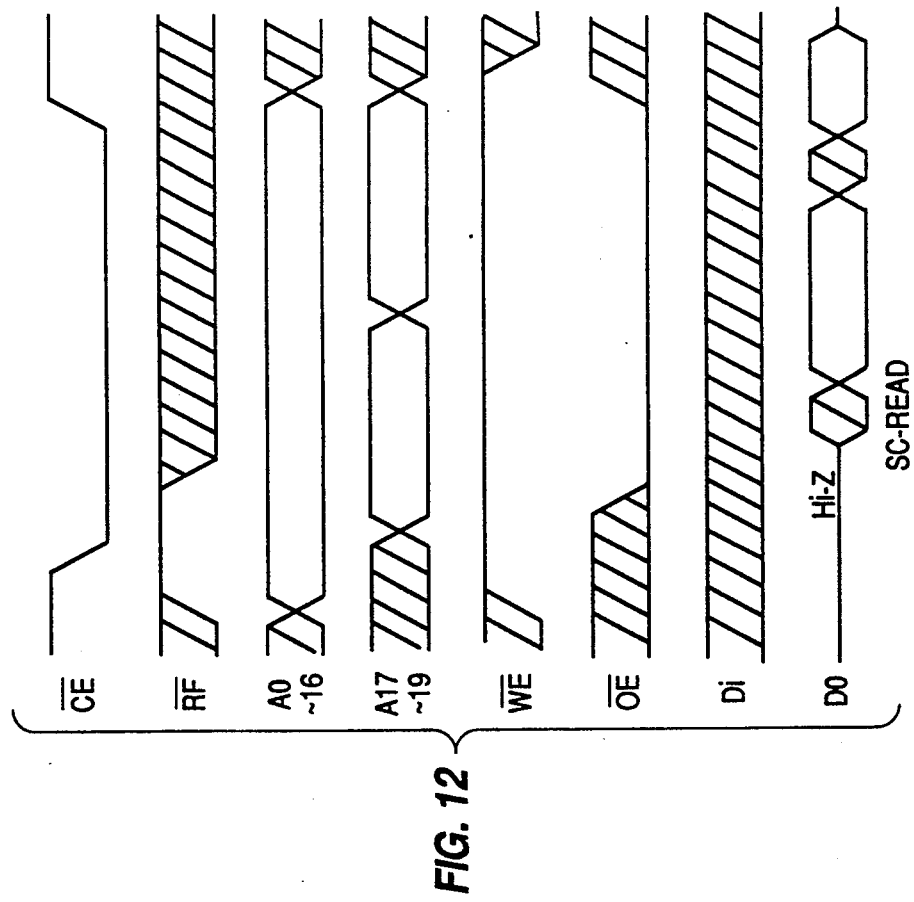

The Bi.CMOS dynamic RAM executes the high-speed continuous read operations of 8 bits at the maximum in the SC (i.e., Static Column) on condition that the Z-address signals fed to the address input terminals A17 to A19 are changed with the chip enable signal $\overline{CE}$ being fixed at the low level and the with the write enable signal $\overline{WE}$ being fixed at the high level, as shown in FIG. 12.

In this Bi.CMOS dynamic RAM of this embodiment, as will be described hereinafter, four memory arrays are simultaneously selected for each memory access, and two memory cells from each memory array, i.e., totally eight memory cells, are simultaneously selected in accordance with the x-and Y-address signals. In the ordinary read cycle, the read data of the eight memory cells to be simultaneously selected are alternatively selected in accordance with the Z-address signals of 3 bits and outputted through the data output terminal DO. In the case of the SC read cycle, however, the read data are alternatively selected in accordance with the change in the Z-address signal and outputted through the data output terminal DO.

(6) SC Write Cycle

Figure 13:
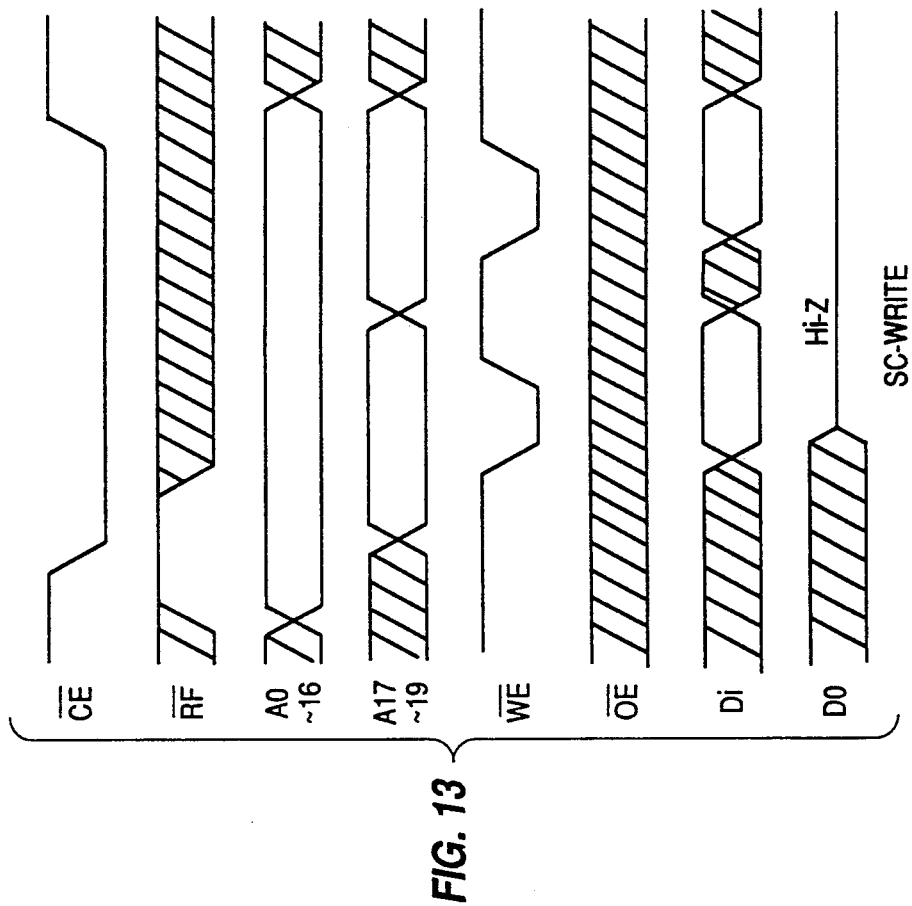

As shown in FIG. 13, the Bi.CMOS dynamic RAM executes the high-speed continuous write operations of 8 bits at the maximum in the SC write cycle on condition that the write enable signal $\overline{WE}$ is repeatedly changed to the low level with the chip enable signal $\overline{CE}$ being fixed at the low level whereas the Z-address signals to be fed to the address input terminals A17 to A19 are repeatedly changed to be synchronized with the write enable signal $\overline{WE}$. At this time, the data input terminal DI is fed with a series of write data prior to each rising edge of the write enable signal $\overline{WE}$.

In the Bi.CMOS dynamic RAM, like the case of the aforementioned SC read cycle, the eight memory cells designated by the X- and Y-address signals are simultaneously brought into the selected state. These memory cells are alternatively selected in accordance with the aforementioned Z-address signals and are sequentially written with the corresponding write data.

(7) $\overline{CE}$ Refresh Cycle

Figure 14:
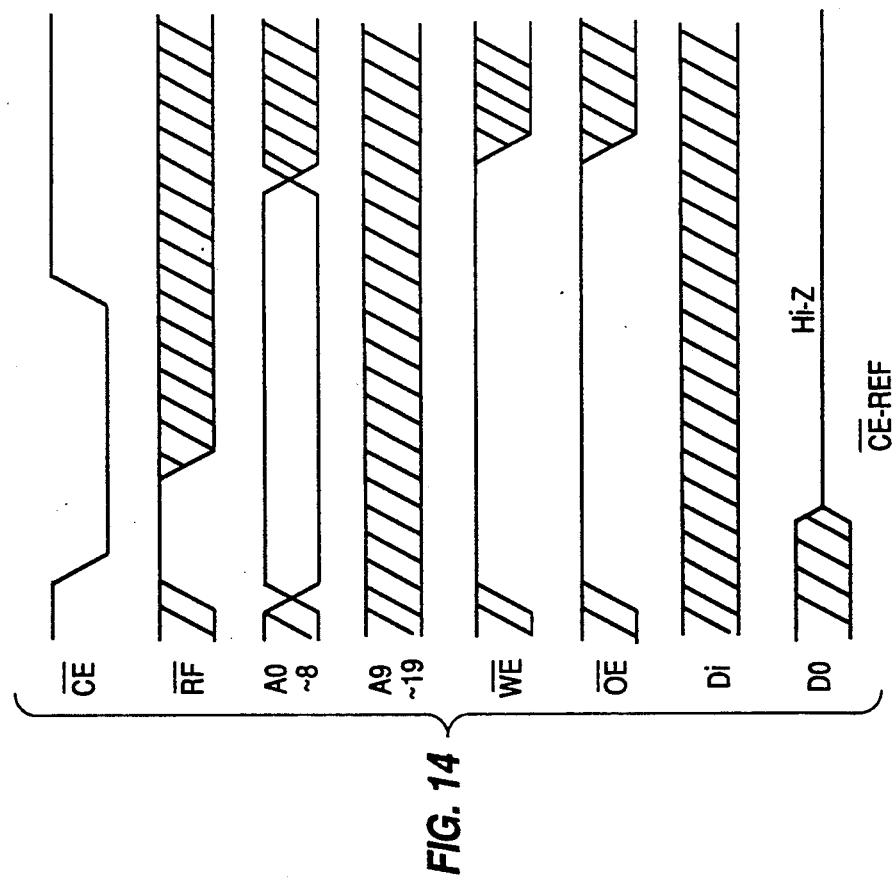

As shown in FIG. 14, the Bi.CMOS dynamic RAM executes the $\overline{CE}$ refresh cycle on condition that the refresh control signal $\overline{RF}$ is at the high level at the breaking edge of the chip enable signal $\overline{CE}$ and that the write enable signal $\overline{WE}$ and the output enable signal $\overline{OE}$ are fixed at the high level. The address input terminals A0 to A8 are fed with the X-address signals for designating the word lines to be refreshed, in synchronism with the chip enable signal CE.

In the Bi.CMOS dynamic RAM, like the aforementioned read cycle, the four memory arrays are simultaneously selected, and one word line for each memory array, i.e., totally four word lines, are simultaneously brought into the selected state. As a result, the storage data of the 512 memory cells coupled to those word lines, i.e., totally 2,048 memory cells, are outputted altogether to the corresponding data lines so that they are refreshed by the corresponding unit amplifiers of each sense amplifier.

(8) Auto-Refresh Cycle

Figure 15:
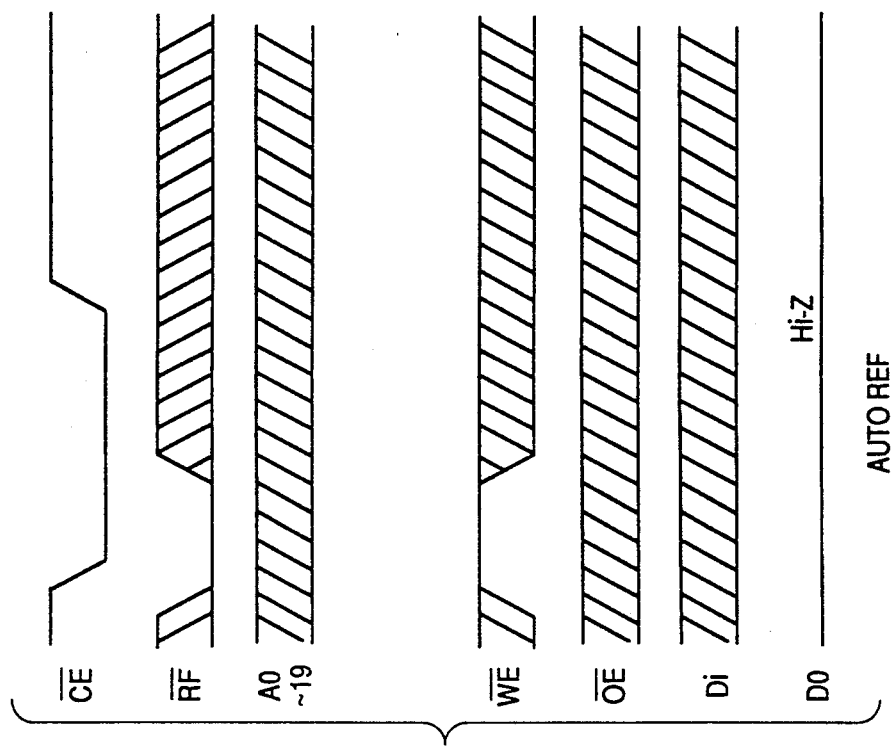

As shown in FIG. 15, the Bi.CMOS dynamic RAM executes the auto-refresh cycle on condition that the refresh control signal $\overline{RF}$ is at the low level and the write enable signal $\overline{WE}$ is at the high level at the breaking edge of the chip enable signal $\overline{CE}$. At this time, the refresh address for designating the word line to be refreshed is fed from a refresh counter RFC built in the Bi.CMOS dynamic RAM.

In the Bi.CMOS dynamic RAM, the four word lines designated by the aforementioned refresh counter RFC are simultaneously brought into the selected state so that the total of 2,048 corresponding memory cells are refreshed. The refresh counter RFC is automatically updated at an instant when its output, i.e., the aforementioned refresh address, is taken into the X-address buffer.

(9) Test Mode Set Cycle

Figure 16:
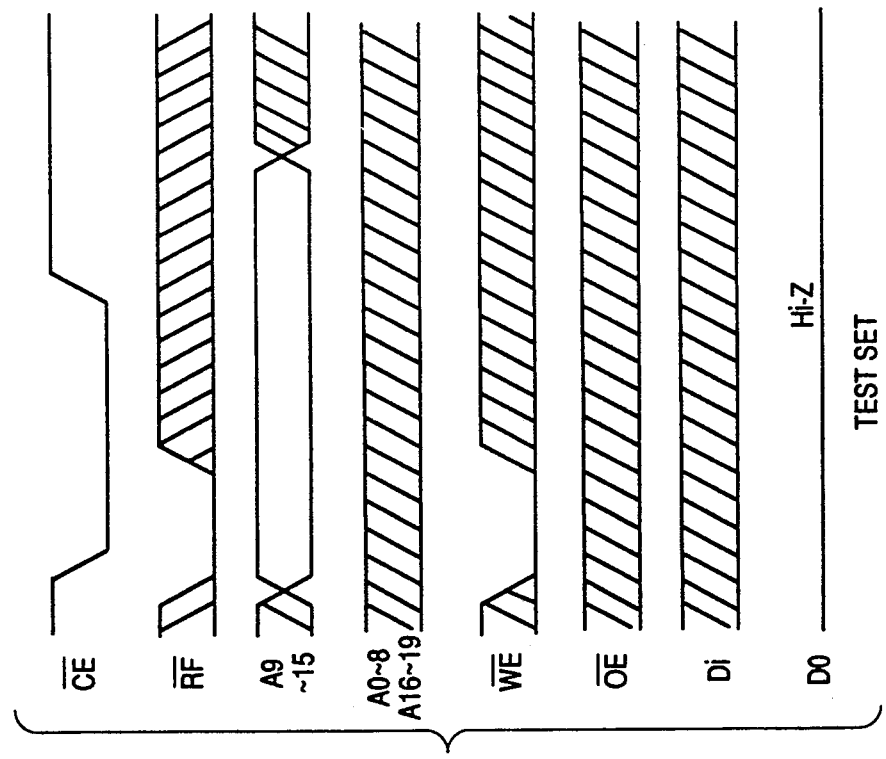
Figure 18B:
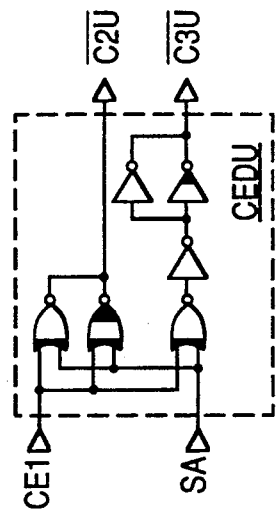
Figure 18C:
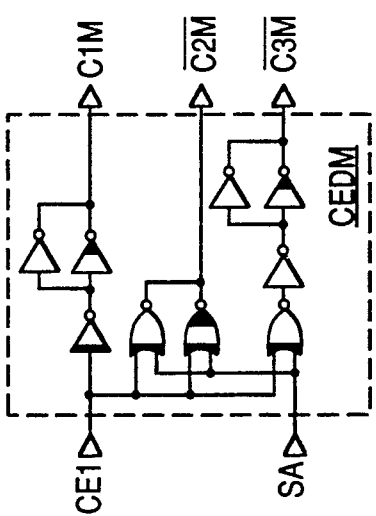
Figure 18D:
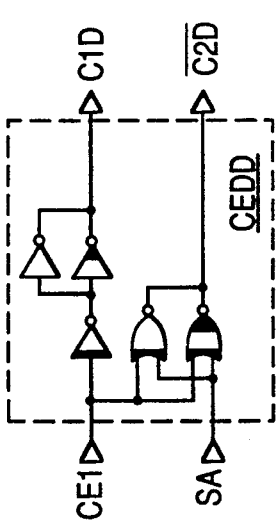
Figure 18A:
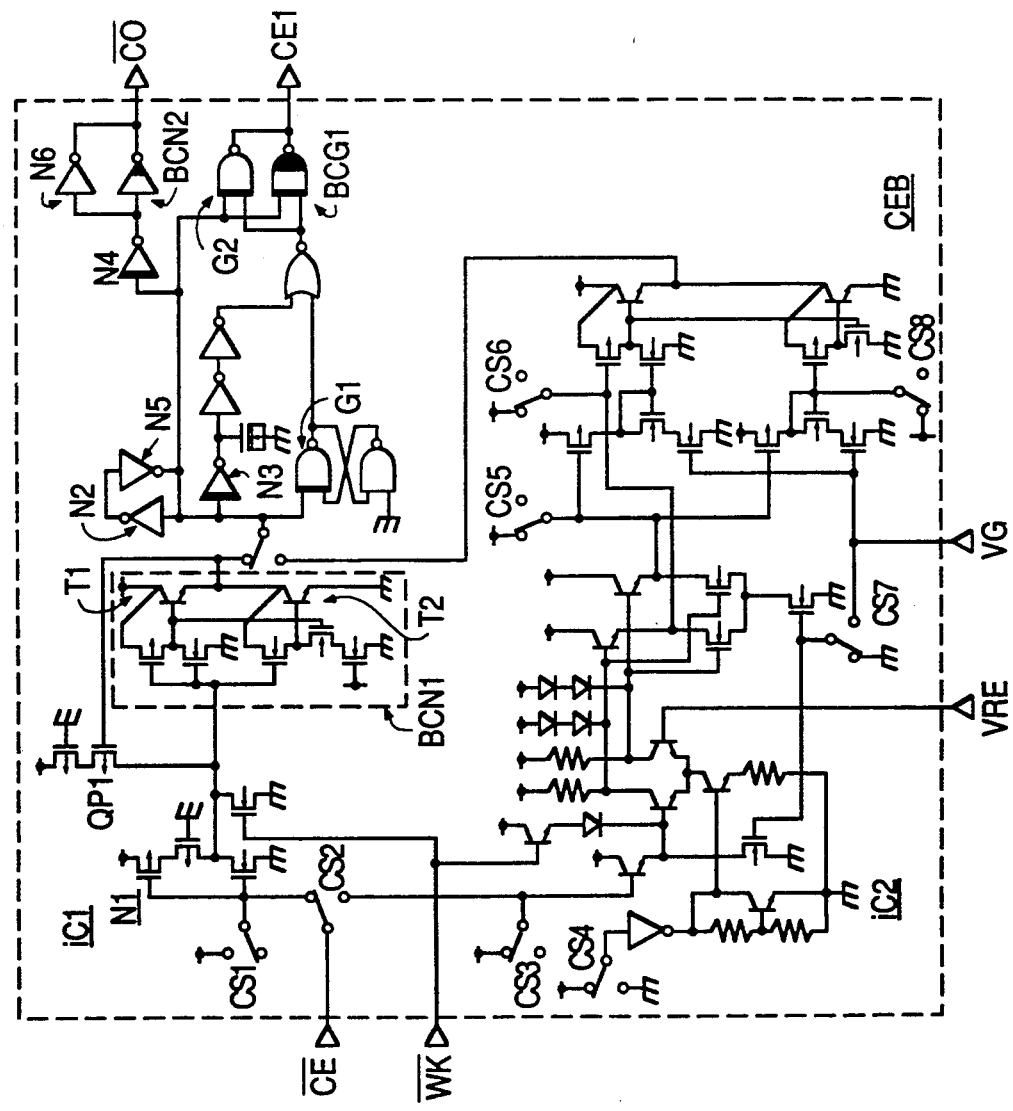

As shown in FIG. 16, the Bi.CMOS dynamic RAM comes into the test mode set cycle on condition that the refresh control signal $\overline{RF}$ and the write enable signal $\overline{WE}$ are at the low level at the breaking edge of the chip enable signal $\overline{CE}$. At this time, the address input terminals A9 to A15 are fed with the test mode setting signals for designating the contents of the test mode, although not especially limitative thereto. In the Bi.CMOS dynamic RAM, as will be described hereinafter, the test mode set cycle is decided so that the test mode setting signals are latched in the test mode set signal latches, These test mode set signals are latched in the corresponding latches till a next test mode set cycle is executed. The substantial test operations in each test mode are not accomplished till the test cycle is executed.

The kinds and summary of the test modes prepared for the Bi.CMOS dynamic RAM will be described hereinafter.

(10) Test Cycle

Figure 17:
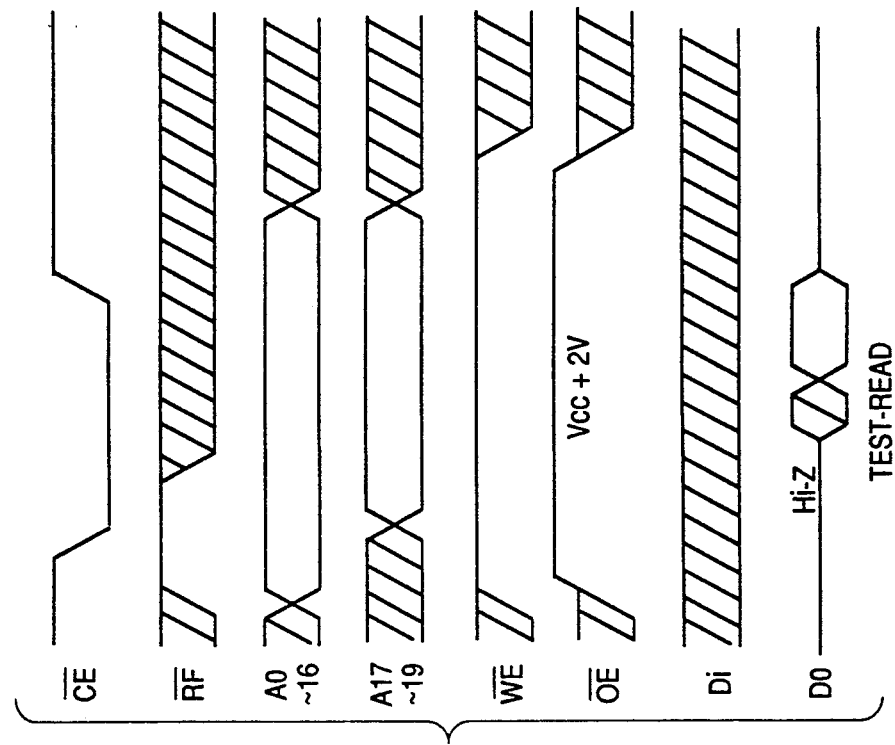

The Bi.CMOS dynamic RAM executes a corresponding predetermined test cycle on condition that the chip enable signal $\overline{CE}$ is at the low level and that the output enable signal $\overline{OE}$ is fed with a high voltage which is higher by 2 V than the power voltage VCC of the circuit, for example, as representatively shown as the test read cycle in FIG. 17 (although not limited to this).

In the Bi.CMOS dynamic RAM, as has been described hereinbefore, the test mode is set in advance by executing the test mode set cycle, and the substantial and specific test operations in the aforementioned test mode are selectively accomplished by executing the test cycle.

1.1.4. Block Structure

Figure 1:
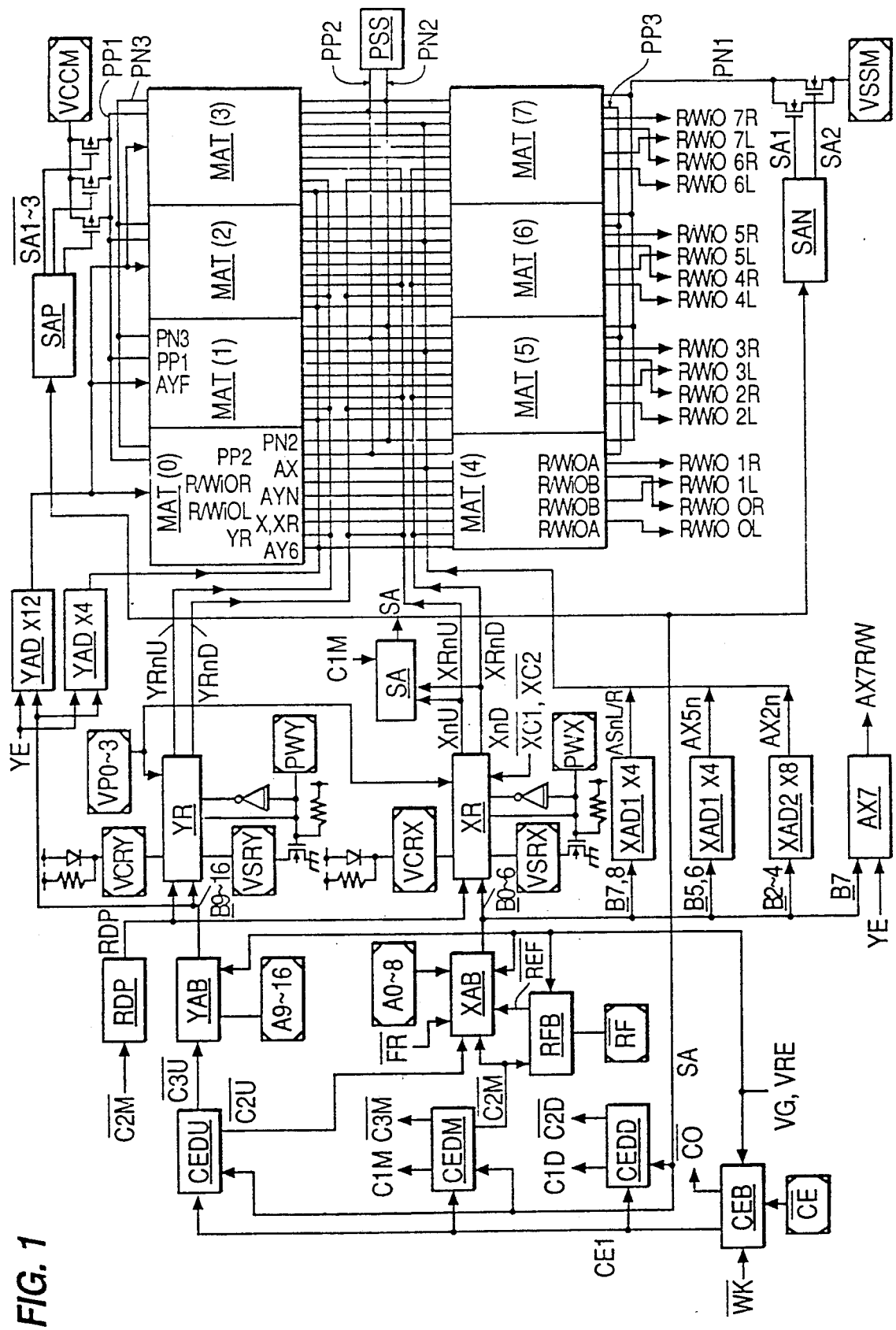
Figure 2:
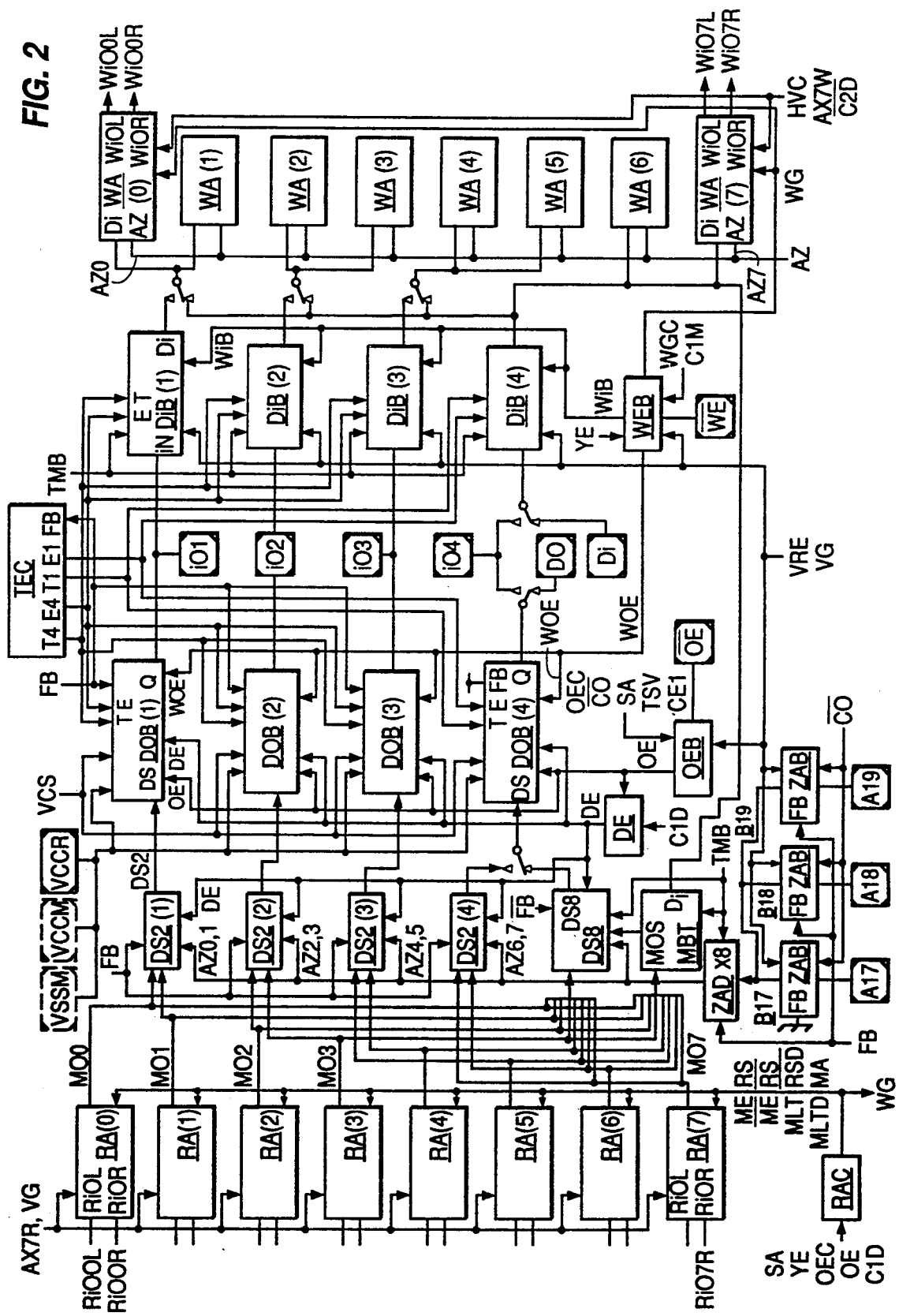
Figure 4:
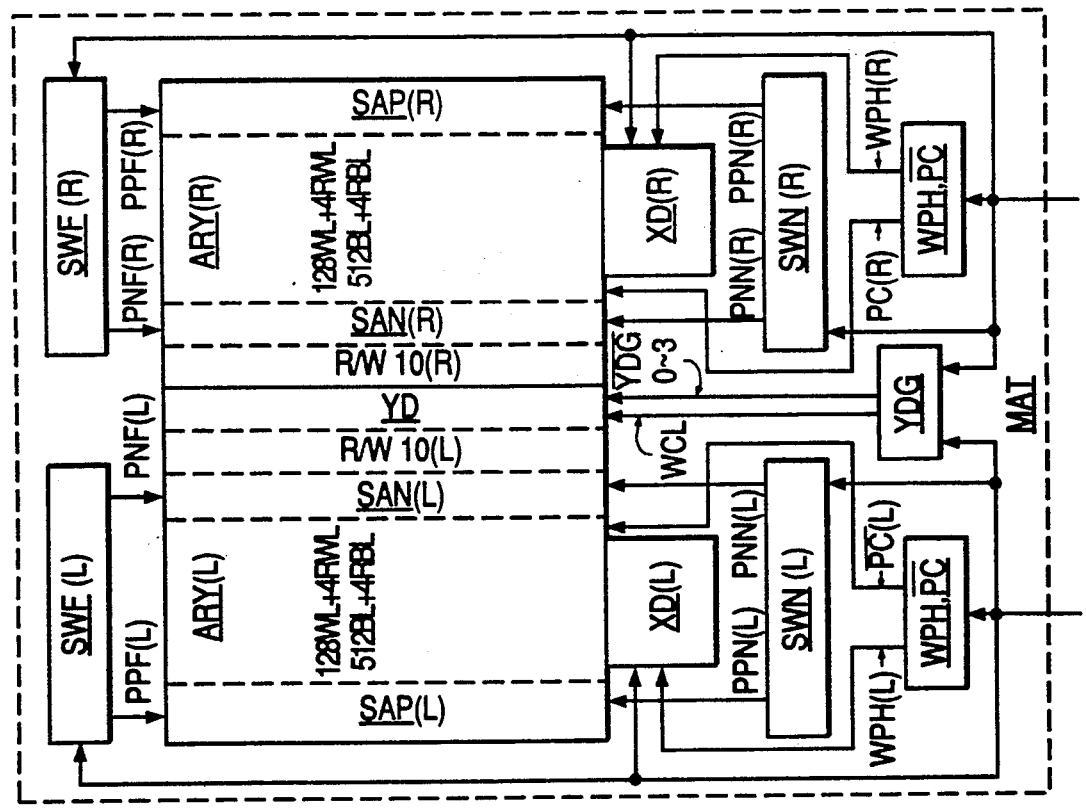
FIG. 4 is a block diagram showing one embodiment of the memory mat of the aforementioned Bi.CMOS dynamic RAM.

FIGS. 1 to 3 are block diagrams showing one embodiment of the Bi.CMOS dynamic RAM according to the present invention. On the other hand, FIG. 4 is a fundamental block diagram showing one embodiment of the memory mats MAT0 to MAT7 of the aforementioned Bi.CMOS dynamic RAM. With reference to these Figures, the block structure and features of the Bi.CMOS dynamic RAM of this embodiment will be described in the following. Incidentally, the circuit components of the individual blocks of FIGS. 1 to 3 are formed over one semiconductor substrate made of a P-type single crystalline silicon, although not especially limitative thereto. In FIGS. 1 to 3 and later Figures, moreover, the signal lines concerned with the input or output signals are indicated to start from bonding pads which are formed over the semiconductor substrate.

The specific structures, operations and features of the individual blocks will be described in detail hereinafter.

(1) Memory Mat and Memory Array

The Bi.CMOS dynamic RAM of this embodiment is equipped with eight memory mats MAT0 and MAT7, although not especially limitative thereto, as shown in FIG. 1. Each of these memory mats includes, as shown in the block diagram of FIG. 4: one Y-decoder YD; and a pair of memory arrays ARYL and ARYR which are arranged symmetrically across the Y-decoder YD. Each memory mat further includes: a Y-detector drive circuit YDG provided for the Y-decoder YD; X-decoders XDL and XDR provided for the aforementioned memory arrays ARYL and ARYR; common source line switch circuits SWFL and SWFR, and SWNL and SWNR; word line precharge signal generators WPHL and WPHR; and data line precharge signal generators PCL and PCR.

Figure 28:
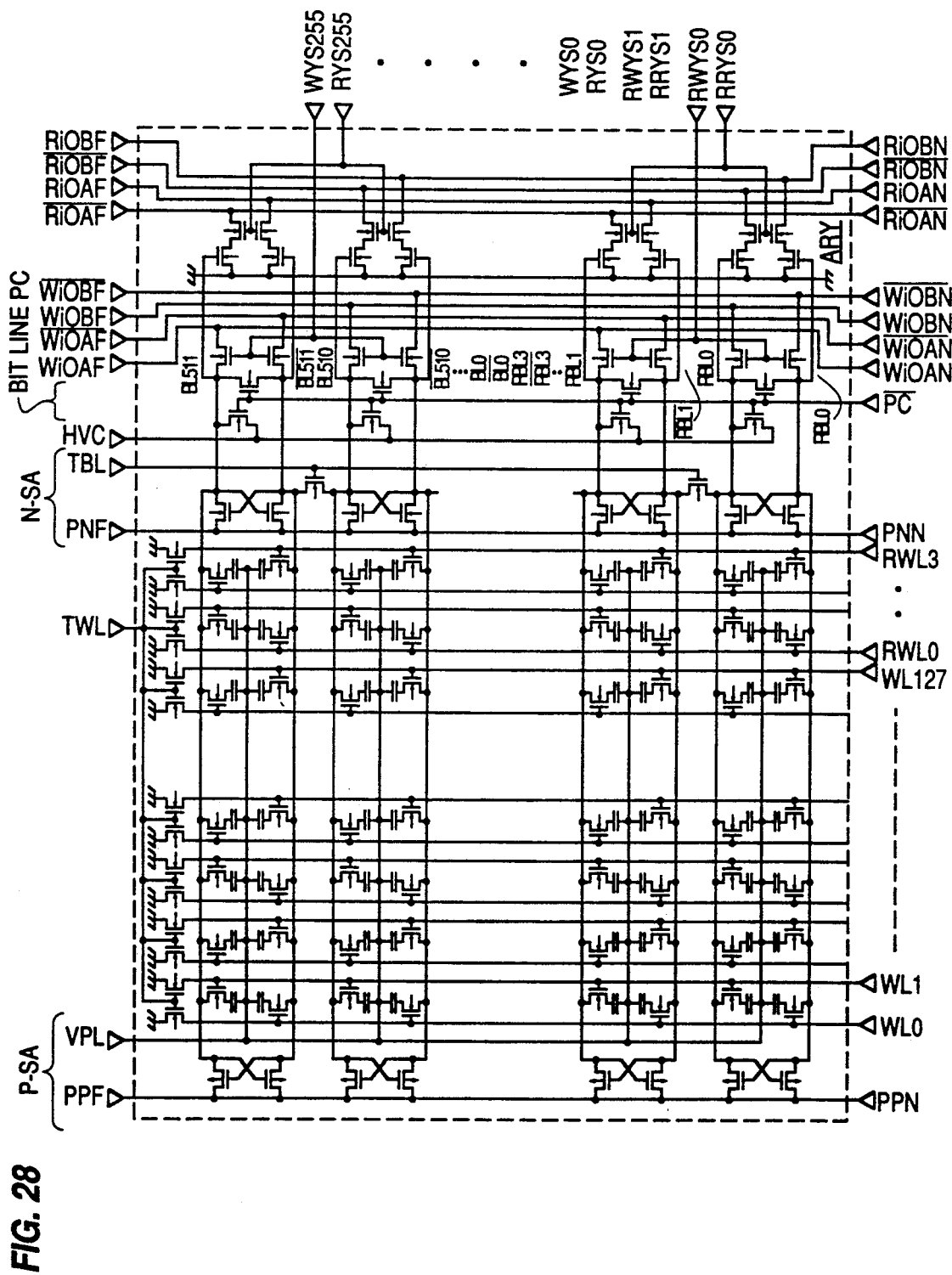

As shown on the righthand side of FIG. 28, the memory mats MAT0 to MAT7 further include write common I/O lines and read common I/O lines which are provided two sets for each memory array. These write common I/O lines and the read common I/O lines are selectively and exclusively connected with the two designated sets of complementary bit lines through the column switches of the corresponding memory arrays. In this embodiment, as will be described hereinafter, the aforementioned write common I/O lines are connected directly with the designated complementary bit lines of the memory array through the corresponding switch MOSFET of the column switch, and the read common I/O lines are connected indirectly through the same bit lines through the gates of the corresponding switch MOSFET of the column switch (as shown in FIGS. 28 and in FIG. 70). As a result, the DC levels of the individual common I/O lines are optimized for their applications so that the writing and reading operations of the Bi.CMOS dynamic RAM can be speeded up.

Incidentally, the aforementioned memory mats MAT0 to MAT7 make pairs by the combinations MAT0 and MAT4 to MAT3 and MAT7, as can be seen from FIG. 1. Moreover, the paired memory mats are symmetrically arranged across the corresponding x-selector, and the aforementioned write common I/O lines and read common I/O lines are arranged to extend through the paired two memory mats. On the other hand, the total of two sets of common source lines PP and PN for each memory array are connected to common source circuits outside of the memory arrays at common source line switch circuit SWF and SWN.

The paired memory arrays ARYL and ARYR constituting each memory mat include: 128 word lines and 4 redundancy word lines arranged in parallel with the vertical direction of FIG. 4; and 512 sets of complementary bit lines and 4 sets of redundancy bit lines arranged in parallel with the horizontal direction, as will be described hereinafter. At the intersections of the aforementioned word lines and complementary bit lines, there are arranged in a lattice form 132×516, i.e., 68,112 dynamic memory cells. Of these memory cells, substantially 516 cells are first selected in a simultaneous manner by the selecting operations of the word lines, and two of them are simultaneously selected by the selecting operations of the data lines and are connected with the aforementioned write common I/O lines or read common I/O lines. As a result, each memory array is made to have a substantial storage capacity of 65536 bits (i.e., 64 Kbits). It is needless to say that each of the memory mats MAT0 to MAT7 have a storage capacity and an address space twice as large as those of the aforementioned memory arrays ARYL or ARYR.

In this embodiment, the memory mats MAT0 to MAT7 are selectively started, when a corresponding array selection signal AS0L or AS0R, or AS1L or AS1R is set to the high level and applied to one of the inputs ASL or ASR shown in FIG. 4, to execute a series of operations necessary for the word line selections, the data line selections and the sense amplifier drive in a self-control manner and independently of one another. As a result, the Bi.CMOS dynamic RAM can have its selections simplified and speeded up and can be united at the unit of the storage capacity of the aforementioned memory mat, i.e., 128 Kbits.

(2) Control Unit

The Bi.CMOS dynamic RAM of this embodiment is not substantially equipped with a timing generator for centralized control of the operations of the individual units. The control logic of each unit is constructed of a plurality of serially coupled function units, each of which has its operations started or stopped in accordance with the output signal of the preceding function unit. As a result, each control logic is in the so-called Domino type circuit mode, in which the control sequences advance in accordance with the Domino theory with neither being synchronized with the predetermined clock signal or timing signal nor awaiting the predetermined clock signal or timing signal. As a result, the operation of the Bi.CMOS dynamic RAM are equivalently speeded up to shorten the access time.

The Bi.CMOS dynamic RAM replaces the aforementioned timing generator by a control unit for forming predetermined internal control signals and distributing them to individual units on the basis of the chip enable signal CE, the refresh control signal RF, the write enable signal WE and the output enable signal OE, which are fed as the start control signals from the outside.

Specifically, the chip enable signal $\overline{CE}$ fed through a pad $\overline{CE}$ is inputted to the $\overline{CE}$ buffer CEB of the control unit, as shown in FIG. 1, and is fed as an internal control signal CE1 to three CE drivers CEDU, CEDM and CEDD disposed at the upper, medium and lower sides of the semiconductor substrate. These CE drivers form corresponding internal control signals $\overline{C2U}$ and $\overline{C3U}$, C1M, $\overline{C2M}$ and $\overline{C3M}$, and C1D and $\overline{C2D}$, and feed them to the peripheral circuits which are arranged in the corresponding positions of the semiconductor substrate.

Likewise, the refresh control signal $\overline{RF}$ fed through the pad $\overline{RF}$ is inputted to the $\overline{RF}$ buffer RFB of the control unit to form an internal control signal $\overline{REF}$. The refresh control signal $\overline{RF}$ is further fed to the buffer unit circuit AB, as shown in FIG. 3, to form a complementary internal control signal BR (which designate both the non-inverted internal control signal BR and the inverted internal control signal $\overline{BR}$, like the following complementary signals).

On the other hand, the write enable signal $\overline{WE}$ fed through the pad $\overline{WE}$ is inputted, as shown in FIG. 2, to the $\overline{WE}$ buffer WEB of the control unit to form internal control signals WEB, WE and WOE. The write enable signal $\overline{WE}$ is fed further to the buffer unit circuit AB shown in FIG. 3, to form a complementary internal control signal BW for deciding the operation cycle.

The output enable signal $\overline{OE}$ fed through the pad $\overline{OE}$ is inputted to the $\overline{OE}$ buffer OEB of the control unit to form the internal control signal OE. The output enable signal $\overline{OE}$ is inputted further to a high-voltage detecting circuit SVC shown in FIG. 3. This high-voltage detecting circuit SVC raises the output signal, i.e., the internal control signal TSV selectively to the high level when the aforementioned output enable signal $\overline{OE}$ takes a high level over the power voltage VCC of the circuit.

As can be seen from the foregoing description, the individual circuits when form the aforementioned control unit are dispersed and arranged in the optimum positions over the semiconductor substrate such that they correspond to the positions of the arrangement of the bonding pads to be fed with the individual start control signals and the circuits for receiving the internal control signals.

(3) Address Selection Unit

The embodiment of the Bi.CMOS dynamic RAM described herein has a total of twenty address input pads A0 to A19. Of these, the pads A0 to A8 are fed with the X-address signals for selecting the word lines, and the pads A9 to A16 are fed with the Y-address signals for selecting the bit lines. Moreover, the pads A17 to A19 are fed with the Z-address signals for inputting and outputting the storage data alternatively to and from the eight memory cells which are adapted to be simultaneously brought into selected states by a single memory access. In other words, the Bi.CMOS dynamic RAM of this embodiment adopts the so-called non-address multiplex type, in which the individual address signals are inputted through the respective individual outer terminals.

The X-address signals of 9 bits fed through the pads A0 to A8 are inputted to the corresponding unit circuits of an X-address buffer XAB, as shown in FIG. 1. This X-address buffer XAB includes the refresh counter RFC of a binary counter of 9 bits (formed by the counter unit circuits CT0 to CT8 shown in FIG. 19), although not especially limitative thereto, to fetch and latch either the X-address signals inputted through the aforementioned pads A0 to A8 or the refresh address signals outputted from the refresh counter RFC, in a selective manner in accordance with the internal control signals $\overline{C2U}$, $\overline{C2M}$ and $\overline{REF}$. On the basis of these address signals, the X-address buffer XAB forms complementary internal address signals B0 to B8.

Of these complementary internal address signals B0 to B8, the address signals B0 to B6 excepting the more significant two bits are fed to an X-redundancy circuit XR. Of those, moreover, the complementary internal address signals B0 and B1 of less significant 2 bits are fed to form word line selection drive signals XnU and XnD, although not especially limitative thereto. Moreover, the remaining complementary internal address signals B2 to B8 are combined by 1 to 3 bits and fed to the corresponding X-predecoders XAD1 or XAD2 or AX7 to form a predecode signal AX2n, AX5n, AX7R or AX7W, or an array selection signal AS0L, AS0R, or AS1L, AS1R selectively.

Incidentally, in the X-redundancy circuit XR, in parallel with the forming operations of the aforementioned word line selection timing signals, the complementary internal address signals B1 to B6 of 6 bits are compared and referred to the band addresses assigned to the individual redundancy word lines. In case the result is that the two addresses are coincident in all the bits, the redundancy word line selection drive signals XRnU and XRnD are alternatively formed by combination with the complementary internal address signal B0.

The word line selection drive signals, redundancy word line selection drive signals and predecode signals thus far described are fed to the X-decoders XD of the individual memory mats to select the word lines. On the other hand, the array selection signals AS0L. AS0R, or AS1L, AS1R are combined in the aforementioned manner and fed commonly to the memory mats MAT0 to MAT7 to start them.

On the other hand, the Y-address signals of 8 bits fed through the pads A9 to A16 are inputted to the corresponding unit circuits of a Y-address buffer YAB, as shown in FIG. 1. The Y-address buffer YAB fetches and latches the Y-address signals in accordance with the internal control signal $\overline{C3U}$. Moreover, complementary internal address signals B9 to B16 are formed on the basis of those Y-address signals.

The complementary internal address signals B9 to B16 are fed in the form of a predetermined combination of 2 bits to a corresponding Y-predecoder YAD to form predecode signals AY0n, AY2n, AY4n and AY6n selectively. The complementary internal address signals B9 to B16 are fed further to a Y-redundancy circuit YR so that they are compared and referred to the bad addresses assigned to the individual redundancy bit lines. In case the result is that the two addresses are coincident in all bits, redundancy data line drive signals YRnU and YRnD are alternatively formed.

The predecode signals and redundancy data line drive signals thus far described are fed to the Y-decoder YD of the individual memory mats to select the complementary bit lines.

Moreover, the Z-address signals of 3 bits fed through the pads A17 to A19 are inputted, as shown in FIG. 2, to the corresponding unit circuits of a Z-address buffer ZAB. This Z-address buffer ZAB fetches and amplifiers the aforementioned Z-address signals to latch them in accordance with an internal control signal $\overline{CO}$ fed from the aforementioned CE buffer CEB. On the basis of these Z-address signals, moreover, the Z-address buffer ZAB forms the complementary internal address signals B17 to B19.

These complementary internal address signals B17 to B19 are fed to a Z-predecoder ZAB to form input/output selection signals AZ0 to AZ7 alternatively. These input/output selection signals are fed in a predetermined combination to corresponding write amplifiers WA0 to WA7 and data selection circuits DS21 to DS24 and DS8 to select the write of the input data and the outputs of the read data.

(4) Data Input/Output Unit

The data input/output unit of the Bi.CMOS dynamic RAM is equipped with four data input buffers DIB1 to DIB4 and four data output buffers DOB1 to DOB4, as shown in FIG. 2.

When the Bi.CMOS dynamic RAM has the structure of ×4 bits, all the aforementioned data input buffers DIB1 to DIB4 and data output buffers DOB1 to DOB4 are used.

At this time, the data input buffers DIB1 to BDI4 have their input terminals coupled to the corresponding data input/output terminals I/01 to I/04, respectively, and their output terminals coupled to the input terminals of the corresponding two write amplifiers WA0 and WA1 to WA6 to WA7, respectively. The output terminals of these write amplifiers are coupled to the corresponding two sets of write common I/O lines WIO0L and WIO0R to WIO7L and WIO7R, respectively.

If the Bi.CMOS dynamic RAM is made to have the structure of ×4 bits, the data input buffers DIB1 to DIB4 fetch the input data fed from the corresponding data input/output terminals I/O1 to I/O4 in accordance with the internal control signal WIB and transmit them to the corresponding two write amplifiers. In accordance with the internal control signal WG and the input/output selection signals AZ0 to AZ7, the write amplifiers WA0 to WA7 are selectively brought into operative states. In these operative states, the individual write amplifiers form the complementary write signals on the basis of the input data fed through the corresponding data input buffers and feed them to the selected memory cells through the corresponding write common I/O lines.

Likewise, the data output buffers DOB1 to DOB4 have their input terminals coupled to the output terminals of the corresponding data selection circuits DS21 to DS24, respectively, and their output terminals coupled to the corresponding data input/output terminals I/O1 to I/O4, respectively. The two input terminals of the data selection circuits DS21 to DS24 are coupled to the output terminals of corresponding two read amplifiers RA0 and RA1 to RA6 and RA7, respectively. The input terminals of these read amplifiers are coupled to corresponding two sets of read common I/O lines RIO0L and RIO0R to RIO7L and RIO7R, respectively.

In this embodiment, the read signals outputted from the selected memory cells of the memory array through the aforementioned read common I/O lines are current signals. At this time, the potential of each read common I/O line is substantially fixed to exclude the influences of the parasitic capacity coupled thereto. For example, to accomplish this, the bias voltage of the read common I/O lines can be set at 3.4 volts when the supply voltage is at 5.0 volts or at 1.7 volts when the supply voltage is at 3.3 volts. As a result, the transmission delay time of the read signal is shorted to speed up the read operations of the Bi.CMOS dynamic RAM.

The read amplifiers AR0 to RA7 are selectively and simultaneously brought into operative states in accordance with internal control signals RS, $\overline{RSD}$, MA, MLT, MLTD and ME. IN these operative states, the individual read amplifiers convert the read signals, which are outputted from the selected memory cells through the corresponding read common I/O lines, into voltage signals and amplifier them. These read data are latched in the output latches of the individual read amplifiers and are transmitted to the corresponding data selection circuits DS21 to DS24. These data selection circuits DS21 to DS24 are brought into operative states substantially is accordance with an internal control signal DE to select the output signals of the corresponding two read amplifiers in accordance with the input/output selection signals AZ0 to AZ7 and transmit them to the corresponding data output buffers DOB1 to DOB4. Substantially accordance with the internal control signal OE, the data output buffers DOB1 to DOB4 are brought into operative states to send out the read data transmitted through the corresponding data selection circuits DS21 to DS24 to the corresponding data input/output terminals I/01 to I/O4.

If the Bi.CMOS dynamic RAM is made to have the structure of ×1 bit, on the other hand, only one data input buffer DIB4 and only one data output buffer DOB4 are used.

At this time, the data input buffer DIB4 has its input terminal coupled to the data input terminal DI and its output terminal coupled commonly to all the write amplifiers WA0 to WA7. When the Bi.CMOS dynamic RAM is in the write cycle, the input data fed through the data input terminal DI are transmitted through the data input buffer DIB4 to all the write amplifiers WA0 to WA7. These write amplifiers WA0 to WA7 are alternatively brought into operative states in accordance with the input/output selection signals AZ0 to AZ7 to feed the complementary write signals formed on the basis of the input data to the corresponding write common I/O lines.

Likewise, the data output buffer DOB4 has its input terminal coupled to the output terminal of the data selection circuit DS8 and its output terminal coupled to the data output terminal DO. The eight input terminals of the data selection circuit DS8 are coupled to the output terminals of the read amplifiers RA0 to RA7, respectively. The read data amplified by he read amplifiers RA0 to RA7 and latched by their output latches are alternatively selected by the data selection circuit DS8 in accordance with the input/output selection signals AS0 to AS7 and are sent output of the data output terminal D0 through the data output buffer DOB4.

The Bi.CMOS dynamic RAM has its data input/output unit equipped further with a multi-bit test circuit MBT for the multi-bit test mode. In accordance with a test control signal TMB, the multi-bit test circuit MBT is selectively brought into an operative state to compare and refer the read data of 8 bits outputted from the read amplifiers RA0 to RA7, thereby to output the result to the data selection circuit DS8.

(5) Test Unit

The Bi.CMOS dynamic RAM is equipped, as shown in FIG. 3, with a test unit composed of a test mode set signal latch AF, a high-voltage detection circuit SVC and a test mode control circuit TEST, although not especially limitative thereto.

Of these components, the test mode set signal latch AF fetches and latches the test mode set signals, which are fed through the pads A9 to A15, in accordance with an internal control signal FT when the Bi.CMOS dynamic RAM is in the test mode set cycle. The output signals AF9 to AF15 of the test mode set signal latch AF are fed to the test mode control circuit TEST.

On the other hand, the high-voltage detection circuit SVC monitors the level of the pad $\overline{OE}$ to raise its output signal TSV selectively to the high level when the monitored level is at a high level exceeding the power voltage VCC of the circuit. The level of the pad OE is selectively fed with the aforementioned high voltage when the Bi.CMOS dynamic RAM is in the test cycle, as has been described hereinbefore.

The test mode control circuit TEST controls the test mode of the Bi.CMOS dynamic RAM in response to the output signals of the aforementioned test mode set signal latch AF and high-voltage detection circuit SVC.

The kinds of the test modes of the Bi.CMOS dynamic RAM of this embodiment and their specific contents will be described hereinafter.

(6) Signal Generation Unit

The Bi.CMOS dynamic RAM is equipped, as shown in FIG. 3, with an OEC signal generator, a YE signal generator, an $\overline{RF}$ signal generator FR, an $\overline{FT}$ signal generator and an XC signal generator, although not especially limitative thereto.

Of these generators, the OEC signal generator forms an internal control signal OEC on the basis of the complementary internal control signals BW and BR and the internal control signal WOE. Here, the complementary internal control signal BW is selectively caused to take the logic "1" (in which non-inverted signal is at the high level whereas the inverted signal is at the low level, although the opposite state will be called the logic "0") when the write enable signal $\overline{WE}$ is caused to take the low level prior to the chip enable signal $\overline{CE}$. The complementary control signal BR is selectively caused to take the logic "1" when the refresh control signal $\overline{RF}$ is caused to take the low level prior to the chip enable signal $\overline{CE}$. The internal control signal WOE is selectively caused to take the low level if the write enable signal $\overline{WE}$ is caused at the low level when the internal control signal C1M takes the high level, i..e, the chip enable signal $\overline{CE}$ takes the low level.

The output signal of the OEC signal generator, i.e., the internal control signal OEC, is fed to the aforementioned $\overline{OE}$ buffer OEB to control the data output.

On the other hand, the YE signal generator YE forms the internal control signal YES on the basis of the internal control signal BR, the test control signal $\overline{TCT}$ and the internal control signal $\overline{C2M}$. Here, the test control signal $\overline{TCT}$ is selectively raised to the high level, as will be described hereinafter, when the Bi.CMOS dynamic RAM is in the counter test mode. The internal control signal YE is selectively raised to the high level when the internal control signal BR or the test control signal $\overline{TCT}$ is at the low level, namely, in case the Bi.CMOS dynamic RAM is either not in the auto-refresh mode or in the auto-refresh mode and in the counter test mode. The internal control signal YE is used as a control signal for activating the read amplifiers, the write amplifiers and so on.

Moreover, the $\overline{RF}$ signal generator FR forms the internal control signal $\overline{FR}$ on the basis of the aforementioned inverted internal control signal $\overline{BR}$. The internal control signal $\overline{FR}$ is selectively set at the low level when the inverted control signal $\overline{BR}$ is at the low level, i.e., when the Bi.CMOS dynamic RAM is in the auto-refresh mode. The internal control signal $\overline{FR}$ is used as the count pulse of the refresh counter RFC contained in the X-address buffer XAB.

The $\overline{FT}$ signal generator FT forms the internal control signal $\overline{FT}$ on the basis of the aforementioned inverted internal control signals $\overline{BW}$ and $\overline{BR}$ and internal control signal C1M. The internal control signal $\overline{FT}$ is selectively set to the low level in synchronism with the internal control signal C1M when both the aforementioned inverted internal control signals $\overline{BW}$ and $\overline{BR}$ are at the low level, namely, the test mode set cycle prevails in the Bi.CMOS dynamic RAM in which both the write enable signals $\overline{WE}$ and the refresh control signal $\overline{RF}$ are set at the low level prior to the chip enable signal $\overline{CE}$. Thus, the internal control signal $\overline{FT}$ is used as the latch control signal of the test mode set signal latch AF, as has been described hereinbefore.

The XC signal generator XC forms internal control signals $\overline{XC1}$ and $\overline{XC2}$ on the basis of internal control signals CE1 and WGC and test control signals TB1 and $\overline{TDW}$. Here, the internal control signal CE1 is set to the high level when the chip enable signal $\overline{CE}$ is at the low level, and the internal control signal WGC is selectively raised to the high level when a predetermined time elapses after the chip enable signal $\overline{CE}$ is dropped to the low level. Moreover, the test control signals TB1 and $\overline{TDW}$ are selectively set to the high or low level when the Bi.CMOS dynamic RAM is in the bar-in test mode or the double word line test mode. The internal control signal $\overline{XC1}$ is selectively set to the low level in synchronism with the internal control signal CE1 when the test control signal $\overline{TDW}$ is at the low level, namely, when the Bi.CMOS dynamic RAM is in the double line test mode. Likewise, the internal control signal $\overline{XC2}$ is selectively set to the low level when both the test control signal TBI and the internal control signal WGC are at the high level, namely, when the Bi.CMOS dynamic RAM is in the bar-in test mode. These internal control signals $\overline{XC1}$ and $\overline{XC2}$ are fed to the X-redundancy circuit XR to set the number of the word lines to be simultaneously selected.

(7) Power Unit

The Bi.CMOS dynamic RAM is equipped with a plurality of voltage generators VG, VCH, VBB, HVC, VCS and VRE which are based upon the power voltage VCC at +5 V of the circuit for forming corresponding internal voltages. The Bi.CMOS dynamic RAM is further equipped with an oscillator SOC for feeding a voltage generating pulse signal OSC to the aforementioned voltage generators VG and VCH and a $\overline{WK}$ signal generator for forming an internal control signal $\overline{WK}$.

Figure 42C:
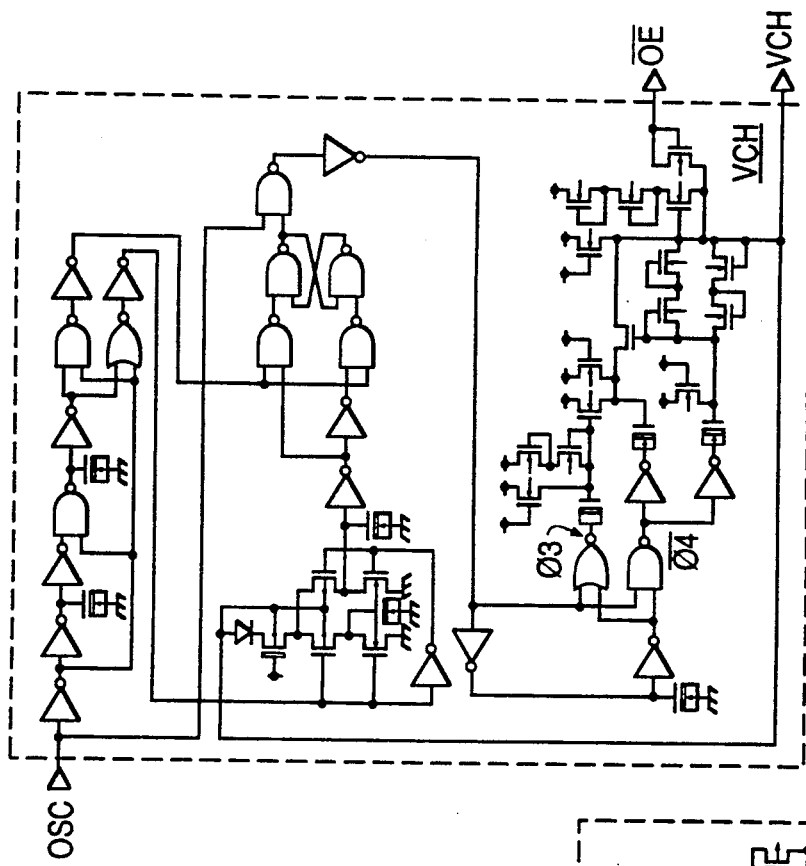
Figure 42A:
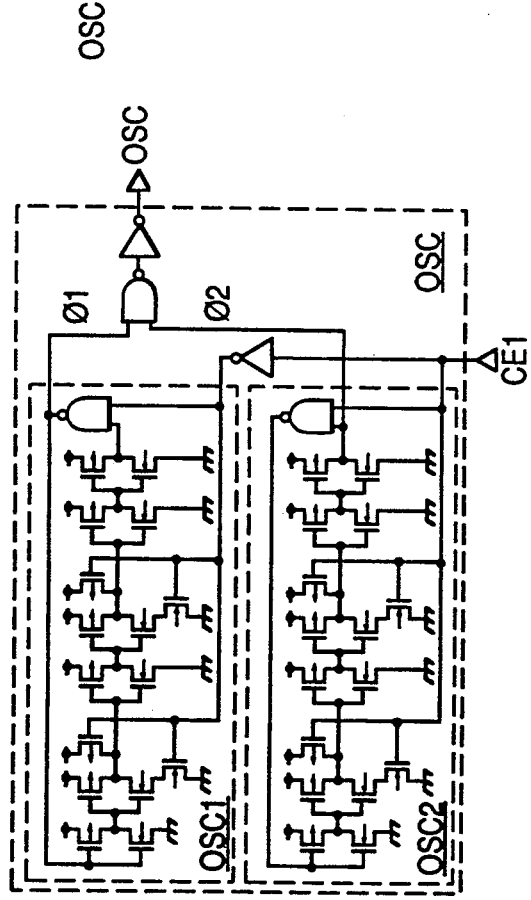
Figure 42B:
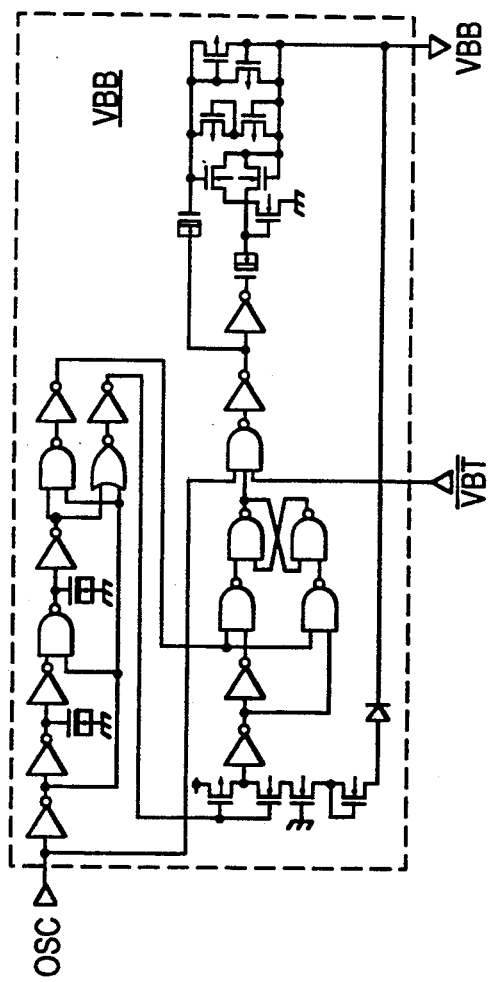
Figure 43A:
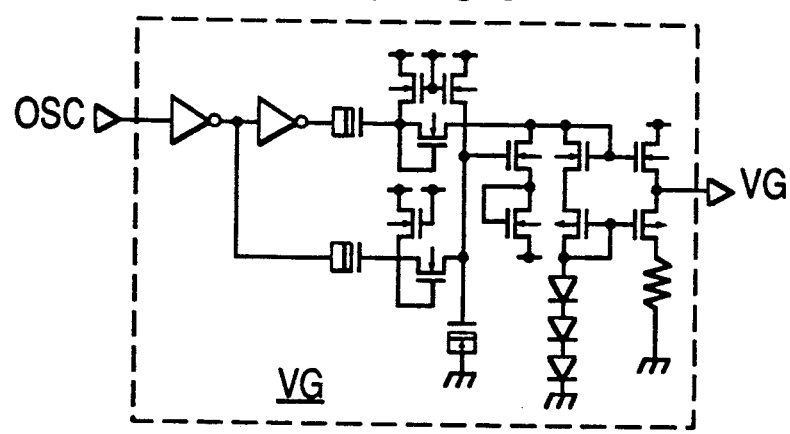
Figure 43B:
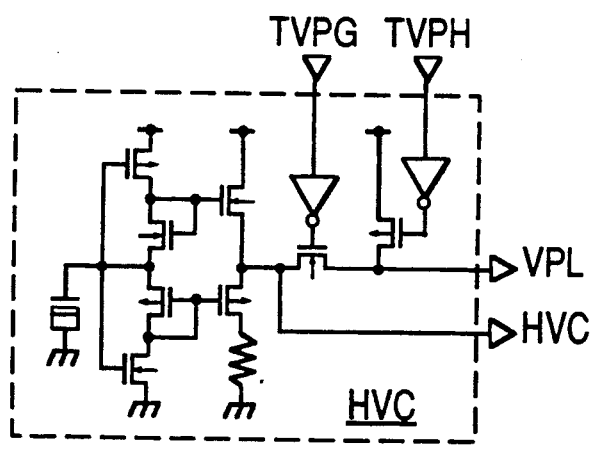
Figure 43C:
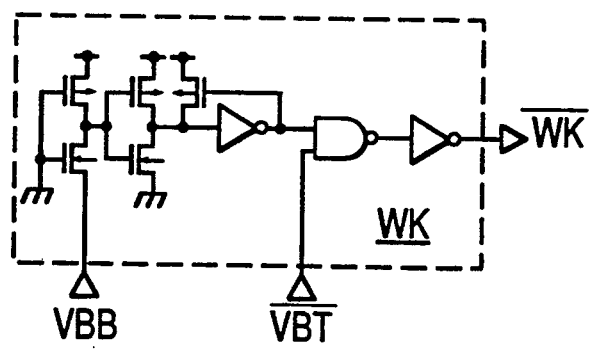
Figure 44A:
FIGS. 44 to 46 are signal waveform charts showing operation waveforms of the embodiment shown in FIGS. 1 to 4.
Figure 44B:
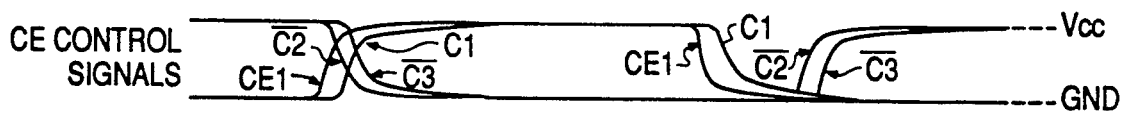
Figure 44C:
Figure 44D:
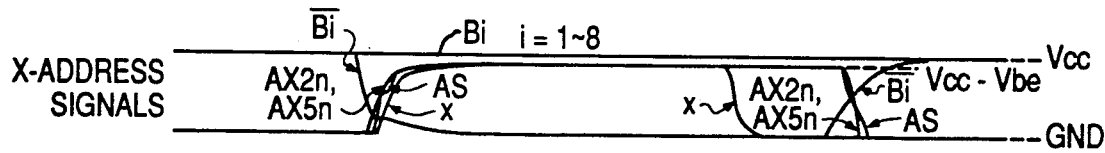
Figure 44E:
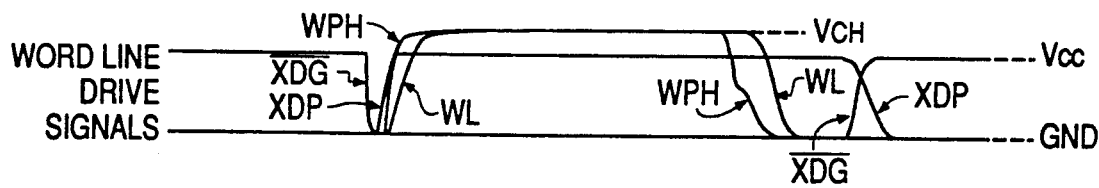
Figure 44F:
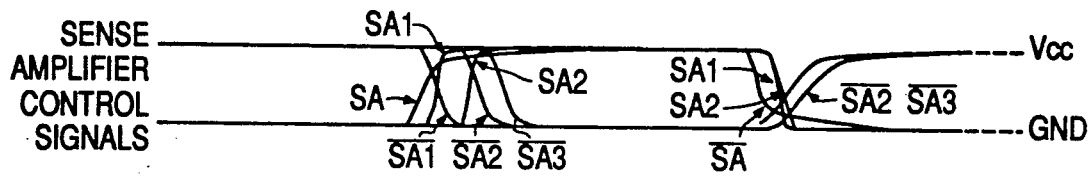
Figure 44G:
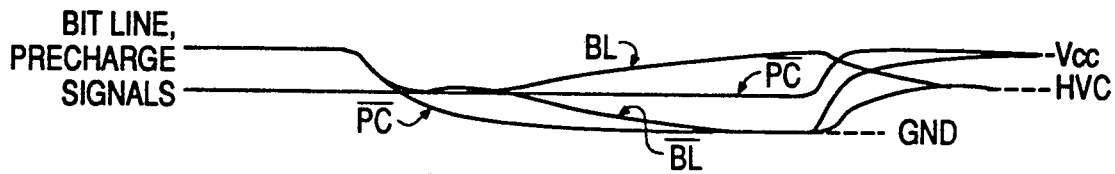
Figure 45A:
Figure 45B:
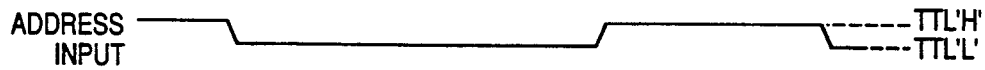
Figure 45C:
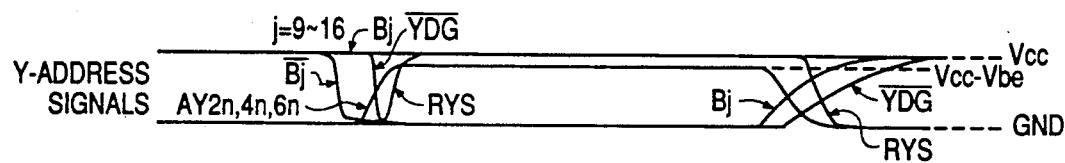
Figure 45D:
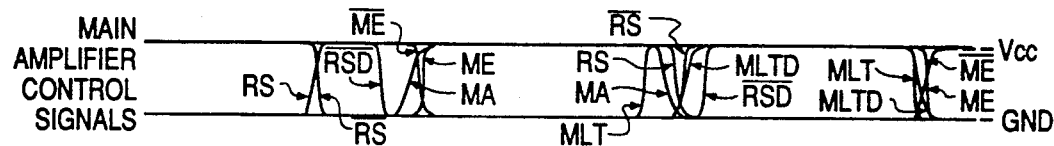
Figure 45E:
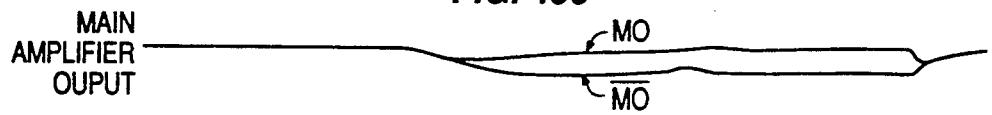
Figure 45F:
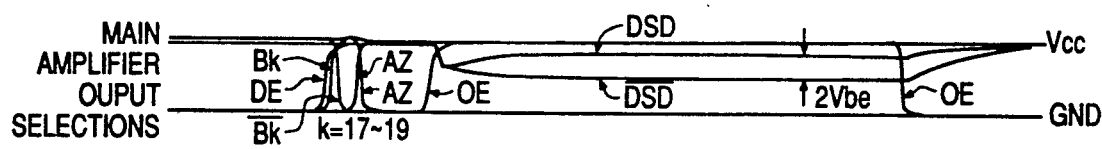
Figure 45G:

Of these, as shown in FIGS. 42 and 43, the oscillator OSC is composed of: a first oscillator OSC1 adapted to be selectively brought into an operative state when the internal control signal CE1 is at the low level, namely, the Bi.CMOS dynamic RAM is in the unselected state; and a second oscillator OSC2 adapted to be selectively brought into an operative state when the internal control signal CE1 is at the high level, namely, when the Bi.CMOS dynamic RAM is in the selected state. Both of those oscillators SOC1 and OSC2 form the pulse signal of one period at the beginning of the change of the aforementioned internal control signal CE1 to the low or high level and then the aforementioned pulse signal OSC periodically for a predetermined period on condition that the internal control signal CE1 is fixed at the low or high level.

The voltage generator VG forms a predetermined internal voltage VG in response to the aforementioned pulse signal OSC. The internal voltage VG is used for feeding a predetermined gate voltage to the MOSFET functioning as a current source.

Likewise, the voltage generator VCH receives the aforementioned pulse signal OSC to form the internal voltage VCH having a higher level than the power voltage of the circuit. This internal voltage VCH is fed to the word line drive circuit of each X-decoder XD and is transmitted as the word line selection voltage alternatively to the designated word line.

Incidentally, the Bi.CMOS dynamic RAM of this embodiment is prepared with the bar-in test mode for raising sixteen word lines simultaneously. When this bar-in test mode is executed, the load upon the internal voltage VCH is so abruptly increased that the current supply ability of the aforementioned voltage generator VCH is insufficient. Therefore, the internal voltage VCH is supplied through the external terminal $\overline{OE}$.

In response to the aforementioned pulse signal OSC, the voltage generator VBB forms the substrate back bias voltage VBB or a predetermined negative voltage. This substrate back bias voltage VBB is fed to the semiconductor substrate of the Bi.CMOS dynamic RAM so that the operations of the Bi.CMOS dynamic RAM are stabilized. The operations of the voltage generator VBB are selectively stopped as a result that the power voltage VCC of the circuit is fed to the pad VBT.

Thus, the structure of the power unit is simplified by sharing one oscillator OSC among the plural voltage generators.

On the basis of the power voltage VCC of the circuit, the voltage generator HVC forms the internal voltage HVC having a voltage value half as large as that of the power voltage VCC. The internal voltage HVC is fed as the precharge voltage for equalizing the individual complementary nodes of the bit lines, the write common I/O lines and so on and is fed as an internal voltage VPL to the individual memory arrays so that it is used as the plate voltage of the dynamic memory cells. The voltage generator HVC stops the aforementioned internal voltage VPL selectively when the test control signal TVPG is at the high level, namely, when the Bi.CMOS dynamic RAM is in the aforementioned double word line test mode or in the VPL stress test mode. When the Bi.CMOS dynamic RAM is in the aforementioned VPL stress test mode so that the test control signal TVPH is at the high level, the internal voltage VPL is caused to take the power voltage VCC of the circuit.

On the basis of the power voltage VCC of the circuit, the voltage generator VRE forms the predetermined internal voltage VRE. This internal voltage VRE is fed to the bipolar current switch circuit, which is contained in the ECL input circuit of each input buffer, so that it is used as a reference potential for setting the logical threshold level. In this embodiment, the power source voltage VCC of the circuit to be fed to the voltage generator VRE is fed through an individual pad VCCR to the Bi.CMOS dynamic RAM to stabilize the internal voltage VRE.

The $\overline{WK}$ signal generator WK monitors the aforementioned substrate back bias voltage VBB to drop its output signal, i.e., the internal control signal $\overline{WK}$ to the low level on condition that the monitored back bias voltage VBB reaches a predetermined value. The internal control signal $\overline{WK}$ is fed to the $\overline{CE}$buffer CEB so that it is used for selectively bringing it into an operative state. When the power source voltage VCC of the circuit is fed to the aforementioned pad VBT, the internal control signal $\overline{WK}$ is fixed at the low level, although not especially limitative thereto. As a result, the characteristic evaluation test and so on of the Bi.CMOS dynamic RAM can be executed in the state in which the substrate back bias voltage VBB is shallow.

1.1.5. Internal Signal Type and Peripheral Circuit Mode

Figure 6:
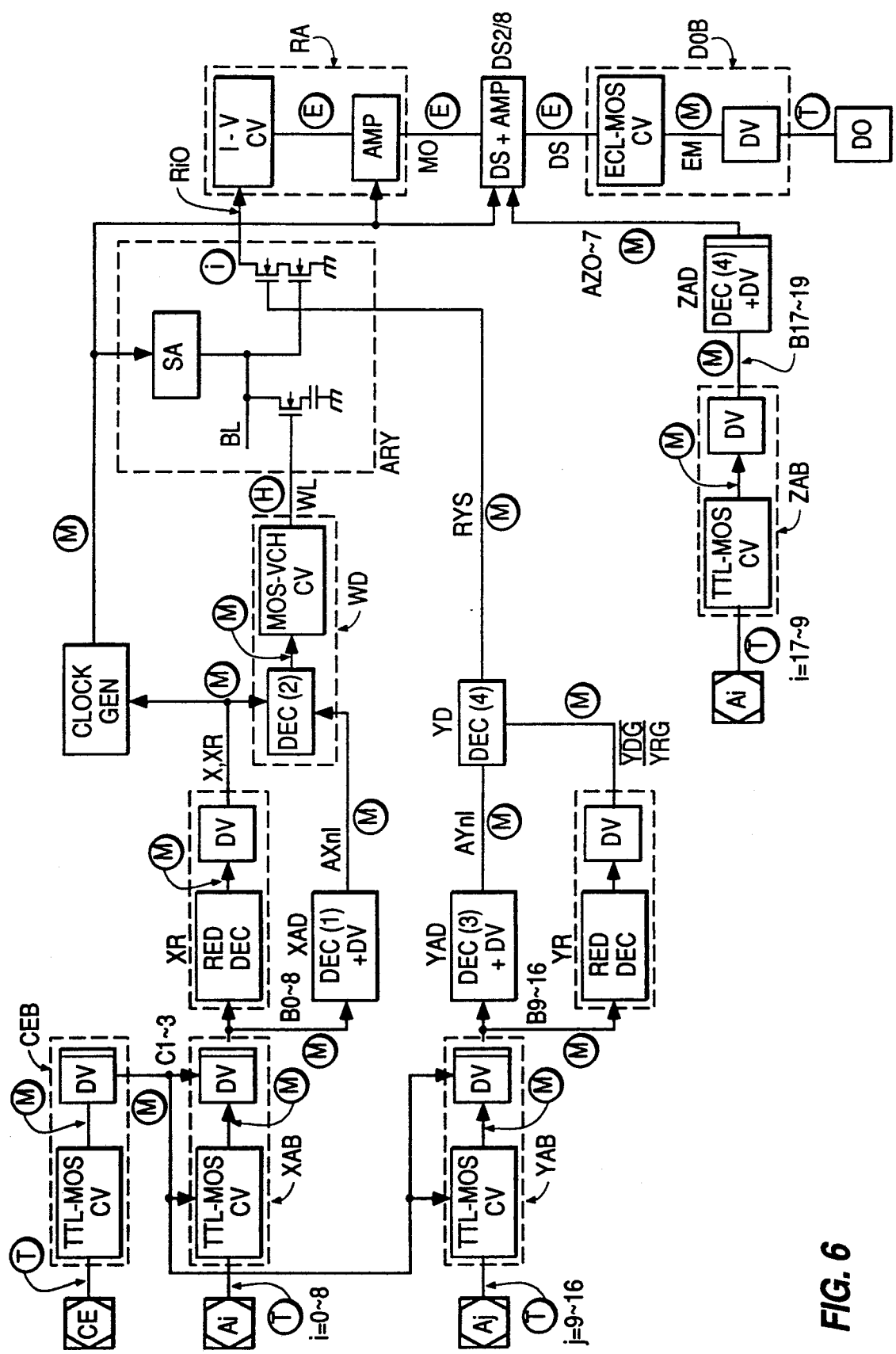
FIG. 6 is a functional block diagram showing one embodiment of the internal signal type and the peripheral circuit mode.

FIG. 6 is a functional block diagram showing one embodiment of the internal signal type and the peripheral circuit mode of the Bi.CMOS dynamic RAM according to the present invention. Reference to the summary of the internal signal type and the peripheral circuit mode of the Bi.CMOS dynamic RAM of the present embodiment and their features will be described in the following with reference to FIG. 6. In FIG. 6, encircled alphabets designate the signal types of the internal signals to be transmitted and have the meanings of Table 5. On the other hand, the symbols attached to the frames of the individual blocks designate the circuit modes of the individual blocks and have the meanings of Table 6.

TABLE 5

| Symbol | Internal Signal Type | |
|---|---|---|
| | Signal Kind | Signal Amplitude |
| T | Voltage Signal | TTL Level |
| M | | MOS Level |
| E | | ECL Level |
| H | | VCH Level |
| I | Current Signal | — |

TTL: Transistor Transistor Logic;
MOS: MOSFET; and
ECL: Emitter Coupled Logic

TABLE 6

| Symbol | Fundamental Circuit Mode |
|---|---|
| ▢ | MOS or CMOS |
| ▢ | Bi.CMOS |
| ▢ | ECL or Bipolar Circuit |

MOS: MOSFET Circuit;
CMOS: Complementary MOSFET Circuit;
Bi.CMOS: Bipolar.CMOS Circuit; and
ECL: ECL Circuit The Bi.CMOS dynamic RAM of this embodiment has its memory array composed of the dynamic memory cells and its direct peripheral circuit such as the sense amplifier or the column switch composed of MOSFETs, as has been described hereinbefore, with a view to increase the degree of integration and the capacity. There are, therefore, necessary conditions that the selection level of the word lines of the memory array be higher than the threshold voltage of the address selection MOSFETs composing the memory cells or the absolute value of the bit line write signal amplitude, and that the level of the selection control signal such as the bit line selection signal for the direction peripheral circuit be at the MOS level for turning on and off the MOSFETs sufficiently. In this embodiment, as shown in FIG. 6, the start control or address signals such as the chip enable signal CE fed at the TTL or ECL level are charged at first to the MOS level by a TTL-MOS level changing circuit CV disposed at each input buffer. After this, the MOS level is transmitted through a Bi.CMOS or CMOS driver DV having a relatively high drive ability to an X-redundancy circuit XR, an X-predecoder XAD, a Y-redundancy circuit YR and a Y-predecoder YAD (corresponding to the similarly identified circuits of FIG. 1). In the following, each of the blocks constituting the address selection unit of this Bi.CMOS dynamic RAM has its logical processing portions constructed basically of the CMOS logical gate circuit and its output step constructed basically of the Bi.CMOS logical gate circuit having the CMOS circuit and the bipolar circuit in combination, although not especially limitative thereto. This is the first feature of the internal signal type and the peripheral circuit mode of this Bi.CMOS dynamic RAM so that the selections of the peripheral circuit are speeded up.

Next, the second feature of the internal signal type of this Bi.CMOS dynamic RAM is the adoption of the so-called static word line selection type, in which the word line selection voltage, i.e., the internal voltage VCH having a level higher than the absolute value of the data line write signal amplitude is alternatively transmitted to the designated word line. Thus, the word line selection timing signal at the boost level, which has been formed in the dynamic RAM of the prior art through the predetermined boost capacity when the word line selections advance to a timing for driving the word lines, can be eliminated so that the word line drive can be realized merely by transmitting the aforementioned internal voltage VCH selectively to the word line designated in accordance with the selection signal. This is shown in FIG. 6 with the high voltage VCH output of the MOS-VCH CV level change circuit being applied to a selected word line WL (noting that FIG. 6 is simplified to show only a selected word line for purposes of simplification). As a result, the transmission delay time for forming and transmitting the word line selection timing signal of the aforementioned boost level is substantially eliminated to speed up the word line selections of the Bi.CMOS dynamic RAM.

The third feature of the internal signal type and the peripheral circuit mode of this Bi.CMOS dynamic RAM is that the common I/O lines provided for the memory arrays are divided into the write common I/O lines, to which a designated data line is directly connected through the corresponding switch MOSFET, and the read common I/O lines, to which is indirectly connected the designated data line through the gate of the corresponding switch MOSFET (as shown in FIGS. 28 and 70), and that the current signal used is the read signal to be transmitted through the read common I/O lines. As a result, the read signals to be outputted from the selected memory cells through the corresponding data line BL are substantially transmitted to a read amplifier RA without any potential change in the read common I/O lines, i.e., without any charge or discharge of the parasitic capacity coupled to the read common I/O lines.

The fourth feature of the internal signal type and the peripheral circuit mode of this Bi.CMOS dynamic RAM is that the current-voltage converter I-VCV and the differential amplifier AMP of the read amplifier RA coupled to the read common I/O lines are constructed basically of differential bipolar transistors. The read signal to be transmitted as a current signal through the read common I/O lines is changed into the voltage signal at the ECL level by the current-voltage converter of the read amplifier RA, and the voltage signal is amplified by the differential amplifier of high speed and high sensitivity. The voltage signal is transmitted at the ECL level to a data selection circuit DS and further to a data output buffer DOB. These read data are once converted to the MOS level by the data output buffer DOB until they are sent out at the TTL or ECL level from the output driver DV through the data output terminal DO. As a result, the amplification and outputting of the read signal are speeded up to shorten the read cycle of the Bi.CMOS dynamic RAM accordingly.

The write operations of the storage data in this Bi.CMOS dynamic RAM are accomplished at the MOS level, although not shown in FIG. 6.

1.1.6. Fundamental Circuits and Circuit Elements

In the Bi.CMOS dynamic RAM of this embodiment, some devices are made on the fundamental circuits such as a logical circuit and the circuit elements such as resistance means. The construction and feature of the fundamental circuits and the circuit elements will be described in the following.

(1) Logical Circuit

In this Bi.CMOS dynamic RAM, the logical circuit constituting each logical block is selected from the CMOS logical gate circuit, the ECL circuit and the Bi.CMOS logical gate circuit by considering its operation speed, the current consumption and the layout area. In the figures, logic boxes which are not filled in with black shading are intended to represent logic circuits formed with standard threshold CMOS elements. Logic boxes having their output sides filled in with black are intended to represent Bi.CMOS logic circuits. As will be explained hereinafter those gates having their inputs filled in with black are logic circuits having input MOSFETs with enlarged threshold voltages. In the $\overline{CE}$ buffer CEB shown in FIG. 18, for example, the circuit requiring a relatively large fan-out is exemplified by either the Bi.CMOS inverter circuit BCN1 or BCN2, which is composed basically of bipolar transistors (which will be shortly referred to as "transistors") T1 and T2 or a Bi.CMOS NAND gate circuit BCG1, and another circuit requiring little fan-out is exemplified by a CMOS logical gate circuit.

As is well known in the art, the output signal of the Bi.CMOS logical gate circuit is compressed by the base-emitter voltage of the transistors T1 and T2 and so on. In the CMOS logical gate circuit made receptive of that output signal, the P-channel and N-channel MOSFETs may be simultaneously turned on to pass a through current weakly. In the Bi.CMOS dynamic RAM of this embodiment, therefore, the Bi.CMOS logical gate circuit has its output terminals equipped with two CMOS inverter circuits N2 and N5, as represented by the Bi.CMOS inverter circuit BCN1 of FIG. 18, so that the final output signal level may be expanded to the power source voltage VCC or the ground potential of the circuit. With a similar aim, as represented by the Bi.CMOS inverter circuit BCN2 of the same Figure, a CMOS inverter circuit N6 or the like is added in parallel with the Bi.CMOS logical gate circuit. These are the first features of the logical circuit of this Bi.CMOS dynamic RAM so that the power consumption of the Bi.CMOS dynamic RAM is reduced.

Figure 65:
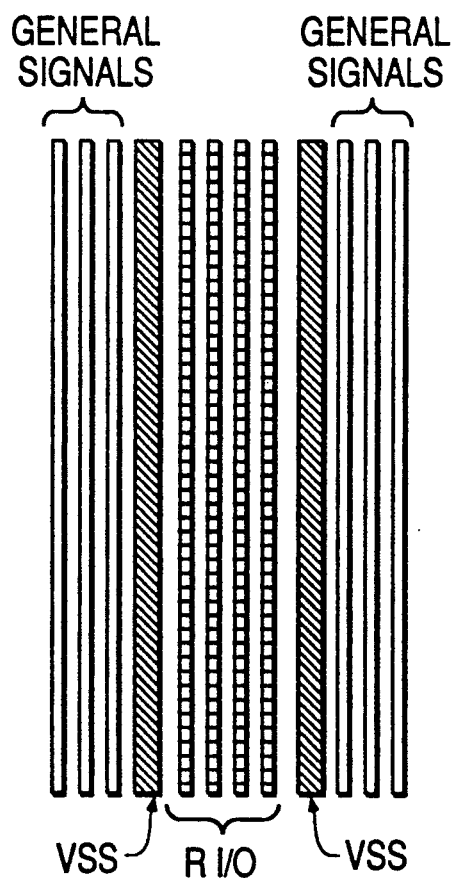

Incidentally, as to the transistor T1 or the like constituting the aforementioned Bi.CMOS inverter circuit BCN1, as can be analogized from the circuit diagram, the source of the P-channel MOSFET connected between the base of the transistor T1 and the power voltage of the circuit is intentionally coupled to the second collector. At this time, the first collector C1 of the transistor T1 is coupled to an aluminum wiring layer AL1, which is to be connected with the power source voltage of the circuit, through two contacts CN11 and CN12, as shown in FIG. 65, for example, although not especially limitative thereto. On the other hand, the second collector C2 of the transistor T1 is coupled through a relatively large on contact CN2 to an aluminum wiring layer AL2 to be connected with the source of the aforementioned P-channel MOSFET. this is the second feature of the logical circuit of this Bi.CMOS dynamic RAM to reduce the substrate current of the Bi.CMOS logical gate circuit.

Next, the third feature of the logical circuit of this Bi.CMOS dynamic RAM is that the absolute value of the threshold voltage of the MOSFETs constituting the CMOS inverter circuit made receive of the output signal of the Bi.CMOS logical gate circuit is intentionally increased, as represented by the CMOS inverter circuits N2 to N4 and CMOS NAND gate circuits G1 and G2 of FIG. 18, for example. Specifically, the output signal of the Bi.CMOS inverter circuit is at first dropped by the base-emitter voltage $B_{BE}$ of the transistor T1 from the power source voltage VCC of the circuit, as exemplified in FIG. 81(b), for example, but is caused to finally reach the power source voltage VCC of the circuit by adding the CMOS inverter circuit N9 or the like in parallel. In the ordinary CMOS inverter circuit, the component P-channel MOSFETs are weakly turned on to pass excessive through current i, because the absolute value $|V_{THP}|$ of the threshold voltage is relatively small. In the embodiment, therefore, the aforementioned through current is reduced by setting the threshold voltage of the P-channel and N-channel MOSFETs composing the Bi.CMOS logical gate circuit at a level equal to or higher than the base-emitter voltage $V_{BE}$ of the transistor T1 or the like. As a result, the power consumption of the Bi.CMOS dynamic RAM is further dropped.

Thus, the method of reducing the through current i by increasing the threshold voltage of the MOSFETs is likewise executed in the CMOS logical gate circuit which has a relatively long layout distance between the output terminal of the preceding circuit and its own input terminal. In the following circuit diagrams, the input sides of the CMOS and Bi.CMOS logical gate circuits, in which the threshold voltage of the component MOSFETs are intentionally enlarged, are indicated by painting out in black. On the other hand, the Bi.CMOS logical gate circuits have their output sides painted out in black.

As represented by a data selection circuit DS2 of FIG. 34, on the other hand, the ECL circuit is equipped with diodes D1 to D3 connected in series between the collectors of a pair of bipolar transistors constituting a current switch circuit, i.e., a non-inverted output node DS2 and an inverted output node $\overline{DS2}$ and the power voltage VCC of the circuit. These diodes have a function of clamping the level of the aforementioned output nodes at the predetermined ECL level. Without any special counter-measure, however, the potential level of the common coupled node of the diodes D1 and D2 or D3 may be set at some value (a finite level) by electric charge stored in the parasitic capacity of the common coupled node when the diodes D1 and D2 or D3 are substantially brought into a cut-off state. Then, a problem arises, in which the operation speed of the data selection circuit DS2 depends on the potential level of the common coupled node of the diodes D1 and D2 or D3. In this embodiment, therefore, between the aforementioned common coupled node and the power voltage of the circuit, there is connected the P-channel MOSFET QP2 which is designed to have a relatively small conductance and to be steadily turned on, thereby to equalize the level of each common coupled node to the power voltage VCC of the circuit. This is the fourth feature of the logical circuit of the Bi.CMOS dynamic RAM of this embodiment so that the signal transmission delay time of the data selection circuit DS2 or the like is stabilized.

Figure 32:
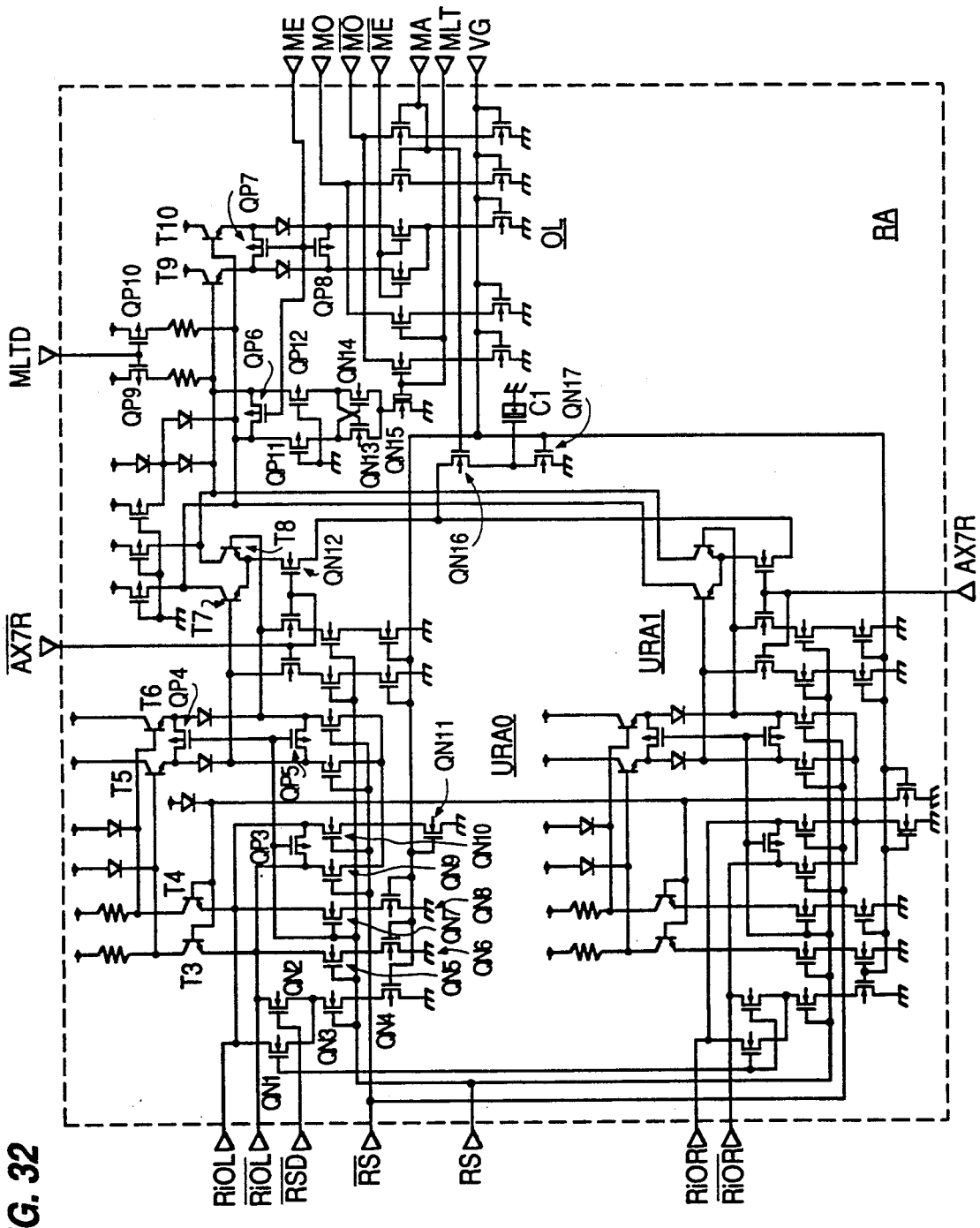

A similar method of equalizing the commonly coupled nodes of the clamp diodes is adapted in the data selection circuit DS8 of FIG. 34 or the read amplifier RA of FIG. 32, for example.

(2) Resistance Means

This Bi.CMOS dynamic RAM is equipped with a plurality of resistance means using diffusion resistors. In this embodiment, as exemplified in FIG. 66, the aforementioned resistance means is made to have a fundamental structure of a P$^-$ diffusion layer L which has a predetermined sheet resistance and which is formed over a relatively long distance of the semiconductor substrate. The diffusion layer L has its one side coupled to an aluminum wiring layer AL through a contact CN3 formed in a fixed position, although not especially limitative thereto. The contact CN3 is underlaid therearound by a P$^-$ layer for ohmic contact.

The other side of the aforementioned diffusion layer L is fixedly formed with an aluminum wiring layer AL which is extended over a relatively long distance. A contact CN4 or coupling that aluminum wiring layer AL and the aforementioned diffusion layer L is selectively formed in a predetermined position matching the performance evaluation of the corresponding internal circuit, for example. Moreover, a P$^+$ layer for the ohmic contact is formed to envelop the other ends of the contact CN4 and the diffusion layer L. By moving the position to be formed with the aforementioned contact CN4, specifically, the resistance means is enabled to take an arbitrary resistance value between the maximum resistance value Rmax, as shown in FIG. 66(a), and the minimum resistance value Rmin, as shown in FIG. 66(b). As a result, the resistances of each resistance means can be trimmed merely by partially correcting the photomask for forming the contact and the P$^+$ layer, to make efficient the product adjustment of the Bi.CMOS dynamic RAM.

(3) Input Circuit

This Bi.CMOS dynamic RAM has product types matching the TTL or ECL level, as has been described hereinbefore, and the product types can be realized by a common semiconductor substrate. The Bi.CMOS dynamic RAM is equipped with a plurality of input buffers which are provided to correspond to the start control signals such as the chip enable signal $\overline{CE}$ or the address signals, as has been described hereinbefore. These input buffers are equipped, as represented by the $\overline{CE}$ buffer CEB of FIG. 18, with an input circuit IC1 corresponding to the input signal at the TTL level, and an input circuit IC2 corresponding to the input signal at the ECL level. These input circuits have their input levels interchanged selectively by changing the portions relating to the connection changing points CS1 to CS8 of the photo masks, for example. This is the first feature of the input circuit of the Bi.CMOS dynamic RAM of this embodiment so that the kinds of the Bi.CMOS dynamic RAM can be efficiently developed.

Noting the input circuit IC1 of the aforementioned $\overline{CE}$ buffer CEB, on the other hand, the input signal, i.e., the chip enable signal $\overline{CE}$ is inputted at first into the CMOS inverter circuit N1 of the input circuit IC1 so that it is changed to have the MOS level. The output signal of the CMOS inverter circuit N1 is inputted to the aforementioned Bi.CMOS inverter circuit BCN1 and is changed to the internal signal CE1 through several Bi.CMOS logical gate circuits. The second feature of the input circuit of the Bi.CMOS dynamic RAM is that the input signal is received at first by the CMOS logical gate circuit and then by the Bi.CMOS logical gate circuit having a high drive ability. As a result, the input capacity, as seen from the input external terminal is reduced to shorten the transmission delay time of the input signal substantially.

The third feature of the input circuit of the Bi.CMOS dynamic RAM is that the output signal of the aforementioned Bi.CMOS inverter circuit BNC1 is fed to the gate of a MOSFET QP1 of P-channel type (i.e., first conductivity type connected between the input terminal of the Bi.CMOS inverter circuit BNC1 and the power voltage (i.e., first power voltage) of the circuit, to form a positive feedback route. This positive feedback route has an action to stabilize the output signal of the Bi.CMOS inverter circuit BNC1 in case the level of the input signal is substantially fluctuated by the fluctuations of the power voltage of the circuit or in case noises are superposed on the input signal. As a result, the noise margin of the input circuit IC1 is improved to stabilize the operations of the Bi.CMOS dynamic RAM.

(4) Drive Circuit

This Bi.CMOS dynamic RAM is equipped with a drive circuit for feeding a predetermined operation current selectively to a corresponding internal circuit, as represented by the read amplifier RA of FIG. 32. The Bi.CMOS dynamic RAM of this embodiment has several features in the drive circuit. As shown in FIG. 32, more specifically, the read amplifier RA is equipped with a current-voltage conversion circuit which is composed basically of a pair of transistors T3 and T4. These transistors T3 and T4 have their emitters coupled to the non-inverted and inverted signal lines of a corresponding read common I/O lines RIOL and their bases fed commonly with a predetermined constant voltage which is lower by one step of diode than the power voltage VCC of the circuit. The collectors of those transistors are coupled to the power voltage VCC of the circuit through the corresponding load resistors, and N-channel MOSFETs QN5 and QN6, and QN7 and QN8 are connected in series between the emitters of the aforementioned transistors and the group potential of the circuit. The MOSFETs QN6 and QN8 are designed to have relatively large conductances, although not especially limitative thereto. The MOSFETs QN5 and QN7 have their gates fed commonly with the internal control signal RS, and the MOSFETs QN6 and QN8 have their gates fed commonly with the aforementioned internal voltage VG. As a result, the transistor T3 and T4 receive a predetermined operation current, which is determined by the voltage value of the internal voltage VG and the conductances of the MOSFETs QN6 and QN8, on condition that the aforementioned internal control signal RS is set to the high level, so that they are brought into operative states. At this time, there is attained at the collector of each transistor a voltage signal which correspond to the current change of the read signal transmitted through the read common I/O line RIOL from the selected memory cell. In other words, the transistors T3 and T4 act as the sense amplifier for the current-voltage conversion. On the other hand, the MOSFETs QN6 and QN8 act as the first current source for applying the relatively large operation current to the aforementioned sense circuit, whereas the MOSFETs QN5 and QN7 act as the first switch means for feeding the aforementioned operation current selectively to the sense circuit.

The emitters of the aforementioned transistors T3 and T4 are coupled to the ground potential of the circuit through N-channel MOSFETs QN9, QN10 and QN11. This MOSFET QN11 is designed to have a sufficiently smaller conductance than those of the aforementioned MOSFETs QN6 and QN8. The gates of the MOSFETs QN9 and QN10 are fed commonly with the inverted signal of the aforementioned internal control signal $\overline{RS}$, i.e., the inverted internal control signal RS, and the gate of the MOSFET QN11 is fed with the aforementioned internal voltage VG. As a result, the MOSFET QN11 acts as the second current source for feeding a relatively small operation current to the aforementioned sense circuit. The MOSFETs QN9 and QN10 act as the second switch means for feeding the aforementioned operation current selectively to the sense circuit on condition that the aforementioned inverted internal control signal $\overline{RS}$ is at the high level.

Here, the aforementioned complementary internal control signal RS is caused to take the logic "0", when the Bi.CMOS dynamic RAM is in an unselected state, and the logic "1" temporarily at a predetermined timing when in the selected state. As a result, the sense circuit composed of the aforementioned transistors T3 and T4 is fed with the relatively small operation current, when the Bi.CMOS dynamic RAM is in its unselected state, so that it is warmed up. When the Bi.CMOS dynamic RAM is selected, the aforementioned sense amplifier is fed with a relatively large operation current so that it is brought into a completely operative state. This is the first feature of the drive circuit of this Bi.CMOS dynamic RAM so that the operation rise of the current-voltage conversion circuit of the read amplifier RA is speeded up.

Incidentally, another device is made in the aforementioned current-voltage conversion circuit. When the Bi.CMOS dynamic RAM is in the selected state, the relatively large operation current fed to the transistors T3 and T4 composing the sense amplifier is given through another current source which is composed of the MOSFETs QN6 and QN8, as has been described hereinbefore. This is intended to prevent the read current from dropping due to the substantial shorting of the read common I/O lines in case those current sources are shared. When the Bi-CMOS dynamic RAM is not selected, on the contrary, the relatively small operation current to be fed to the aforementioned transistors T3 and T4 is given through the common current source composed of the MOSFET QN11. This is intended to prevent the rise of the sense amplifier from being delayed by the level difference which might otherwise be caused by the slight dispersion in the characteristics due to such a layout that one MOSFET QN11 provided has a very small conductance. The aforementioned MOSFETs QN9, QN10 and QN11 are arranged to take a generally symmetric layout with a view to attaining the level balance, as shown in FIG. 85.

The invention of the drive circuit thus far described can also be applied to a drive circuit such as an emitter-follower circuit which is composed of transistors T5 and T6 or T9 and T10 of the aforementioned RA.

Next, the third feature of the drive circuit of the Bi.CMOS dynamic RAM is the drive circuit of the differential amplifier (i.e., internal circuit) which is composed basically of differential transistors T7 and T8 of the aforementioned read amplifier RA. Specifically, the differential transistors T7 and T8 are selectively brought into operative states when their emitters are fed selectively with the operation current from an N-channel MOSFET QN17, which acts as the current source when its gate is fed with the internal voltage VG, through both an N-channel MOSFET QN12, which is selectively turned on in according with the complementary predecode signal AX7R, and an N-channel MOSFET QN16 which is selectively turned on in accordance with the internal control signal MA,. In this embodiment, a capacitor C1 (i.e., capacity means) is connected in parallel between the drain of the aforementioned MOSFET QN17 and the ground potential of the circuit. This capacitor C1 temporarily extracts the operation current of the differential transistors T7 and T8 at the initial stage, in which both the aforementioned MOSFETs QN12 and so on and QN16 are turned on to form the current feed route. As a result, the logical sum can be taken by the collector coupling to speed up the rise of the differential transistors T7 and T8, which cannot be warmed up, and accordingly the read operations of the Bi.CMOS dynamic RAM.

(5) Fuse Cutting Circuit

Figure 23B:
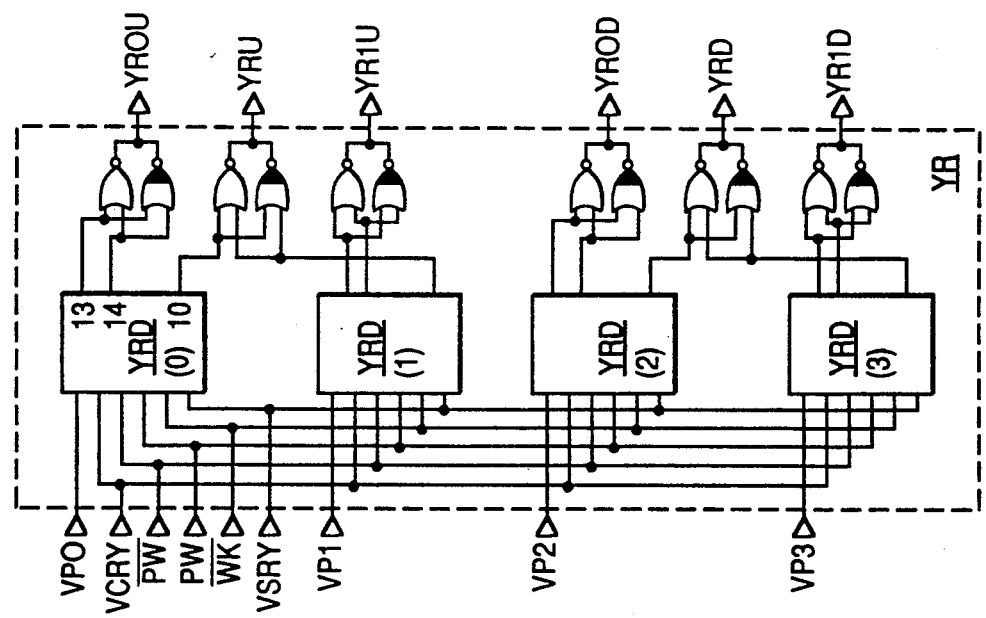
Figure 23A:
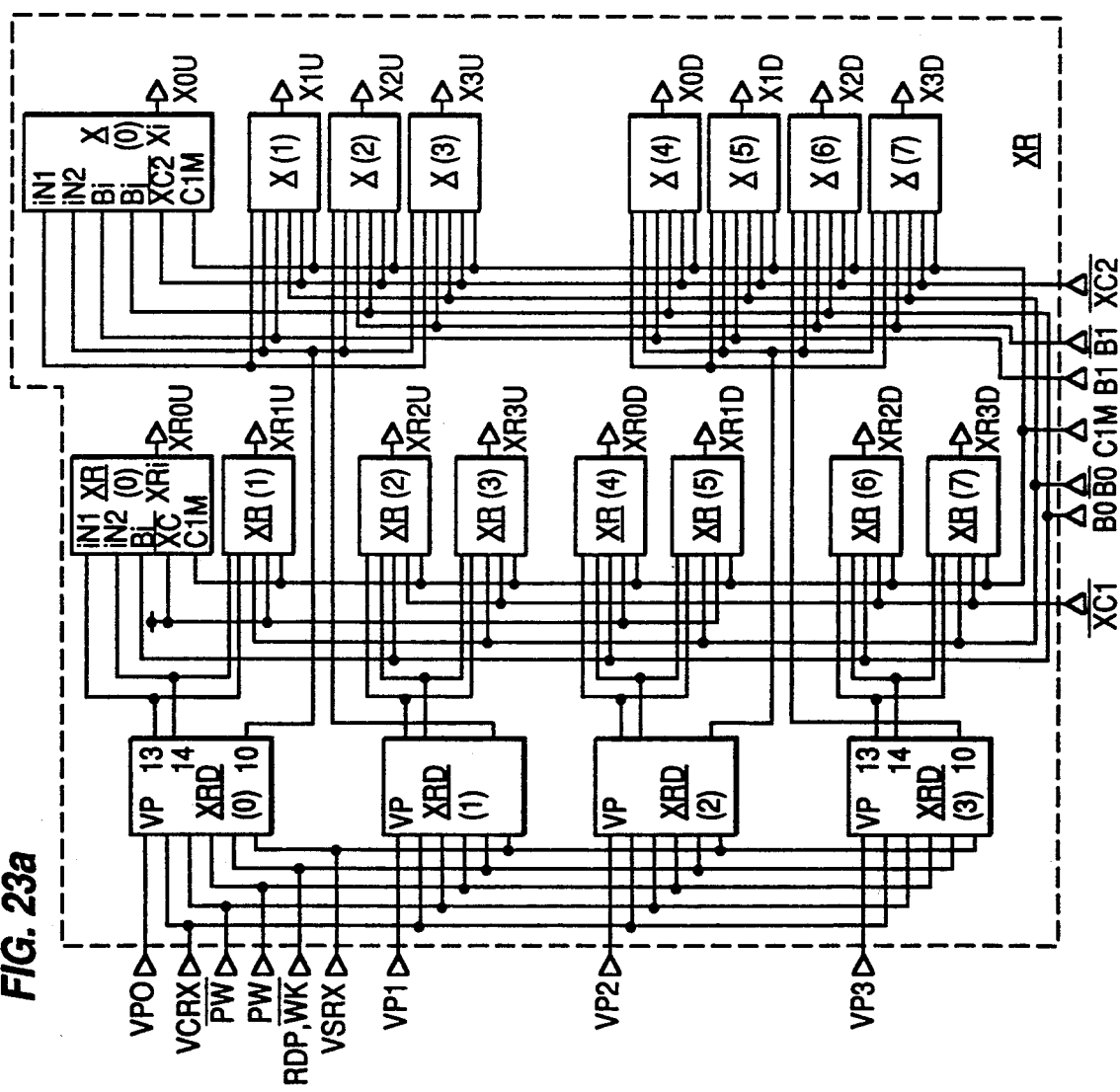
Figure 24A:
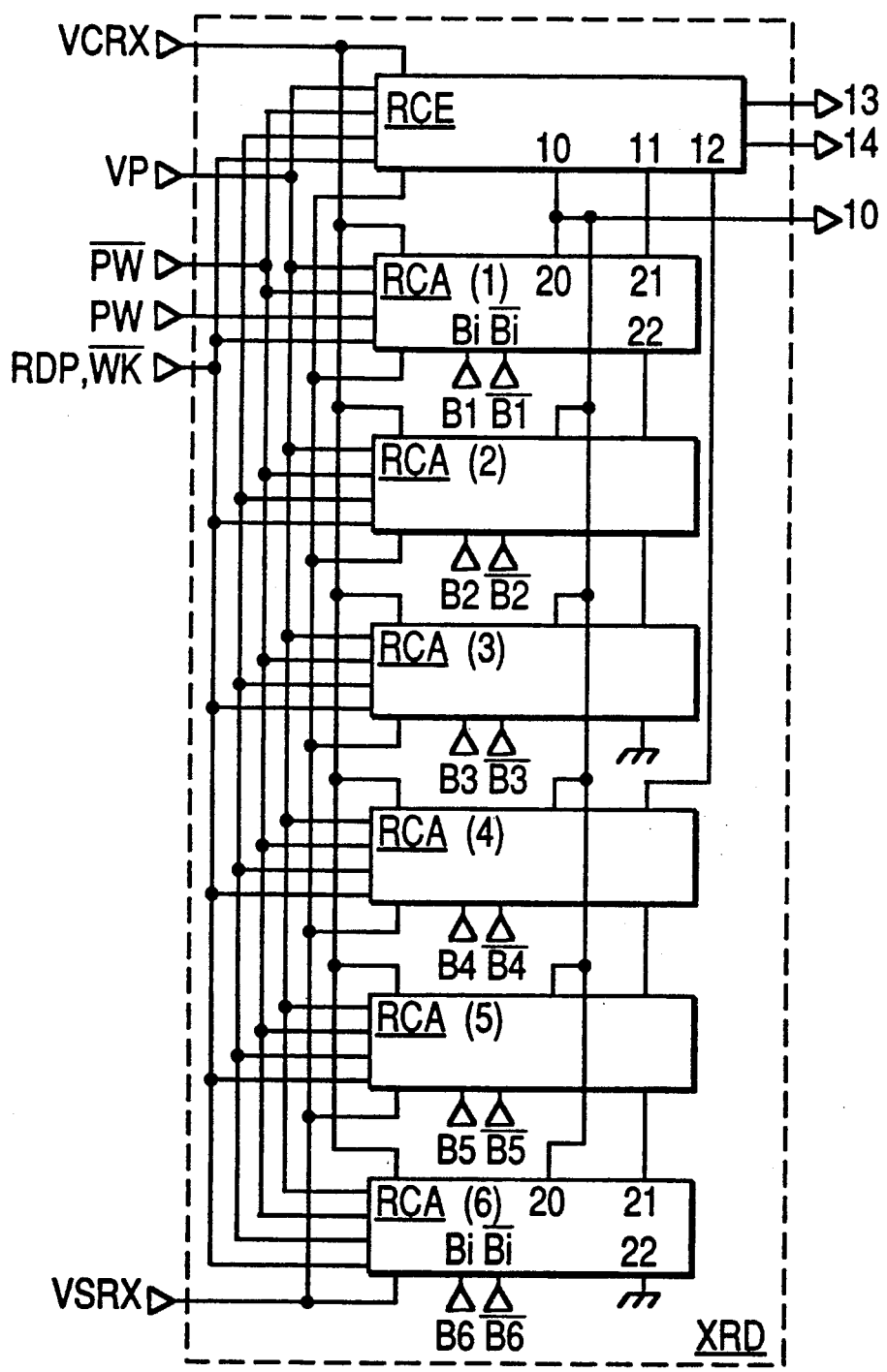
Figure 24B:
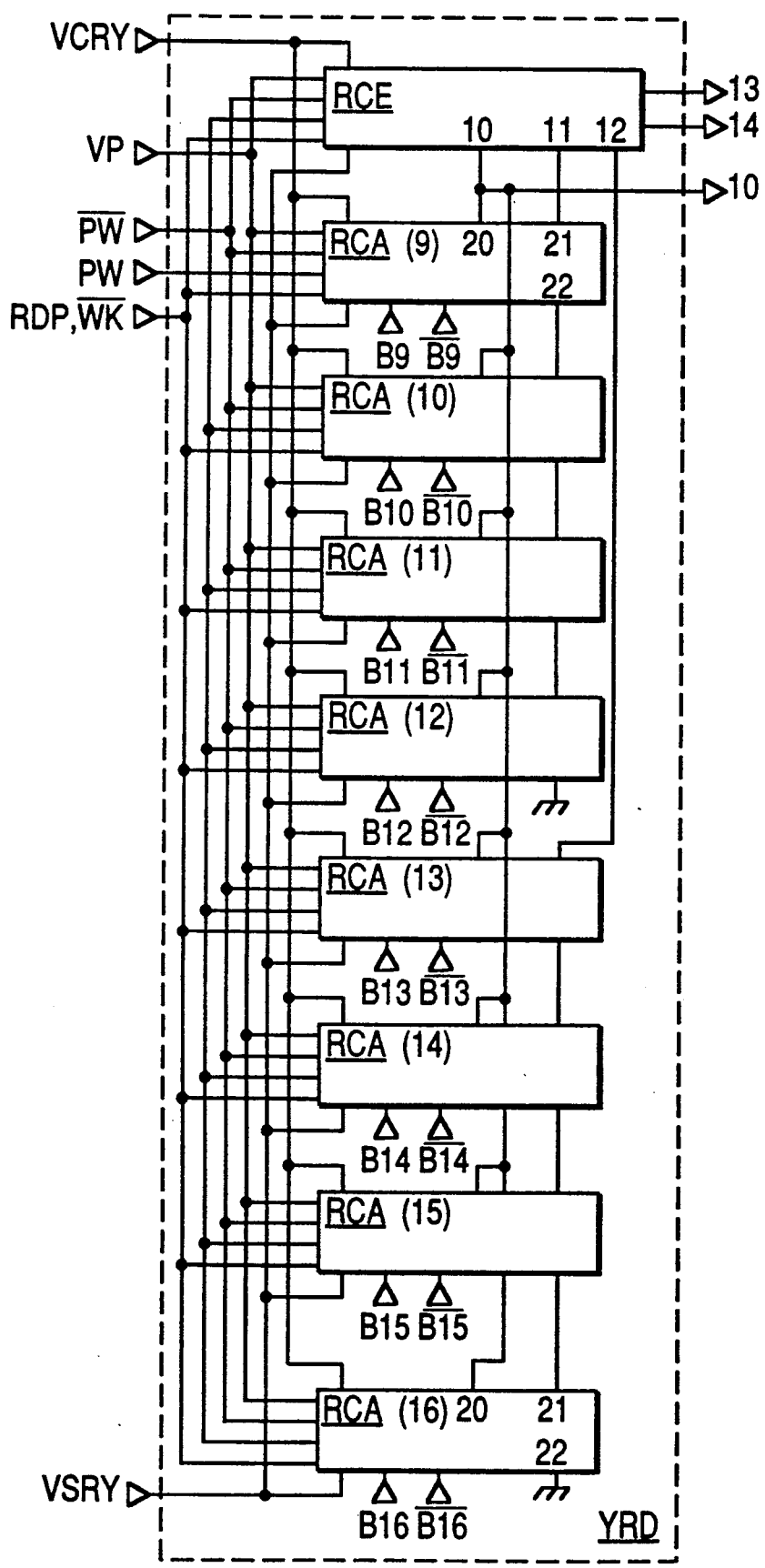
Figure 25A:
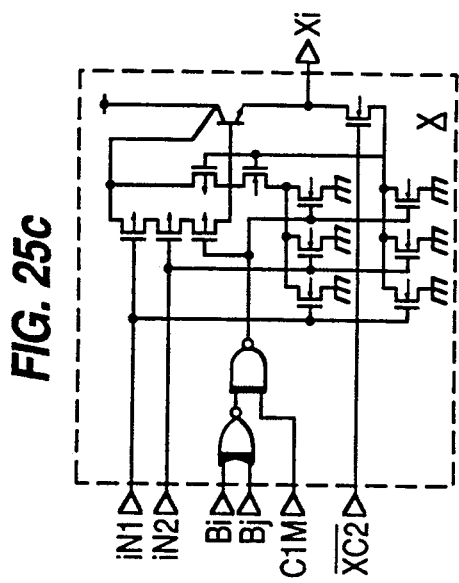
Figure 25C:
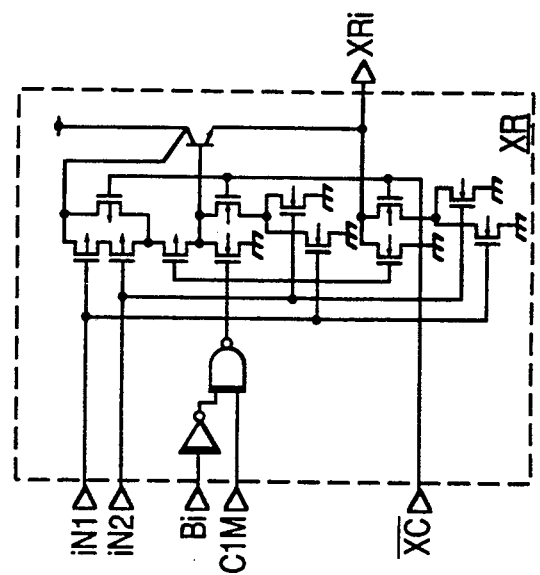
Figure 25B:
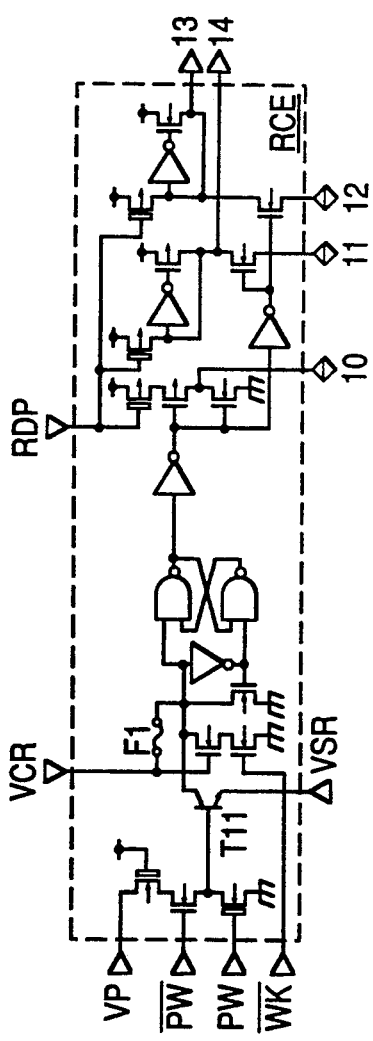
Figure 25D:
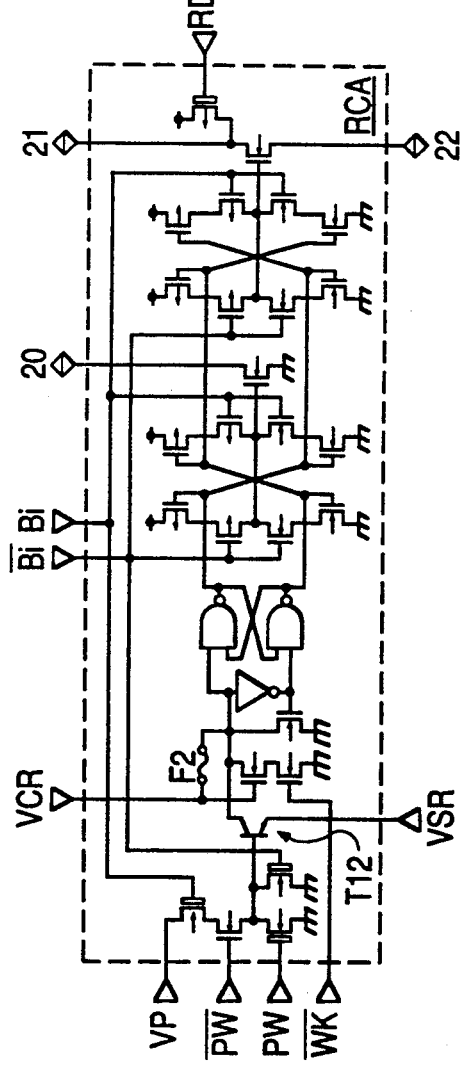
Figure 26B:
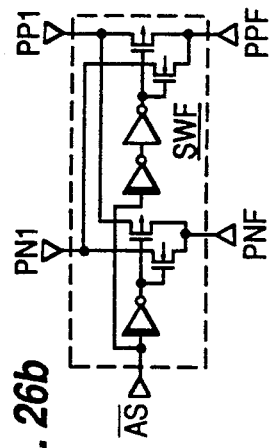
Figure 26C:
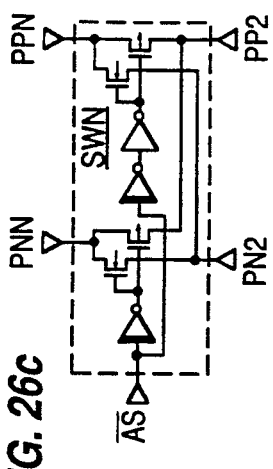
Figure 26D:
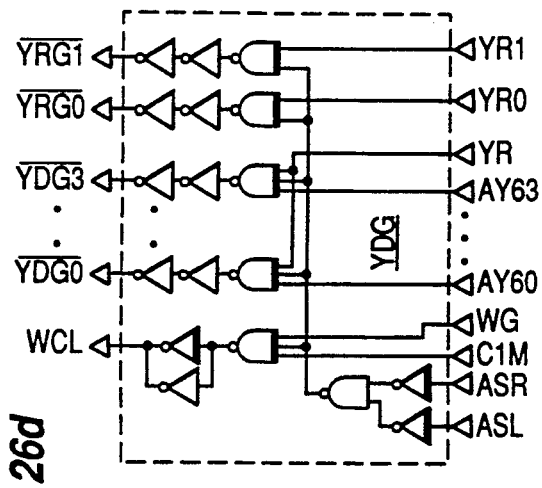
Figure 26A:
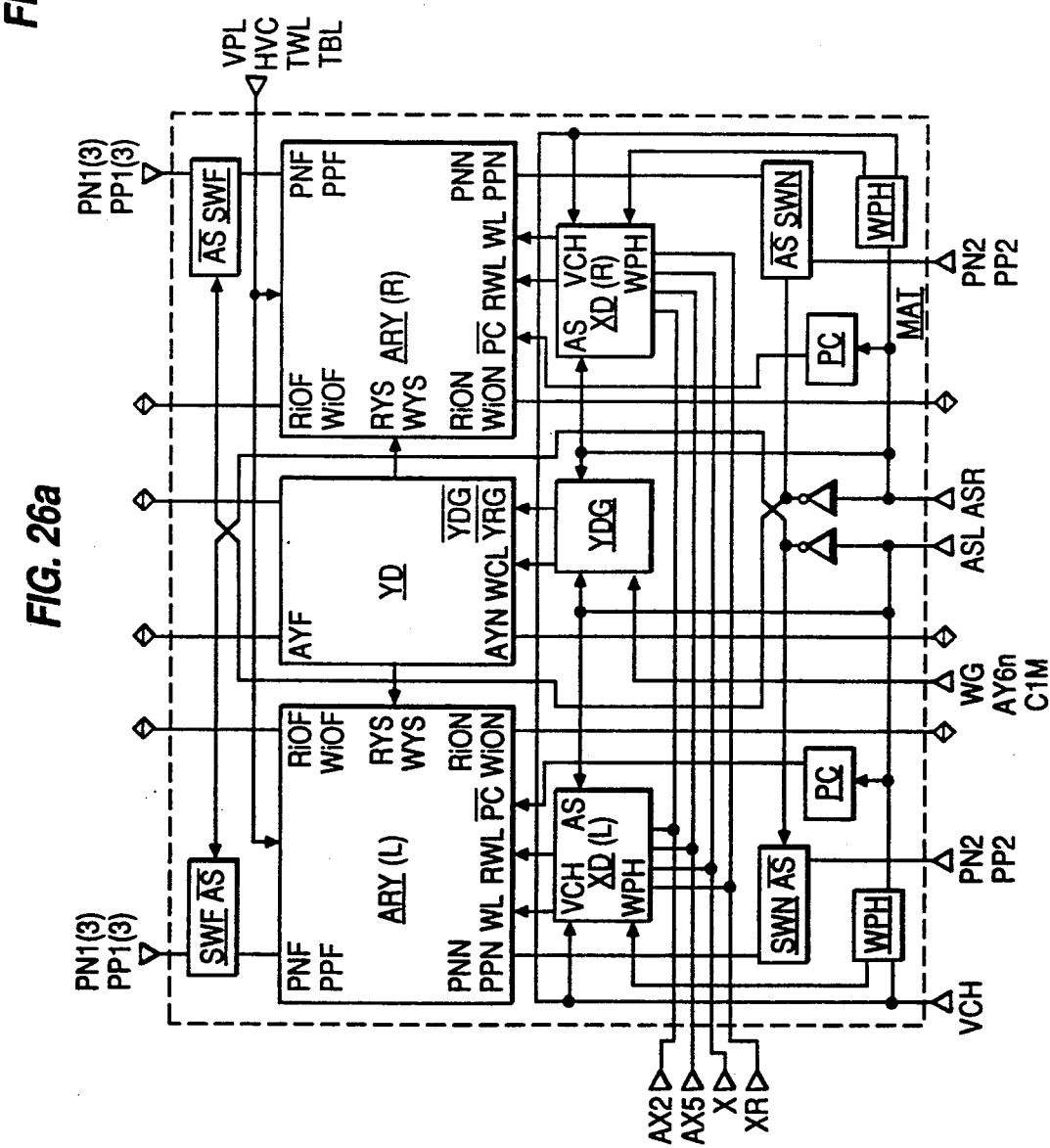

Two Bi.CMOS dynamic RAMs are provided for the upper and lower side memory mats, as has been described hereinbefore with regard to FIG. 1 and as shown in FIG 23, the redundancy circuit XR for these memory mats is equipped with totally four X-redundancy selection circuits XRD0, XRD1, XRD2 and XRD3 and Y-redundancy selection circuits YRD0, YRD1, YRD2 and YRD3 which are provided commonly for two of the four sets of redundancy word lines and four sets of redundancy complementary bit lines of those memory mats. As shown in FIG. 24, the X and Y redundancy selection circuits include redundancy enable circuits RCE and redundancy address comparators RCA. These redundancy selection circuits are equipped with a plurality of fuse means provided for the individual bits of bad addresses for acting as bad address ROMs for latching the bad addresses assigned to the paired redundancy word lines or reduncancy complementary bit lines.

In this embodiment, each fuse means is subjected to selective and reliable cutting treatments through a corresponding fuse cutting bipolar transistor T11 or T12 having a relatively large current feeding ability, as represented by fuse means F1 disposed in a redundancy enable circuit RCE or fuse means F2 disposed in a redundancy address comparator RCA of FIG. 25.

Here, the aforementioned transistor T11 is selectively turned on when it is fed with a fuse cutting power voltage VRC and a ground potential VSR and further with a power voltage VP selectively in a manner to correspond to the redundancy word line or data line. On the other hand, the transistor T12 is selectively turned on when the corresponding bit of the bad address, i.e., the corresponding complementary internal address signals B1 to B6 are set to the logic "1". As a result, the base current to be fed to the fuse cutting transistors T11 and T12 is reduced.

Figure 72:
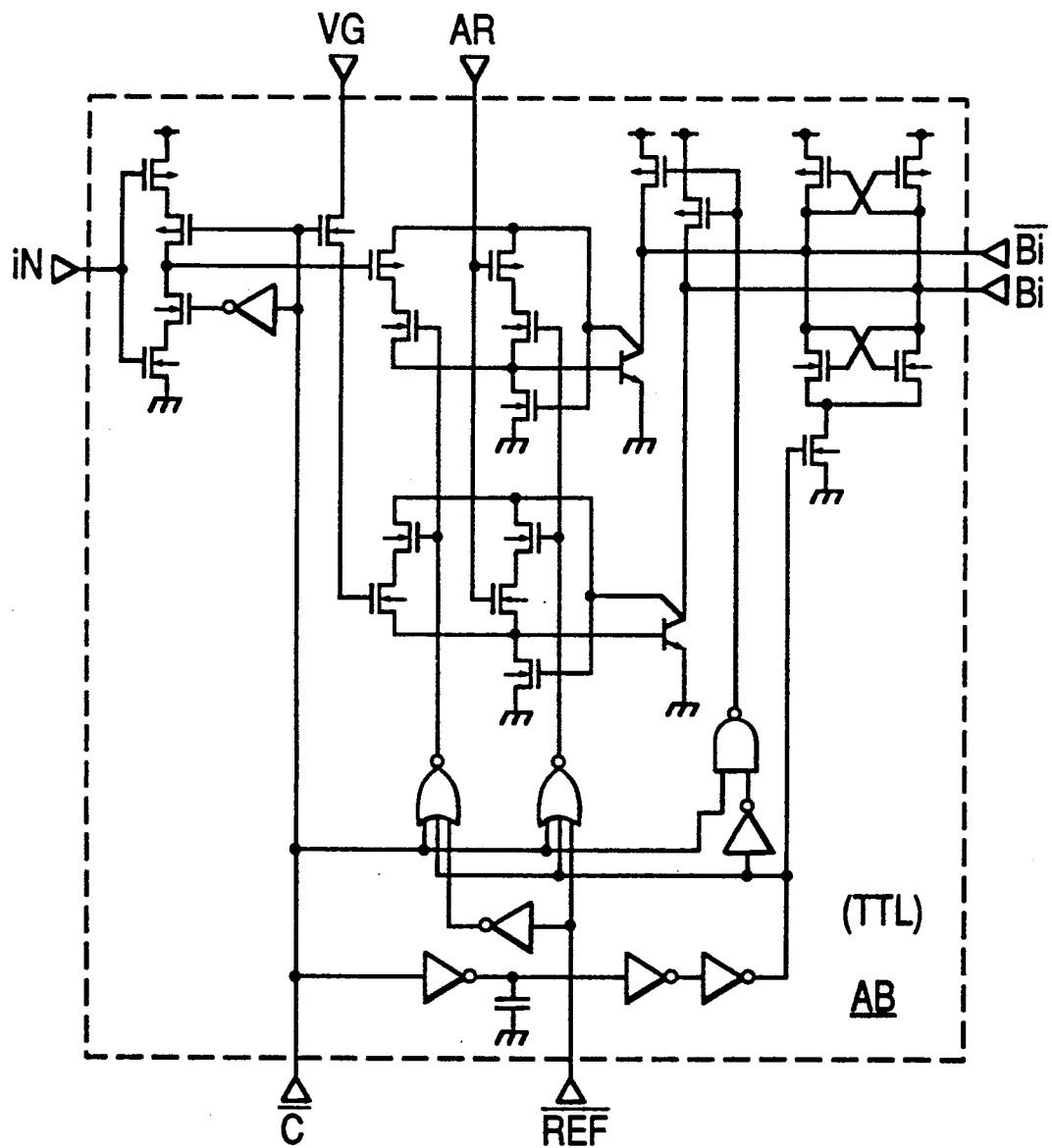

As shown in FIG. 72, moreover, if the cutting transistor T11 disposed in the redundancy enable circuit RCE is selectively turned on in accordance with the complementary internal address signal B0, the base current can be further reduced.

(6) Electrostatic Production Circuit

The Bi.CMOS dynamic RAM is equipped with a plurality of electrostatic protection circuits corresponding to the input bonding pads, respectively, although not especially limitative thereto. FIG. 88(a) is a to plan view showing one embodiment of the aforementioned electrostatic protection circuit, and FIG. 88(b) is a section showing the same. Moreover, FIG. 88(c) is a circuit diagram showing an equivalent circuit of the aforementioned electrostatic protection circuit.

Each electrostatic protection circuit of this embodiment includes an N+ diffusion layer, i.e., an input diffusion layer L1 which is coupled to corresponding pad PAD through a metallic wiring layer, i.e., an aluminum wiring layer AL1 and a contact CONT. The input diffusion layer L1 is coupled to a deeper diffusion layer CN2 (i.e., a second deeper diffusion layer) through a diffusion layer L2 acting as a protection resistor R and to the input terminal IN of the corresponding internal circuit through the corresponding contact CONT and the aluminum wiring layer AL3. The aforementioned deeper diffusion layer CN2 acts as the drain of a clamp MOS-FET QN and is coupled to its underlying P+ layer to construct the clamp diode D3 which is connected between the aforementioned input terminal IN and the P-type semiconductor substrate, i.e., the substrate back bias voltage VBB, and has a relatively small breakdown voltage.

Below the aforementioned input diffusion layer L1, on the other hand, there is formed an N well area NWELL. A deeper diffusion layer CN1 (i.e., first deeper diffusion layer) is formed to face the input diffusion layer L1. The aforementioned deeper diffusion layer CN1 is coupled to the power voltage VCC of the circuit through the corresponding aluminum wiring layer AL2. As a result, the input diffusion layer L1 constitutes the clamp diode D1, which is connected between the pad PAD and the P-type semiconductor substrate, i.e., the substrate back bias voltage VBB, and has a relatively large breakdown voltage. The deeper diffusion layer CN1! constitutes the clamp diode D2 which is connected between the power voltage VCC of the circuit and the substrate back bias voltage VBB and has a relatively small breakdown voltage.

Thus, the spike noises or the like to be inputted through the pad PAD are absorbed at first by the clamp diode D1 having a relatively high breakdown voltage, and the remaining spike noises or the like are absorbed by the camp diode D3 having a relatively low breakdown voltage. When a pulse of negative voltage is applied to the pad PAD, the diode D1 takes positive junction to feed the current to the substrate, but this current is absorbed by the aforementioned diode D3. As a result, the protection characteristics of the electrostatic protection circuit can be improved to enhance the reliability of the Bi.CMOS dynamic RAM.

1.1.7. Address Structure and Selection Type

Figure 5:
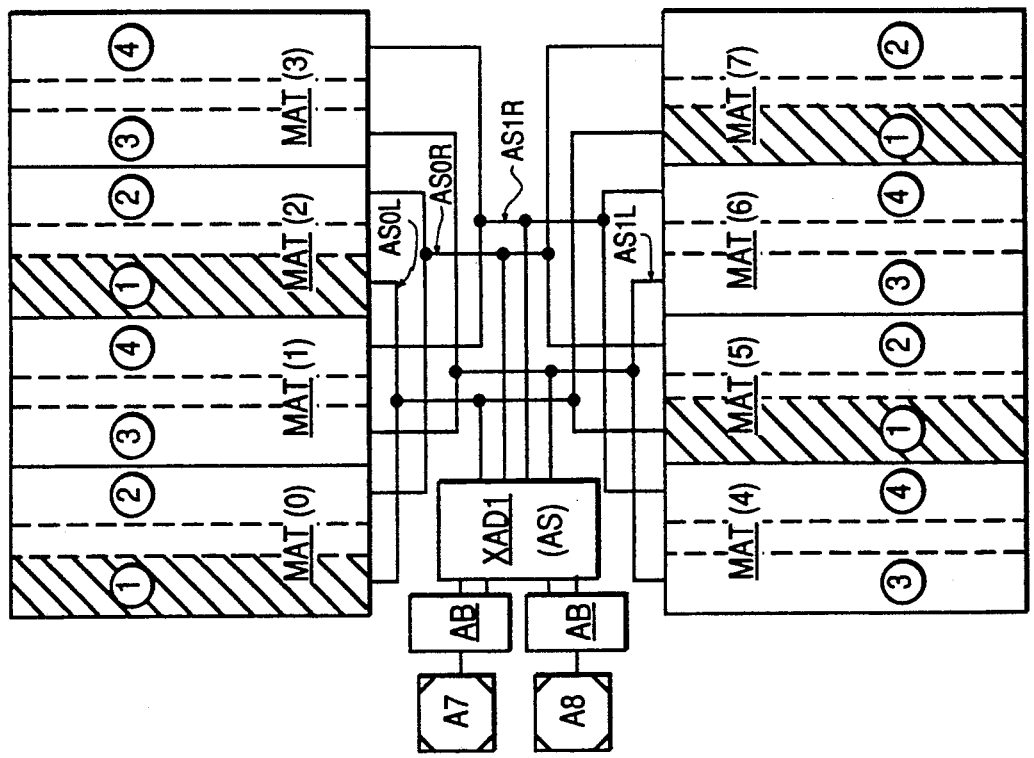
FIG. 5 is a diagram showing the memory mat selection conception of one embodiment of the Bi.CMOS dynamic RAM according to the present invention.

The Bi.CMOS dynamic RAM takes the non-address multiplex type, as has been described hereinbefore, and is equipped with a total of twenty address input terminals A0 to A19. As shown in FIG. 5, the Bi.CMOS dynamic RAM is further equipped with eight paired memory mats MAT0 and MAT4 to MAT3 and MAT7, each of which is equipped with a pair of memory arrays ARYL and ARYR. Moreover, each memory array is equipped with 32 groups each composed of four word lines, i.e., totally 128 word lines, and 512 groups of data lines.

In this embodiment, when the Bi.CMOS dynamic RAM is in the selected state, four of the aforementioned memory mats MAT0 to MAT7 are simultaneously brought into operative states. As hatched in FIG. 5, moreover, the lefthand or righthand memory arrays are simultaneously brought into operative states by the four simultaneously operated memory mats. In other words, in this Bi-CMOS dynamic RAM, the four memory mats are symmetrically arranged across the center line (which will be shortly referred to as the transverse center line) in parallel with the shorter side of the semiconductor substrate, and the four zigzag memory mats are simultaneously brought into the operative states. As a result, the exothermic distribution of the surface of the semiconductor substrate can be made uniform by the simultaneous operations of the plural memory mats to enhance the reliability of the Bi.CMOS dynamic RAM.

In this Bi.CMOS dynamic RAM, the address signals to be inputted through the twenty address input terminals A0 to A19 are classified, as enumerated in Table 7, although not especially limitative thereto, and are used for the corresponding applications.

TABLE 7

| Signal | Kind | Function |
| --- | --- | --- |
| A0 | X-Address | Selection of word lines in group. |
| A1 | | Formation of signals X0 to X3. |
| A2 | | Selection of word line groups. |
| A3 | | Formation of signals AX20 to AX27. |
| A4 | | Selection of word line groups. |
| A5 | | Formation of signals AX50 to AX53. |
| A6 | | Selection of array. |
| A7 | | Formation of ASOL(R) or ASIL(R). |
| A8 | | |
| A9 | Y-Address | Selection of data lines. |
| A10 | | Formation of signals AY00 to AY03. |
| A11 | | Selection of data lines. |
| A12 | | Formation of AY20 to AY23. |
| A13 | | Selection of data lines. |
| A14 | | Formation of signals AY40 to AY43. |
| A15 | | Selection of data lines. |
| A16 | | Formation of signals AY60 to AY63. |
| A17 | Z-Address | Selection of read or write map. |
| A18 | | Formation of signals AZ0 to AZ7. |
| A19 | | |

Specifically, the address signals A0 to A8 of 9 bits inputted through the address input terminals A0 to A8 are the X-address signals, of which the address signals A0 and A1 of less significant 2 bits are used for forming the word line selection drive signals X0 to X3 for alternatively designating the four word lines in the aforementioned word line group, although not especially limitative thereto. On the other hand, the address signals A7 and A8 of more significant 2 bits are used for alternatively forming the array selection signals AS0L AS0R, or AS1L, AS1R for designating the combination of the four memory mats to be simultaneously brought into the operative states. The remaining address signals of 5 bits are fed to the corresponding X-predecoders in the combination of A2 to A4 or A5 and A6 so that they are used for forming the predecoder signals AX20 to AX27 or AX50 to AX53 alternatively.

The aforementioned array selection signals are fed to the corresponding memory mats so that each of these memory mats starts its series operations for selecting the word lines and data lines and for driving the sense amplifiers. Moreover, the aforementioned word line selection drive signals and predecode signals are fed to the respective X-decoders so that one word line is designated by the memory array brought into the operative state and is alternatively brought into the selected state.

Likewise, the address signals A9 to A16 of 8 bits inputted through the address input terminals A9 to A16 are used as the Y-address signals and used for the data line selecting operations. Specifically, the address signals A9 to A16 are fed in the combinations of A9 and A10, A11 and A12, A13 and A14, and A15 and A16, as enumerated in Table 7, to the corresponding Y-predecoders so that the predecode signals AY00 to AYU03 to AY60 to AY63 are alternatively formed.

The aforementioned predecode signals are fed to the Y-decoders so that the two complementary bit lines designated by the memory array rendered operative are selected and connected to the wire amplifier or read amplifier through the corresponding two groups of write common I/O lines or read common I/O lines. In the Bi.CMOS dynamic RAM of this embodiment, as has been described hereinbefore, four memory arrays are simultaneously brought into the operative states so that two groups of complementary bit lines, i.e., two memory cells, are simultaneously brought into operative states from those memory arrays. In this Bi.CMOS dynamic RAM, more specifically, eight memory cells are simultaneously brought into selected states by the single memory access at all times so that the selections by the Z-address signals are awaited after the memory cells has been connected to the corresponding write amplifier or read amplifier.

On the other hand, the address signals A17 to A19 of 3 bits inputted through the address input terminals A17 to A19 are used as the Z-address signals, as enumerated in Table 7, and are used for the input/output selections of the storage data. The address signals A17 and A19 are decoded by the Z-predecoders to form the input-/output selection signals AZ0 to AZ7 alternatively. These input/output selection signals are fed to the corresponding write amplifiers WA0 to WA7 and the data selection circuits DS2 and DS8, as will be described hereinafter. As a result, the write data inputted through the data input terminal DI are alternatively transmitted to the weight memory cells which are simultaneously brought into the selected states, or the read data outputted from the eight memory cells to be simultaneously brought into the selected states are alternatively sent out through the data output terminal DO.

1.1.8. Redundancy System

The Bi.CMOS dynamic RAM is equipped, as has been described hereinbefore, with the total of eight memory mats MAT0 to MAT3 (which will be referred to as the upper-side memory mats) and MAT4 to MAT7 (which will be referred to as the lower-side memory mats), four of which are paired and symmetrically arranged across the X-selection circuit at the center of the substrate. Each of these memory mats is equipped with a pair of memory arrays, each of which is equipped with four redundancy word lines RWL0 to RWL3 and four redundancy complementary bit lines RBL0 to RBL3 (see FIG. 4).

This Bi.CMOS dynamic RAM has several features concerning the assignment of the aforementioned redundancy word lines and redundancy complementary data lines, i.e., the redundancy system. Specifically, the first feature of the redundancy system of the Bi.CMOS dynamic RAM is that the switchings of the redundancy word lines and redundancy complementary data lines are accomplished independently of each other in the upper- and lower-side memory mats, namely, by the so-called block retrieval method. This takes in into consideration that the contents of troubles are different in case the arrangement positions on the semiconductor substrate surface are different. Since the redundancy retrieval unit is thus reduced, the retrieval coefficient, i.e., the production yield of the Bi.CMOS dynamic RAM can be enhanced.

Next, the second feature of the redundancy system of the Bi.CMOS dynamic RAM is that the switchings of the redundancy system of the Bi.CMOS dynamic RAM are accomplished at the unit of the two word lines arranged adjacent to each other. This takes is consideration that the shorting troubles between the adjacent word lines take place in a relatively high probability. As a result, the retrieval coefficient, i.e., the production yield of the Bi.CMOS dynamic RAM can be further enhanced.

In the Bi.CMOS dynamic RAM, moreover, the selections of the complementary bit lines in each memory array are accomplished at the unit of two groups, and the switchings of the redundancy complementary bit lines are accordingly accomplished at the unit of two groups, as will be described hereinafter.

From the descriptions thus far made, the X-redundancy circuit XR of the Bi.CMOS dynamic RAM is equipped with two X-redundancy selection circuits XRD0 to XRD1 corresponding to the upper-side memory mat and two X-redundancy selection circuits XRD2 and XRD3 corresponding to the lower-side memory mat. These X-redundancy selection circuits are made to correspond commonly to the two of the four redundancy word lines which are disposed in the four upper- or lower-side memory mats, i.e., eight memory arrays. In each of the X-redundancy selection circuits, the complementary internal address signals B1 to B6 of 6 bits excepting the least significant bit and the array selecting more significant 2 bits are compared with and referred to the bad addresses which are assigned to the corresponding two redundancy word lines. As a result, in case the two address are coincident, the redundancy word line selection drive signals ZR0U to XR3U or XR0D to XR3D corresponding to the upper- to lower-side memory mat are alternatively formed by the combination with the complementary internal address signal B0 of the least significant bit.

Likewise, the Y-redundancy circuit YR of the Bi.CMOS dynamic RAM is equipped with the two Y-redundancy selection circuits YRD0 and YRD1 corresponding to the upper-side memory mat and two Y-redundancy selection circuits YRD2 and YRD3 corresponding to the lower-side memory mat. These Y-redundancy selection circuits are made to correspond commonly to the two of four groups of redundancy complementary bit lines disposed in the four memory mats arranged in the upper or lower side. i.e., in the eight memory arrays. In each Y-redundancy selection circuit, complementary internal address signals B9 to B16 of 8 bits corresponding to the Y-address signals are compared with and referred to the bad addresses assigned to the corresponding two groups of redundancy complementary bit lines. As a result, in case the two address are coincident, the redundancy bit lines drive signal YR0U or YR1U, or YR0D or YR1D corresponding to the upper- or lower-side memory mat is alternatively formed.

1.1.9. Fundamental Layout System

This Bi.CMOS dynamic RAM has several features relating to the layout of the semiconductor substrate. The summary and features of the fundamental layout of the Bi.CMOS dynamic RAM of this embodiment will be described in the following.

(1) Chip Layout

Figure 47:
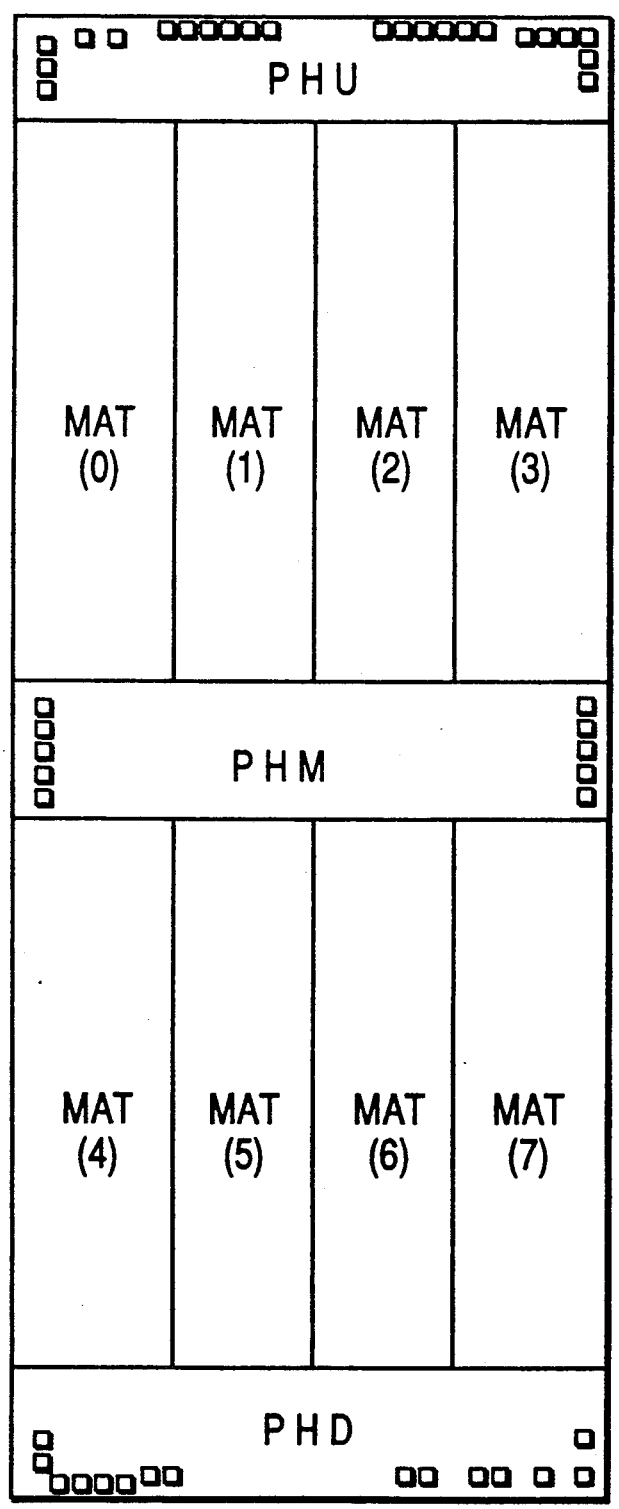
FIG. 47 is an overall arrangement diagram showing one embodiment of an arrangement of peripheral circuits for the Bi.CMOS dynamic RAM according to the present invention.

FIG. 47 is a diagram showing the chip layout of one embodiment of the semiconductor substrate of the Bi.CMOS dynamic RAM. In the description to be made, for conveniences, the upper and lower portions of FIG. 47 are called the upper and lower sides of the semiconductor substrate, and the lefthand and righthand portions of the same Figure are called the lefthand and righthand sides of the semiconductor substrate.

In FIG. 47, the individual blocks constituting the Bi.CMOS dynamic RAM are formed over the surface of a P-type semiconductor substrate having a rectangular shape. At the center portion of the semiconductor substrate, there is arranged a middle peripheral circuit PHM which extends along the center line (which will be referred to as the transverse center line) in parallel with the shorter side and which includes X-selection circuits. Across this center peripheral circuit PHRM, there are symmetrically arranged four memory mats MAT0 to MAT3 and MAT4 to MAT7.

In this embodiment, each memory mat includes a pair of memory arrays, each of which includes substantially 128 word lines. Moreover, each word line takes the so-called "divided word line type", in which it is arranged from the start of the aforementioned center peripheral circuit PHM to each of the shorter sides of the semiconductor substrate. As needless to say, the memory access of the Bi.CMOS dynamic RAM is started by the word line selecting operations, i.e., the X-selecting operations. Thus, the center peripheral circuit PHM including the X-selection circuits is arranged at the center of the semiconductor substrate, and the word lines, i.e., the memory mats are symmetrically arranged across the center peripheral circuit PHM, so that the Bi.CMOS dynamic RAM has its word line selecting operations and its access time speeded up.

Outside of the memory mats MAT0 to MAT3, there is arranged along the upper side of the semiconductor substrate an upper peripheral circuit PHU which includes Y-address buffers YAB. Likewise, outside of the memory mats MAT4 to MAT7, there is arranged along the lower side of the semiconductor substrate a lower peripheral circuit PHD which includes write amplifiers and read amplifiers.

As can be analogized from FIG. 47, the bonding pads for transmitting input signals or output signals to the individual peripheral circuits are arranged around and close to the corresponding upper peripheral circuit PHU, middle peripheral circuit PHM and lower peripheral circuit PHD. As a result, the transmission delay times of the individual input signals and output signals can be shortened to speed up the Bi.CMOS dynamic RAM.

(2) Memory Mats and Memory Arrays

Figure 48:
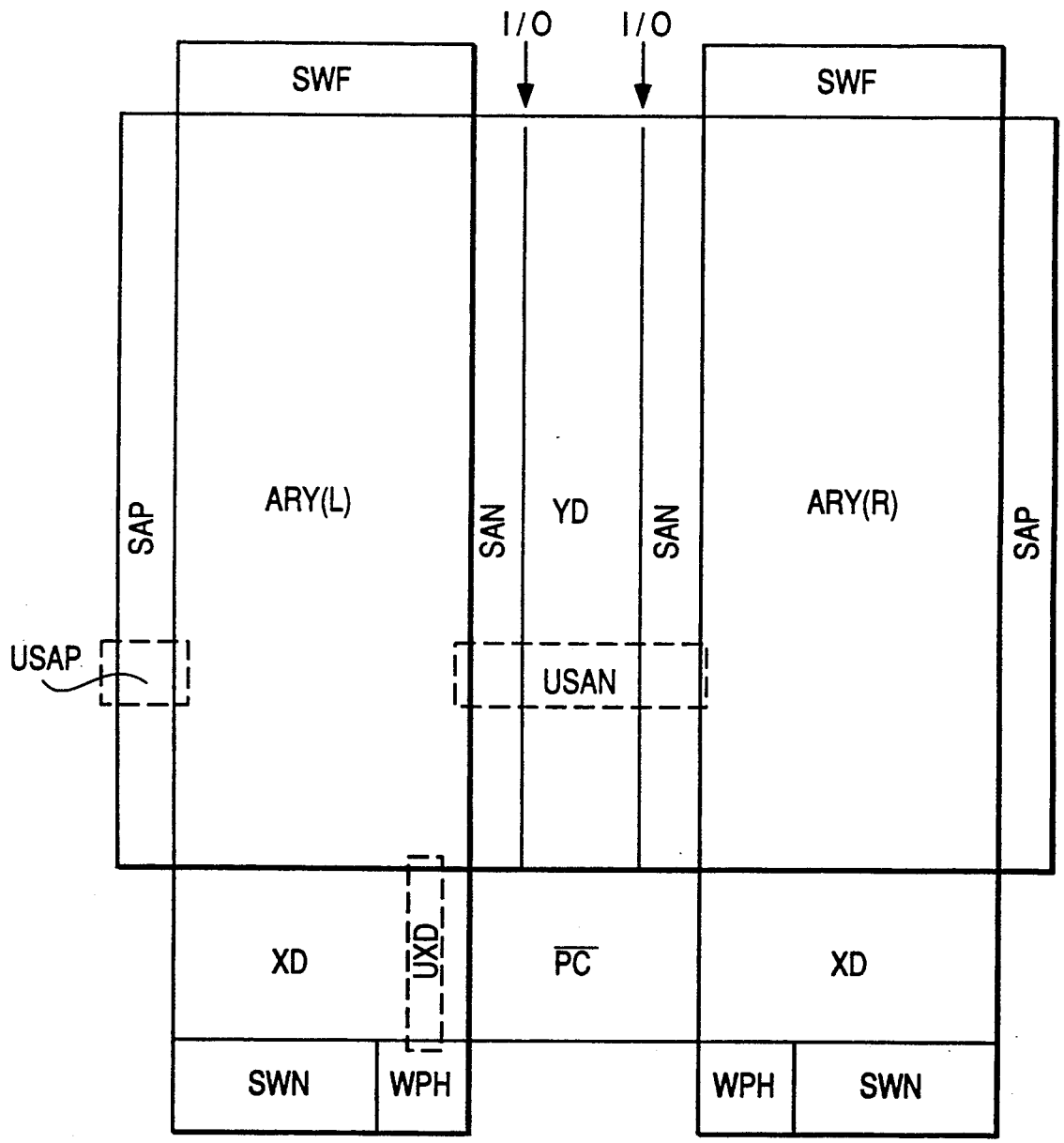
FIGS. 48 to 52 are partial arrangement diagrams of the individual portions of FIG. 47.

FIG. 48 is a diagram showing the fundamental arrangement of one embodiment of the memory mats MAT0 to MAT3 to be arranged at the upper side of the semiconductor substrate of FIG. 47. The memory mats MAT4 to MAT7 to be arranged at the lower side of the semiconductor substrate are arranged symmetrically with respect to the transverse center line of the semiconductor substrate of the same Figure.

In FIG. 48, each memory mat is arranged at its center with the Y-decoder YD, across which are arranged a pair of memory arrays ARYL and ARYR. Each memory array is arranged at its righthand and lefthand sides with corresponding P-type sense amplifier SAP and N-type sense amplifier SAN, which are underlaid by corresponding X-decoders XD, respectively. Above each memory array and below each X-decoder, moreover, there are arranged corresponding common source line switch circuits SWF and SWN, inside of the latter of which is arranged a corresponding word line precharge signal generator WPH.

Figure 75A:
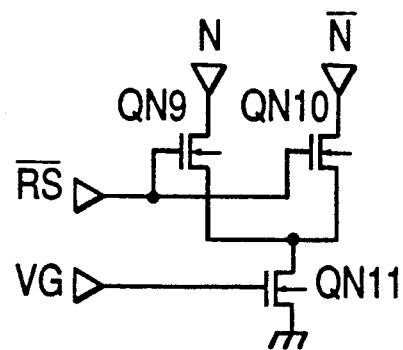
Figure 75B:
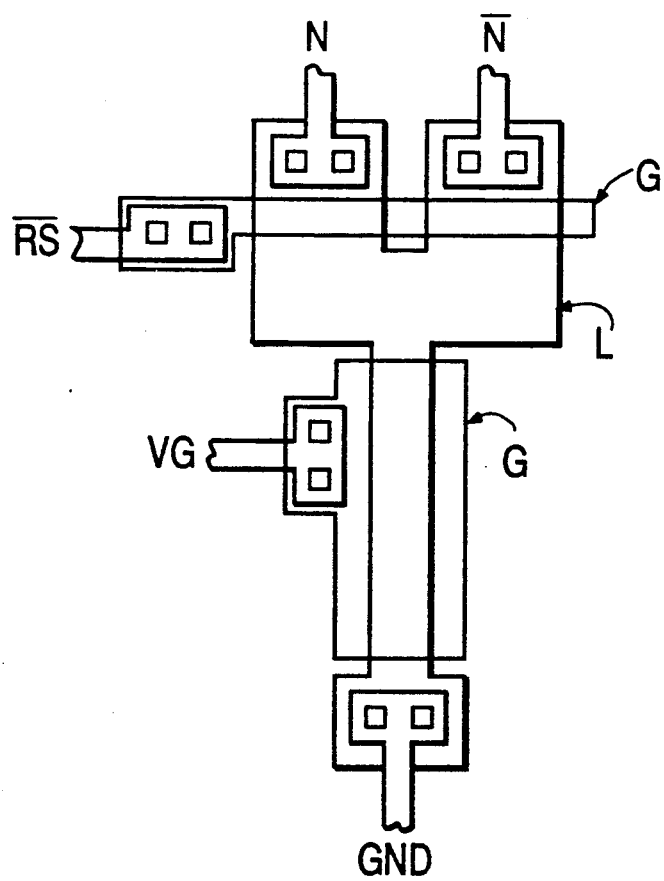

Between the Y-decoder YD and each N-type sense amplifier SAN, there are arranged two groups of write common I/O lines and read common I/O lines, which are extended in parallel with the word lines. These common I/O lines are arranged to extend to the memory mats which are symmetrically arranged across the transverse center line of the semiconductor substrate. Moreover, the read amplifiers to be coupled to the read common I/O lines are composed of bipolar transistors so that they have very high sensitivities. In the Bi.CMOS dynamic RAM of this embodiment, as shown in FIG. 75, two ground potential supply lines VSS are arranged at the two sets of read common I/O lines RI/O. As a result, the read common I/O lines are prevented from being coupled to other signal lines so that the noise margin of the Bi.CMOS dynamic RAM is enhanced.

(3) Peripheral Circuits and Pads

Figure 49:
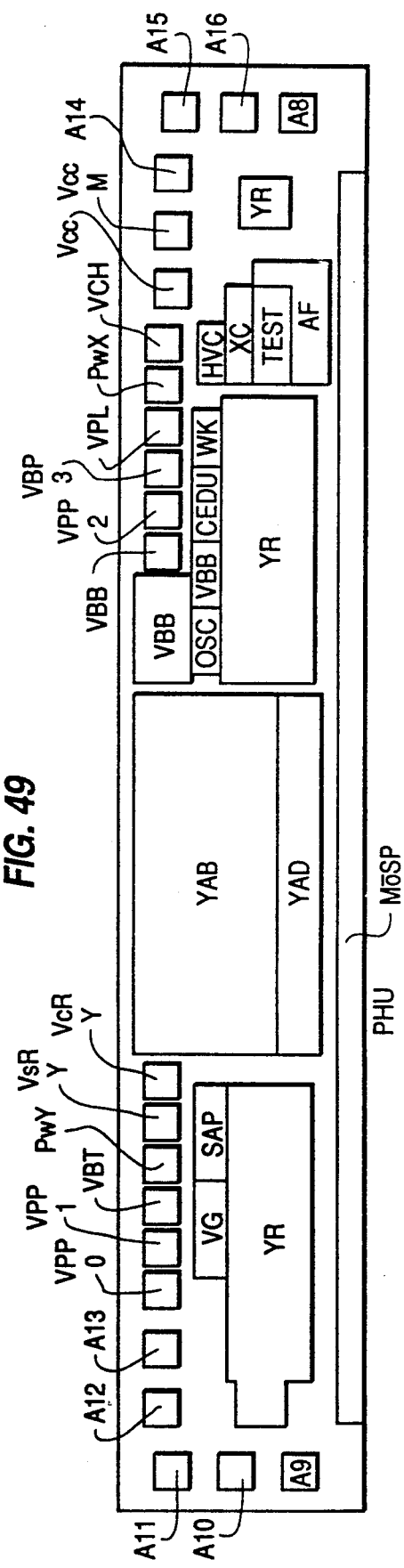

FIG. 49 is a diagram showing a partial arrangement of the upper peripheral circuit PHU of the Bi.CMOS dynamic RAM of FIG. 47. On the other hand, FIGS. 50 and 51 are diagrams showing partial arrangements of the middle peripheral circuit PHM and the lower peripheral circuit PHD of the Bi.CMOS dynamic RAM of FIG. 47.

In FIG. 49, the upper peripheral circuit PHU is arranged generally at its center portion with the Y-address buffer YAB and Y-predecoder YAD, which are interposed between the Y-redundancy circuits YR, although note especially limitative thereto. Above the lefthand Y-redundancy circuit YR, there are arranged the voltage generator VG and the sense amplifier drive circuit SAP, around which are arranged address input pads A9 to A13 for inputting the Y-address signals. Likewise, above the righthand Y-redundancy circuit YR, there are arranged the oscillator OSC, the voltage generator VBB, the CE driver CEDU and the $\overline{WK}$ signal generator WK. At the righthand side of these, there are arranged the voltage generator HVC, the XC signal generator XC, the test mode control circuit TEST, and the test mode setting signal latch AF. Around these circuits, there are arranged the address inputting pads A8 and A14 to A16 for inputting Y-address signals. At the lowermost stage of the upper peripheral circuit PHU, moreover, there is arranged along the memory mats MAT0 to MAT3 the sense amplifier driving P-channel MOSFET (MOSP).

Figure 50:
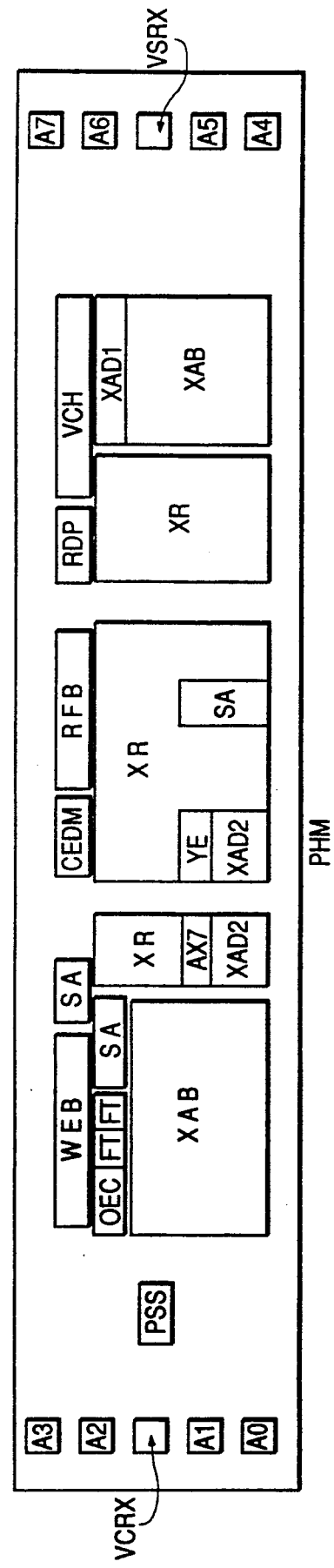

In FIG. 50, the middle peripheral circuit is arranged at its center portion with the X-redundancy circuit XR, which is interposed between the X-address buffer XAB, the X-predecoders XAC and AX7, and the various signal generators. The middle peripheral circuit PHM includes the word line selecting voltage generator VCH,, the $\overline{WE}$ buffer WEB, the $\overline{RF}$ buffer RFB and the CE driver CEDM. At the two sides of the middle peripheral circuit PHM, there are arranged along the individual longer sides of the semiconductor substrate the address inputting pads A0 to A7 for inputting the X-address signals.

Figure 51:
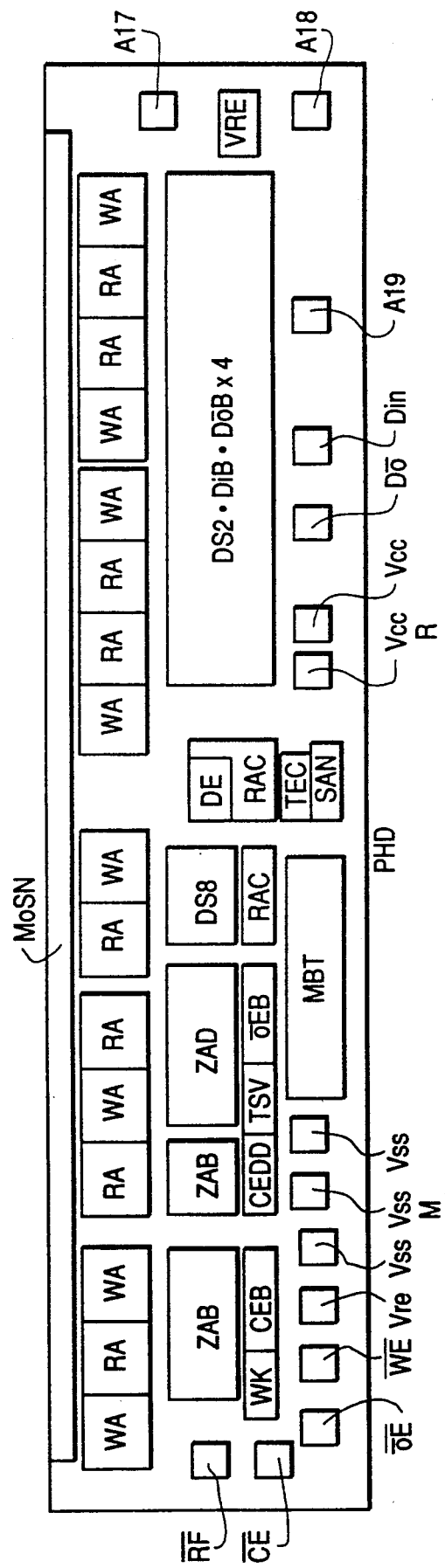

In FIG. 51, on the other hand, the lower peripheral circuit PHD includes: eight write amplifiers WA and read amplifiers RA arranged along the memory mats AMT4 to MAT7; and N-channel MOSFETs (MOSN) arranged at the uppermost stage for driving the sense amplifiers. These write amplifiers WA and read amplifiers RA are underlaid by the Z-address buffers ZAB, the Z-predecoder ZAD, the data selection circuits DS2 and DS8, the data input buffer DIB, and the data output buffer DOB. These circuits are surrounded by the address inputting pads A17 to A19 for inputting Z-address signals, the data inputting pad DI and the data outputting pad DO. There are also arranged the pads $\overline{CE}$, $\overline{RF}$, $\overline{WE}$ and $\overline{OE}$ for inputting the individual start control signals, and the pads VSS for supplying the ground potential of the circuit.

(4) Word Lines and Word Line Drive Circuits

Figure 52:
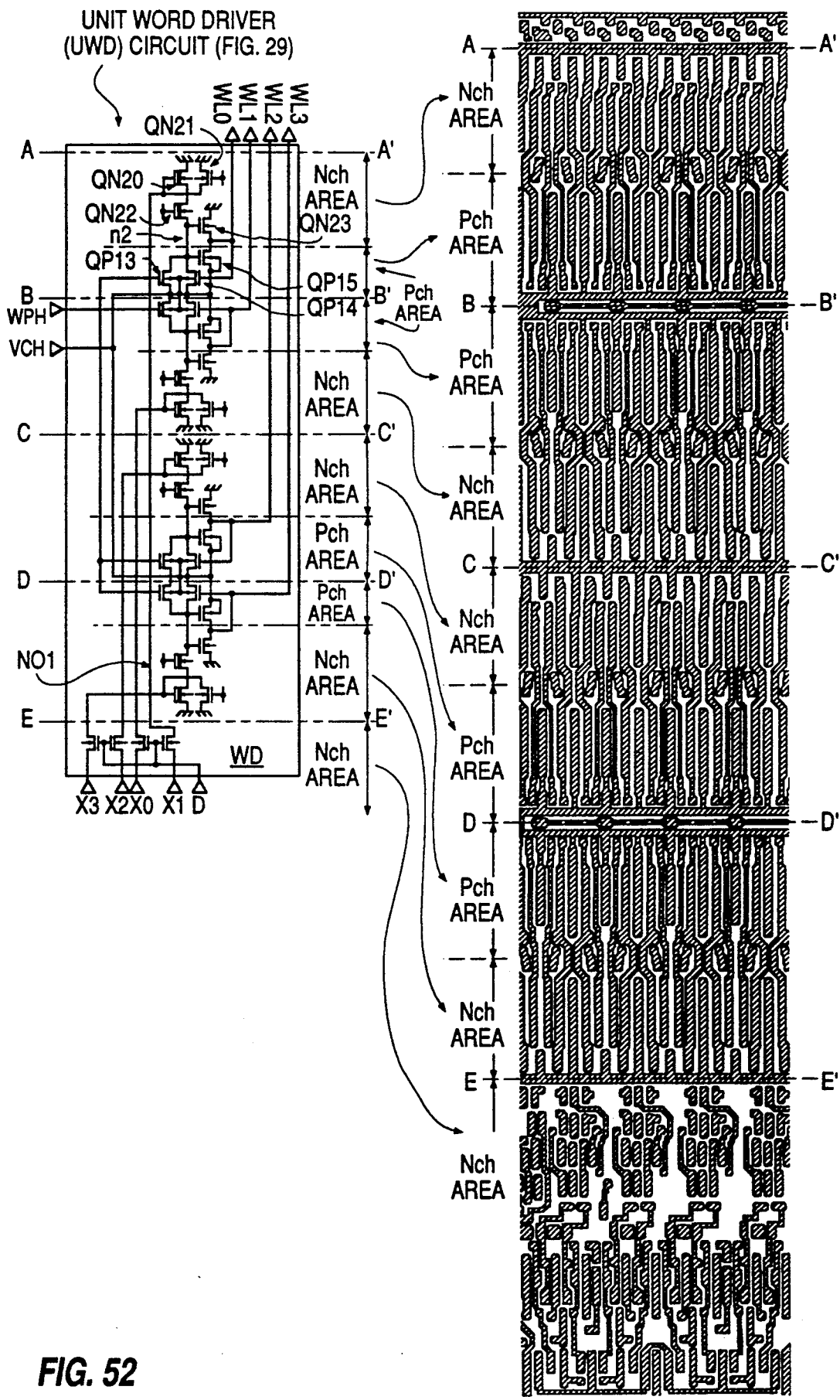

FIG. 52 is a diagram showing a partial arrangement of one embodiment of the unit circuit UXD contained in the X-decoder XD of the memory mat of FIG. 48.

Figure 29B:
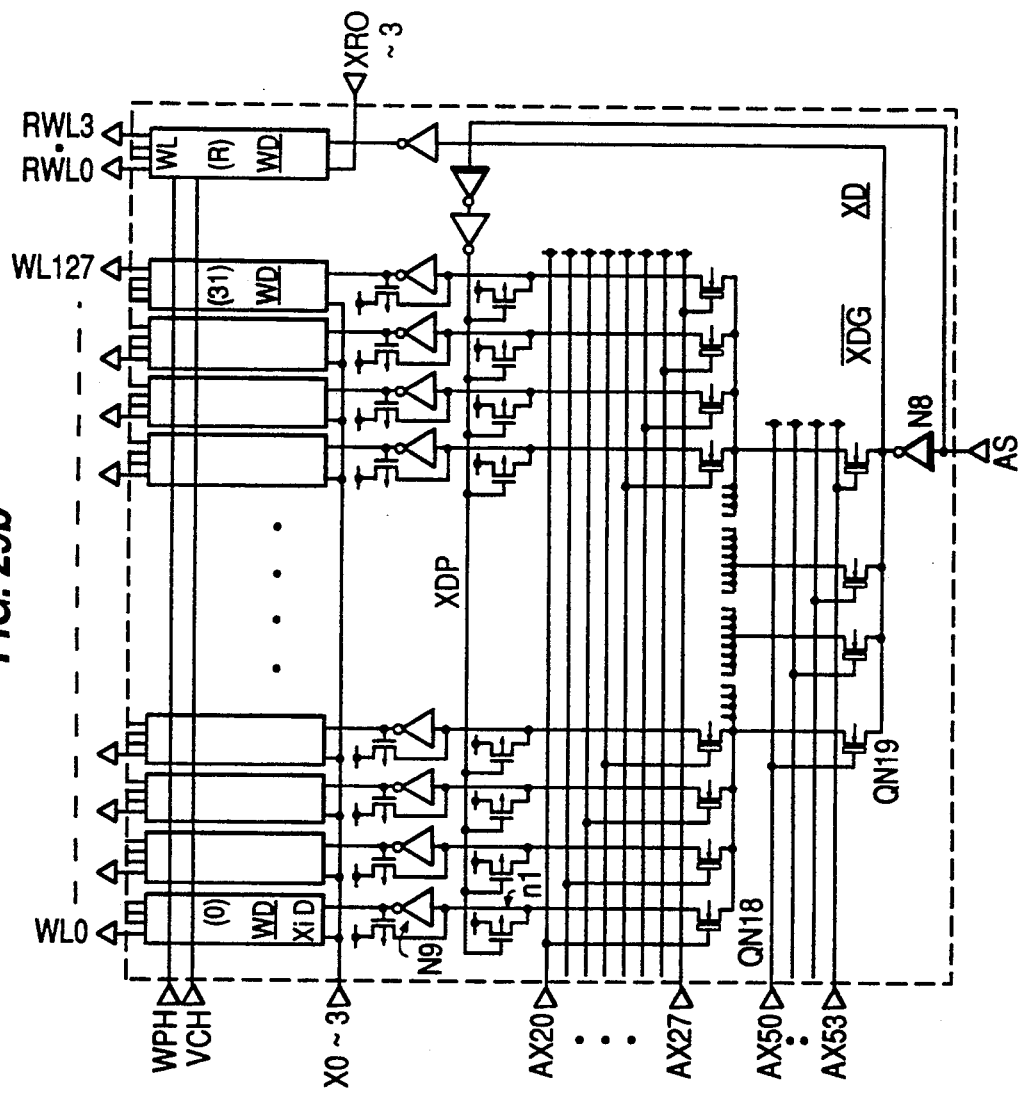
Figure 29A:
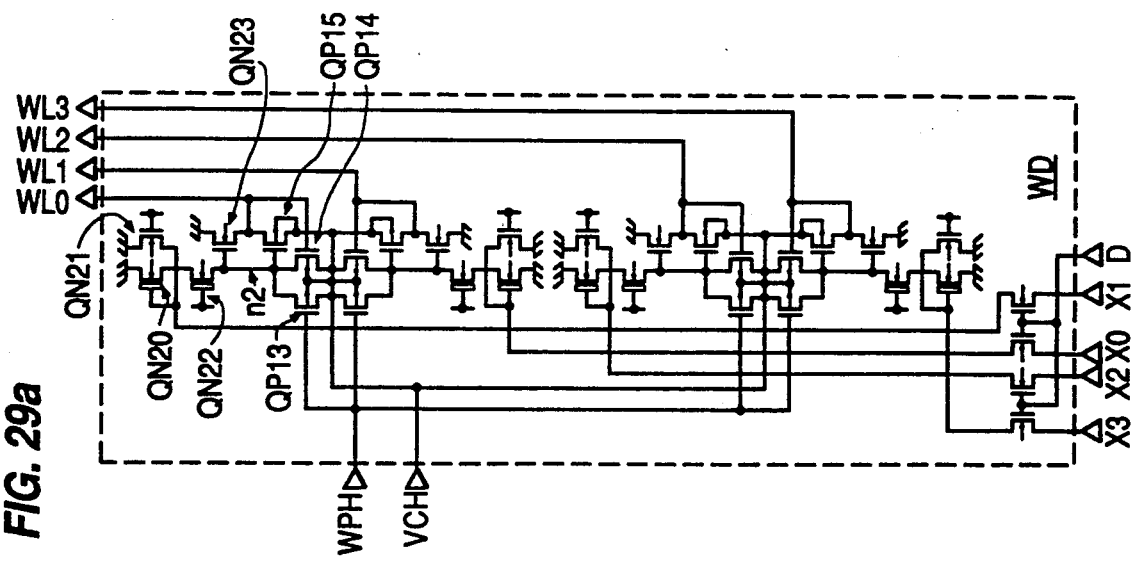
Figure 30C:
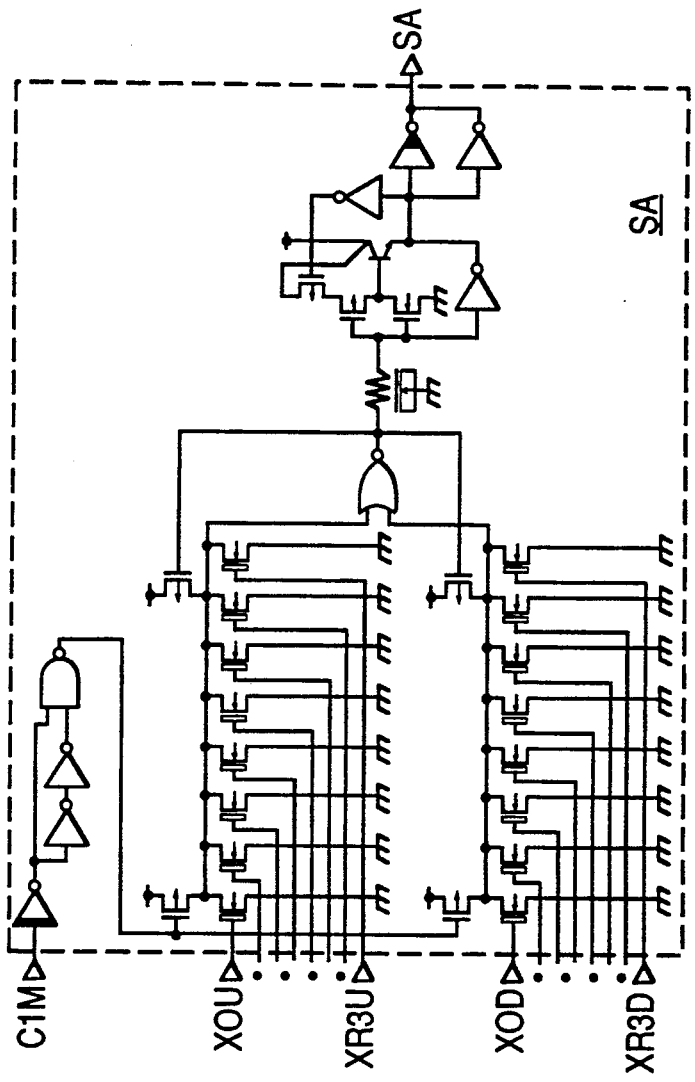
Figure 30D:
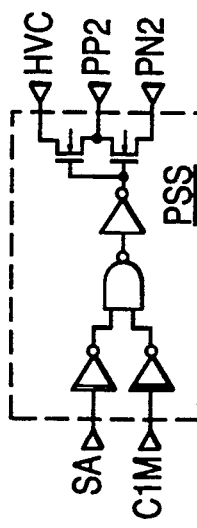
Figure 30A:
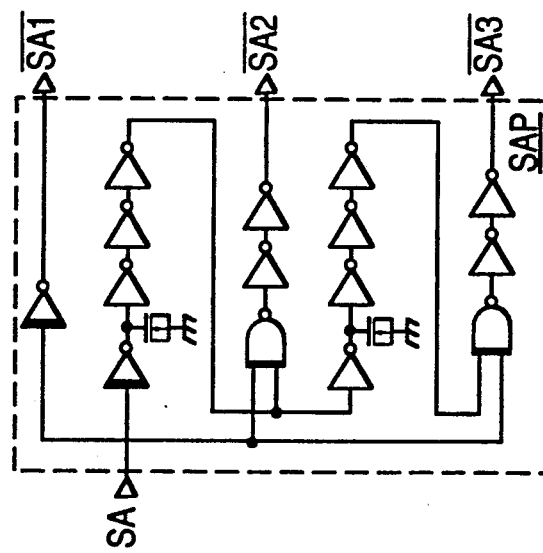
Figure 30B:
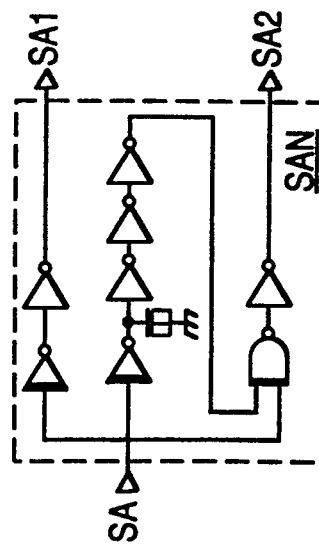

In this embodiment, each X-decoder XD in FIG. 48 is equipped with 32 unit circuits UXD provided for a group, i.e., four word lines, and another unit circuit UXD provided for four redundancy word lines. As shown in FIG. 29, these unit circuits UXD include: a portion of the decoder circuit responding to the predecode signals AX20 to AX27, AX50 to AX53 and XDG for bringing the corresponding word line groups into selected states; and word line drive circuits WD responding to the output signals of the aforementioned decoder unit circuits and the word line selection drive signals X0 to X3 for bringing the word lines in the group alternatively into the selected states. Moreover, these word line drive circuits WED include a plurality of P-channel type (first conductivity type) and N-channel type (second conductivity type) MOSFETs which are provided for the word lines in the group.

In this embodiment, each unit circuit UXD of the X-decoder Xd is arranged at the same pitch as the layout pitch of the corresponding four word lines and in the longitudinal direction of the same word lines. Moreover, the four sets of P-channel MOSFETs and N-channel MOSFETs corresponding to the individual word lines of the word line drive circuits WD are stacked alternatively and adjacent to each other. As a result, the layout of the word line drive circuits WD is made efficient to reduce the area required for the layout of the X-decoders XD.

As has been described hereinbefore, each word lines takes the divided word line type including: a plurality of divided word lines divided in the longitudinal direction thereof; and a main word line formed in parallel with the divided word lines and bounding them together. In this embodiment, each divided word line acts as the gate of the corresponding memory cells, although not especially limitative thereto, and is made of silicide having a relatively small sheet resistance, for example. Moreover, each main word line is formed of a metallic wiring layer such as an aluminum wiring layer to bind the corresponding plural divided word lines together generally at the center portion of the extending direction of the divided word lines. As a result, the transmission delay time of the selection signals of each word line is shortened to further speed up the word line selections of the Bi.CMOS dynamic RAM.

(5) Sense Amplifiers

A unit circuit USAN is contained in the N-type sense amplifier SAN of the memory mat of FIG. 48.

In this embodiment, each unit circuit of the Y-decoder YD is provided for two sets of complementary data lines, as will be described hereinafter. As shown in FIGS. 48 and 59 to 61, those unit circuits are arranged between the two N-type sense amplifiers SAN which are provided for the memory array ARYL and ARYR and which are interposed between respectively two sets of read common I/O lines RIOA and RIOB and the write common I/O lines WI0A and WI0B. These common I/O lines are underlaid by the corresponding switch MOSFETs, which are surrounded by the corresponding unit circuits of the N-type sense amplifiers SAN. These unit circuits are selectively fed with the ground potential of the circuit through the common source line PN which is formed to have a relatively large width. At the two sides of the aforementioned read common I/O lines RIOA and RIOB, as has been described hereinbefore, there are formed a pair of ground potential supply lines VSS which have the shielding action and are arranged close to each other.

The unit circuit USAP is contained in the P-type sense amplifier SAN the memory mat of FIG. 48.

The unit circuits USAP of the P-type sense amplifier SAP are arranged across the corresponding memory array and generally symmetrically with the corresponding unit circuits USAN of the aforementioned N-type sense amplifier SAN. These unit circuits are fed selectively with the power voltage of the circuit through the common source lines PP which are formed to have a relatively large width.

(6) Common I/O lines

The Bi.CMOS dynamic RAM is equipped with the two sets of write common I/O lines and read common I/O lines which are provided for each memory array, as has been described hereinbefore. Of these, the write common I/O lines are connected directly with the designated complementary data lines through the corresponding switch MOSFETs, and the read common I/O lines are connected indirectly therewith through the gates of the corresponding switch MOSFETs as shown in FIGS. 28 and 60. Moreover, these common I/O lines are arranged to extend through the two memory arrays which are paired and arranged symmetrically across the X-selection circuit at the center of the substrate. Moreover, the read common I/O lines are coupled to the especially highly sensitive read amplifiers, and the group potential supply lines having the shielding action are arranged at the two sides of the I/O lines to improve the noise margin.

Figure 57:
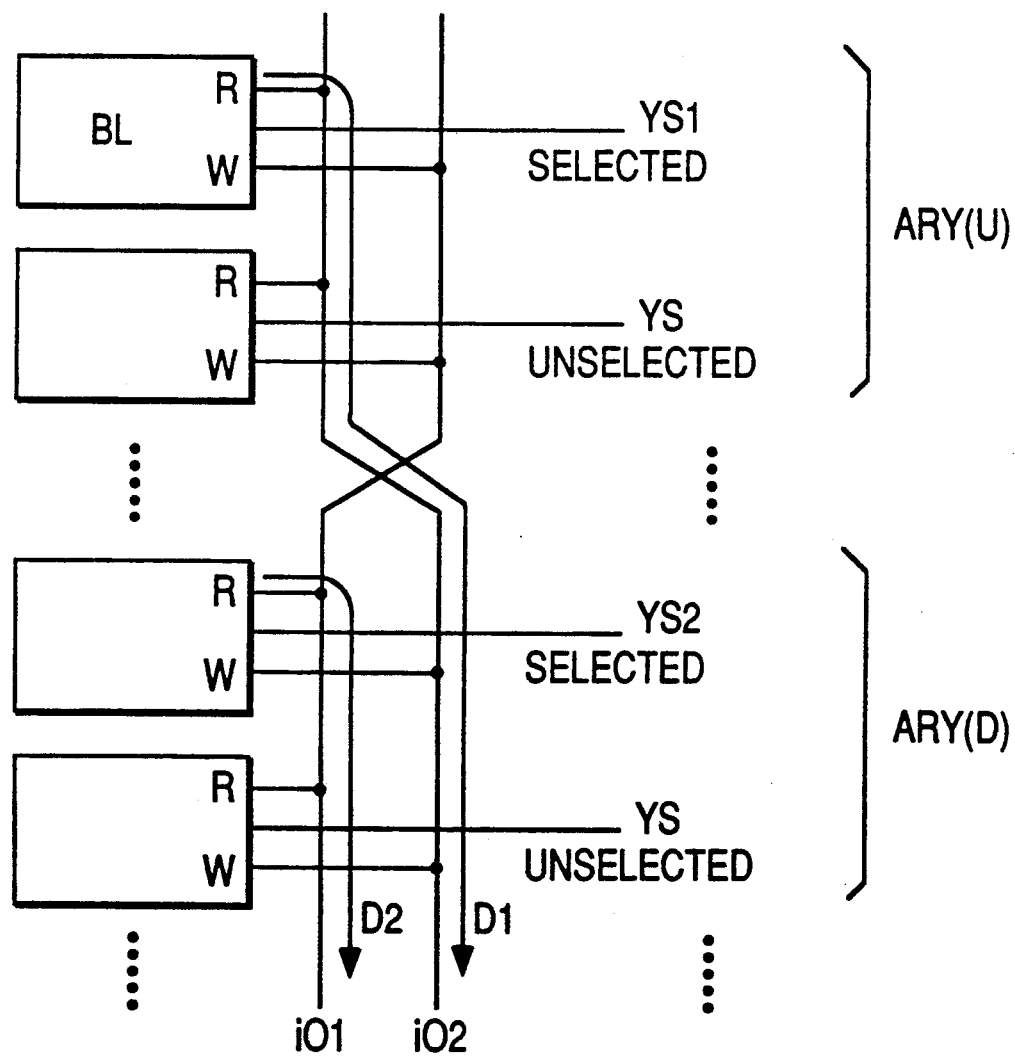
Figure 68:
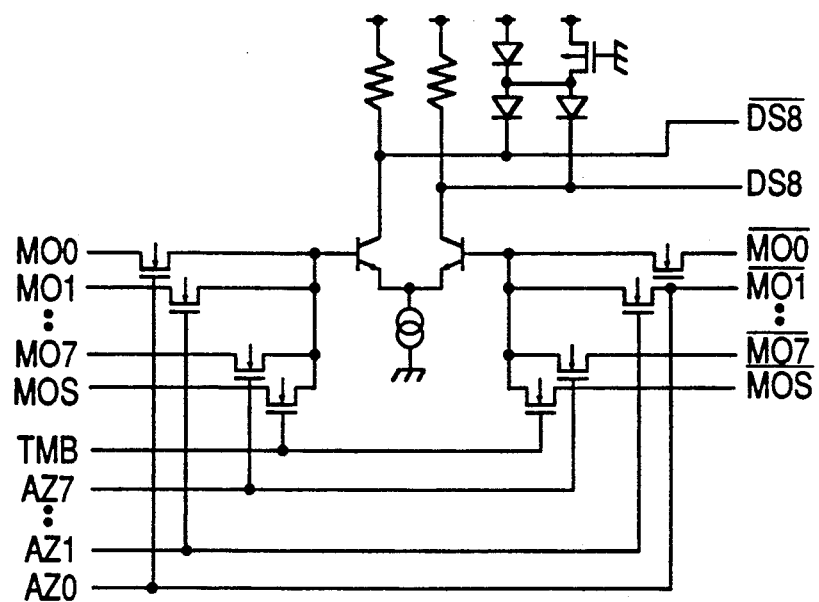
Figure 69:
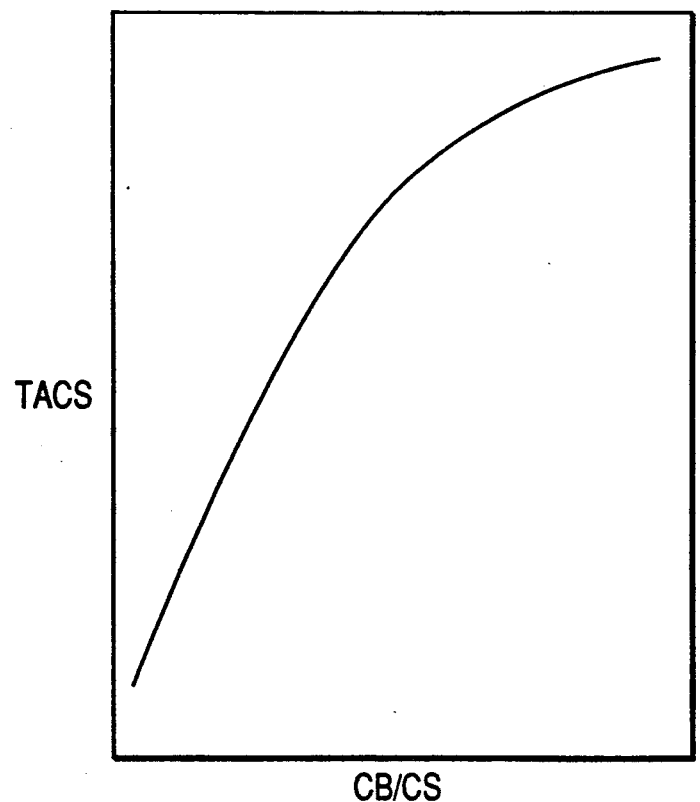

Incidentally, in the Bi.CMOS dynamic RAM of this embodiment, the aforementioned write common I/O lines and read common I/O lines are substantially shared by the two paired memory arrays. It is, therefore, conceivable to provide the common I/O lines I02 and I02 to be shared as the write common I/O lines and the read common I/O lines, as shown in FIGS. 57 and 68, for example. In FIG. 57, specifically, the common I/O lines I01 and I02 are arranged to intersect at the middle between the memory array ARYU disposed at the upper side and the memory array ARYD disposed at the lower side. Each common I/O line is coupled thereabove to the corresponding write amplifier and therebelow to the corresponding read amplifier. Totally two sets of complementary data lines are selectively connected, as selected by the memory arrays, with those common I/O lines so that the write amplifier or the read amplifier is selectively brought into the operative state in accordance with the operation mode of the Bi.CMOS dynamic RAM. As a result, the number of common I/O lines required is reduced to one half so that the area necessary for the layout is accordingly reduced.

Figure 58:
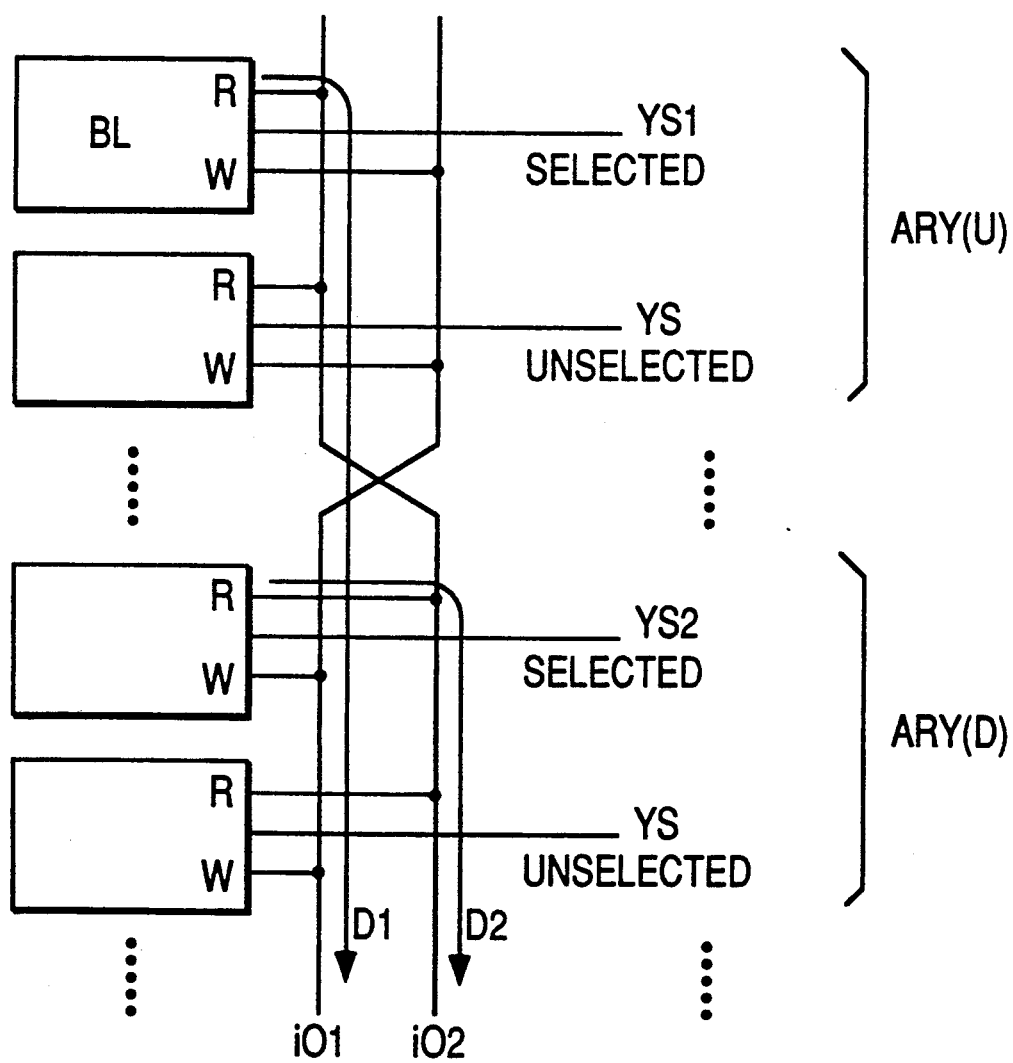

In FIG. 58, on the other hand, the common I/O lines I01 and I02 are not intersected at the middle of the memory arrays ARYO and ARYD, but the write node W and the read node R of each data line are coupled to the different common I/O lines at the upper and lower memory arrays so that the common I/O lines are substantially intersected to provide the effects similar to FIG. 57.

Figure 59A:
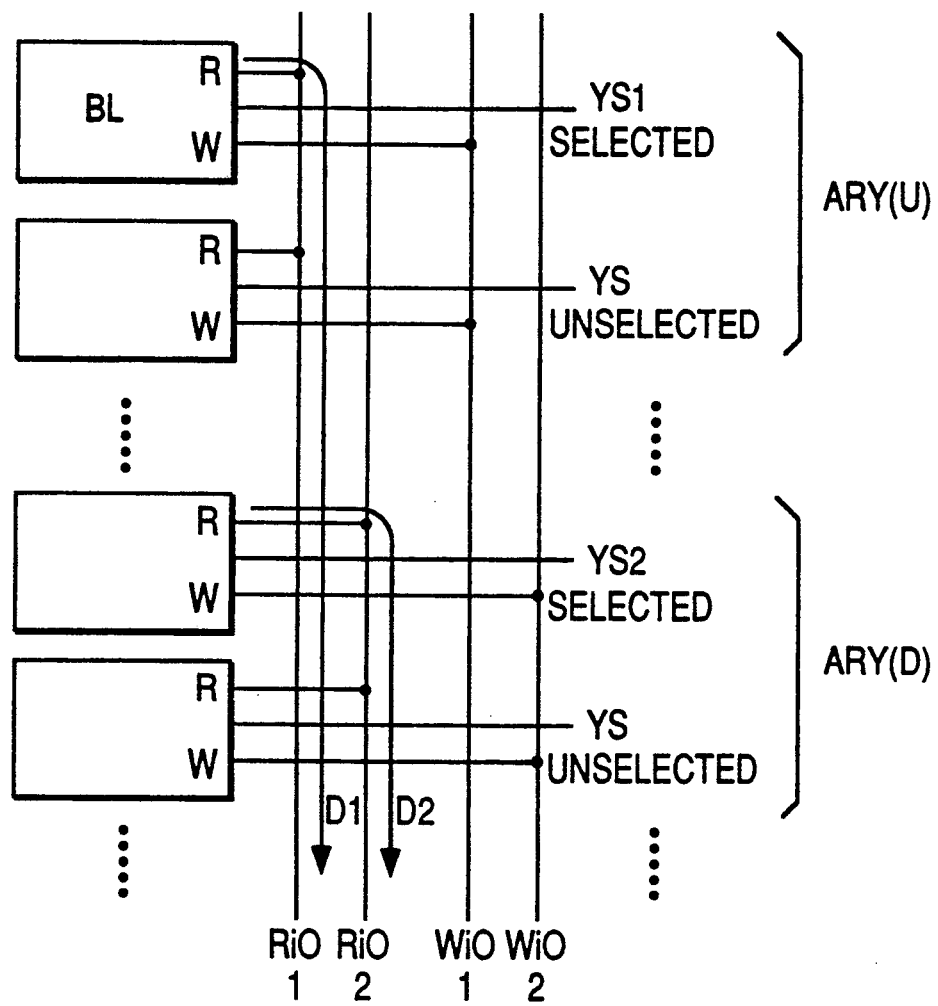
Figure 59B:
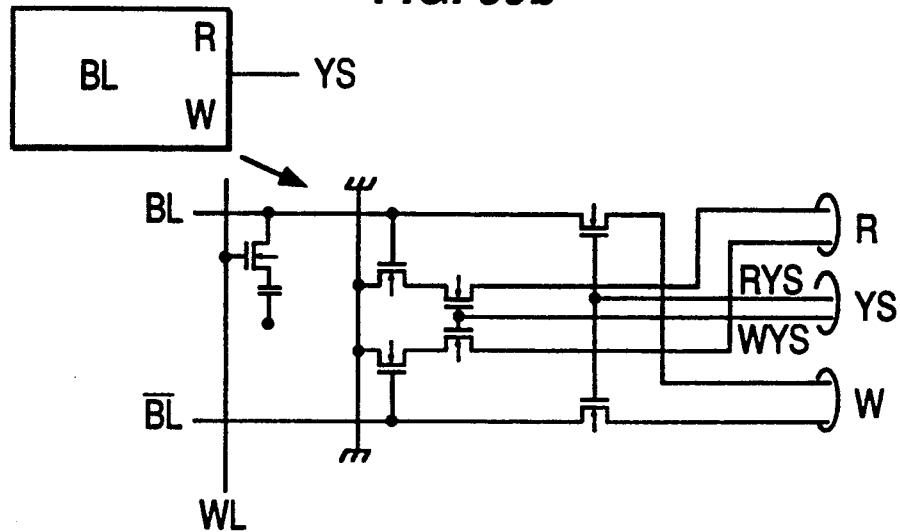

Even in case two sets of write common I/O lines and read common I/O lines are individually provided like the Bi.CMOS dynamic RAM of this embodiment, one set of complementary data lines may be selected from the paired memory arrays ARYU and ARYD, as shown in FIG. 59, for example.

(7) Reference Potential Generator

This Bi.CMOS dynamic RAM is equipped with a plurality of input buffers corresponding to the individual start control signals and address signals, as has been described hereinbefore. Each of these input buffers has two input circuits which are provided for the two TTL and ECL levels and rendered selectively effective. Of these, the input circuit provided for the ECL level includes a current switch circuit, which is composed basically of differential bipolar transistors, and a current source for applying a predetermined operation current to the differential transistors, as will be described hereinafter. The current source is composed basically of transistors T13 to T15 which have their bases receptive of a predetermined reference potential and their emitters coupled to the ground potential of the circuit through predetermined resistors as shown in, for example, FIG. 61(a).

Figure 61A:
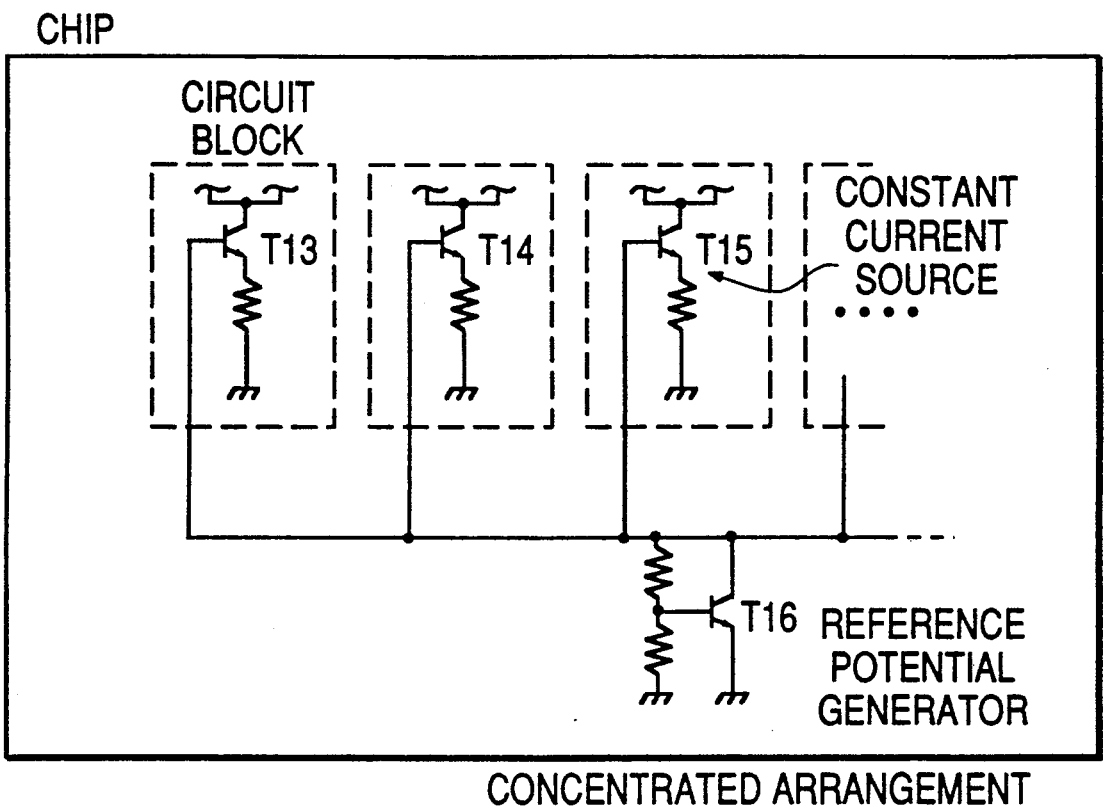
Figure 61B:
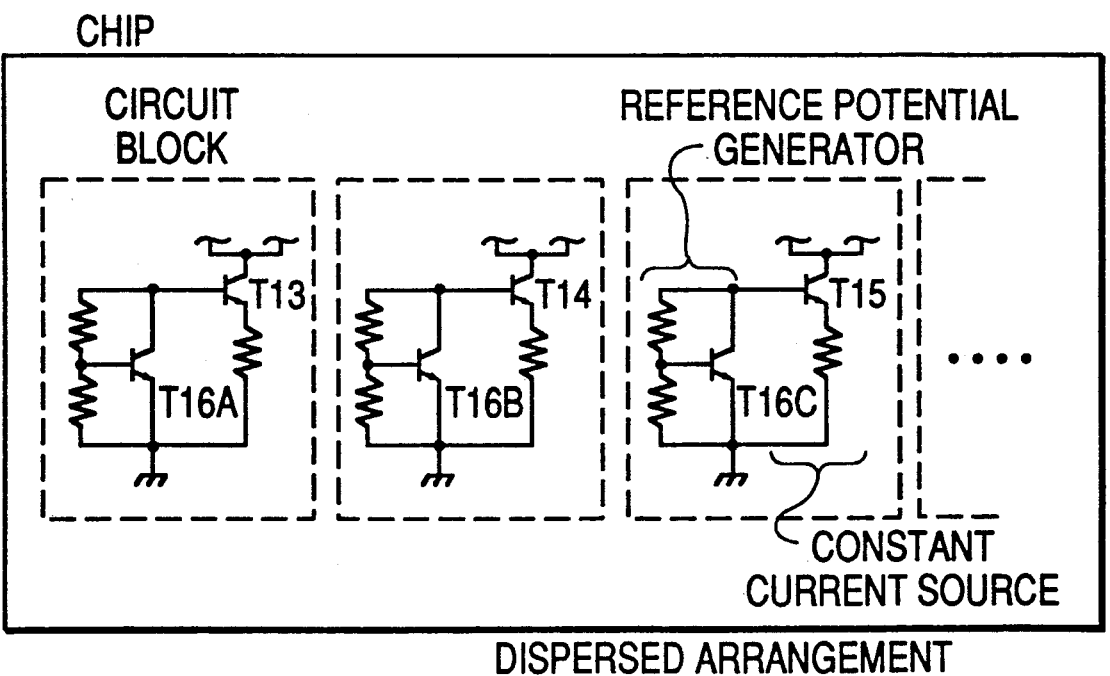
Figure 62A:
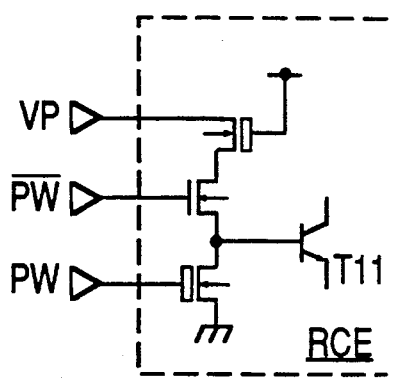
Figure 62B:
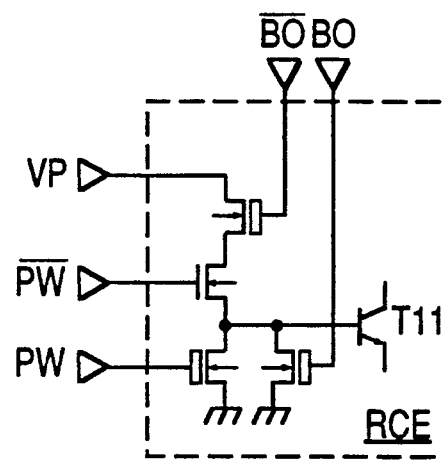

In the semiconductor integrated circuit device composed basically of the ECL circuit according to the prior art, the reference potential generator for supplying the reference potential to the aforementioned current source is provided commonly for the plural current sources, as exemplified in FIG. 61(a). As a result, the reference potential itself fluctuates in accordance with the voltage drop or the change in the operation current in the supply route so that the operation margin of the current switch circuit is dropped.

In the Bi.CMOS dynamic RAM of this embodiment, therefore, there are prepared a plurality of reference potential generators which are provided for the individual current sources and disposed close to the corresponding current sources. As a result, it is possible to shorten the layout distance from each reference potential generator to the current source and to prevent the fluctuations of the reference potential, which might otherwise be caused by sharing the reference potential generator among other current sources. As a result, the operation margin of the current switch circuit is enlarged to stabilize the operation of the Bi.CMOS dynamic RAM.

(8) Power Trunk Lines

Figure 53:
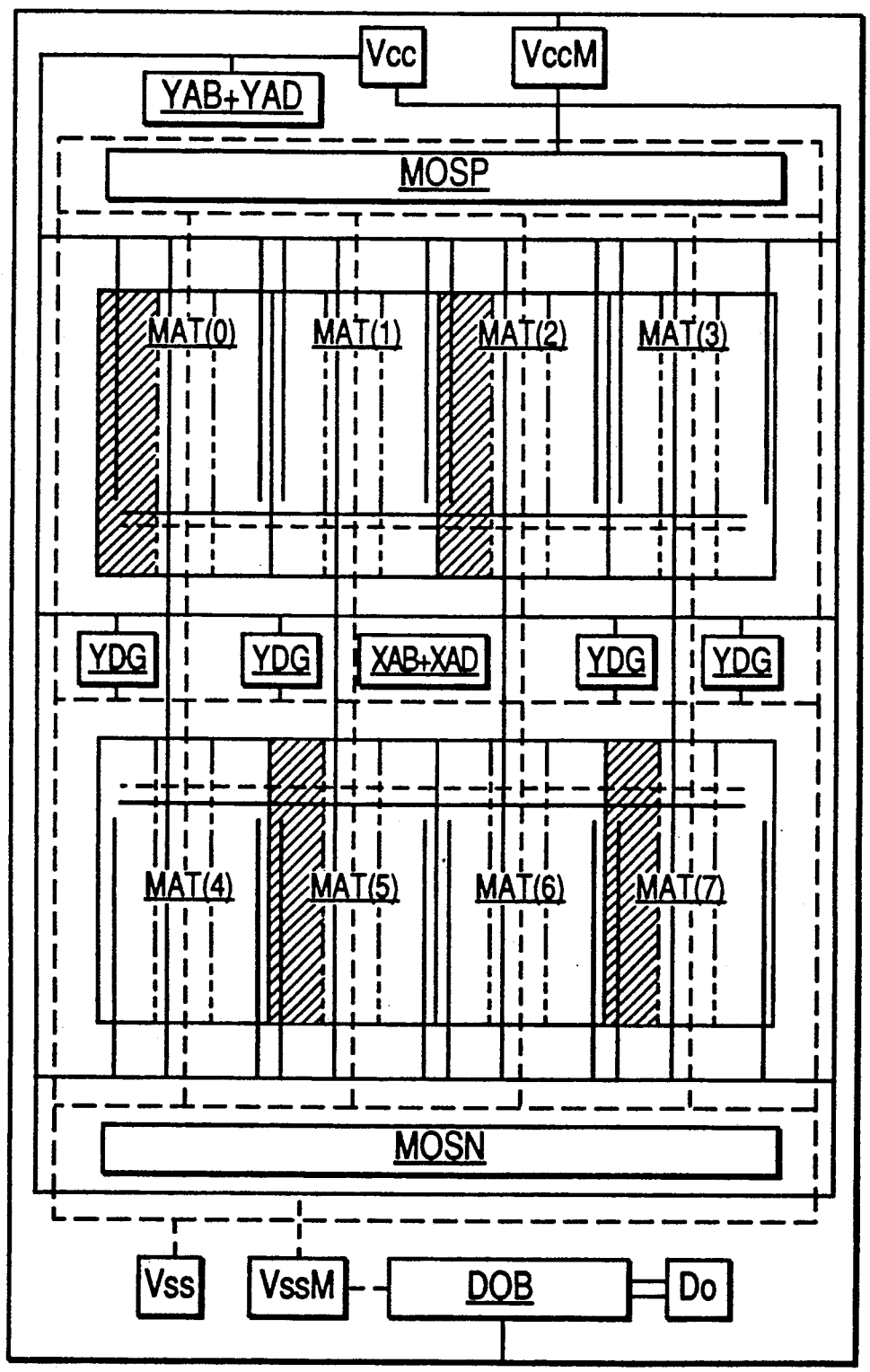
FIG. 53 is a power trunk line diagrams showing one embodiment.

FIG. 53 is a diagram showing the power trunk lines of one embodiment of the Bi.CMOS dynamic RAM of FIG. 47. In FIG. 53, the power supply lines for transmitting the power voltage VCC of the circuit are indicated by solid lines, and the power supply lines for transmitting the ground potential VSS of the circuit are indicated by broken lines.

In FIG. 53, the power voltage VCC of the circuit to be supplied through the power voltage supply pad VCC is distributed through both a plurality of transverse power voltage supply lines, which are arranged along the upper peripheral circuit PHU, the middle peripheral circuit PHM and the lower peripheral circuit PHD, and two longitudinal power voltage supply lines which are arranged along the two longer sides of the semiconductor substrate for coupling the transverse power voltage supply lines together. The power voltage VCC of the circuit is further distributed to the individual memory mats through a plurality of power voltage supply lines which are branched from the aforementioned power voltage supply lines.

Likewise, the ground potential VSS of the circuit to be supplied through the ground potential supply pad VSS is distributed through both a plurality of transverse ground potential supply lines, which are arranged along the upper peripheral circuit PHU, the middle peripheral circuit PHM and the lower peripheral circuit PHD, and two longitudinal ground potential supply lines which are arranged along the two longer sides of the semiconductor substrate for coupling the transverse power voltage supply lines together. The ground potential VSS of the circuit if further distributed to the individual memory mats through a plurality of ground potential supply lines which are branched from the aforementioned ground potential supply lines.

On the other hand, power voltage VCC of the circuit to be fed through the power voltage supply pad VCCM is fed to the sense amplifier driving P-channel MOSFETs (MOSP) and the data output buffer DOB. Likewise, ground potential VSS of the circuit to be fed through the ground potential supply pad VSSM is fed to the sense amplifier driving P-channel MOSFETs (MOSN) and the data output buffer DOB. Thus, the power noises upon other peripheral circuits can be suppressed to stabilize the operations by separating the power voltage supply lines and the ground potential supply lines for the sense amplifier driving MOSFETs having relatively high current changes and the data output buffer DOB.

In the Bi.CMOS dynamic RAM of this embodiment, although not shown in FIG. 53, the power voltage supply pad VCCR for the voltage generator VRE is separately provided to stabilize the internal voltage VRE, as has been described hereinbefore.

Here, the power supply lines such as the power voltage supply lines and the ground potential supply lines are formed of the two aluminum wiring layers AL1 and AL2 which are disposed in the semiconductor substrate. These aluminum wiring layers may be used as either the main word lines or the signal lines coupling the individual circuit elements. As a result, the power supply lines formed of the same aluminum wiring layers as those of the aforementioned signal lines may be intersected at several portions of the semiconductor substrate. At this time, as shown in FIG. 54(a), the power supply lines of the aluminum wiring layer AL1, which are intersected by the signal lines, are cut at a right angle and extended around the aluminum wiring layer AL2 through the through holes (contacts) TH. Then, the cut area is reduced to reduce the number of the through holes TH coupling the aluminum wiring layers AL1 and AL2. As a result, the substantial impedance of the power supply lines is increased to cause the power fluctuations.

Figure 54C:
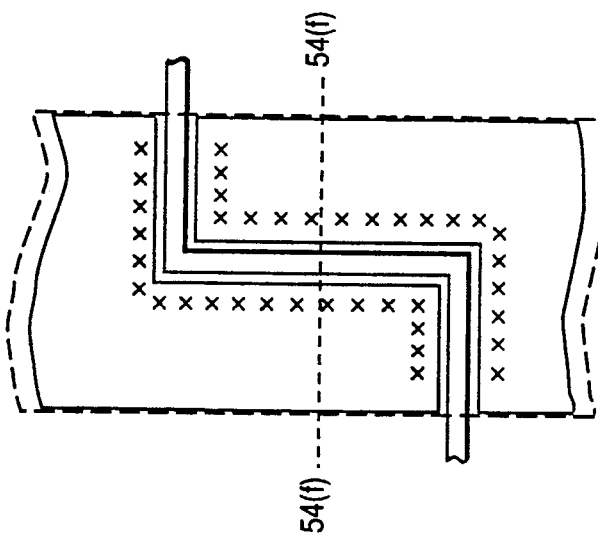
Figure 54F:
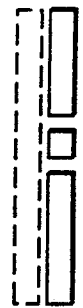
Figure 54B:
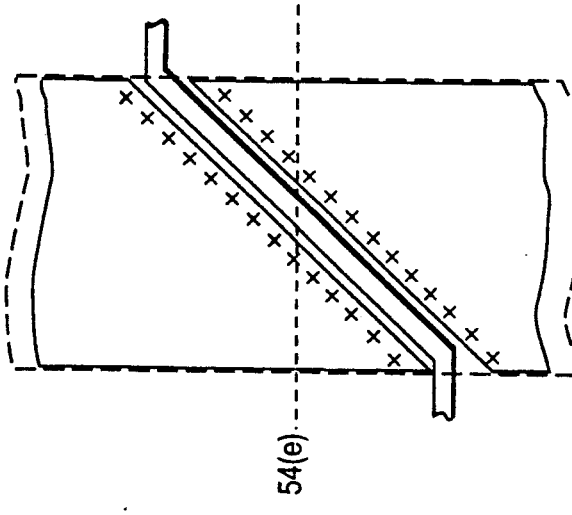
Figure 54E:
Figure 54A:
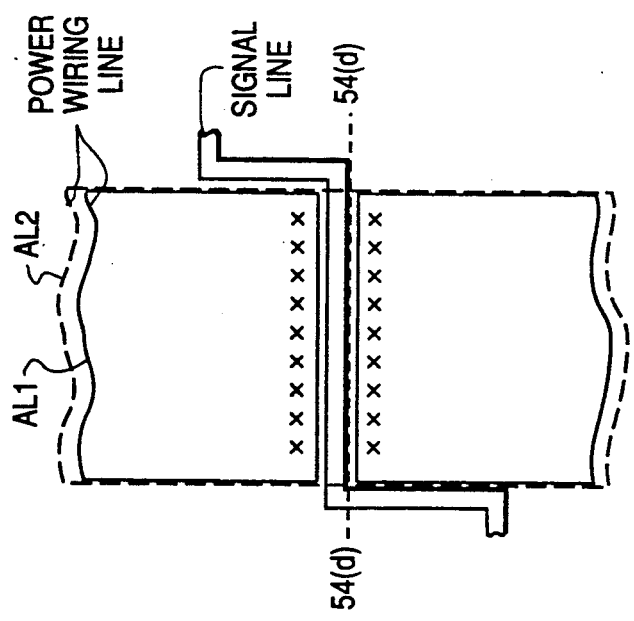
Figure 54D:
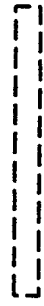
Figure 55:
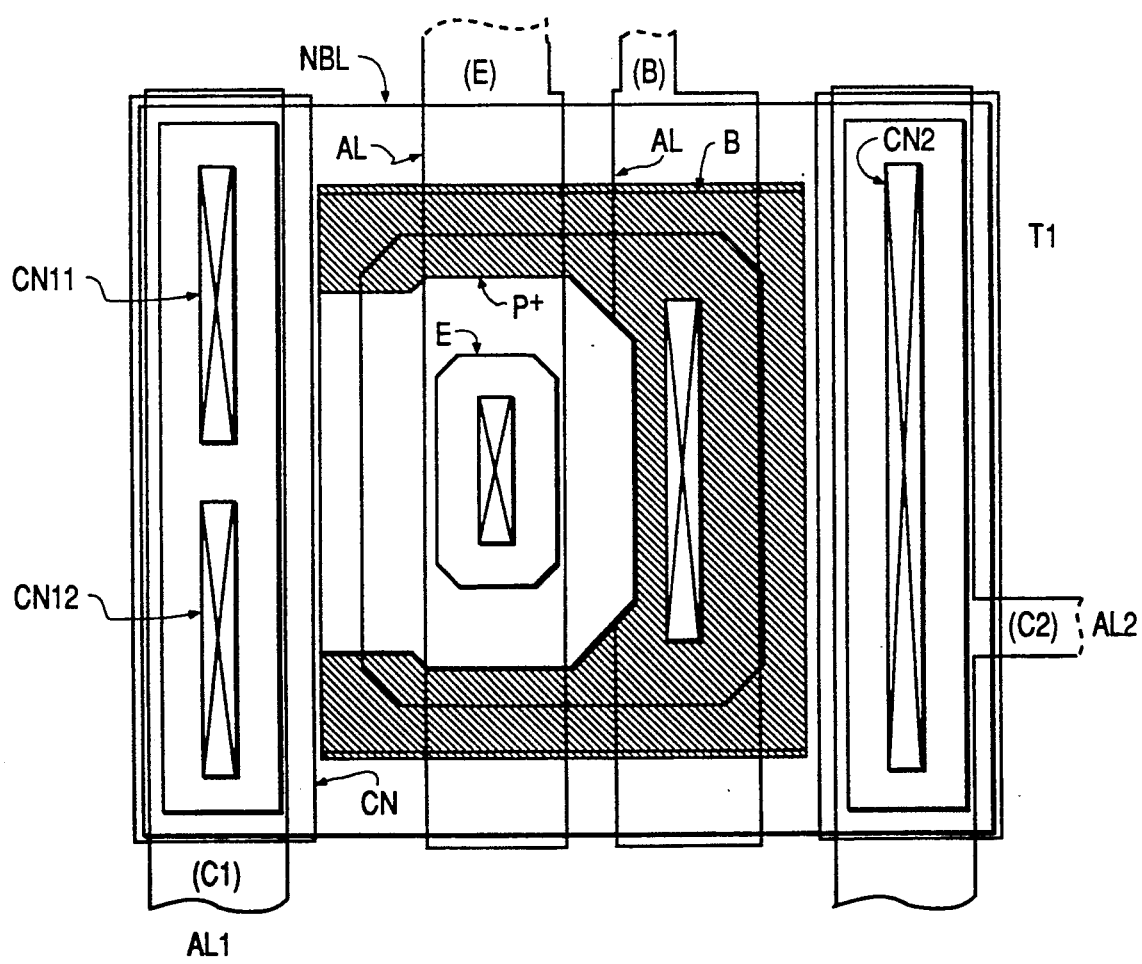
Figure 56:
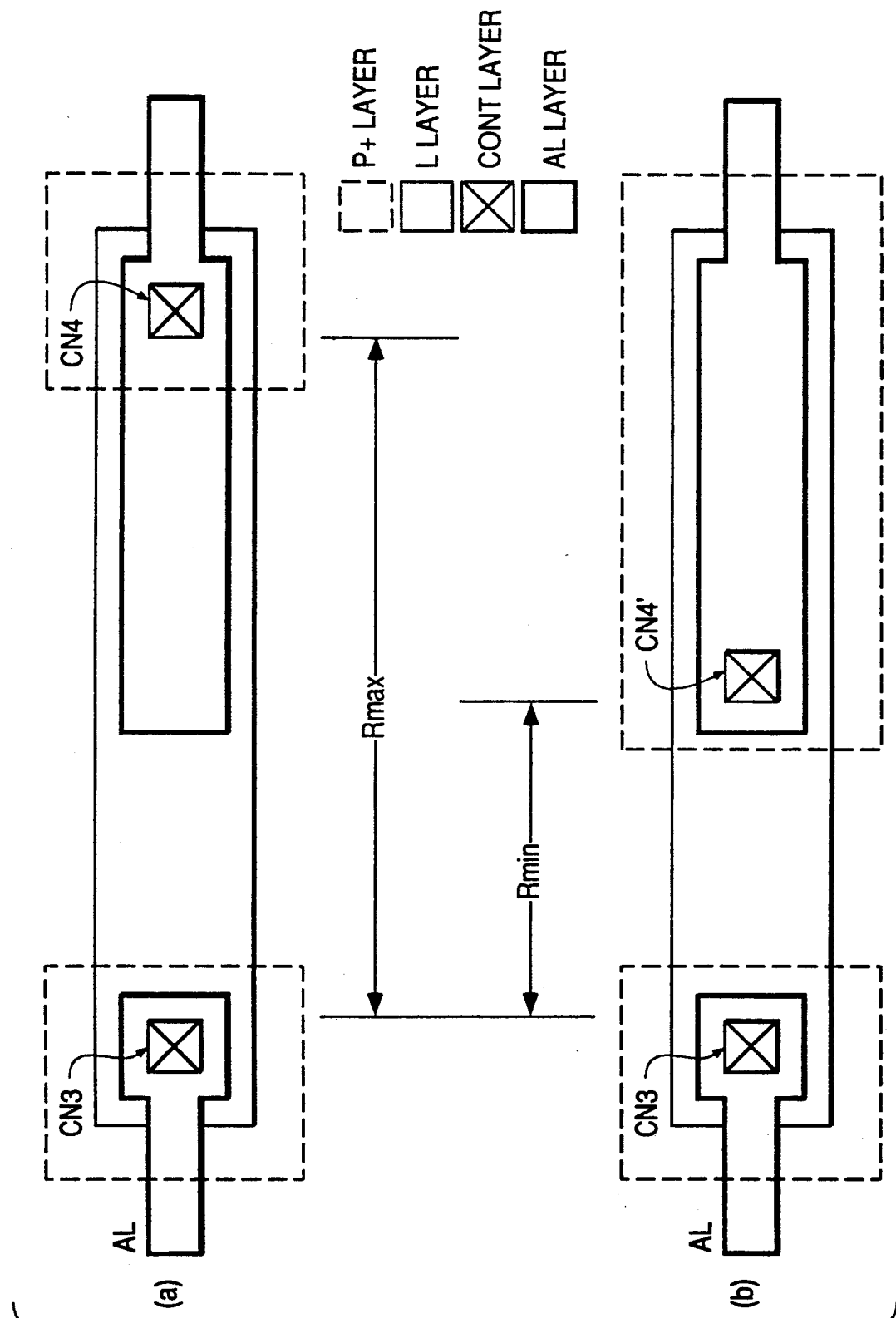

In order to cope with this, the Bi.CMOS dynamic RAM has its signal lines and power supply lines intersected generally obliquely, as shown in FIG. 54(b) or 54(c). As a result, the cut area of the power supply lines is increased, and the number of the through holes TH coupling the aluminum wiring layers AL1 and AL2 is increased. This suppresses the substantial impedance of the power supply lines and accordingly the power fluctuations.

(9) Main Signal Lines

This Bi.CMOS dynamic RAM has the start control signals such as the chip enable signal $\overline{CE}$ and is equipped with clock signal lines for distributing those start control signals to a plurality of peripheral circuits which are arranged at the center and along the individual shorter sides of the semiconductor substrate surface. These clock signals lines, i.e., the so-called main signal lines are transmitted over the plural memory mats, which are arranged at the upper and lower sides of the semiconductor substrate, and the memory arrays. As a result, the layout length of the main signal lines is elongated to augment the substantial impedance so that the noise margin of the corresponding clock signals is dropped.

In order to cope with this, in the Bi.CMOS dynamic RAM of this embodiment the internal control signal CE1, which is transmitted, as shown in FIG. 1, from the $\overline{CE}$ buffer CEB arranged at the lefthand lower side of the semiconductor substrate to the CE driver CEDD contained in the lower peripheral circuit PHD, the CE driver CEDM contained in the middle peripheral circuit PHM and the CE driver CEDU contained in the upper peripheral circuit PHU, is transmitted through the two signal lines, which are arranged at the two sides of the individual memory mats and memory arrays and along the individual longer sides of the semiconductor substrate. Moreover, these signal lines are commonly coupled in the aforementioned CE driver CEDM contained in the center portion of the semiconductor substrate, i.e., the middle peripheral circuit PHM. As a result, the substantial impedance of the main signal lines is dropped to enlarge the noise margin of the corresponding clock signals.

3.1.10. Test Method

This Bi.CMOS dynamic RAM, when finished, has a plurality of test modes to be executed through the external terminals and therefore is equipped with the test mode control circuit TEST and the test mode setting signal latch AF, as shown, for example, in FIG. 3.

The Bi.CMOS dynamic RAM is brought into the test mode set cycle, when the refresh control signal $\overline{RF}$ and the write enable signal $\overline{WE}$ are set to the low level prior to the chip enable signal $\overline{CE}$, as has been described hereinbefore with regard to FIG. 16. At this time, the test mode is selectively designated in accordance with the test mode setting signals fed through the address input terminals A9 to A15. When the chip enable signal $\overline{CE}$ is set to the low level, the test cycle is caused by a predetermined high voltage exceeding the power voltage of the circuit to the output enable signal input terminal OE, so that the substantial testing operations are started in the corresponding test mode.

Table 8 enumerates the test modes corresponding to the test mode setting signals prepared in the Bi.CMOS dynamic RAM. The summary and features of the test modes of the Bi.CMOS dynamic RAM of this embodiment will be described with reference to Table 8.

TABLE 8

| Setting Signal | Test Mode (Corresponding Test Control Signal) |
| --- | --- |
| A9 | Multi-bit Test Mode (TMB) |
| A10 | Counter Test Mode ($\overline{TCT}$) |
| A11 | Bar-in Test Mode (TBI) |
| A12 | VPL Stress Test Mode (TVPH) |
| A13 | Double Word Line Test Mode ($\overline{TDW}$) |
| A14 | Word Line Screening Test Mode (TWL) |
| A15 | Bit Line Screening Test Mode (TBL) |

(1) Multi-Bit Test Mode

The Bi.CMOS dynamic RAM is brought into the multi-bit test mode when the test mode setting signal to be fed through the address input terminal A9 is at the logic "1" in the test mode set cycle. If, in the test mode operation, the output enable signal OE is raised to the power voltage VCC of the circuit or higher, the test control signal TMB in the Bi.CMOS dynamic RAM is raised to the high level, but the input/output selection signals AZ0 to AZ7 are dropped to the low level. As a result, the read data of 8 bits outputted through the read amplifiers RA0 to RA7 from the eight memory cells adapted to be simultaneously brought into the selected states are transmitted to the multi-bit test circuit MBT, in which they are referred to the expected value data fed through the data input terminal DI. As a result, if all the read data of 8 bits are coincident with the expected value data, the output signals of the high level are sent out from the data output terminal DO. If the read data are different even by one bit from the expected value data, the output signals of the low level are sent out.

(2) Counter Test Mode

The Bi.CMOS dynamic RAM is brought into the counter test mode when the test mode set signal fed through the address input terminal A10 is set at the logic "1" in the test mode set cycle. After this, the output enable signal OE is raised to the power voltage VCC of the circuit or higher for the test mode operations. Then, in the Bi.CMOS dynamic RAM, the test control signal $\overline{TCT}$ is set to the low level, and the Y-activation signal YE is set at the high level even in the auto-refresh cycle. As a result, the Y-read and Y-write amplifiers can be brought into the operative states while the auto-refresh cycle is being executed. Thus, the predetermined read and write test operations can be performed while designating the addresses with the refresh counter RFC (formed by the unit counter circuits CT0 to CT8 shown FIG. 19). As a result, the normality of the operation of the refresh counter RFC can be tested and confirmed.

(3) Bar-in Test Mode

The Bi.CMOS dynamic RAM is brought into the bar-in test mode when the test mode set signal fed through the address input terminal A11 is set at the logic "1" in the test mode set cycle. After this, the output enable signal $\overline{OE}$ is raised to the power voltage VCC of the circuit or higher for the test mode operation. Then, in the Bi.CMOS dynamic RAM, the test control signal TBI is set at the high level, and the internal control signal $\overline{XC2}$ is set at the low level at a predetermined timing. Thus, the word line selection drive signals X0 to X3 are set altogether to the high level so that four word lines from every four memory arrays to be simultaneously brought into the operative states, i.e., totally sixteen word lies, are simultaneously brought into the selected states. As a result, the selection ratio of the word lines can be enhanced to accomplished an efficient screening.

Incidentally, in this bar-in test mode, the sixteen word lines are simultaneously brought into the selected states so that the current supply ability of the voltage generator VCH for forming the word line selection voltages becomes short. In the Bi.CMOS dynamic RAM of this embodiment, therefore, the aforementioned internal voltage VCH is supplied through the output enable signal input terminal $\overline{OE}$ to be fed with the test controlling high voltage.

(4) VPL Stress Test Mode

The Bi.CMOS dynamic RAM is brought into the VPL stress test mode when the test mode set signal to be fed through the address input terminal A12 is set to the logic "1" in the test mode set cycle. After this, the output enable signal $\overline{OE}$ is raised to the power voltage VCC of the circuit or higher for the test mode operation. Then, in the Bi.CMOS dynamic RAM, the test control signal TVPH is set at the high level, and the test control signal TVPG is set at the high level. As a result, the supply of the internal voltage HVC, i.e., the plate voltage VPL by the voltage generator HVC is interrupted, and the power voltage VCC of the circuit is fed in place as the aforementioned plate voltage VPL to the memory cells. Thus, the aging of the latching characteristics of the memory cells can be tested and confirmed by writing the memory cells at the low level to apply the VPL stress to the first oxide film.

(5) Double Word Line Test Mode

The Bi.CMOS dynamic RAM is brought into the double word line test mode when the test mode set signal fed through the address input terminal A13 is set to the logic "1" in the test mode set cycle. After this, the output enable signal $\overline{OE}$ is raised to the power voltage VCC of the circuit for the test mode operation. In the Bi.CMOS dynamic RAM, the test control signal $\overline{TDW}$ is set at the low level so that the internal control signal $\overline{XC1}$ is set to the low level whereas the test control signal TVPG is set to the high level. As a result, the supply of the plate voltage VPL to the memory cells by the voltage generator HVC is interrupted, and not only the designated word lines but also the redundancy word lines of the corresponding memory array, i.e., the redundancy word lines coupled to the data lines common with the aforementioned word lines are forcibly brought into the selected states. Thus, by inverting the logics of the storage data of the memory cells to be simultaneously brought into the selected states, the information latching abilities of the two memory cells can be compared to test and confirm the shortage of the capacity of the information storing capacitors.

Incidentally, in the Bi.CMOS dynamic RAM of this embodiment, two redundancy word lines RWL2 and RWL3 of the four redundancy word lines provided for each memory array are used for the aforementioned double word line test mode, although not especially limitative thereto.

(6) Word Line Screening Test Mode

The Bi.CMOS dynamic RAM is brought into the word line screening test mode when the test mode set signal fed through the address input terminal A14 is set at the logic "1" in the test mode set cycle. After this, the output enable signal $\overline{OE}$ is raised to the power voltage VCC of the circuit or higher for the test mode operation. Then, the test control signal TWL is set to the high level in the Bi.CMOS dynamic RAM. As a result, all the word lines of each memory array are coupled at their remote ends to the ground potential of the circuit and sequentially brought into the selected states to that they are fed with the test current. Thus, the screening with all the word lines being partially cut can be efficiently executed.

(7) Bit Line Screening Test Mode

The Bi.CMOS dynamic RAM is brought into the bit line screening test mode when the test mode set signal fed through the address input terminal A15 is set to the logic "1" in the test mode set cycle. After this, the output enable signal OE is raised to the power voltage VCC of the circuit or higher for the test mode operation. Then, the test control signal TBL is raised to the high level in the Bi.CMOS dynamic RAM. As a result, in each memory array, two sets of complementary bit lines arranged adjacent to each other and adapted to be simultaneously brought into the selected states are shortened, and the write data are sequentially set to give a shorting current. Thus, the screening with all the bit lines being partially cut can be efficiently executed.

Figure 46:
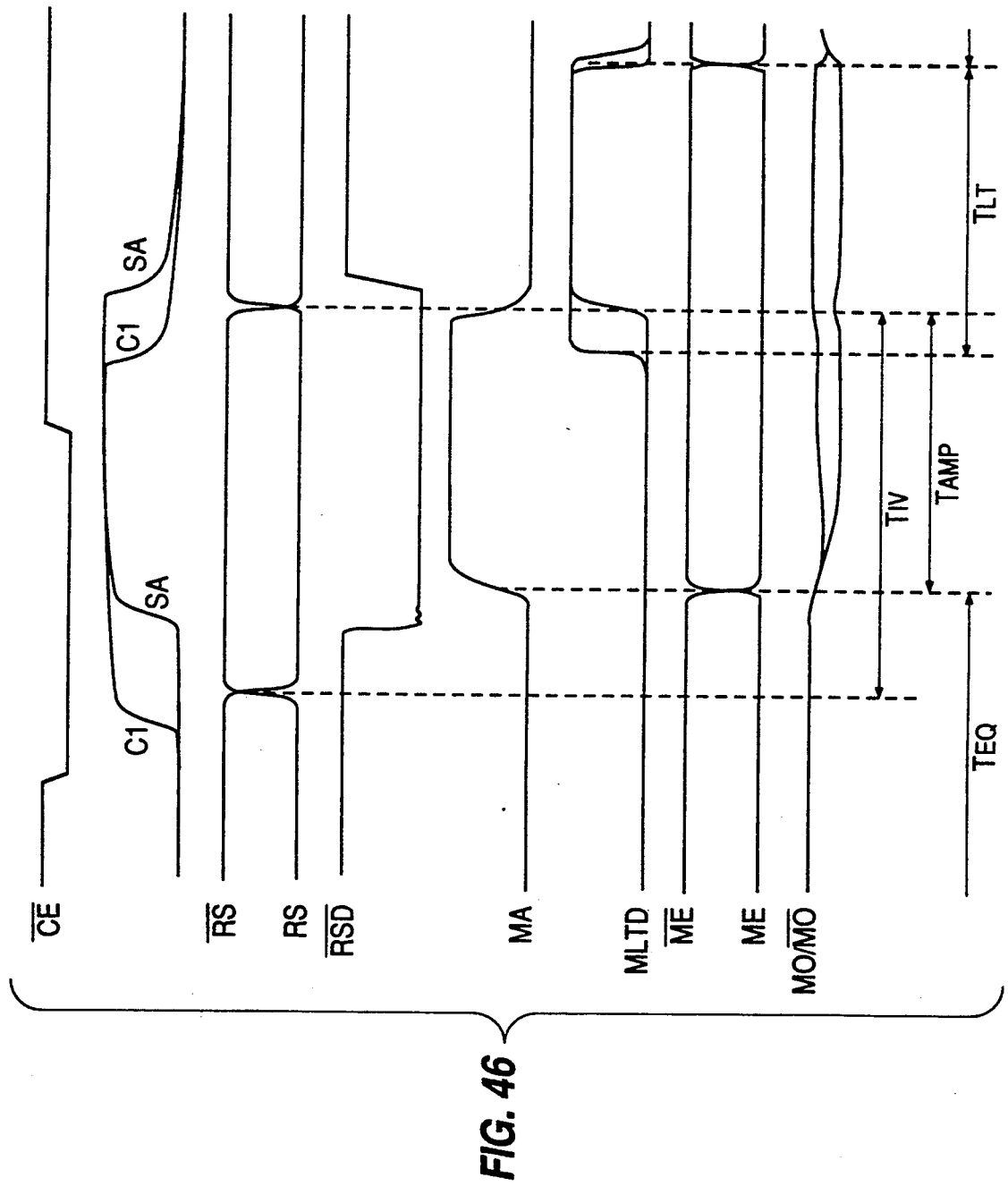

3.2. Specific Structures and Layouts of Individual Portions, and Their Operations and Features FIGS. 18 to 43 are circuit diagrams showing one embodiment of each portion of the Bi.CMOS dynamic RAM to which is applied the present invention. On the other hand, FIGS. 44 to 46 are waveform charts showing one embodiment of the signal waveforms used in the aforementioned Bi.CMOS dynamic RAM. The specific structures and layouts of the individual portions of the Bi.CMOS dynamic RAM of this embodiment and their operations and features will be described with reference to the above-specified Figures. In the circuit diagrams of FIG. 18 to FIG. 43, the individual portions are illustrated to have the so-called hierarchy structures. In case the individual portions have complicated structures, the overall block structures of the individual portions are shown at first, and the specific circuit structures of the individual functional units are exemplified without any overlap. The signal waveform charts of FIGS. 44 to FIG. 46 should be referred to, if necessary.

3.2.1. Memory Mats

The Bi.CMOS dynamic RAM of this embodiment is equipped with a total of eight paired memory mats MAT0 and MAT4 to MAT3 and MAT7, as has been described hereinbefore. These paired mats are symmetrically arranged across the X-selection circuits which are arranged at the center of the semiconductor substrate and through which these extend a total of four sets of corresponding write common I/O lines and read common I/O lines.

Each of the memory mats MAT0 to MAT7 is equipped, as shown in FIG. 26, with one Y-decoder YD and a pair of memory arrays ARYL and ARYR which are symmetrically arranged across the Y-decoder YD, although not especially limitative thereto. Further included are: the Y-decoder drive circuit YDG provided for the Y-decoder YD; the two X-decoders XD provided for the individual memory arrays; the word line precharge signal generator WPH; the bit line precharge signal generator PC; and two sets of common source line switch circuits SWF and SWN. These memory mats are united as the component units of the Bi.CMOS dynamic RAM, as has been described hereinbefore, and are selectively brought into the operative states, when the corresponding array selection signal ASL (e.g., AS0L or AS1L) or ASR (e..g, AS0R or AS1R) is set to the high level, so that they execute a series of operations necessary for writing, reading or refresh the storage data in the self-control manners.

(1) Memory Arrays

The memory arrays ARYL and ARYR constituting each memory mat are equipped, as shown in FIG. 28, with: 128 word lines WL0 to WL127 and 4 redundancy word lines RWL0 to RWL3 which are arranged in parallel with the vertical direction of the same Figure; and 512 sets of complementary bit lines BL0 to BL511 and 4 sets of redundancy complementary bit lines RBL0 to RBL3 which are arranged in parallel with the horizontal direction. To the intersections of these word lines and complementary bit lines, there are coupled with a predetermined regularity the dynamic memory cells which are composed of the information storing capacitors and the address selecting MOSFETs.

The word lines composing the memory arrays are coupled at one side to the corresponding X-decoder XD so that they are alternatively brought into the selected states. At the other side, the word lines are coupled to the ground potential of the circuit through the N-channel MOSFETs having gates for receiving the test control signal TWL. This test control signal TWL is selectively raised to the high level when the Bi.CMOS dynamic RAM is in the word line screening test mode, as has been described hereinbefore, so that all the word lines of the memory array are earthed to the ground potential of the circuit.

On the other hand, as shown in FIG. 28, the complementary bit lines composing the memory array are coupled at one side to the corresponding unit circuit of the P-sense amplifier P-SA. At the other side, the complementary bit lines are coupled to the corresponding unit circuits of the N-type sense amplifier N-SA and the data line precharge circuit. Moreover, two sets of the complementary bit lines are selectively connected with the write common I/O lines WIOA and WIOB or the read common I/O lines RIOA and RIOB through the corresponding write switch MOSFETs or the read switch MOSFETs. At this time, the write common I/O lines WIOA and WIOB are directly connected with the designated complementary bit lines through the corresponding write switch MOSFETs. The read common I/O lines RIOA and RIOB are indirectly connected through the gates of the corresponding read switch MOSFETs. These respective connections can be seen, for example, in FIGS. 28 and 60. As a result, each of the read common I/O lines forms a current signal corresponding to the read signal which is established on the designated complementary bit signal.

Thus, the memory array of the Bi.CMOS dynamic RAM is divided into sixteen arrays substantially in the extending direction of the bit lines because it is divided at first into eight memory mats, which is then divided into halves. As is well known in the art, the amount of the fine read signal on the bit lines is substantially proportional to the ratio of CB/CS of the bit line parasitic capacity CB to the capacity CS of the information storing capacitor composing the memory cell, thereby to determine the access time TACS of the Bi.CMOS dynamic RAM. As a result, the structure of the Bi.CMOS dynamic RAM is optimized by taking the so-called bit line division system, in which the memory array is divided in the extending direction of the bit lines, as has been described hereinbefore, so that the access time can be shortened.

Figure 70A:
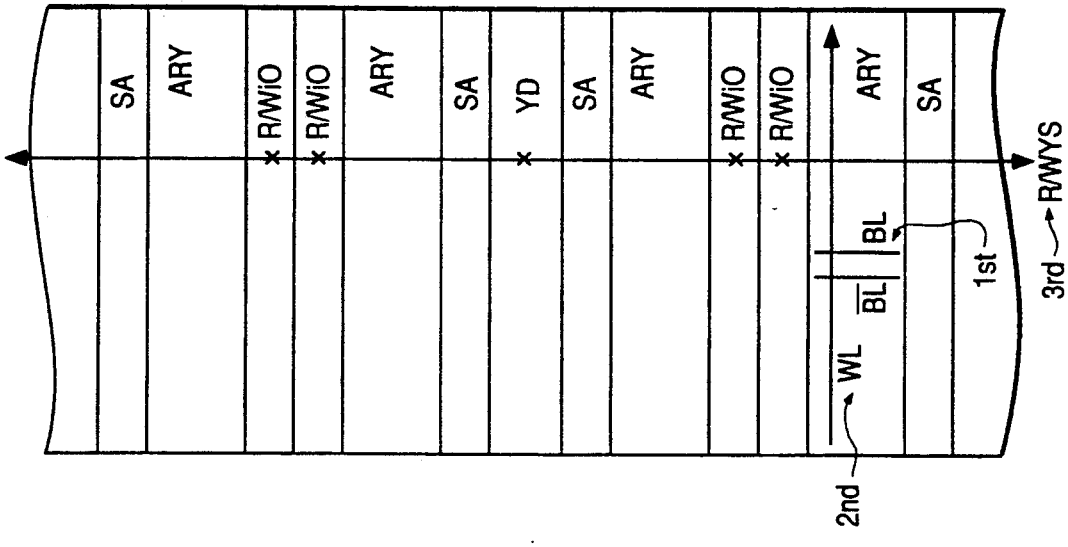

In this Bi.CMOS dynamic RAM, moreover, the individual complementary bit lines are connected indirectly and selectively with the read common I/O lines through the gates of the corresponding switch MOSFETs. Therefore, the memory arrays of this embodiment do not take the so-called shared sense system, in which the individual complementary bit lines are directly coupled to the corresponding switch MOSFETs not through the shared sense MOSFETs, for example. As shown in FIG. 70(a), moreover, there are provided for each memory array ARY the sense amplifiers SA, the write common I/O lines WIO and the read common I/O lines RIO, and the corresponding Y-decoder YD is disposed in their middle. As a result, the substantial capacity of the complementary bit lines is dropped to retaining a sufficient signal amount in the read common I/O lines. In other words, the optimum solution for this Bi.CMOS dynamic RAM having the common I/O lines divided for different applications is not to take the shared sense system.

Figure 70B:
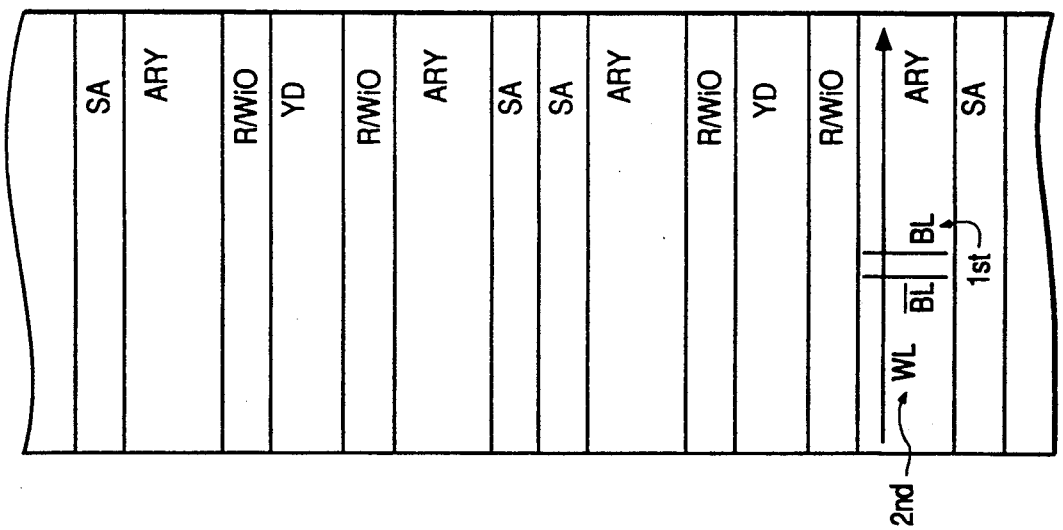
Figure 71A:
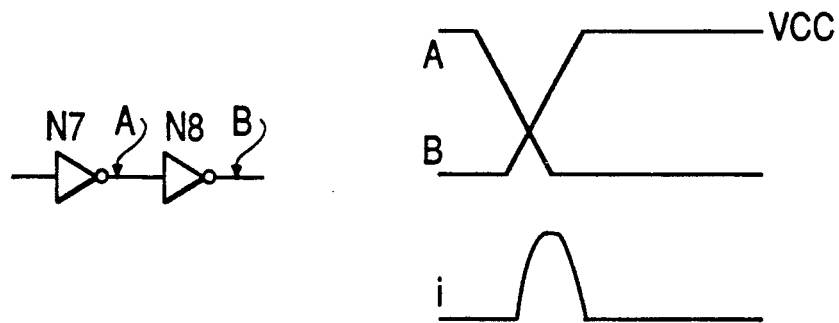
Figure 71B:
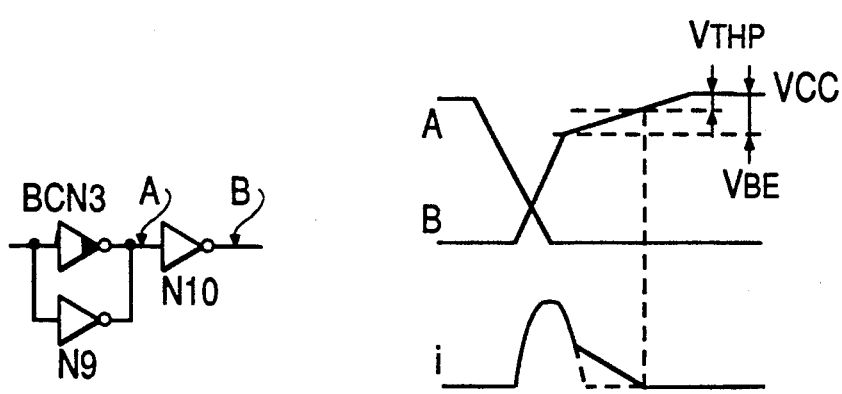
Figure 71C:
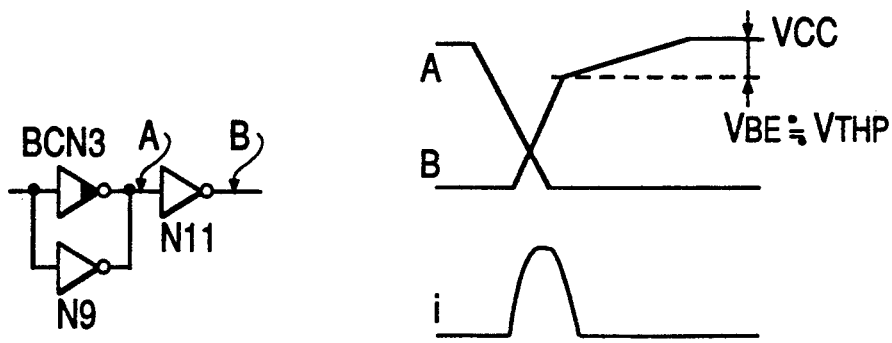

Incidentally, so far as the drop of the layout efficiency caused by the unemployment of the shared sense system is concerned, a method of activating a plurality of units, which are composed of the memory arrays ARY, the corresponding sense amplifiers, the write common I/O lines and the read common I/O lines, selectively with the common bit line selection signals and unit selection signals can be conceived by arranging those units at the two sides of the Y-decoder YD, as shown in FIG. 70(b).

(2) Sense Amplifiers

As shown on the left side of FIG. 28, a unit circuit of the P-type sense amplifiers P-SA contained in each memory array is composed of two P-channel MOSFETs of cross connections. These MOSFETs have their commonly connected gates and drains coupled to the corresponding complementary bit lines and their sources coupled commonly to the common source line PP.

Likewise, as shown in the middle of FIG. 28, a unit circuit of the N-type sense amplifiers N-SA contained in each memory array is composed of two N-channel MOSFETs having their gates and drains connected crossly to each other. These MOSFETs have their commonly connected gates and drains coupled to the corresponding complementary bit lines and their sources coupled commonly to the common source line PN. As a result, each unit circuit of the N-type sense amplifier N-SA constitutes one sense amplifier unit amplifier together with the corresponding unit circuit of the P-type sense amplifier P-SA. These unit amplifiers are selectively brought into the operative states when the common source line PP is fed with the power voltage of the circuit whereas the common source line PN is fed with the ground potential of the circuit. In these operative states, each unit amplifier amplifies the fine read signals, which are outputted from the plural memory cells coupled to the selected word lines through the corresponding complementary bit lines, to form a binary read signal at the high or low level.

(3) Common Source Line Switch Circuit and Sense Amplifier Drive Circuit

The common source line switch circuits SWF and SWN contain two pairs of P-channel MOSFETs and N-channel MOSFETs which are selectively turned on in accordance with the corresponding array selection signal $\overline{AS}$, as shown in FIG. 26, although not especially limitative thereto. Specifically, when the corresponding array selection signal $\overline{AS}$ is at the high level whereas the corresponding memory array is not in the selected state, the terminals PN1 and PPF and the terminals PP1 and PNF of the common source line switch circuit SWF are crossly connected, and the terminals PNN and PP2 and the terminals PPN and PN2 of the common source line switch circuit SWN are also crossly connected. When, on the contrary, the corresponding array selection signal $\overline{AS}$ is set to the low level so that the corresponding memory array is brought into the selected state, the corresponding terminals PN1 and PNF and terminals PP1 and PPF of the common source line switch circuit SWF are connected in parallel, and the terminals PNN and PN2 and terminals PPN and PP2 of the common source line switch circuit SWN are also connected in parallel.

In this embodiment, the eight memory mats MAT0 to MAT7 are respectively paired, as has been described hereinbefore, and the aforementioned common source lines PP and PN are arranged to extend through the paired two memory mats, i.e., memory arrays. Moreover, the common source line PP and PN extending through the corresponding two memory arrays are commonly coupled outside of the upper memory arrays, i.e., at the terminals PP1 or PN3 of the corresponding common source line switch circuit SWF, as shown in FIG. 1. Of these, the common source line PP, i.e., the terminal PP1, is further coupled to the power voltage supply pad VCCM through the P-channel type three sense amplifier drive MOSFETs. The gates of these drive MOSFETs are fed with the corresponding sense amplifier drive signals SA1 to SA3 from the sense amplifier drive circuit SAP.

Likewise, the common source lines PP and PN extending through the corresponding two memory arrays are commonly coupled outside of the lower memory arrays, i.e., at the terminal PP3 or PN1 of the corresponding common source line switch circuit SWF. Of these, the common source line PN, i.e, the terminal PN1 is further coupled to the ground potential supply pad VCCM through the N-channel type two sense amplifier drive MOSFETs. The gates of these drive MOSFETs are fed with the corresponding sense amplifier drive signals SA1 and SA2 from the sense amplifier drive circuit SAN, as shown in FIG. 1.

On the other hand, the common source lines PP and PN extending through the corresponding two memory arrays are commonly coupled at the middle of the corresponding two memory arrays, i.e., at the terminals PPN2 and PN2 and further coupled to the input terminal of the common source line equalize circuit PSS. This common source line equalize circuit PSS is composed, as shown in FIG. 30, of: an N-channel MOSFET, which is connected between the aforementioned common nodes PP2 and PN2 to have a relatively large conductance; and an N-channel connected between the aforementioned common node PP2 and the internal voltage supply point HVC to have a relatively small conductance. These MOSFETs are selectively turned on, when the Bi.CMOS dynamic RAM is brought into the unselected state, to short the aforementioned common nodes PP2 and PN2 and to precharge them to the level of the aforementioned internal voltage HVC.

Incidentally, the aforementioned sense amplifier drive signals SA1 to SA3 and SA1 to SA2 are formed under predetermined timing conditions by the sense amplifier drive signal generator SA and the sense amplifier drive circuits SAP and SAN, as shown in FIG. 30. Specifically, when the word line selection drive signals X0U to X3U and X0D to X3D or the redundancy word line selection drive signals XR0U to XR3U and XR0D to XR3D are alternatively set to the high level and when the internal control signal C1M is set to the high level, the sense amplifier drive signal generator SA raises the sense amplifier drive signal SA to the high level. This sense amplifier drive signal SA is sequentially delayed or inverted to the corresponding aforementioned sense amplifier drive signals SA1 to SA3 or SA1 or SA2 by the sense amplifier drive circuits SAP and SAN. When the sense amplifier drive signals SA1 to SA3 are sequentially set to the low level and when the sense amplifier drive signals SA1 to SA2 are sequentially set to the high level, the corresponding sense amplifier drive MOSFETs are sequentially turned on.

Thus, the power voltage and ground voltage of the circuit are supplied in such a normal polarity exclusively to the common source lines PP and PN, on which the corresponding array selection signal AS is set to the high level so that the corresponding memory array is brought into the selected state, namely, the common source lines PP and PN, on which the corresponding common source line switch circuits SWF and SWN are connected in parallel, as to bring the corresponding sense amplifiers P-SA and N-SA into the operative states, so that the corresponding memory arrays are brought into the so-called selected states. Moreover, the common source lines PP and PN, with which are connected the corresponding common source line switch circuits SWF and SWN in the so-called crossed manner, are fed with the power voltage and ground voltage of the circuit in the opposite polarity so that the corresponding memory arrays are brought into the so-called unselected states. At this time, those common source lines PP and PN equivalently act as the power supply lines.

(4) Bit Line Precharge Circuit and Bit Line Precharge Signal Generator

The unit circuit of the bit line precharge circuit contained in each memory array is composed, as exemplified in FIG. 28, of: one N-channel MOSFET which is connected between the non-inverted signal line and inverted signal line of each complementary bit line to have a relatively large conductance; and another N-channel MOSFET which is connected between the non-inverted signal line of each complementary bit line and the internal voltage HVC supply line to have a relatively small conductance. These MOSFETs have their gates fed commonly with the bit line precharge signal $\overline{PC}$ from the bit line precharge signal generator PC.

These two MOSFETs composing each unit circuit of the bit line precharge circuit are selectively turned on when the aforementioned bit line precharge signal $\overline{PC}$ is set at the high level. As a result, the non-inverted and inverted signal lines of each complementary bit line are shorted to have their potentials precharged to the level of the internal voltage HVC, i.e., about one half of the power voltage VCC of the circuit.

Figure 27B:
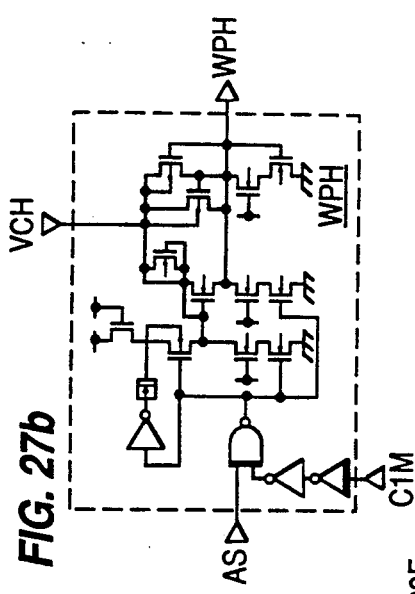
Figure 27C:
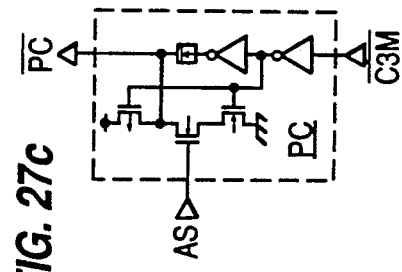
Figure 27A:
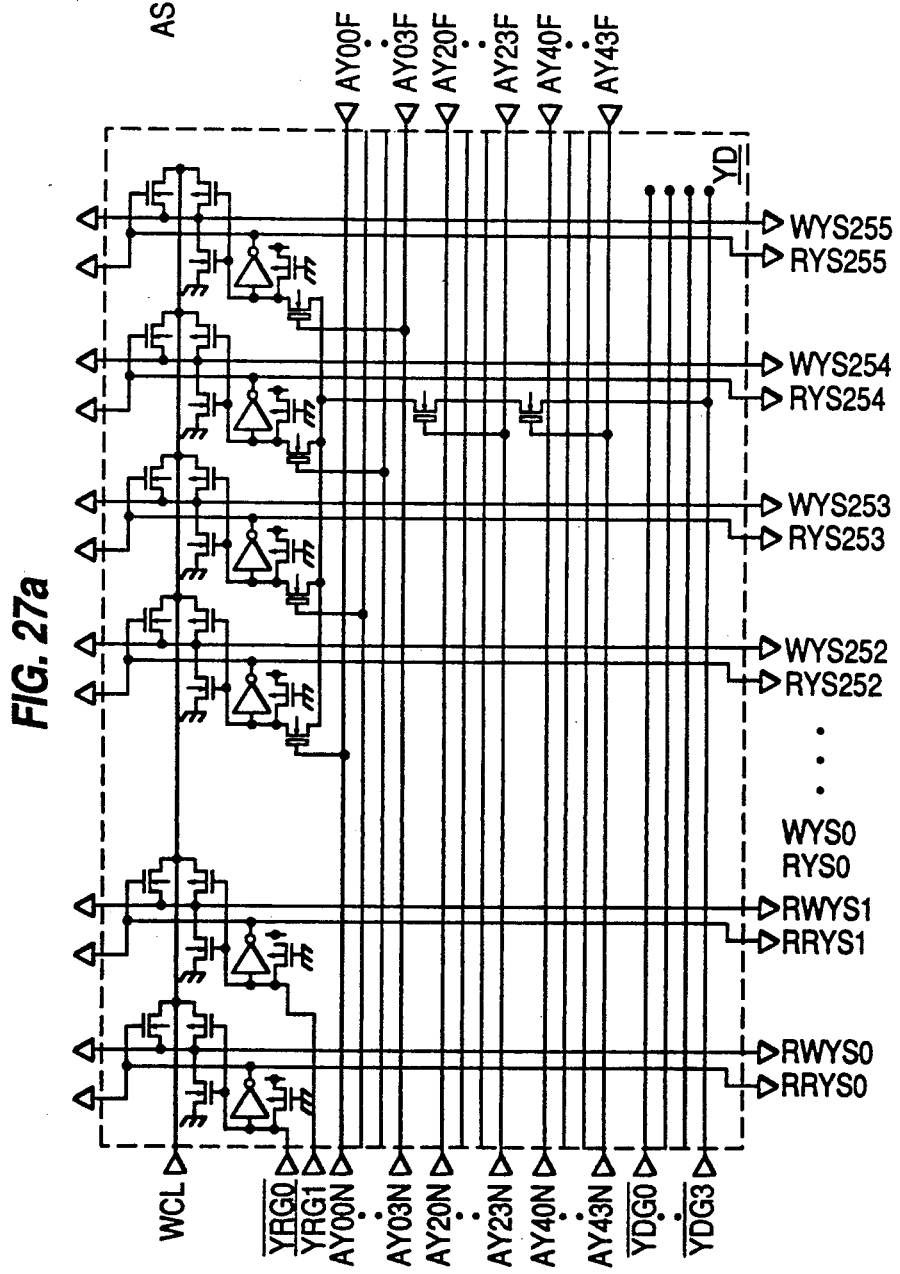

Incidentally, the aforementioned precharge signal $\overline{PC}$ is given the high level such as the power voltage VCC of the circuit when the Bi.CMOS dynamic RAM is brought into the non-selected state, as is apparent from the precharge signal generator PC of FIGS. 27 and 84(a). Moreover, the precharge signal PC is set at first to the level of one half of the power voltage VCC of the circuit, i.e., the same level as that of the internal voltage HVC by the charge share between the capacitor C1 and the parasitic capacity of the precharge signal line $\overline{PC}$, when the Bi.CMOS dynamic RAM is brought into the selected state, and is then selectively set to the low level such as the ground potential of the circuit when the corresponding array selection signal AS is raised to the high level. As a result, the control of the precharge MOSFETs are speeded up so that the reading operations of the Bi.CMOS dynamic RAM are accordingly speeded up.

On the other hand, the MOSFETs composing the unit circuit of the precharge circuit are made to have a predetermined conductance matching the high level of the precharge signal $\overline{PC}$ so that their physical sizes are determined. Moreover, the sizes of the MOSFETs determines the load amount of the precharge signal $\overline{PC}$ and exerts influences upon the necessary layout area of the memory array. As shown in FIG. 84(b), therefore, there is prepared a second precharge signal $\overline{PCH}$ which is selectively and temporarily raised to a high voltage such as the internal voltage VCH in response to the array selection signal AS in the memory access just before at the initial state when the Bi.CMOS dynamic RAM is brought into the non-selected state, and there is provided another precharge MOSFET which is turned on that precharge signal $\overline{PCH}$. According to this method, the conductance, i.e., size of the MOSFET is reduced about one half of that of the precharge MOSFET of the prior art because the aforementioned precharge signal $\overline{PC}$ is used as the internal voltage VCH for a while. In accordance with this, moreover, the size of the partner precharge MOSFET is also reduced to reduce the necessary layout area of the memory array.

(5) X-Decoder and Word Line Drive Circuit

The X-decoder is equipped, as shown in FIG. 29, with: thirty two word line drive circuits WD provided for each word line group, i.e., the four word lines of the memory array; and decoder circuits provided for the aforementioned word line group having thirty two outputs, although not especially limitative thereto. Those word line drive circuits WD are fed commonly with the word line selection drive signals X0 to X3 and the aforementioned word line selection voltages such as the internal voltage VCH and the internal control signal WPH.

The X-decoder XD is further equipped with another word line drive circuit WD which is provided for four redundancy word lines. This word line drive circuit WD is fed with the redundancy word line selection drive signals XR0 to XR3 and the aforementioned word line selection voltage, i.e., the internal voltage VCH and the internal control signal WPH. The input terminal D of the word line drive circuit WD is fed with the inverted signal of the inverted internal signal $\overline{XDG}$, i.e., the corresponding array selection signal AS, although not especially limitative thereto.

Here, the word line selection drive signals X0 to X3 are alternatively set to the high level in accordance with the complementary inner address signals B0 and B1 of less significant 2 bits, as will be described hereinafter, when the Bi.CMOS dynamic RAM is brought into the selected state and when the word line selection operations can be accomplished. Moreover, the redundancy word line selection drive signals XR0 to XR3 are selectively raised to the high level at the predetermined timing, as will be described hereinafter, when the addresses inputted upon the memory accesses are coincident with the bad addresses assigned to the corresponding redundancy word lines. As has been described hereinbefore, moreover, the internal voltage VCH has its absolute value set at a predetermined high voltage exceeding that of the write signal amplitude in the complementary data lines. On the other hand, the internal control signal WPH is set to the low level such as the ground potential of the circuit, when the Bi.CMOS dynamic RAM is brought into the non-selected state so that the corresponding array selection signal AS and internal control signal C1M are set to the low level, and is set to the high voltage such as the internal voltage VCH when the Bi.CMOS dynamic RAM is brought into the selected state so that both the corresponding array selection signal As and internal control signal C1M are set to the high level, as shown in FIG. 27.

On the other hand, the decoder unit circuit of the X-decoder XD includes: an inverter circuit N9 connected between the input terminal D and internal node n1 of the corresponding word line drive circuit WD; and two decoder MOSFETs QN18 and QN19 connected in series between the aforementioned internal node N1 and the inverter circuit N8. Of these, the MOSFET QN19 is shared by eight decoder unit circuits to form the so-called decoder tree. The gates of the MOSFETs QN18 and QN19 are fed with the predecode signals AX20 to AX27 and AX50 to AX53, respectively, in a correspondingly predetermined combination. As a result, the output signal of each unit circuit of the X-decoder XD, i.e., the input signal D of the word line drive circuit WD is selectively set to the high level on condition that the corresponding array selection signal AS is at the high level and that the predecode signals AX20 to AX27 and AX50 to AX53 are set altogether to the high level in a corresponding predetermined combination.

Each word line drive circuit WD of the X-decoder XD includes four unit circuits which are provided for four word lines composing the corresponding word line group, as exemplified in FIG. 29. Each of these unit circuits includes, although not especially limitative thereto: a P-channel type (i.e., first conductivity type) MOSFET QP15 (i.e., first MOSFET) connected between the word line WL0 and the wordline selection voltage supply point, i.e., the internal voltage VCH supply point; and an N-channel type (i.e., second conductivity type) MOSFET QN23 (i.e., second MOSFET) connected between the aforementioned word line WL0 and the ground potential (i.e., second power voltage) of the circuit and having its gate coupled commonly to the gate of the aforementioned MOSFET QP15, i.e, the internal node n2. Between this internal node n2 and the internal voltage VCH supply point, there is connected a P-channel MOSFET QP13 which has its gate fed with the aforementioned internal control signal WPH (i.e., precharge control signal). In parallel with this MOSFET QP13, moreover, there is connected a P-channel MOSFET QP14 (i.e., fourth MOSFET) which has its gate coupled to the corresponding aforementioned word line WL0. Between the aforementioned internal node n2 and the ground potential of the circuit, moreover, there is connected an N-channel MOSFET QN20 (i.e., switch means) which is selectively turned on when the aforementioned input signal D is set at the high level and when the corresponding aforementioned word line selection drive signal X0 or the like is set at the high level.

From these, the aforementioned unit circuit of the word line drive circuit WD sets the corresponding word lines WL0 to WL3 selectively to the selection level such as the internal voltage VCH when the input signal D is at the high level, when the corresponding word line selection drive signals X0 to X3 are at the high level and when the internal control signal WPH is at the high voltage such as the internal voltage VCH. The MOSFET QP14 constitutes a positive feedback circuit for stabilizing the word line levels.

The word line drive circuits WD provided for the redundancy word lines accomplish similar operations, in accordance with the corresponding array signal AS and redundancy word line selection drive signals XR0 to XR3, to set the redundancy word lines RWL0 to RWL3 alternatively to the selection level such as the internal voltage VCH.

Figure 73A:
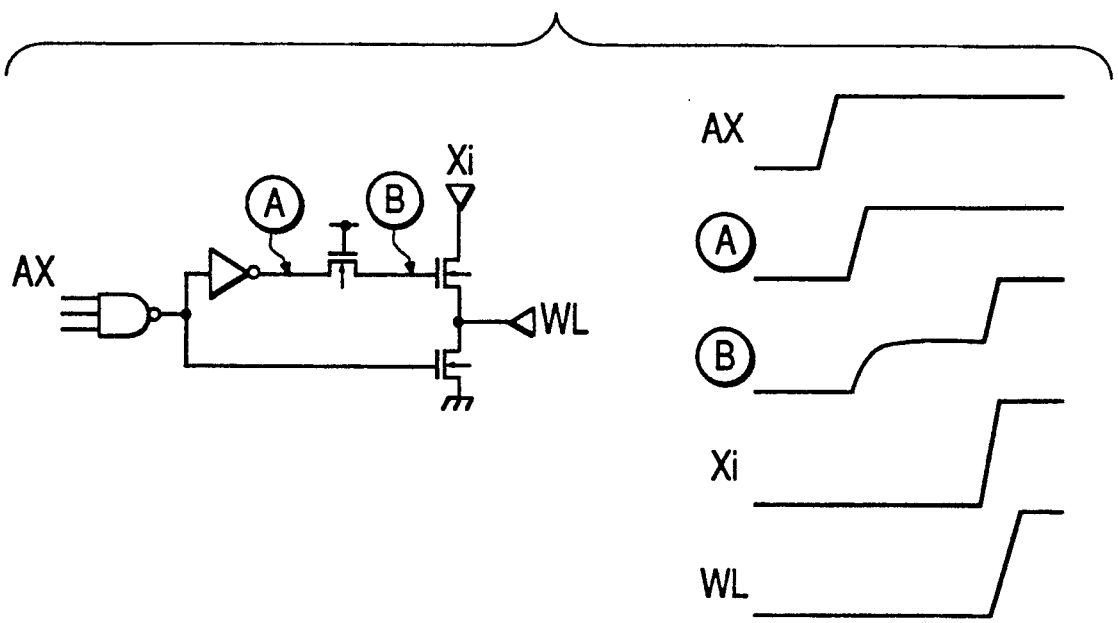
Figure 73B:
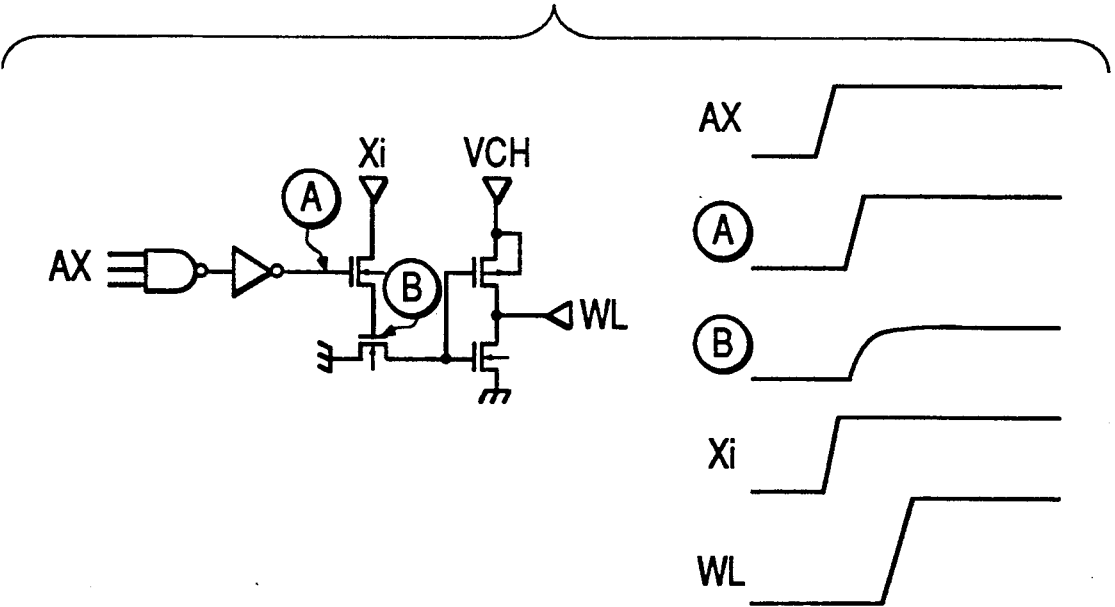
Figure 74B:
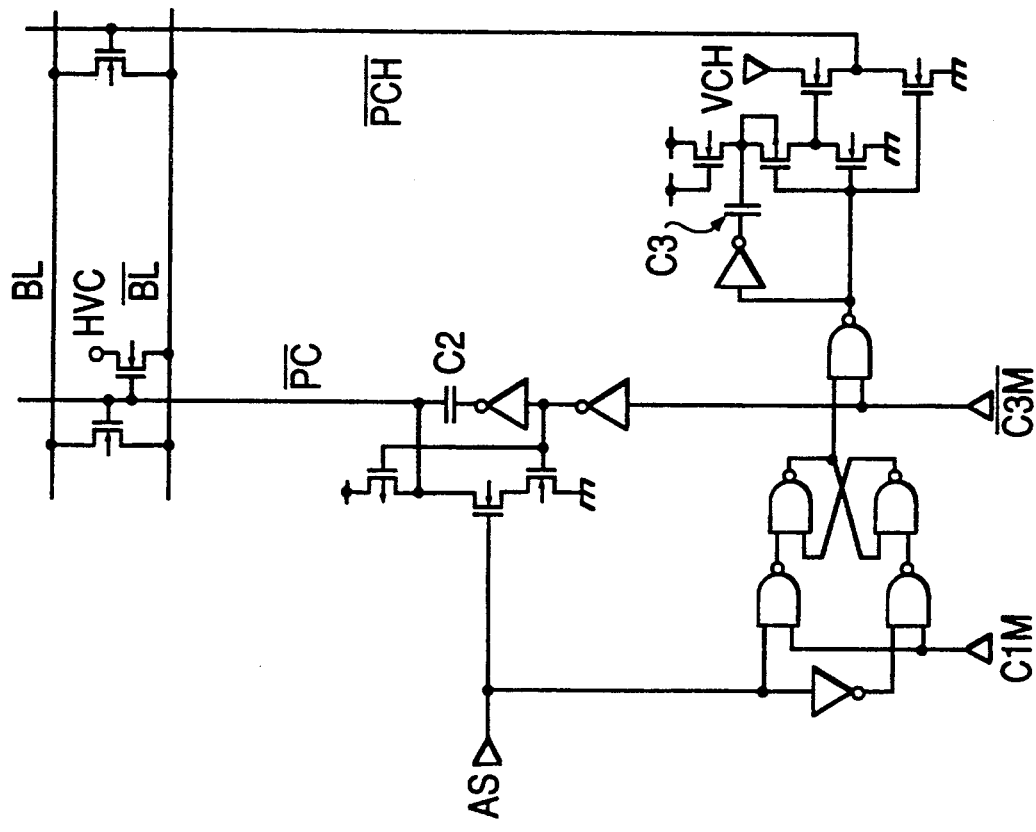
Figure 74A:
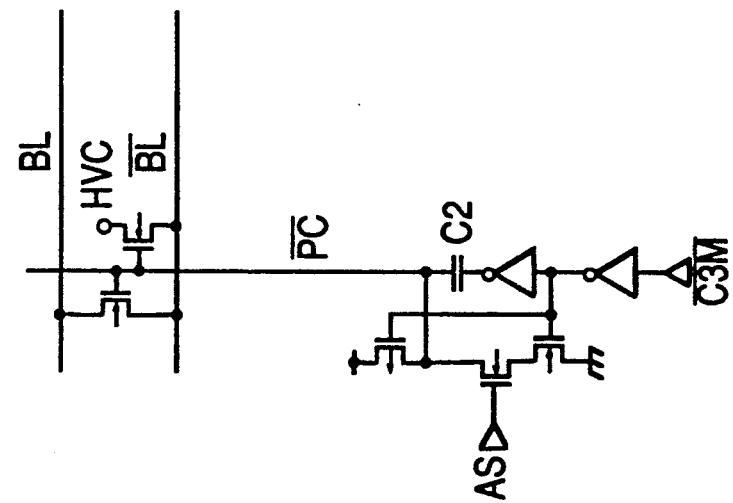

As shown in FIG. 73(b), there is taken the so-called static word line selection system, in which the internal voltage having an absolute value exceeding that of the amplitude of the write signal on the complementary data lines, i.e., the word line selection voltage is alternatively transmitted to the designated word line. As a result, the word line selection operations of the Bi.CMOS dynamic RAM are speeded up more by the time period for the boost operations and the transmission delay time of the word line selection drive signal X1 than the dynamic RAM of the prior art, in which the word line selection drive signal X1 is formed by the boost capacity, as shown in FIG. 83(a), so that the access time is accordingly shortened.

(6) Y-decoder

Each memory array of this Bi.CMOS dynamic RAM is equipped with 512 sets of complementary bit lines and 4 sets of redundancy complementary bit lines, as has been described hereinbefore. Every two sets of the complementary bit lines are paired and are selectively connected with the write common I/O lines WIOA and WIOB when the corresponding write data line selection signals 1WYS0 to WYS255 or RWYS0 and RWYS1 are alternatively set to the high level by the Y-decoder YD. The two sets of the complementary bit lines are selectively connected with the read common I/O lines RIOA and RIOB when the corresponding read bit line selection signals RYS0 to RSY255 or RRYS0 and RRYS1 are alternatively set to the high level.

The Y-decoder YD is provided, as shown in FIG. 27, for two sets of complementary bit lines, although not especially limitative thereto, and is equipped with: 256 bit line drive circuits, every four of which constitute a decoder unit circuit; and two bit line drive circuits provided for two sets of redundancy complementary bit lines. These bit line drive drive circuits are fed with: the Y-decoder control signals $\overline{YDG0}$ to $\overline{YDG3}$ and the predecode signals AY00 to AY03, AY20 to AY23 and AY40 to AY43 in a corresponding predetermined combination; or selectively the corresponding Y-decoder control signal $\overline{YRG0}$ or $\overline{YRG1}$. Moreover, all the bit line drive circuits are fed commonly with the internal control signal WCL.

Here, the Y-decoder control signals $\overline{YDG0}$ to $\overline{YDG3}$ and $\overline{YRG0}$ and $\overline{YRG1}$ and the internal control signal WCL are formed by the Y-decoder drive circuit YDG. Specifically, the Y-decoder drive circuit YDG raises the aforementioned internal control signal WCL to the high level, as shown in FIG. 26, on condition that the internal control signals C1M and WG are at the high level, i.e., that the Bi.CMOS dynamic RAM is in the selected state in the write cycle, when the corresponding array selection signal ASL or ASR is at the high level. Moreover, the Y-decoder drive circuit YDG sets the aforementioned Y-decoder control signals $\overline{YDG0}$ to $\overline{YDG3}$ alternatively to the low level in accordance with the predecoded signals AY60 to AY63 on condition that the internal control signal YR is at the high level, i.e., that the address inputted upon the memory access is not coincident with the bad addresses assigned to any of the redundancy complementary data lines. Moreover, the aforementioned Y-decode control signals $\overline{YRG0}$ and $\overline{YRG1}$ are selectively set to the low level on condition that the corresponding internal signal YR0 or YR1 is at the high level, i.e, that the address inputted upon the memory access is coincident with the bad addresses assigned to the corresponding redundancy complementary bit lines.

The bit line drive circuit raises at first the read bit line selection signals RYS0 to RYS255 or RRYS0 and RRYS1 alternatively to the high level on condition that the corresponding aforementioned Y-decoder control signals $\overline{YDG0}$ to $\overline{YDG3}$ are at the low level whereas the predecode signals AY00 to AY03, AY20 to AY23 and AY40 to AY43 are raised altogether to the high level in the corresponding combination, or that the corresponding aforementioned Y-decoder control signal $\overline{YRG0}$ or $\overline{YRG1}$ is at the low level. In case the internal control signal WCL is set to the high level with a delay, the corresponding write bit line selection signals WYS0 to WYS255 or RWYS0 and RWYS1 are then alternatively set to the high level. As a result, the corresponding two sets of complementary bit lines of the memory arrays are connected at first with the read common I/O lines RIOA and RIOB and further selectively with the write common I/O lines WIOA and WIOB.

Figure 60A:
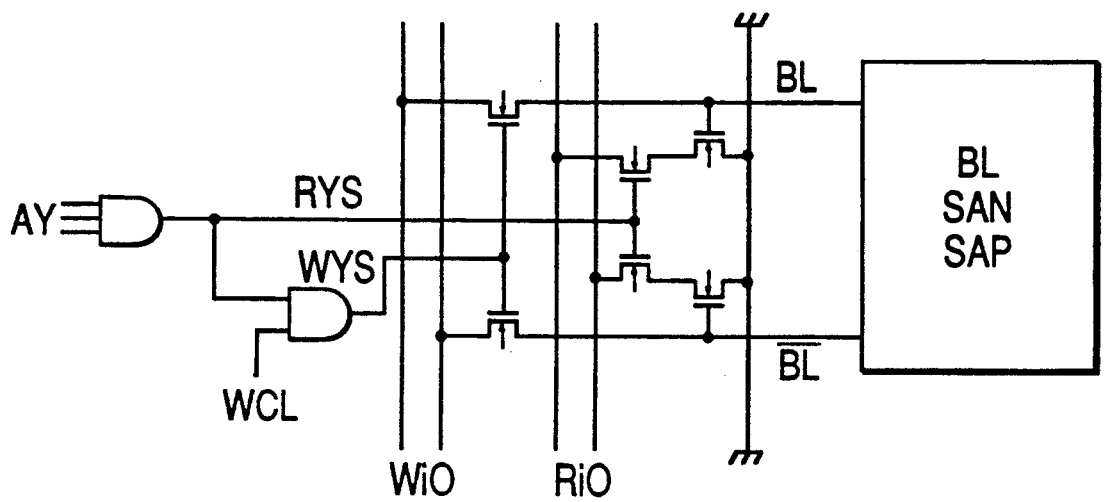
Figure 60B:
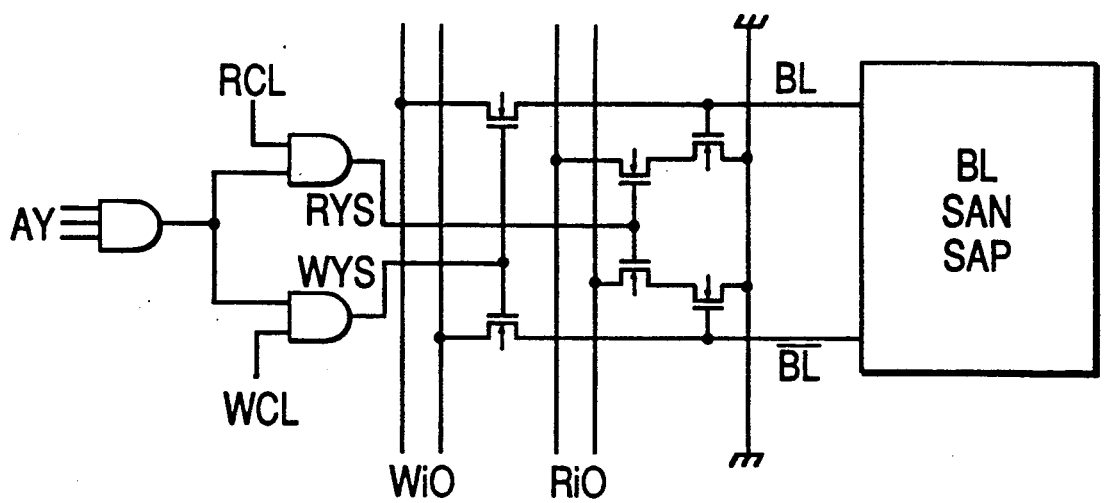

Incidentally, in the aforementioned Y-decoder YD, as conceptionally shown in FIG. 60(a), the read bit line selection signal YRS is formed independently of the operation cycle of the Bi.CMOS dynamic RAM, and the read common I/O lines are activated upon each access. As shown in FIG. 70(b), therefore, the read common I/O lines may be activated only in the read cycle by accomplishing the gate control of the read bit line selection signal RYS with the internal control signal RCL which is selectively set to the high level in the read cycle.

3.2.2. X-Selection Circuit (1) X-Address Buffer

The Bi.CMOS dynamic RAM is equipped with the X-address buffer XAB which is made receptive of X-address signals of 9 bits, i.e., the address signals A0 to A8. This X-address buffer XAB includes the refresh counter RFD, which is composed of the counter unit circuits CT0 to CT8, and is further equipped with nine buffer unit circuits AB0 to AB8 provided for the aforementioned X-address signals, as shown in FIG. 19. Of these, the input terminals IN of the buffer unit circuits AB0 to AB8 are coupled to the corresponding address input terminals A0 to A8, which produce output signals the complementary internal address signals B0 to B8. Moreover, these buffer unit circuits are commonly fed with the internal control signal $\overline{REF}$ and internal control signal $\overline{C2M}$ or $\overline{C2U}$, which are selectively set to the low level in the auto-refresh cycle. On the other hand, the counter unit circuits CT0 to CT8 have their input terminals $\overline{FR}$ fed commonly with the internal control signal $\overline{FR}$, which is set to the low level in a predetermined timing in the auto-refresh cycle, and its carry input terminal Ci fed sequentially with the carry output signals of the preceding counter unit circuit. The carry input terminal Ci of the counter unit circuit CT0 is coupled to the power voltage of the circuit. The output signals of the individual counter unit circuits are fed as the refresh address signals AR0 to AR8 to the corresponding aforementioned buffer unit circuits AB0 to AB8.

Figure 20:
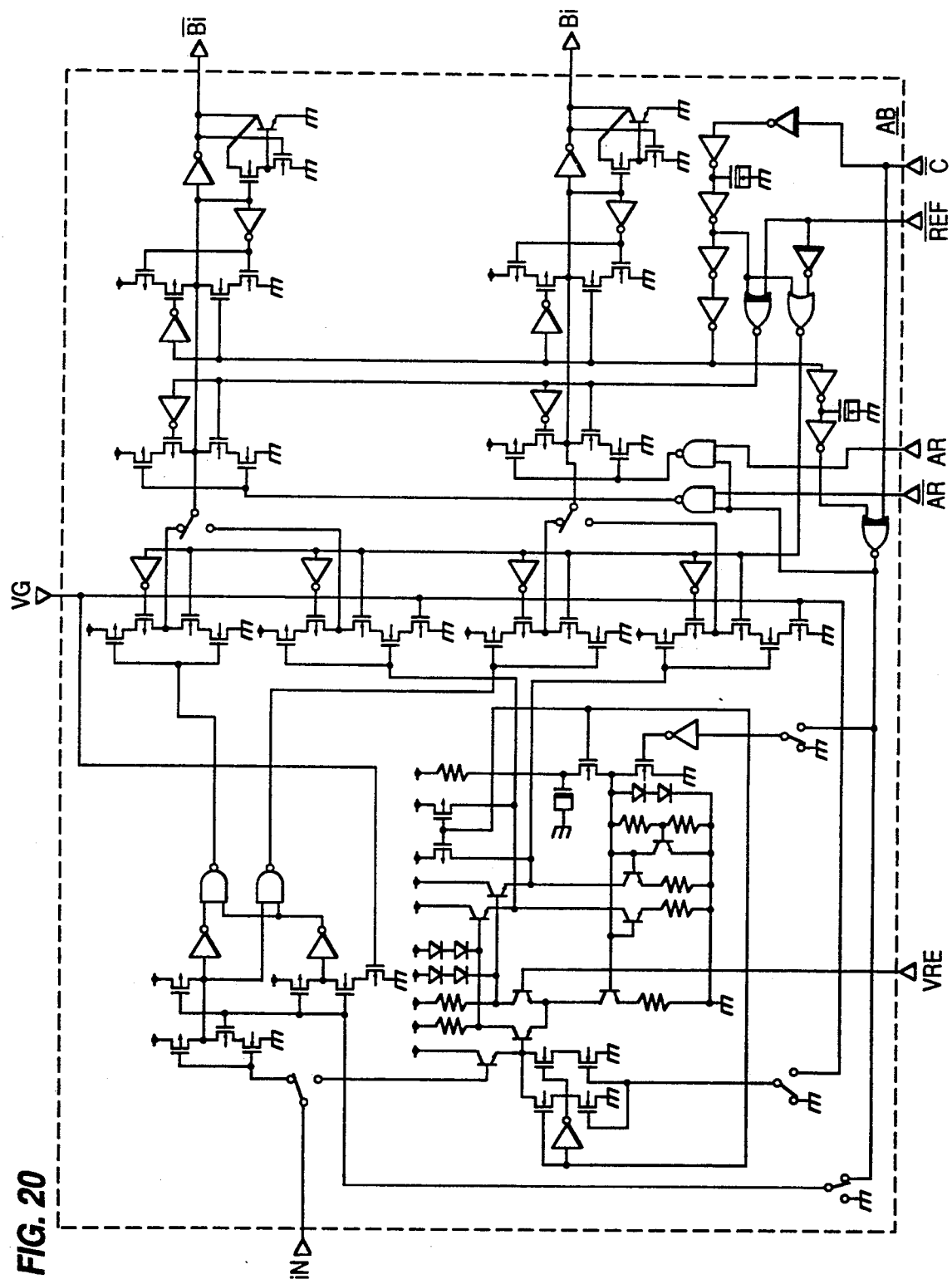

Each of the buffer unit circuits AB0 to AB8 composing the X-address buffer XAB includes, as exemplified in FIG. 20: two input circuits provided for the TTL and ECL levels; and a pair of multiplexers and latches for selectively transmitting the corresponding bits of the complementary output signals or aforementioned refresh address signals AR (AR0 to AR8) of those input circuits. Specifically, these multiplexers select the complementary output signals of the corresponding input circuit and transmit them to the succeeding latch circuit when the Bi.CMOS dynamic RAM is in the ordinary operation cycle so that the internal control signal $\overline{REF}$ is at the high level. The multiplexers further select the corresponding bits of the corresponding refresh address signals AR0 to AR8 and transmit them to the aforementioned latch circuits when the Bi.CMOS dynamic RAM is in the auto-refresh cycle so that the aforementioned internal control signal $\overline{REF}$ is in the low level. These latch circuits fetch and latch the address signals transmitted from the aforementioned multiplexers in accordance with the internal control signal C, i.e., the internal control signal C2M and so on. The output signals of these latch circuits are the corresponding complementary internal address signals B0 to B8.

Thus, the X-address signals A0 to A8 and the refresh address signals AR0 to AR8 are transmitted through the multiplexers, in which the plural clocked inverters circuits are substantially logically connected, so that the transmission delay time of the X-address signals can be shortened to speed up the access of the Bi.CMOS dynamic RAM.

On the other hand, the counter unit circuits CT0 to CT8 composing the X-address buffer XAB include a pair of master latches and slave latches connected in series, as exemplified in FIG. 21, although not especially limitative thereto. These latches advance step-by-step in accordance with the count-up internal control signal $\overline{FR}$ and carry input signal Ci to function as a binary counter of 1 bit. The counter unit circuits CT0 to CT8 function as the binary counters, i.e., refresh counters RFC, of 8 bits by having their carry output terminals and carry input terminals connected in series. The output signals of the master latches of the individual counter unit circuits are the corresponding refresh address signals AR0 to AR8.

FIG. 72 is a circuit diagram showing another embodiment of the aforementioned buffer unit circuit AB for the TTL interface. The individual bits of the X-address signals and the corresponding bits of the refresh address signals AR0 to AR8 are logically summed by the preceding circuit of the bipolar transistors composing the Bi.CMOS driver and are latched by the latch composed of the CMOS. As a result, the circuit structure of the buffer unit circuit AB is simplified to shorten the transmission delay time accordingly.

(2) X-Predecoder

The Bi.CMOS dynamic RAM is equipped with two sets of four X-predecoders XAD1, one set of eight X-predecoders XAD2 and one AX7, although not especially limitative thereto. Of these, two sets of X-predecoders XAD1 are fed with the complementary internal address signals B5 and B6, and B7 and B8 in combination of 2 bits, as shown in FIG. 22. Moreover, the X-predecoders XAD2 are fed with the complementary internal address signals B2 to B4, and the X-predecoder AX7 is fed with the complementary internal address signal B7.

The X-predecoder XAD1 is composed of a 2-input Bi.CMOS NOR gate circuit to raise the predecode signals AX50 to AX53, the array selection signals AS0L and AS0R, or AS1L and AS1R alternatively to the high level in accordance with the combination of the logical levels of the complementary internal address signals B5 and B or B7 and B8.

Likewise, the X-predecoder XAD2 is composed of a 3-input Bi.CMOS NOR gate to raise the predecode signals AX20 to AX27 alternatively to the high level in accordance with the combination of the logical levels of the complementary internal address signals B2 to B4. Moreover, the X-predecoder AX7 forms the complementary selection signal AX7W or AX7R selectively on the basis of the complementary internal address signal B7 and the Y-activation signal, i.e, the internal control signal YE.

(3) X-Redundancy Circuit, Word Line Drive Signal Generator, and Redundancy Word Line Drive Signal Generator The Bi.CMOS dynamic RAM is equipped, as has been described hereinbefore, with: the memory mats MAT0 to MAT3 and MAT4 to MAT7, four of which are paired and symmetrically arranged across the X-selection circuit disposed at the center of the substrate; and the total of sixteen memory arrays ARYL or ARYR which are paired to correspond to the individual memory mats. Moreover, each memory array is equipped with the four redundancy word lines RWL0 to RWL3 and the four sets of redundancy complementary bit lines RBL0 to RBL3. In this embodiment, these redundancy word lines and redundancy complementary bit lines are commonly switched in the so-called block retrieval system at the unit of the upper-side memory mats MAT0 to MAT3 or the lower-side memory mats MAT4 to MAR7, as has been described hereinbefore. Moreover, the switching of the redundancy word lines is accomplished at the unit of adjacent two word lines, and the switching of the redundancy complementary bit lines is likewise accomplished at the unit of adjacent two sets of complementary bit lines.

The X-redundancy circuit XR is equipped, as shown in FIG. 23, with: two X-redundancy selection circuits XRD0 and XRD1 which are provided for the redundancy word lines RWL0 and RWL1 or RWL2 and RWL3 of the upper-side memory mats MAT0 to MAT3; and two X-redundancy selection circuits XRD2 and XRD3 which are provided for the two redundancy word lines RWL0 and RWL1 or RWL2 an RWL3 of the lower-side memory mats MAT4 to MAT7. The X-redundancy circuit XR is further equipped with a total of eight word line drive signal generators X0 to X7 and redundancy word line drive signal generators XR0 to XR7, four of which are provided for the upper- and lower-side memory mats.

The X-redundancy selection circuits XRD0 to XRD3 are equipped, as shown in FIG. 24, with: one redundancy enable circuit RCE; and six redundancy address comparators RCA1 to RCA6 provided for the complementary internal address signals B1 to B6. Of these, the redundancy enable circuit RCE includes, as shown in FIG. 25: fuse means F1 to be selectively cut through the fuse cutting transistor T11; and the latch and the precharge circuit disposed at the downstream stage of the former.

The aforementioned fuse means F1 to be disposed in the redundancy enable circuit RCE is selectively cut when the corresponding X-redundancy selection circuit XRD0 to XRD3 are valid, namely, when bad addresses are assigned to the corresponding two redundancy word lines RWL0 and RWL1 or RWL2 and RWL3 of the upper- or lower-side memory mats. At this time, the output signals of the aforementioned latches circuits are raised to the high level. As a result, the redundancy enable circuit RCE has its detection nodes 10, 11 and 12 precharged to the high level such as the power voltage of the circuit in accordance with the precharge signal RDP. When the fuse means F1 is not cut, the output signals of the aforementioned latch circuits are set to the low level so that both the output terminals 13 and 14 of the redundancy enable circuit RCE are fixed at the high level.

The detection node 10 of the redundancy enable circuit RCE is coupled, as shown in FIG. 24, in parallel to the detection node of the corresponding six redundancy address comparators RCA1 to RCA6. Moreover, the detection nodes 11 and 12 of the redundancy enable circuit RCE are sequentially coupled in series to extend through every three detection nodes 21 and 22 of the corresponding six redundancy address comparators RCA1 to RCA3 or RCA4 to RCA6 and are coupled at their remote ends to the ground potential of the circuit.

Each of the redundancy address comparators RCA1 to RCA6 composing each X-redundancy selector includes the fuse means F2 which is to be selectively cut through the fuse selecting bipolar transistor T12, as exemplified in FIG. 25. At the downstream stage of the fuse means F2, there is disposed the latch circuit which has its output signal raised selectively to the logic "1" (which conveniently means that the output signal at the upper side of the latch circuit is at the high level whereas the output signal at the lower side is at the low level, like the following) when the aforementioned fuse means 2 is cut. Downstream of the latch circuit, there is disposed the address comparator for comparing and referring the complementary internal address signals B1 to B6 corresponding to the complementary output signals of the aforementioned latch circuit.

The aforementioned fuse means F2 disposed in the redundancy address comparator RCA is selectively cut, although not especially limitative thereto, when the corresponding bits of the bad addresses assigned to the corresponding X-redundancy selection circuits XRD0 to XRD3 are at the logic "1". At this time, the output signals of the aforementioned latch circuits are at the logic "1". As a result, the detection node 20 of the redundancy address comparator RCA is selectively coupled to the ground potential of the circuit when the output signals of the aforementioned latch circuits and the corresponding complementary internal address signals B1 to B6 are incoincident, i.e., when the corresponding bits of the aforementioned bad addresses and the corresponding bits of the address signals fed upon the memory access are incoincident.

Likewise, the detection nodes 21 and 22 of the redundancy address comparator RCA are selectively shorted when the output signals of the aforementioned latch circuits and the corresponding complementary internal address signals B1 to B6 are coincident, namely, when the corresponding bits of the aforementioned bad adresses and the corresponding bits of the address signals fed upon the memory access are coincident.

The detection node 10 of the aforementioned redundancy enable circuit RCE is coupled to the output terminal 10 of the corresponding X-redundancy selection circuits XRD0 to XRD3 as shown in FIG. 24. As can be analogized from the description thus far made, therefore, the level of the aforementioned output terminal 10 is selectively set to the low level and used as the so-called incoincidence detection signal on condition that the X-redundancy selection circuits are valid, that the any of the detection nodes 20 of the corresponding six redundancy address comparators RCA1 to RCA6 is coupled to the ground potential of the circuit, namely, that an incoincidence of 1 bit is present between the assigned bad addresses and the complementary internal address signals B1 to B6.

On the other hand, the detection nodes 11 an 12 of the aforementioned redundancy enable circuit RCE are coupled, as shown in FIG. 25, to the output terminals 13 and 14 of each X-redundancy selection circuit through the precharge MOSFET which are selectively turned on in accordance with the output signals of the corresponding latch circuits. As a result, the levels of those output terminals 13 and 14 are selectively set to the low level and used as the so-called coincidence detection signals when all the detection nodes 21 and 22 of the corresponding three redundancy address comparators RCA1 to RCA3 or RCA4 to RCA6 are shorted, namely, when the corresponding three bits of the assigned bad addresses and the complementary internal address signals B1 to B3 or B4 to B6 are coincident.

The output signal 10, i.e., the incoincidence detection signal of the X-redundancy selection circuits XRD0 and XRD1 is fed commonly to the input terminals IN1 and IN2 of the word line drive signal generators X0 to X3. Moreover, the output signal 10, i.e., the incoincidence detection signal of the X-redundancy selection redundancy circuits XRD2 and XRD3 is fed commonly to the input terminals IN1 and IN2 of the word line drive signal generators X4 to X7. On the other hand, the output signals 13 and 14, i.e., the coincidence detection signals of the X-redundancy selection circuits XRD0 and XRD1 are fed commonly to the input terminals IN1 and IN2 of the corresponding two redundancy word line drive signal generators XR0 and XR1 or XR2 and XR3. Moreover, the output signals 13 and 14, i.e., the coincidence detection signals of the X-redundancy selection circuits XRD2 and XRD3 are fed commonly to the input terminals IN1 and IN2 of the corresponding two redundancy word line drive signal generators XR4 and XR5 or XR6 and XR7.

The input terminals $\overline{XC2}$ and C1M of the aforementioned word line drive signal generators X0 to X7 are fed commonly with the internal control signals $\overline{XC2}$ and C1M. The input terminals Bi and Bj are fed with the complemetary internal address signals B0 and B1 in a corresponding predetermined combination. On the other hand, the input terminals C1M of the redundancy word line drive signal generators XR0 to XR7 are fed commonly with the aforementioned internal control circuit C1M. The input terminals redundancy $\overline{XC}$ of the redundancy word line drive signal generators XR2 and XR3, and XR6 and XR7 corresponding to the redundancy word lines RWL2 and RWL3 used in the double word line test mode are fed common with the internal control signal $\overline{XC1}$, and the input terminals $\overline{XC}$ of the remaining redundancy word line drive signal generators XR0 and XR1, and XR4 and XR5. Moreover, the input terminals Bi of the redundancy word line drive signal generators XR0, XR2, XR4 and XR6 in even numbers are fed commonly with the non-inverted internal address signal B0, whereas the input terminals Bi of the redundancy word line drive signal generators XR1, XR3, XR5 and XR7 in even numbers are fed commonly with the inverted internal address signal $\overline{B0}$.

Here, the internal control signals $\overline{XC1}$ and XC2 are selectively set to the low level, as has been described hereinbefore, on condition that the Bi.CMOS dynamic RAM is in the double word line test mode or the bar-in test mode.

The word line selection drive signals X0 to X7 are generated by the Bi.CMOS complex logical gate circuit, as exemplified in FIG. 25, and raises the corresponding word line selection drive signals X0U to X3U selectively on condition that both the corresponding input signals IN1 and IN2, i.e,. the incoincidence detection signals of the corresponding two X-redundancy selection circuits XRD0 and XRD1 or XRD2 and XRD3, and that both the complementary internal address signals B0 and B1 are at the low level in the corresponding combination. When the internal control signal $\overline{XC2}$ is at the low level, namely, when the Bi.CMOS dynamic RAM is in the bar-in test mode, the word lie drive signal generators X0 to X7 set the aforementioned word line selection drive signals X0U to X3U or X0D to X3D to the high level independently of the input signals IN1 and IN2 and the complementary internal address signals B0 and B1. As a result, all the word line selection drive signals X0U to X3U and X0D to X3D are raised to the high level so that the total sixteen word lines, i.e, the four word lines from every four memory arrays, to be simultaneously brought into the operative states are brought altogether into the selected states.

On the other hand, the redundancy word line drive signal generators XR0 to XR7 are constructed, as exemplified in FIG. 25, of the Bi.CMOS complex logical gate circuit and set the corresponding redundancy word line selection drive signals XR0U to XR3U or XR0D to XR3D selectively to the high level on condition that both the corresponding two input signals In1 and IN2, i.e., the two coincidence detection signals 13 and 14, of the X-redundancy selections signals XRD0 to XRD3 are at the low level, and that the corresponding non-inverted internal address signal $\overline{B0}$ or inverted internal address signal B0 is at the low level. In this embodiment, as has been described hereinbefore, the four redundancy word lines provided for each memory array are switched at the unit of the adjacent two word lines. In each X-redundancy selection circuit, therefore, only the corresponding redundancy word lines are alternatively brought into the selected states not by referring to the address signal of the least significant bit but combining the complementary internal address signal B0 by that redundancy word line drive signal generator.

Moreover, the redundancy word line drive signal generators XR2 and XR3, and XR6 and XR7 set the corresponding redundancy word line selection drive signals XR2U or XR3U, or XR2D or XR3D to the high level independently of the input signals IN1 and IN2 when the internal control signal $\overline{XC1}$ is at the low level, namely, when the Bi.CMOS dynamic RAM is in the double word line test mode. As a result, not only the designated one word line but also the corresponding redundancy word line RWL2 or RWL3 is simultaneously brought into the selected state so that the predetermined double word line test is executed.

3.2.3. Y-Selection Circuit

(1) Y-Address Buffer

The Y-address buffer YAB is equipped, as shown in FIG. 19, with eight buffer unit circuits AB provided for the address input signals A9 to A16. These buffer unit circuits AB are made to have the same circuit structure as that of the buffer unit circuits AB of the aforementioned X-address buffer XAB.

The Y-address buffer YAB fetches and latches the aforementioned address input signals A9 to A16 in accordance with the internal control signal C3U. On the basis of these address input signals, moreover, the Y-address buffer YAB form the complementary internal address signals B9 to B16.

(2) Y-Predecoder

The Y-predecoder YAD is constructed, as shown in FIG. 22, of a Bi.CMOS logical gate circuit composed of four sets totalling sixteen units circuits. These unit circuits set their output signals, i.e., predecode signals AY00 to AY03, AY20 to AY23, AY40 to AY43 or AY60 to AY63, to the high level alternatively on condition that both the corresponding complementary internal signals B9 and B10, B11 and B12, B13 and B14, or B16 and B16 of 2 bits are set at the low level in the corresponding combination.

(3) Y-Redundancy Circuit

The Y-redundancy circuit YR is equipped, as shown in FIG. 23, with: two Y-redundancy selection circuits YRD0 and YRD1 provided for the four sets of redundancy complementary bit lines RBL0 to RBL3 of the upper-side memory mats MAT0 to MAT3; and two Y-redundancy selection circuits YRD2 and YRD3 provided for the four sets of RBL0 to RBL3 of the lower-side memory mats MAT4 to MAT7. Each Y-redundancy selection circuit is equipped, as shown in FIG. 24, with: one redundancy enable circuit RCE; and eight redundancy address comparators RCA9 to RCA16 provided for the complementary internal address signals B9 to B16. These redundancy enable circuits and redundancy address circuits are made to have the same circuit structures as those of the redundancy enable circuits RCE and redundancy address comparators RCA1 to RCA6 of the aforementioned X-Redundancy selection circuits XRD0 to XRD3, respectively. Moreover, the redundancy enable circuit RCE has its detection node coupled commonly to the detection nodes of the redundancy address comparators RCA9 to RCA16 and its detection nodes 11 and 12 coupled in series through the detection nodes 21 and 22 of the four redundancy address comparators RCA9 to RCA12 or RCA 13 to RCA16 and further at their remote ends to the ground potential of the circuit.

From the description thus far made, the output signals 10 of the Y-redundancy selection circuits YRD0 to YRD3 are selectively set to the low level and used as the so-called incoincidence detection signals when there is an incoincidence of even 1 bit between the addresses fed upon the memory access and the bad addresses assigned to the two sets of redundancy complementary data lines. On the other hand, the output signals 13 and 14 of each Y-redundancy selection circuit are selectively set to the low level and used as the so-called coincidence detection signals when the more or less significant 4 bits of the Y-addresses fed upon the memory access and the more or less significant 4 bits of the bad addresses assigned to the corresponding two sets of redundancy complementary data lines are wholly coincident.

A negative logical product is taken from the output signals of the Y-redundancy selection circuits YRD0 to YRD3, i.e., the coincidence detection signals by the corresponding 2-input NOR gate circuit to produce the selection control signals YR0U, YR1U, or YR0D, YR1D for selecting the corresponding two sets of redundancy complementary data lines. Another negative logical product is taken from the output signals 10 of the Y-redundancy selection circuits YD0 and YRD1 or YRD2 and YRD3, i.e., the incoincidence detection signals by the 2-input NOR gate circuit to produce the selection control signals YRU or YRD for selecting the complementary data lines other than the redundancy complementary data lines.

3.2.4. Z-Selection Circuit

(1) Z-Address Buffer

A Z-address buffer ZAB is equipped with three buffer unit circuits ZAB provided for the address input signals A17 to A19. These buffer unit circuits include, as exemplified in FIG. 31, two input circuits and latch circuits provided for the TTL and ECL levels and are selectively validated when the internal control signal FB is at the low level. The Z-address buffer ZAB fetches and latches the corresponding aforementioned input address signals A17 to A19 in accordance with the internal control signal $\overline{CO}$ fed from the $\overline{CE}$ buffer CEB. On the basis of these input address signals, moreover, the Z-address buffer ZAB forms the complementary internal address signals B17 to B19. Here, the FB input terminals of the buffer unit circuit ZAB corresponding to the address input signals A18 and A19 are fed with the internal control circuit FB, and the FB input terminal of the buffer unit circuit ZAB corresponding to the address input signal A17 is coupled to the ground potential of the circuit.

(2) Z-Predecoder

The Z-predecoder ZAD includes eight unit circuits which are made receptive of the aforementioned complementary internal address signals B17 to B19 in a corresponding predetermined combination. Specifically, these unit circuits are selectively validated when the aforementioned internal control signal FB is at the low level, namely, when the Bi.CMOS dynamic RAM does not have the structure of ×4 bits, thereby to set the corresponding input/output selection signals AZ0 to AZ7 alternatively to the high level on condition that the all the complementary internal address signals B17 to B19 are set to the high level in the corresponding combination. In case the Bi.CMOS dynamic RAM has the structure of ×4 bits and in case the internal signal FB is at the high level, only the complementary internal address signal B17 is valid. At this time, four of the aforementioned input/output selection signals AZ0 to AZ7 are set simultaneously and selectively to the high level.

The aforementioned decoding operations of the Z-predecoder ZAD are selectively stopped when the test control signal TMB is at the high level, namely, when the Bi.CMOS dynamic RAM is in the multi-bit test mode.

1.2.5. Data Input/Output Unit

(1) Data Input Buffer

The Bi.CMOS dynamic RAM is equipped with four data input buffers DIB1 to DIB4. These data input buffers have their input terminals coupled to the corresponding data input/output terminals I/O1 to I/O4, as shown in FIG. 2, when the Bi.CMOS dynamic RAM is made to have the structure of ×4 bits. At this time, the output terminals of the data input buffers DIB1 to DIB4 coupled commonly to the input terminals of the corresponding two write amplifiers WA0 and WA1 to WA6 and WA7. When the Bi.CMOS dynamic RAM has the structure of ×1 bit, only the data input buffer DIB4 has its input terminal coupled to the data input terminal D1, whereas the other data input buffers DIB1 to DIB3 have their operations stopped substantially. At this time, the output terminal of the aforementioned data input buffer DIB4 is coupled commonly to the input terminals of all the write amplifiers WAW0 to WA7.

Figure 39B:
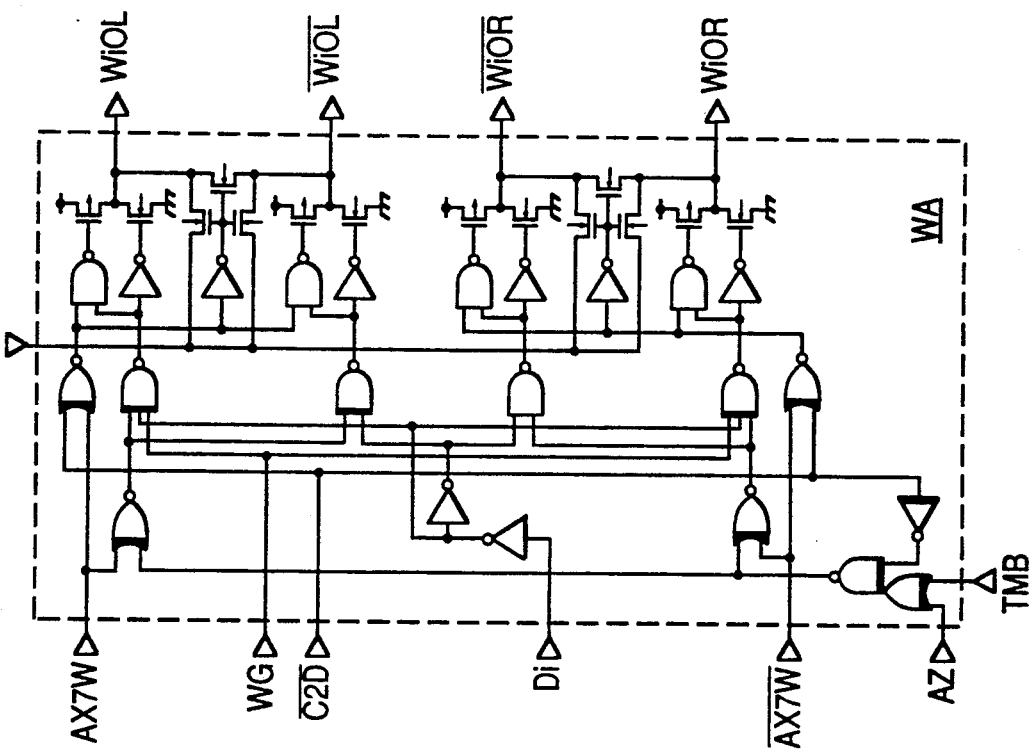
Figure 39A:
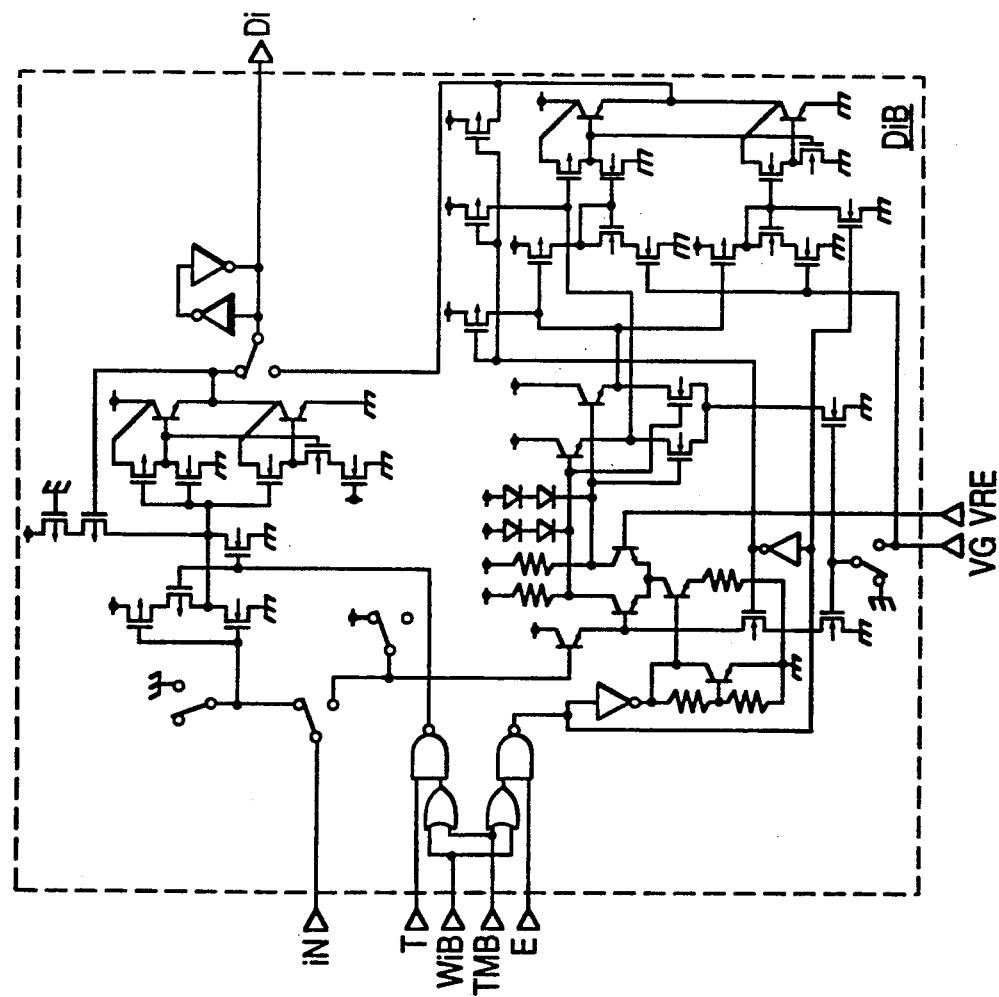

The data input buffers DIB1 to DIB4 are constructed of, as exemplified in FIG. 39, of two input circuits provided for the TTL and ECL levels and fetch the corresponding input signal IN, i.e., the input data on condition that the internal control signal WIB or test control signal TMB is at the high level.

Here, the aforementioned internal control signal WIB is set selectively to the high level, when the Bi.CMOS dynamic RAM is in the operation cycle of the writing system, as will be described hereinafter. The test control signal TMB is set selectively to the high level when the Bi.CMOS dynamic RAM is in the multi-bit test mode.

(2) Write Amplifier

The Bi.CMOS dynamic RAM is equipped with eight write amplifiers WA0 to WA7 provided for the paired write common I/O lines WIO0L and WIO09R to WIO7L and WIO7R. These write amplifiers have their input terminals coupled to the output terminals of the data input buffers DIB1 to DIB4 in a predetermined combination, as has been described hereinbefore, and their output terminals coupled to the corresponding two sets of aforementioned write common I/O lines. The write amplifiers WA0 to WA7 are fed commonly with the internal control signal $\overline{C2D}$ and WG, the test control signal TMB and the complementary selection signal AX7W, as shown in FIG. 2, and further with the corresponding aforementioned input/output selection signals AZ0 to AZ7. Here, the internal control signal WG is selectively set to the high level in a predetermined timing when the Bi.CMOS dynamic RAM is in the operation cycle of the writing system.

The write amplifiers WA0 to WA7 include two sets of write circuits which are provided for the write common I/O lines WIO0L to WIO7L or WIO0R to WIO7R, as exemplified in FIG. 39, although not especially limitative thereto. These write circuits are selectively brought into the operative states on condition that the corresponding non-inverted or inverted selection signal AX7W is set at the low level, when the aforementioned internal control signal $\overline{C2D}$ is at the low level and when the internal control signal WG and the test control signal TMB or the corresponding input/output selection signals AZ0 to AZ7 are at the high level. In this operation state, each write circuit forms the complementary write signal at the MOS level in accordance with the input data DI and feeds it to the corresponding write common I/O lines WIO0L to WIO7L or WIO0R to WIO7R selectively.

In the Bi.CMOS dynamic RAM of this embodiment, the write amplifiers WA0 to WA7 are alternatively brought into the operative states in accordance with the input/output selection signals AZ0 to AZ7. In case, moreover, the Bi.CMOS dynamic RAM is in the SC write cycle, the input/output selection signals AZ0 to AZ7 are sequentially formed in one memory access in accordance with the address input signals A17 to A19 to accomplish the continuous, fast write operations for the eight memory cells to be simultaneously brought into the selected states. In this Bi.CMOS dynamic RAM, however, the read amplifiers RA0 to RA7 are composed of bipolar transistors to have their operations speeded up. However, the write amplifiers WA0 to WA7 are composed basically of the CMOS so that they cannot provide sufficient operation speeds. As a result, the cycle time of the SC write cycle is determined by the operation speeds of the write amplifiers WA0 to WA7.

Figure 79:
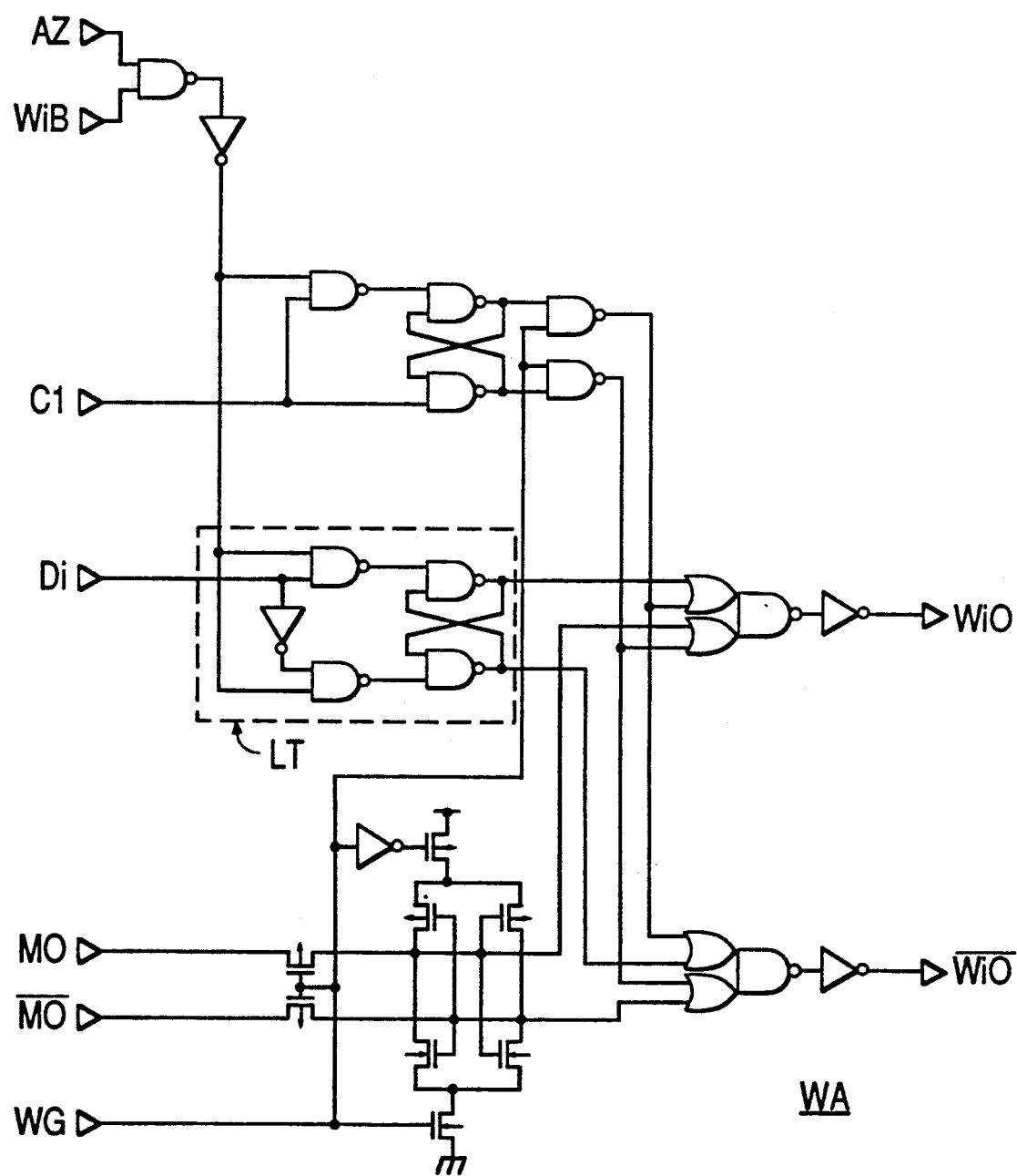

In order to cope with this, as shown in FIG. 79, for example, the input data DI fed through the data input terminal Di are once fetched in the latch circuit LT provided for each write amplifier, and the internal control signal WG is set to the high level for a while at the instant after lapse of a predetermined time and is written all at once in the eight memory cells to be simultaneously brought into the selected states. According to the method thus conceived, the rate of the input data to be serially fed is not determined by the operation speeds of the write amplifiers.

(3) Read Amplifier and Read Amplifier Control Circuit

The Bi.CMOS dynamic RAM is equipped, as shown in FIG. 2, with the eight read amplifiers RA0 to RA7 which are provided for two sets of read common I/O lines RIO0L and RIO0R to RIO7L and RIO7R. These read amplifiers have their input terminals coupled to the corresponding two sets of read common I/O lines RIO0L and RIO0R to RIO7L and RIO7R, respectively, and their output terminals coupled to the corresponding input terminals of the data selection circuit DS8 and the multi-bit test circuit MBT and one or the other input terminal of the corresponding data selection circuits DS21 to DS24. These read amplifiers are fed commonly with the complementary selection signal AX7R from the aforementioned X-predecoder AX7. The read amplifiers are further fed commonly with the complementary internal control signals RS and ME and the internal control signals $\overline{RSD}$, MA, MLT and MLTD from a later-described read amplifier control circuit RAC.

Figure 33:
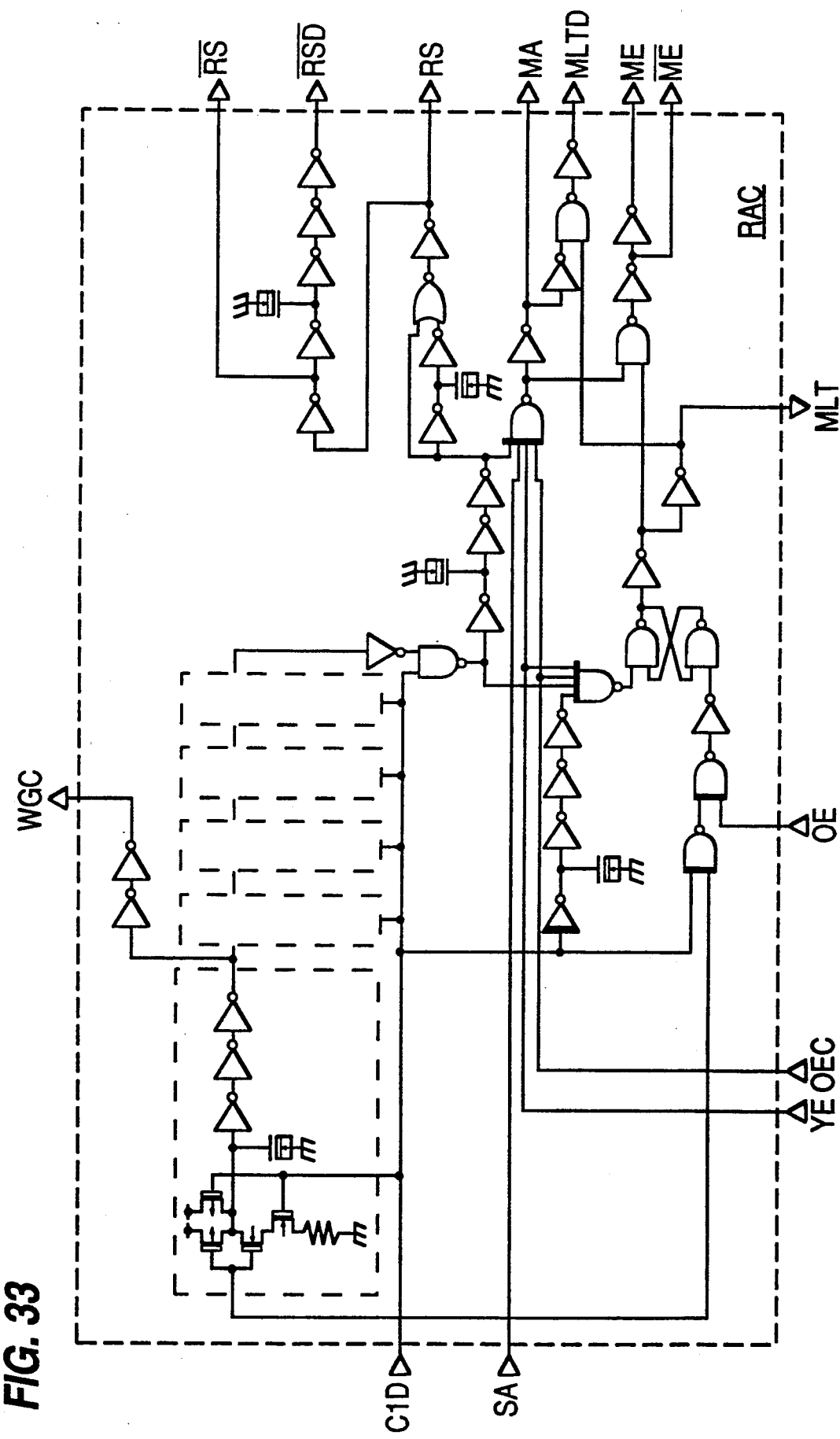

Here, the aforementioned complementary internal control signals RS and ME and the internal control signals $\overline{RSD}$, MA, MLT and MLTD are formed under the timing condition shown in the signal waveform chart of FIG. 46 by the read amplifier control circuit RAC shown in FIG. 33. Specifically, the complementary internal control signal RS (i.e., the first timing signal) is validated at the logic "1" when the chip enable signal $\overline{CE}$ is at the low level whereas the internal control signal C1D is at the high level. The internal control signal $\overline{RSD}$ is set to the low level with a slight delay from the aforementioned complementary internal control signal. The complementary internal control signal RS is set to the logic "0", when the delay signal of the logical sum signal of the internal control signals C1D and SA is at the high level and after lapse of the predetermined delay time. The internal control signal $\overline{RSD}$ is returned to the high level with a slight delay. In each read amplifier, as will be described hereinafter, the current-voltage conversion circuit is brought into the operative state when the complementary internal control signal RS is set at the logic "1". The level fluctuations of the corresponding read common I/O lines are suppressed from the instant when the complementary internal control signal RS is at the logic "1" to the instant when the internal control signal $\overline{RSD}$ is at the low level.

Next, in the read amplifier control circuit RAC, at the instant when the internal control signal SA is at the high level so that the sense amplifier of each memory array is brought into the operative state, the internal control signal MA (i.e., the second timing signal) is validated at the high level, and the complementary internal control signal ME is simultaneously set to the logic "1". The internal control signal MA is returned to the low level when the aforementioned internal control signal RS is at the logic "0". On the other hand, the complementary internal control signal ME is set to the logic "0" when the later-described internal control signal MLT is at the low level. In each read amplifier, as will be described hereinafter, the differential amplifiers are brought into the operative states while the internal control signal MA is at the high level. Moreover, the equalization of each node is stopped while the complementary internal control signal ME is at the logic "1".

In the read amplifier control circuit RAC, moreover, the internal control signal MLT (i.e., the third timing signal) is set at the high level at the instant when the delay signal of the logical sum signal of the aforementioned internal control signals C1D and SA is a the high level. The internal control signal MLTD (i.e., the fourth timing signal) is set at the high level at the instant when the aforementioned internal control signal MA is at the low level. When the internal control signal OE is dropped to the low level, the internal control signal MLT is returned to the low level, followed by the internal control signal MLTD. In each read amplifier, the MOS latch is brought into the operative state, when the internal control signal MLT is at the high level, and the level correcting load means is coupled when the internal control signal MLTD is at the high level.

The read amplifiers RA0 to RA7 are equipped, as exemplified in FIG. 32, with: two unit read amplifiers URA0 and URA1 provided for the read common I/O lines RIOL (RIO0L to RIO7L) and RIOR (RIO0R and RIO7R); and an output latch OL made selectively receptive of the complementary output signals of those unit read amplifiers.

Of these, the unit read amplifiers URA0 and URA1 include: a current-voltage conversion circuit composed basically of a pair of bipolar transistors T3 and T4; a pair of emitter-follower circuits composed basically of bipolar transistors T5 and T6; and a differential amplifier composed basically of differential bipolar transistors T7 and T8.

The current-voltage conversion circuit and the paired emitted-follower circuits of each unit read amplifier are selectively brought into the operative states when the complementary internal control signal RS is at the logic "1". In this operative state, the current-voltage conversion circuit converts the read signals, which are transmitted as the current signal from the selected memory cell through the corresponding read common I/O lines, to the voltage signals at the collectors of the transistors T3 and T4. These voltage signals are transmitted through the emitter-follower circuit to the corresponding differential amplifiers.

Incidentally, between the emitters of the transistors T3 and T4 composing the current-voltage conversion circuit, i.e., the non-inverted and inverted signal lines of the read common I/O lines and the ground potential of the circuit, there is temporarily connected the load means which is composed of N-channel MOSFETs QN1 and QN2, for the time period after the aforementioned internal control signal RS is at the logic "1" before the internal control signal $\overline{RSD}$ is at the low level. As a result, the levels of the emitter potentials of the transistors T3 and T4 are enabled to follow the power fluctuations at the beginning when the Bi.CMOS dynamic RAM is in the selected state and at the timing in which the power fluctuations are relatively high. As a result, the operations of the current-voltage conversion circuit are speeded up together with the reading operations of the Bi.CMOS dynamic RAM.

Next, the differential amplifiers of each unit read amplifier are selectively brought into the operative states when the aforementioned internal control signal MA is at the high level and when the corresponding inverted selection signal AX7R or the non-inverted selection signal $\overline{AX7R}$ is at the high level. In these operating states, the differential amplifier amplifies the read signal, which is transmitted as the voltage signal from the aforementioned current voltage conversion circuit through the paired emitter-follower circuits and transmits it to the output latch OL. Thus, the differential amplifiers having the relatively high current consumption are brought into the operative states for a while in accordance with the internal control signal MA thereby to reduce the power consumption in the long cycle of the Bi.CMOS dynamic RAM.

On the other hand, the output latch OL of each read amplifier includes the bipolar transistors T9 and T10 constituting a pair of output emitter-follower circuits and made receptive of the complementary output signal outputted from the differential amplifier of the aforementioned unit read amplifier URA0 or URA1. Between the bases of those transistors and the ground potential (i.e., the second power voltage) of the circuit, there is connected a latch circuit which is composed basically a pair of N-channel MOSFETs QN13 and QN14 of cross connection and which is selectively brought into the operative state in accordance with the aforementioned internal control signal MLT. Between the bases of those transistors and the power voltage (i.e., the first power voltage) of the circuit, moreover, there is connected a pair of load means which are selectively connected with the aforementioned internal control signal MLTD. As a result, the read signal outputted from the unit read amplifier URA0 or URA1 is latched by the latch circuit composed basically of the MOSFETs and having a small current consumption and is outputted through the output emitter-follower circuit. At this time, the output signal is set to the ECL level.

Incidentally, the differential internal node of each read amplifier is equipped with the equalize MOSFETs QP3 to QP8 which are selectively turned on when the aforementioned complementary internal control signal ME is at the logic "0". These equalize MOSFETs are selectively turned on to short each differential internal node when the Bi.CMOS dynamic RAM is in the non-selected state. As a result, the residual charges of each differential internal node are equalized to speed up the operations of the read amplifiers.

(4) Data Selection Circuit

The Bi.CMOS dynamic RAM is equipped, as shown in FIG. 2, with four data selection circuits DS21 to DS24 and one data selection circuit DS8. Of these, the data selection circuits DS21 to DS24 have their two input terminals fed with the complementary output signals MO0 and M01 to M06 and M07 of the corresponding two read amplifiers RA0 and RA1 to RA6 and RA7 so that their complementary data output signal DS2 is fed to the input terminals of the corresponding data output buffer DOB1 to DOB4. On the other hand, the data selection circuit DS8 has its nine input terminals fed with the complementary output signals MO0 to MO7 and MOS of the eight read amplifiers RA0 to RA7 and the multi-bit test circuit BMT so that its complementary output signal is fed to the input terminal of the data output buffer DOB4 on condition that the Bi.C-MOS dynamic RAM has the structure of ×1 bit. These data selection circuits are fed commonly with the internal control signal DE. On the other hand, the data selection circuit DS21 to DS24 are fed commonly with the internal control signal FB and the corresponding two input/output selection signals AZ0 and AZ1 to AZ6 and AZ7, respectively. Moreover, the data selection circuit DS8 is fed with the inverted signal of the aforementioned internal control signal FB, the input-/output selection signals AZ0 to AZ7 and the test control signal TMB. Here, the internal control signal DE is selectively set to the high level when the Bi.CMOS dynamic RAM is in the read operation cycle. The internal control signal FB is selectively set to the high level when the Bi.CMOS dynamic RAM has the structure of ×4 bits. As has been described hereinbefore, moreover, the test control signal TMB is selectively set to the high level when the Bi.CMOS dynamic RAM is in the multi-bit test mode.

The data selection circuits DS21 to DS24 are composed basically of two sets of differential bipolar transistors having their collectors connected commonly, as exemplified in FIG. 34. These differential transistors function as a multiplexer which is selectively brought into the operative state, when both the aforementioned internal control signals DE and FB are at the high level and when the corresponding input/output selection signals AZ0 to AZ7 are at the high level, to transmit the complementary output signals MO0 or MO1 to MO6 or MO7 of the corresponding read amplifiers RA0 or RA1 to RA6 or RA7 selectively.

On the other hand, the data selection circuit DS8 is composed, as shown in FIG. 34, basically of nine sets of differential bipolar transistors having collectors of cross connection. These differential transistors function as a multiplexer which is selectively brought into the operative state, when both the aforementioned internal control signal DE and the inverted internal control signal $\overline{FB}$ are at the high level and when the corresponding input/output selection signals AZ0 to AZ7 or the test control signal TMB are alternatively set at the high level, to transmit the complementary output signals MO0 to MO7 or MOS of the corresponding read amplifiers RA0 to RA7 or the multi-bit circuit MBT selectively.

In this Bi.CMOS dynamic RAM, as has been described hereinbefore, the eight memory cells are simultaneously selected into the selected state in one memory access so that their read signals are transmitted through the read common I/O lines to the read amplifiers RA0 to RA7 and amplified. Moreover, 4 bits of these read signals are simultaneously selected by the data selection circuits DS21 to DS24 and sent out through the data output buffers DOB0 to DOB4 when the Bi.CMOS dynamic RAM has the structure of ×4 bits. When the Bi.CMOS dynamic RAM has the structure of 1 bit, moreover, the read signals are selected bit by bit by the data selection circuit and sent out through the data output buffer DOB4. When the Bi.CMOS dynamic RAM is in the multi-bit test mode, the read signals of 8 bits are compared and referred by the multi-bit test circuit MBT so that the results are sent out as the complementary output signal MOS through the data selection circuit DS8 and the data output buffer DOB4.

Incidentally, the data selection circuit DS8 and so on of this Bi.CMOS dynamic RAM are composed basically of plural sets of differential transistors having their collectors commonly connected to require relatively large operation current and layout area. Thus, the data selection circuit DS8 or the like having the relative small operation current and layout area can be realized by using the transmission gates MOSFETs which are selectively turned on in accordance with the input/output selection signals AZ0 to AZ7 or the test control signal TMB, as shown in FIG. 68.

Figure 76B:
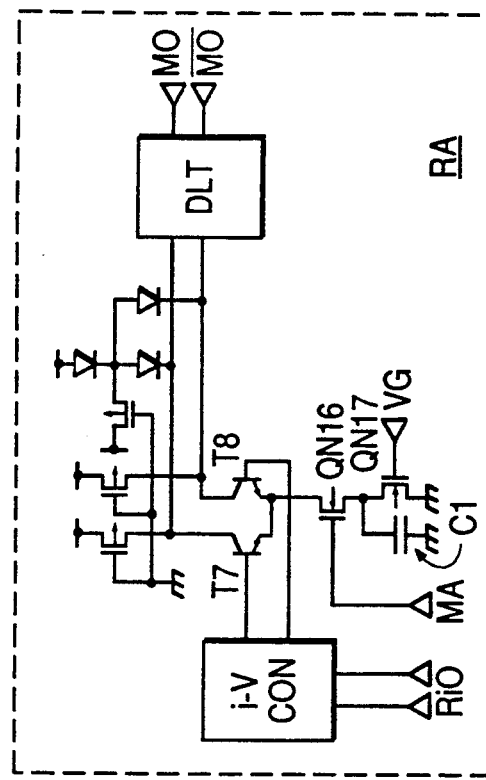
Figure 76A:
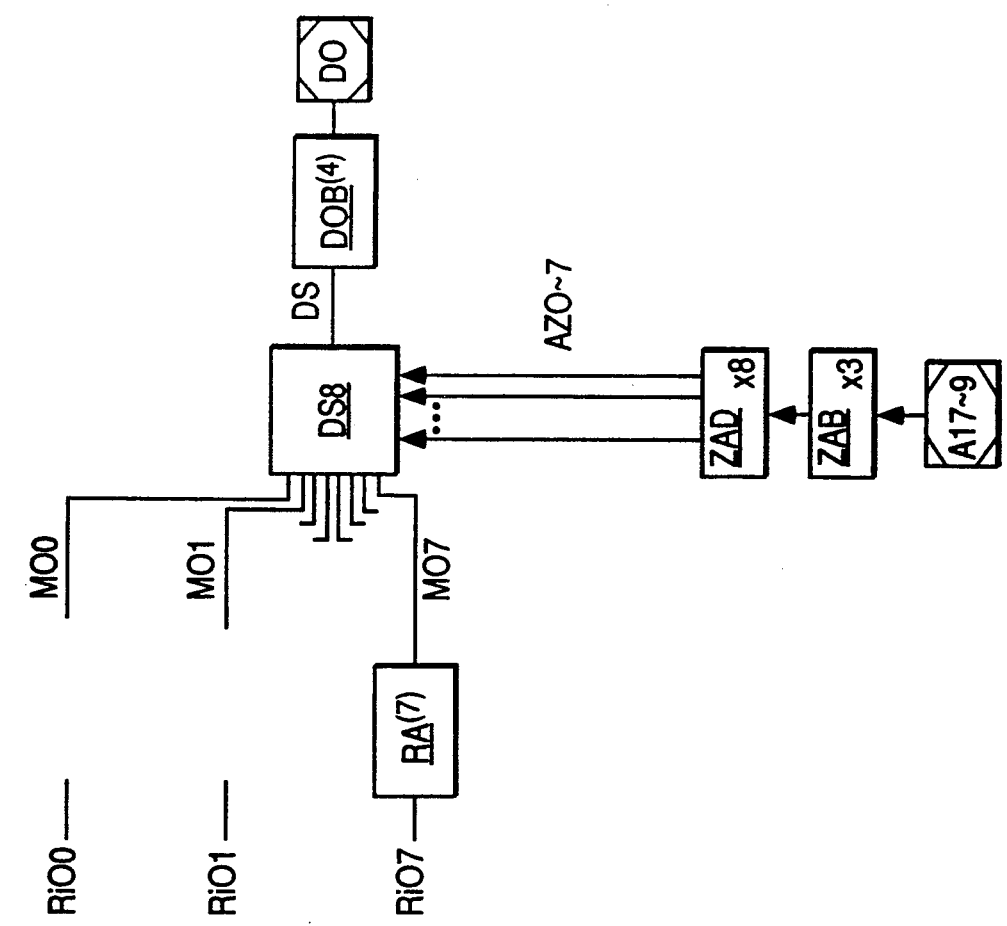

When the Bi.CMOS dynamic RAM has the structure of ×1 bit, on the other hand, the eight read amplifiers RA0 to RA7 are brought altogether into the operative states under the identical condition, as shown in FIG. 76, so that their output signals are alternatively selected in accordance with the input/output selection signals AZ0 to AZ7 by the data selection circuit DS8 and sent out through the data output buffer DOB4. As a result, in case the Bi.CMOS dynamic RAM is in the SC read cycle, for example, a relatively high speed is required for the rise of the read amplifiers corresponding to the bits of the read signals to be outputted at first. As shown in FIG. 77, therefore, there are provided: a latch circuit ZLT for latching the input/output selection signals AZ0 to AZ7 corresponding to the bits of the read signals to be outputted at first in the SC read cycle or the like; and a current source, i.e., an N-channel MOSFET QN25 for feeding a relatively large operation current selectively to the differential amplifier circuit of the corresponding read amplifier when the output signals AL0 to AL7 of the corresponding aforementioned latch circuit ZLT. The power consumption can be spared without dropping the speed of the first cycle of the SC read cycle by setting the remaining operation current at a relatively low level.

(5) Data Output Buffer

The Bi.CMOS dynamic RAM is equipped with four data output buffers DOB1 to DOB4, as shown in FIG. 2. Of these, the data output buffers DOB1 to DOB3 have their input terminals coupled to the output terminals of the corresponding aforementioned data selection circuits DS21 to DS23 and have their output terminals coupled to the corresponding data input/output terminals I/O1 to I/O3. On the other hand, the input terminal of the data output buffer DOB4 is coupled to the output terminal of the aforementioned data selection circuit DS8, when the Bi.CMOS dynamic RAM has the structure of ×1 bit, and to the output terminal of the corresponding data selection circuit DS24 when the Bi.C-MOS dynamic RAM has the structure of ×4 bits The output terminal of the data output buffer DOB4 is coupled to the data output terminal DO, when the Bi.C-MOS dynamic RAM has the structure of ×1 bit, and to the corresponding data input/output terminal I/O when the same has the structure of ×4 bits. The data output buffers DOB1 to DOB4 are fed commonly with the internal control signals DE, OE, WOE, T and E. Moreover, the data output buffers DOB1 to DOB3 are fed commonly with the aforementioned internal control signal FB, and the data output buffer DOB4 has its input terminal FB coupled to the power voltage of the circuit. Here, the internal control signals OE and WOE are the output control signals, and the internal control signals T and E are alternatively set to the high level when the input/output level of the Bi.CMOS dynamic RAM is at the TTL or ECL level.

Figure 36:
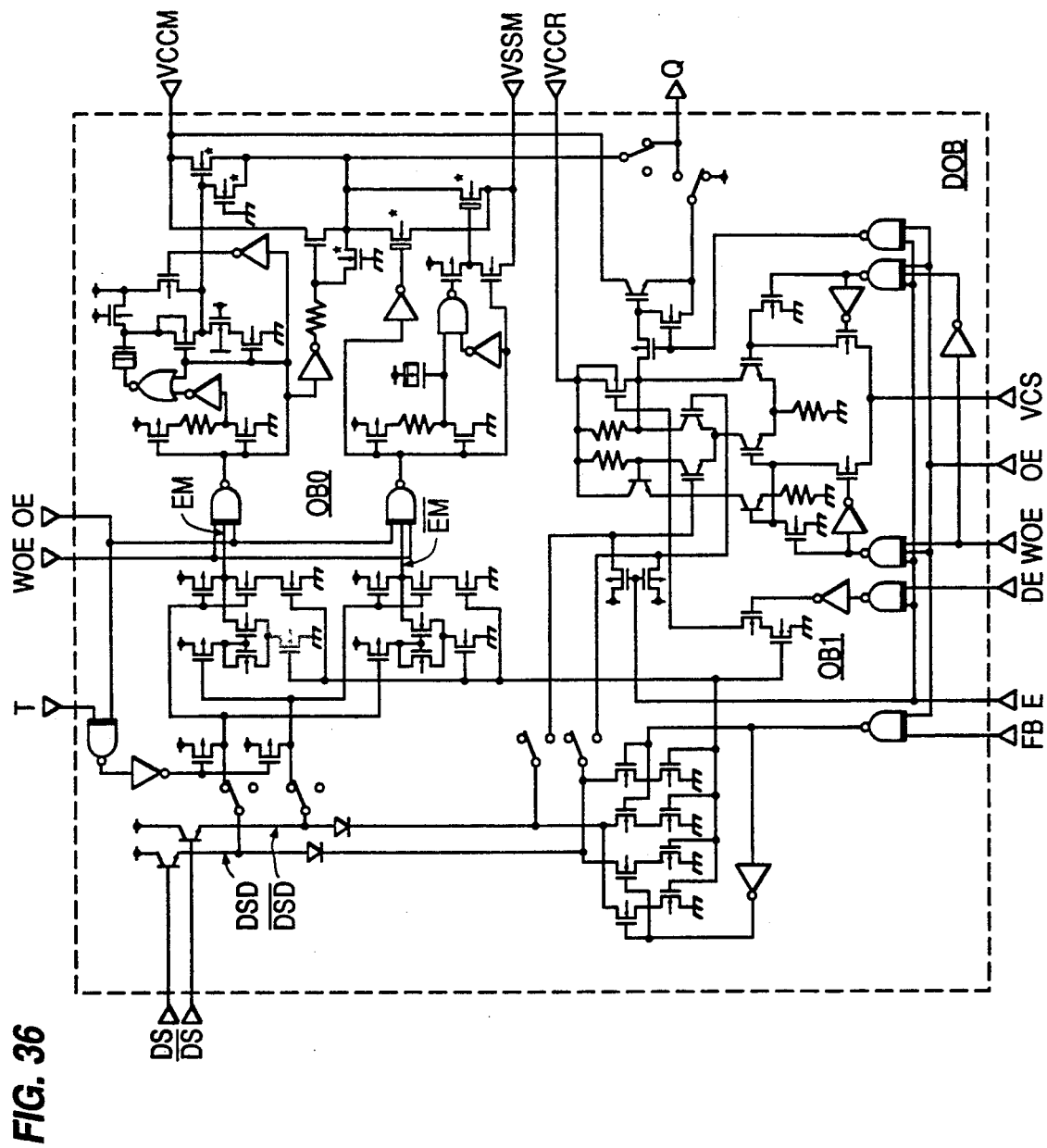

The data output buffers DOB1 to DOB4 are equipped, as exemplified in FIG. 36, with the output buffer OB0 corresponding to the TTL level and the output buffer OB1 corresponding to the ECL level. These output buffers are selectively brought into the operative states when the aforementioned internal control signals OE, WOE, DE and FB and the corresponding internal control signal T or E are at the high level. In these operative states, the output buffer OB1 once changes the read signal, which is transmitted at the ECL level from the corresponding data selection circuits DS21 to DS24 or DS8, to the MOS level and sends it out at the TTL level through a pair of output MOS-FETs. On the other hand, the output buffer OB2 sends out the read signal, which is to be transmitted at the aforementioned ECL level, through the open collector type output bipolar transistor without any change into the MOS level.

Figure 64:
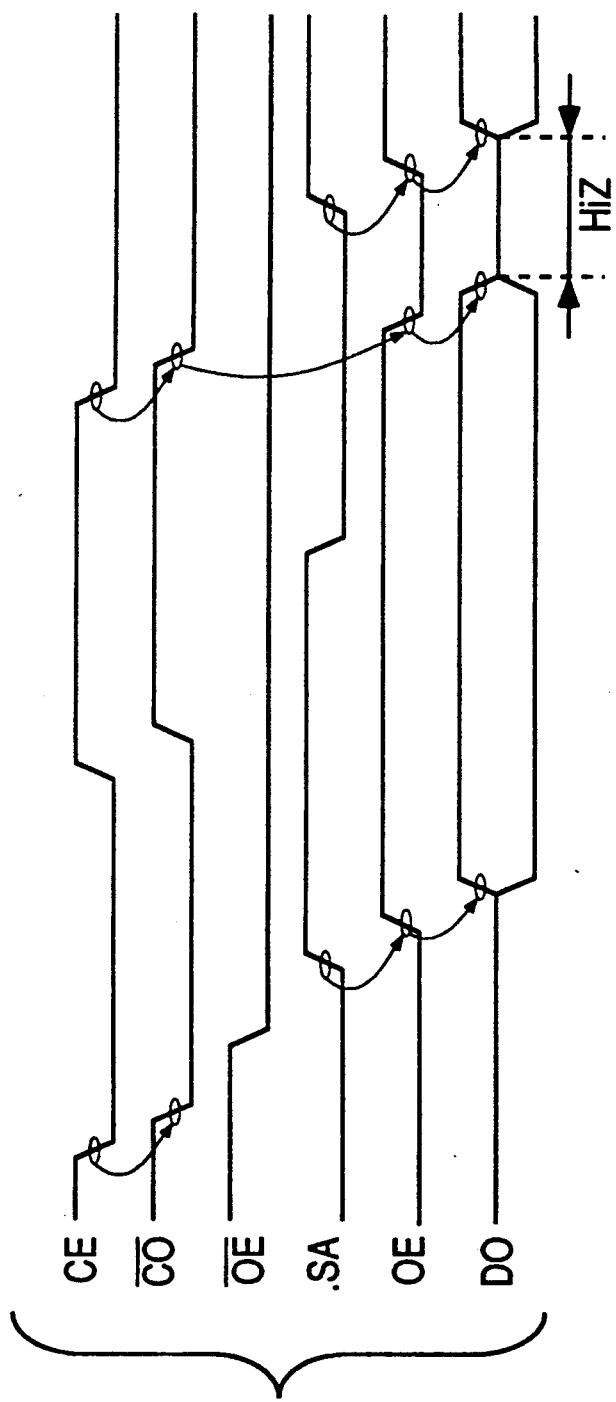

Incidentally, in this Bi.CMOS dynamic RAM, in case the reading operation cycle is to be continuously executed with the output enable signal $\overline{OE}$ being fixed at the low level, the output control signal OE is temporarily dropped to the low level at the beginning of the subsequent cycle, as shown in FIG. 64. As a result, each data output buffer has its input node equalized temporarily to the power voltage of the circuit and its output circuit reset temporarily so that its output is temporarily raised to the high-impedance state HiZ. As a result, the output operations of the data output buffer are speeded up without being influenced by the residual charges of each internal node.

Figure 66:
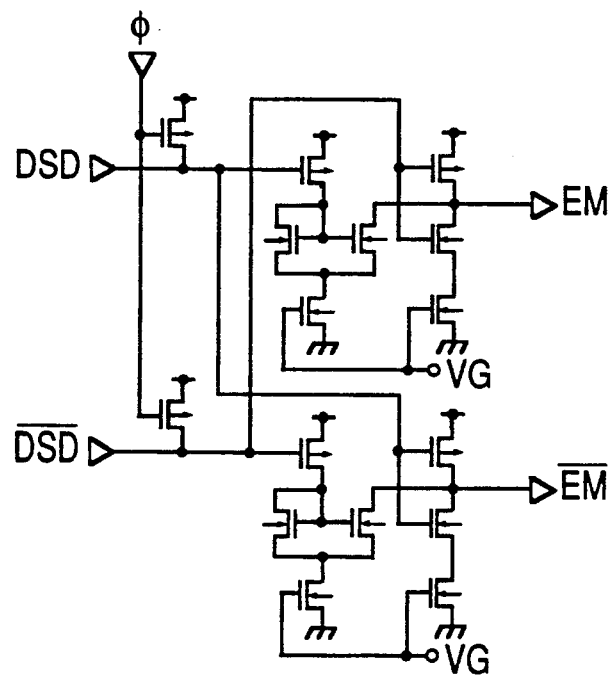
Figure 67:
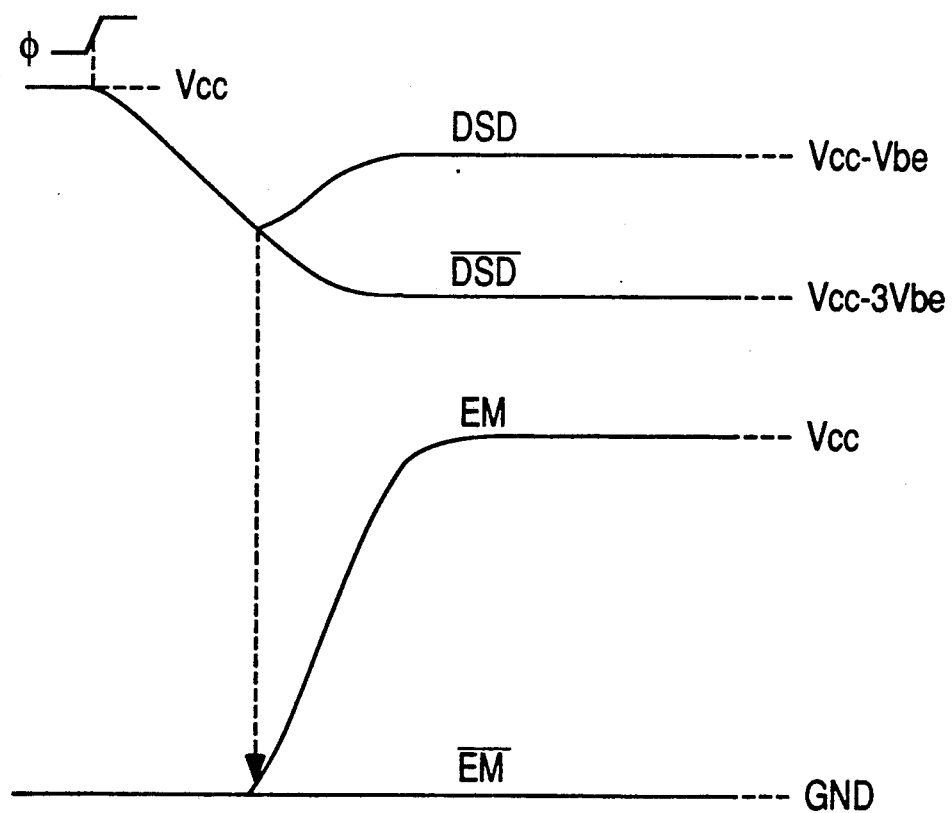

On the other hand, the data output buffers DOB1 to DOB4 of this Bi.CMOS dynamic RAM contain the output buffers OB0 provided for the TTL level. These output buffers OB0 contain level changing circuits for changing the read signals, which are transmitted at the ECL level from the data selection circuits DS21 to DS24 or DS8, once to the MOS level. In this embodiment, the aforementioned level changing circuit is composed, as shown in FIG. 66, basically of a pair of CMOS circuits having a differential mode. Between the complementary input node DSD and the power voltage of the circuit, there is connected an equalize MOSFET which is selectively turned on in accordance with an internal control signal $\phi$, i.e., the aforementioned internal control signal OE. Moreover, these equalize MOSFETs are turned off only when the output operations by the data output buffers are accomplished, as has been described hereinbefore. As a result, the complementary output nodes EM of the level change circuit are fixed at the low level, when the Bi.CMOS dynamic RAM is in the non-selected state, and either of them is raised to the high level when the complementary input nodes are unequal. As a result, the complementary output signals of the level conversion circuits are stably changed without any undesired level fluctuations at the input level change.

1.2.6. Control Unit

(1) $\overline{CE}$ Buffer and CE Driver

The $\overline{CE}$ buffer CEB is equipped, as shown in FIG. 18, with two input circuits IC1 and IC2 which are selectively validated when the input levels is at the TTL or ECL level. The $\overline{CE}$ buffer CEB forms the internal control signals CE and CO in response to the chip enable signal $\overline{CE}$ which is fed through the external terminal $\overline{CE}$.

The aforementioned internal control signal CE1 formed by the $\overline{CE}$ buffer CEB is transmitted to the CE drivers CEDU, CEDM and CEDD, which are disposed in the upper peripheral circuit PHU, the middle peripheral circuit PHM and the lower peripheral circuit PHD, respectively. After this, the internal control signal CE1 is fed as the internal control signals $\overline{C2U}$ and $\overline{C3U}$, C1M, $\overline{C2M}$ and $\overline{C3M}$, and C1D and $\overline{C2D}$ to the corresponding peripheral circuits.

(2) $\overline{OE}$ Buffer

Figure 37B:
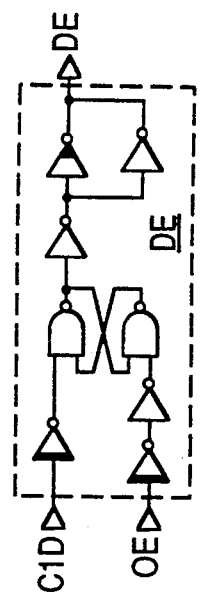
Figure 37A:
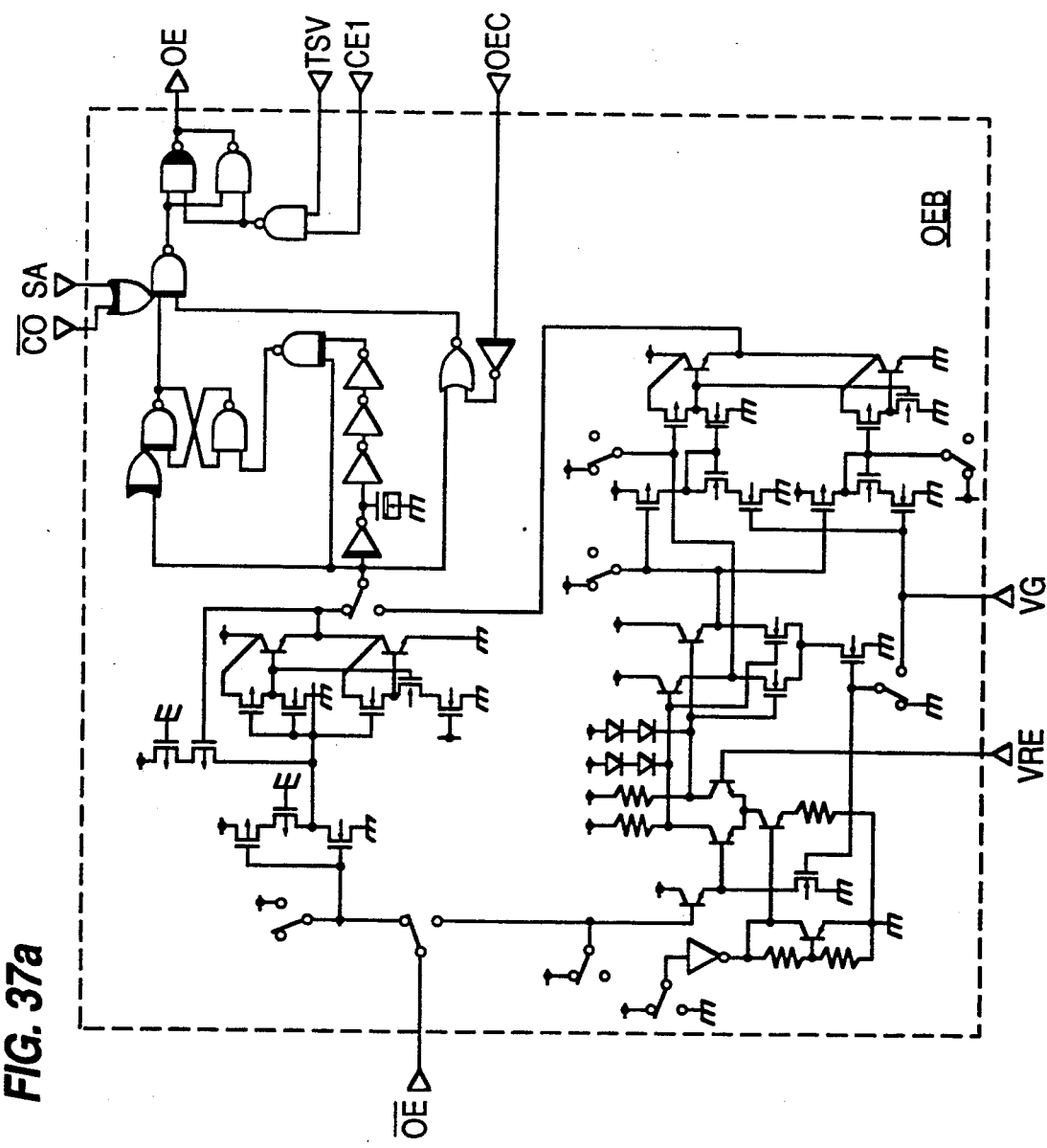
Figure 38:
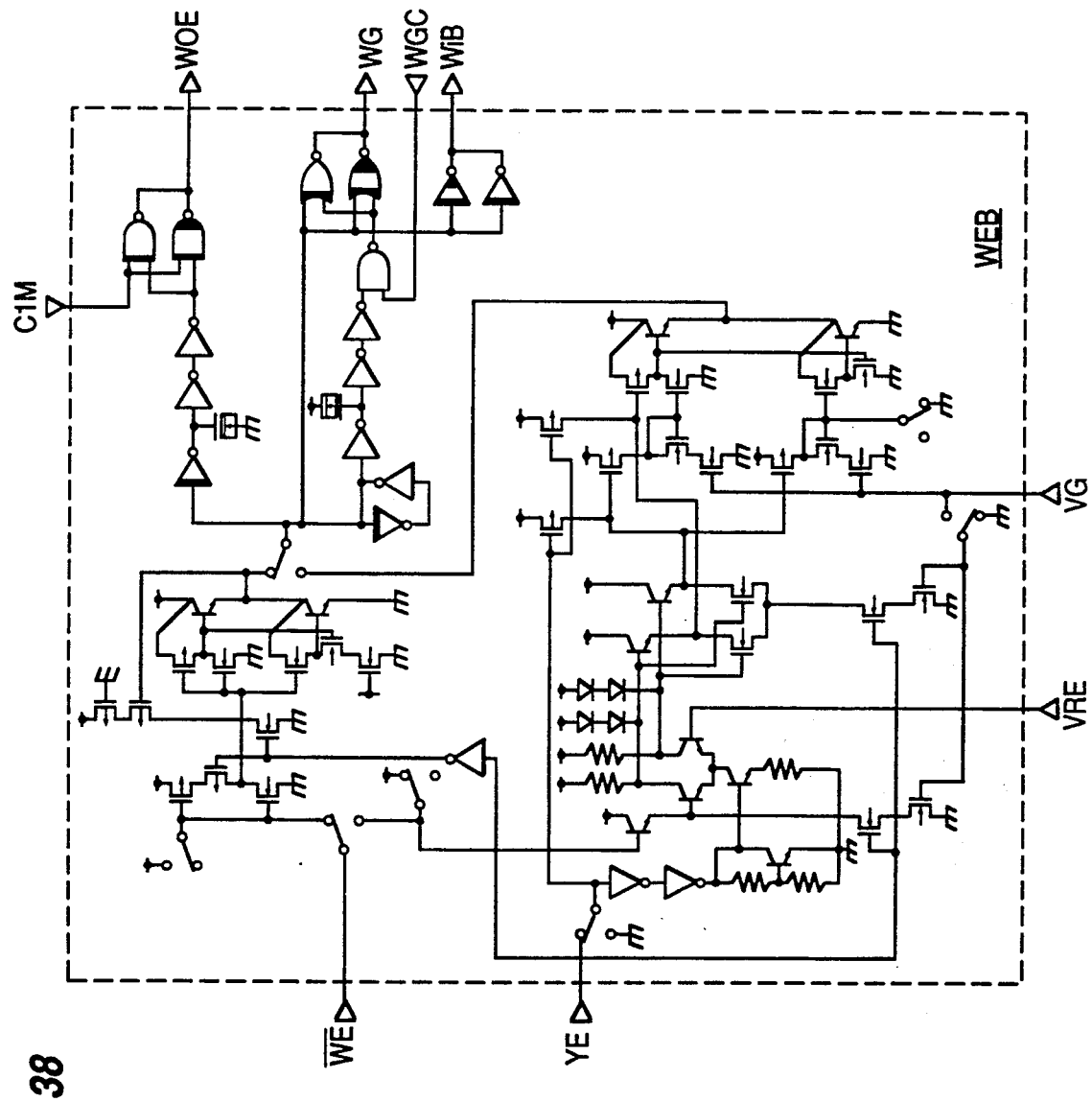

The $\overline{OE}$ buffer OEB is made to have a circuit structure substantially similar to that of the $\overline{CE}$ buffer CEB, as shown in FIG. 37, although not especially limitative thereto, and ia made receptive of the output enable signal $\overline{OE}$ fed through the external terminal for forming the internal control signal OE in accordance with the internal control signals CE1, OEC, $\overline{CO}$ and SA.

(3) $\overline{WE}$ Buffer

The $\overline{WE}$ buffer WEB is made to have a circuit structure substantially similar to that of the $\overline{CE}$ buffer CEB, as shown in FIG. 33, and is made receptive of the write enable signal $\overline{WE}$ fed through the external terminal $\overline{WE}$ for forming the internal control signals WG, WIB and WOE in accordance with the internal control signals C1M, YE and WGC.

(4) $\overline{RF}$ Buffer

The $\overline{RF}$ buffer RFB is made to have a circuit structure substantially similar to that of the $\overline{CE}$ buffer CEB, as shown in FIG. 21, although not especially limitative thereto, and is made receptive of the refresh control signal $\overline{RF}$ fed through the external terminal RF for forming the internal control signal $\overline{REF}$ in accordance with the internal control signal $\overline{C2M}$.

1.2.7. Power Unit and Signal Generation Unit

The Bi.CMOS dynamic RAM is equipped, as shown in FIG. 3, with a plurality of voltage generators for forming predetermined internal voltages VCH, VBB, VRE, VCS, VG and HVC on the basis of the power voltage VCC of the circuit at +5V. Of these, the voltage generators VCH, VBB and VG form the corresponding internal voltages on the basis of the common pulse signal fed from the oscillator OSC, as has been described hereinbefore. The Bi.CMOS dynamic RAM is further equipped with a plurality of signal generators WK, OEC, YE, FR and FT for forming a variety of internal control signals. These signal generators will not be described here because they have been summarized in the foregoing item concerning the block structure.

(1) OSC Oscillator

The Oscillator OSC is equipped, as shown in FIG. 42 with two oscillators OSC1 and OSC2 in each of which seven CMOS logical gate circuits are connected in series in a ring shape, although not especially limitative thereto. Of these, the oscillator OSC1 is selectively brought into the operative state, when the internal control signal CE1 is at the low level, namely, when the Bi.CMOS dynamic RAM is in the non-selected state, and the oscillator OSC2 is selectively brought into the operative state when the aforementioned internal control signal CE1 is at the high level, namely, when the Bi.CMOS dynamic RAM is in the selected state. In this operation state, the oscillators OSC1 and OSC2 form pulse signals $\phi$ 1 and $\phi$ 2 having an equal frequency. These pulse signals are synthesized and fed as the pulse signal OSC to the voltage generators VCH, VBB and VG.

Incidentally, the pulse signal φ 1 formed by the oscillator OSC1 is fixed at the high level, when the internal control signal CE1 is at the high level so that the oscillator OSC1 is brought into the inoperative state, and is promptly changed to the low level, when the internal control signal CE1 is at the low level so that the oscillator OSC1 is brought into the operative state, until it is changed to the high and low levels periodically with a predetermined period.

On the other hand, the pulse signal φ 2 formed by the oscillator OSC2 is fixed at the high level, when the internal control signal CE1 is at the high level so that the oscillator OSC1 is brought into the inoperative state, and is not changed to the low level before lapse of a predetermined time, i.e., one half of the period, when the internal control signal CE1 is at the high level so that the oscillator OSC2 is brought into the operative state, until it is changed to the high and low levels periodically with a predetermined period.

Figure 63A:
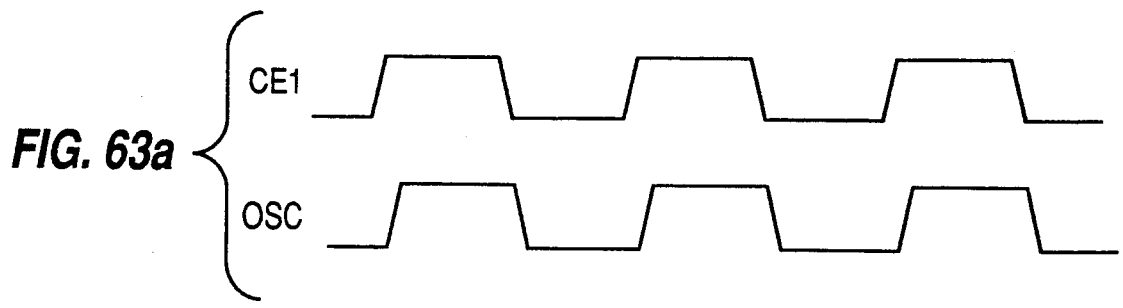
Figure 63B:
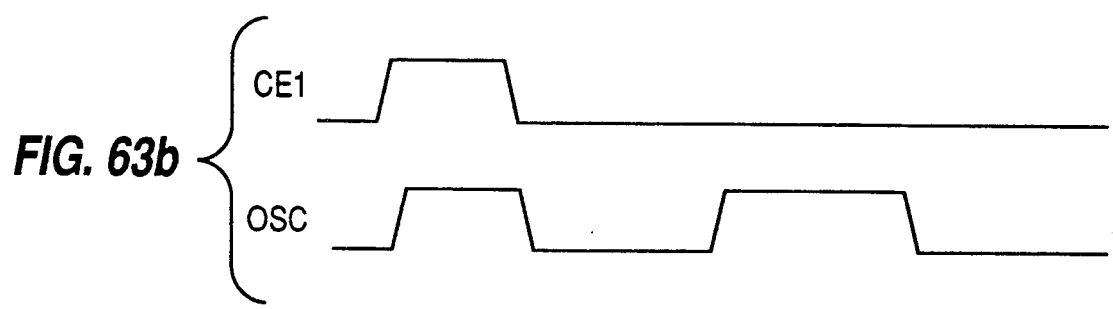
Figure 63C:
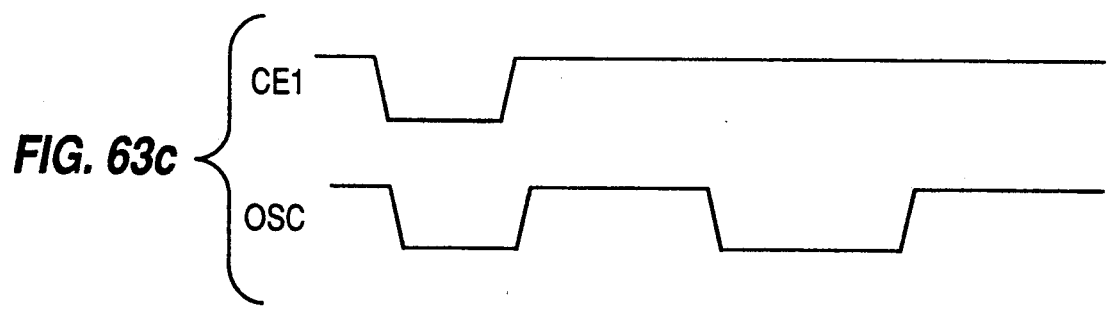

Thus, the output signal of the oscillator OSC, i.e., the pulse signal OSC is formed substantially in synchronism with the internal control signal CE1 when the Bi.CMOS dynamic RAM is repeatedly brought into the selected state so that the aforementioned internal control signal CE1 is repeatedly changed to the high level for a relatively short period, as shown in FIG. 73(a). In case the Bi.CMOS dynamic RAM is temporarily brought into the selected state so that teh the aforementioned internal control signal CE is temporarily brought into the high level for a relatively short time period, the pulse signal OSC is temporarily raised at first to the high level in accordance with the internal control signal CE1, as shown in FIG. 73(b). At the instant when the internal control signal CE1 is returned to the low level, the pulse signal OSC is held at the low level for one half period and is then formed with a predetermined frequency. In case, on the other hand, the Bi.CMOS dynamic RAM held in the selected state for a relatively long period is temporarily brought into the non-selected state so that the aforementioned internal control signal CE1 is temporarily returned to the low level for a relatively short period, the pulse signal OSC is dropped at first to the low level as a result that the internal control signal CE1 is temporarily returned to the low level, as shown in FIG. 63(c). At the instant when the internal control signal CE1 is returned again to the high level, the pulse signal OSC is promptly set to the high level and is then formed with a predetermined frequency.

In short, the pulse signal OSC is raised at first to the high level in the selected state, in case the Bi.CMOS dynamic RAM takes any selected state, and is then formed with the predetermined frequency in the later stable state. As a result, the internal voltage formed on the basis of that pulse signal OSC has its current supply ability enhanced at the instant of the selected state of the Bi.CMOS dynamic RAM so that the rising operation of the Bi.CMOS dynamic RAM is stabilized.

(2) VCH Voltage Generator

The voltage generator VCH first forms the two internal pulse signals φ 3 and φ 4 having no superposed phase on the basis of the pulse signal OSC fed from the aforementioned oscillator OSC and then forms a high-potential word line selection voltage, i.e., the internal voltage VCH having its absolute value exceeding the power voltage of the circuit by driving the corresponding boost capacity with those pulse signals.

When the level of the internal voltage VCH exceeds a predetermined value, the operations of the voltage generator VCH are substantially stopped. When, on the other hand, the Bi.CMOS dynamic RAM is in the bar-in test mode, the current supply ability of the internal voltage VCH is supplied through the external terminal $\overline{OE}$, as has been described hereinbefore.

(3) VBB Voltage Generator

As shown in FIG. 42, the voltage generator VBB forms a predetermined internal pulse signal on the basis of the pulse signal OSC fed from the aforementioned oscillator OSC and then forms the substrate back bias voltage VBB at a predetermined negative potential by driving the corresponding boost capacitor with that internal pulse signal.

The operations of the voltage generator VBB are substantially stopped when the level of the substrate back bias voltage VBB becomes lower than a predetermined value or when the power voltage of the circuit is fed to the pad VBT.

(4) VG Voltage Generator

As shown in FIG. 43, the voltage generator VG forms the internal voltage VG at a predetermined positive potential on the basis of the OSC fed from the aforementioned oscillator OSC. This internal voltage VG is used as the reference potential of the current source formed by the MOSFETs.

(5) VRE Voltage Generator

The voltage generator VRE forms the predetermined internal voltages VRE and VCS by dropping the power voltage VCCR of the circuit fed through the pad VCCR, as shown in FIG. 40, although not especially limitative thereto. These internal voltages are used as either the reference potential of the differential transistors composing the ECL circuit or the reference potential for the operation current source.

(6) HVC Voltage Generator

As shown in FIG. 43, the voltage generator HVC drops the power voltage VCC of the circuit to form the internal voltage HVC having about one half potential of the former. This internal voltage HVC is fed as the plate voltage VPL to the memory cells of each memory array on condition that it is fed as the precharge voltage to each equalize circuit and that the test control signal TVPG is at the low level. When the aforementioned test control signal TVPG is at the high level, the internal voltage HVC is not transmitted as the plate voltage VPL. When the test control signal TVPH is then set at the high level, the power voltage VCC of the circuit is fed as the plate voltage VPL. Thus, a predetermined VPL stress test of the memory cells is executed.

3.2.8. Test Unit

(1) Test Mode Set Signal Latch

The Bi.CMOS dynamic RAM is equipped with seven test mode set signal latches AF for latching the test mode set signals inputted though the address input terminals A9 to A15 in the test mode set cycle.

As shown in FIG. 41, the test mode set signal latches AF fetch the test mode set signals, which are transmitted as the complementary internal address signals B9 to B15, in accordance with the internal control signal $\overline{FT}$, which is selectively set to the low level in the aforementioned test mode set cycle, and latch them till the next test mode set cycle is executed.

(2) High-Voltage Detection Circuit

The Bi.CMOS dynamic RAM is equipped with the high-voltage detection circuit SVC which is fed at its external terminal $\overline{OE}$ with a predetermined high voltage exceeding the power voltage of the circuit to cause the test cycle thereby to detect that high voltage.

As shown in FIG. 41, high-voltage detection circuit SVC includes three MOSFETs which are connected in series between the aforementioned external terminal $\overline{OE}$ and the ground potential of the circuit. When the external terminal $\overline{OE}$ is fed with a predetermined high voltage exceeding the power voltage of the circuit, its output signal, i.e, the test control signal TSC, is selectively raised to the high level.

(3) Test Mode Control Circuit

As shown in FIG. 41, the test mode control circuit TEST forms the test control signals, TMB, $\overline{TCT}$, TBI, TVPH, TVPG, $\overline{TDW}$, TWL and TBL selectively in accordance with the output signals AF9 to AF19 of the aforementioned test mode set signal latch on condition that the output signals of the aforementioned high-voltage detection circuit SVC, i.e., the test control signal TSV is at the high level. These test control signals are used for setting the test mode of the Bi.CMOS dynamic RAM.

(4) Multi-Bit Test Circuit

The Bi.CMOS dynamic RAM is equipped with the multi-bit test circuit MGT for comparing and referring the read signals of the eight memory cells to be simultaneously brought into the selected states in the multi-bit test mode, as has been described hereinbefore.

Figure 35:
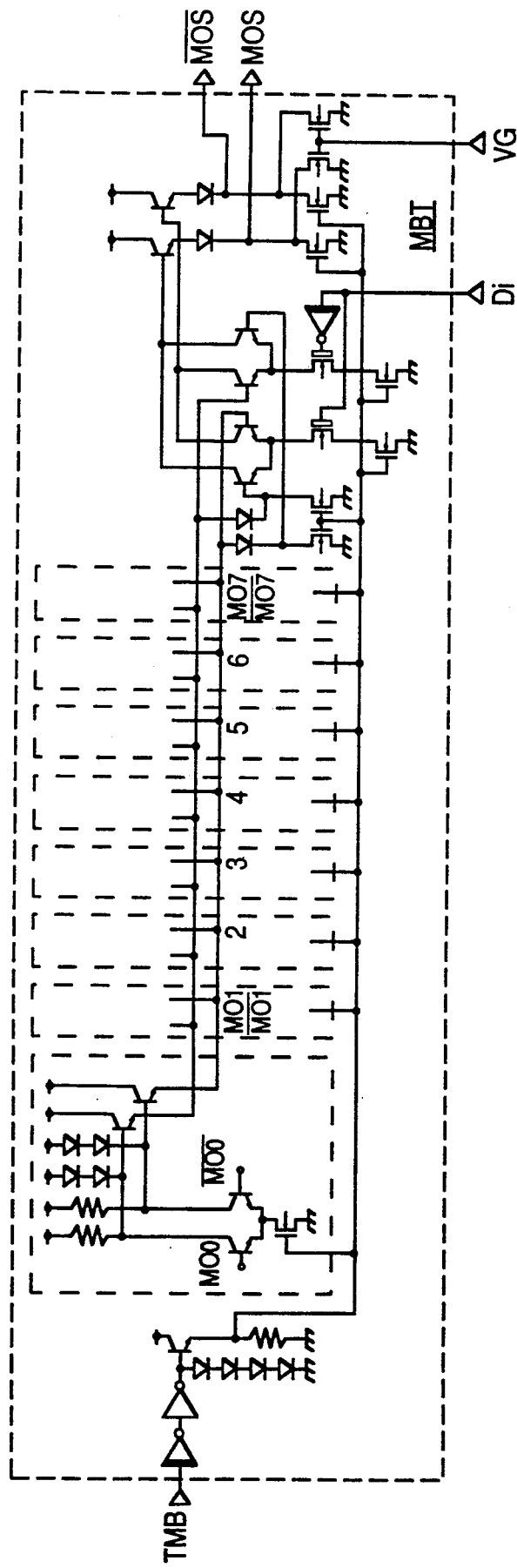

As shown in FIG. 35, the multi-bit test circuit MBT is equipped with: eight unit circuits provided for the read amplifiers RA0 to RA7 and each including a pair of output transistors having its emitters coupled commonly with a pair of differential transistors; and two pairs of differential transistors constituting a logical product and sum circuit together with those unit circuits. The differential transistors constituting each unit circuit have their bases fed with the complementary output signals MO0 to MO7 of the corresponding read amplifiers, respectively. Between the commonly connected emitters of the aforementioned two pairs of differential transistors and the corresponding responding current source, there is connected which has its gate fed with the input data DI or its inverted signal as the expected data.

The multi-bit test circuit MBT is selectively brought into the operative state when the Bi.CMOS dynamic RAM is in the multi-bit test mode so that the test control signal TMB is set to the high level. In this operative state, the multi-bit test circuit MBT compares and refers the complementary output signals M00 to M07 of the individual read amplifiers and the aforementioned expected data, i.e., the input data DIF. As a result, the complementary output signal MOS is selectively at the logic "1" on condition that all the complementary outputs signals M00 to M07 and the input data DIF are coincident.

As has been described in connection with the embodiments, the following operational effects can be attained by applying the present invention to a semiconductor memory device such as the Bi.CMOS dynamic RAM.

(1) The memory array of the semiconductor memory circuit is composed basically of the dynamic memory cells arranged in a lattice form, and the peripheral circuit is composed basically of the Bi.CMOS logical gate circuit having the CMOS gate circuit and the ECL circuit in combination. As a result, the semiconductor memory device can have its structure optimized. Thus, there can be attained an effect that the operations of the semiconductor memory device can be speeded up while highly integrating the same.

(2) The semiconductor memory device comprises: an input circuit for changing a data input signal and an input signal at a TTL or ECL level including and an address signal into a corresponding internal data input signal and a corresponding internal signal at a MOS level including an internal address signal; an address selection circuit for forming a selection signal based on the MOS level on the basis of the internal address signal; a memory array for selecting a memory cell designated in accordance with the selection signal to connect it selectively with a writing common I/O line or a reading common I/O line; a writing circuit for forming a write signal at the MOS level on the basis of the internal data input signal to feed it through the writing common I/O line to the selected memory cell; a reading circuit transforming the read signal, which is outputted as a current signal from the selected memory cell through the reading common I/O line, into a voltage signal and amplifying it to form an internal data output signal at the ECL level; and an output circuit for forming and transmitting a data output signal at the TTL or ECL level on the basis of the internal data output signal. As a result, the semiconductor memory device can have its internal signal mode optimized. As a result, the operations of the semiconductor memory device can be speeded up by shortening the transmission delay time of the internal signals while increasing the degree of integration thereof and reducing the power consumption.

(3) In the aforementioned item (2), a plurality of input circuits are provided for the TTL level and the ECL level and are selectively used by a master slice. As a result, there can be attained an effect that it is possible to realize a plurality of semiconductor memory devices made of the common semiconductor substrate and having different input signal modes.

(4) In the aforementioned item (2), the row addresses for designating the word lines and the column addresses for designating the bit lines are inputted substantially and simultaneously inputted through the individual external terminals. As a result, there can be attained an effect that the address selection unit of the Bi.CMOS dynamic RAM can have its structure optimized to speed up its operations.

(5) In the aforementioned item (2), the read amplifier includes a current-voltage converter and a differential amplifier composed basically of bipolar transistors and a latch composed basically of MOSFETs. As a result, there can be attained an effect that the Bi.CMOS dynamic RAM can have its read amplifier optimized in its structure while speeding up its operations.

(6) In the aforementioned item (2), the output circuit includes: a level changing circuit for changing the internal data output circuit into the MOS level; and a pair of output MOSFETs adapted to be selectively turned on in accordance with the complementary output signal of the level changing circuit. As a result, there can be attained an effect that the Bi.CMOS dynamic RAM can have its output circuit optimized in its structure to reduce the power consumption and speed up the operations.

(7) The word lines are selected by selectively transmitting the word line selection voltage, which has an absolute value substantially higher than the absolute value of the amplitude of the write signal in the data line, to the designated word line. By adopting the so-called static word line selection system, there can be attained an effect that the semiconductor memory device can speed up the word line selecting operations to shorten the access time.

(8) In the aforementioned item (7), each of the word line drive circuits for driving the word lines includes: a first MOSFET of P-channel type connected between the corresponding one of the word lines and the supply node of the word line drive voltage and having its gate coupled to a predetermined internal node; a second MOSFET of N-channel type connected between the corresponding word line and a second power voltage and having its gate coupled commonly to the internal node; a third MOSFET of P-channel type connected between the supply point and the internal node and adapted to be selectively turned on in accordance with a predetermined precharge control signal; switch means connected between the internal node and a second power voltage and adapted to be selectively turned on in accordance with the corresponding selection signal; and a fourth MOSFET of P-channel type connected between the supply point and the internal node and having its gate coupled to the corresponding word line. As a result, there can be attained an effect that it is possible to realize the word line drive circuit which has its circuit structure simplified while stabilizing the level of the word lines.

(9) In the aforementioned item (8), the plural word line drive circuits for each word line group are stacked such that the areas of the P-channel MOSFETs and the N-channel MOSFETs are alternately adjacent to each other. As a result, there can be attained an effect that the layout of the word line drive circuits can be made efficient while reducing the area required for the layout of the peripheral circuit.

(10) the semiconductor memory device comprises: the memory arrays; the corresponding direct peripheral circuits; and a plurality of memory mats for executing in self-controlled manners a series of operations such as writing, reading or refreshing memory data with respect to the memory cells designated in accordance with corresponding predetermined selection signals. As a result, there can be attained an effect that the memory array unit of the semiconductor memory device can have its structure simplified to clarify the extension unit.

(11) The X-selectors constituting the semiconductor memory device are arranged at the center of the semiconductor device are arranged at the center of the semiconductor substrate, and the memory arrays are arranged in the so-called tandem shape, in which they interpose the X-selectors and extend the word lines toward the individual shorter sides of the semiconductor substrate. As a result, there can be attained an effect that the semiconductor memory device can have its layout optimized to speed up the operations.

(12) In the aforementioned item (11), the semiconductor memory device takes the address non-multiplex type, in which the bonding pads having the row address signals transmitted thereto for selecting the word lines are arranged in the vicinity of the two sides of the X-selectors arranged at the center of the semiconductor substrate. As a result, there can be attained an effect that the transmission delay time of the row address signals can be shortened to speed up the access of the semiconductor memory device.

(13) In the aforementioned item (12), the buffer unit circuits made receptive of the aforementioned row address signals are arranged in the vicinity of the corresponding bonding pads. As a result, there can be attained an effect that the transmission delay time of the row address signals can be further shortened to speed up the access of the semiconductor memory device.

(14) In the aforementioned item (11), each of the word lines composing the memory array includes: a plurality of divided work lines divided in the longitudinal direction and made of polysilicon, polycide or silicide; and a main word line made of a metallic wiring layer such as aluminum wiring layer and connecting the divided work lines at their middle of the extending direction. As a result, there can be attained an effect that the transmission delay time of the word line selection signals can be shortened to speed up the word line selections of the semiconductor memory device.

(15) The control unit of the semiconductor memory device is of the so-called Domino mode, in which a series of corresponding operations stated by the predetermined internal control signals are sequentially executed without any synchronization in accordance with the clock signal or timing signal. As a result, there can be attained an effect that the operations of the control unit can be speeded up.

(16) The semiconductor memory device comprises: the write common I/O lines adapted to be connected with the designated data lines of the memory array directly through the corresponding switch MOSFETs; and the read common I/O lines adapted to be connected with the designated data lines of the memory array selectively and indirectly through the gates of the corresponding switch MOSFETs. As a result, there can be attained an effect that the DC levels of the individual common I/O lines can be optimized for the applications to speed up the writing and reading operations of the semiconductor memory device.

(17) In the aforementioned item (16), the read signals to be transmitted from the designated data lines of the memory array through the read common I/O lines to the corresponding read amplifiers are current signals, and the read amplifiers are composed basically of the bipolar transistors. As a result, there can be attained an effect that the transmission delay time of the read signals can be shortened to further speed up the reading operations of the semiconductor memory device.

(18) In the aforementioned item (16), the shared sense system is not adopted as the memory array so that the structure of the memory array can be optimized to stabilize and speed up the reading operations of the semiconductor memory device.

(19) In the aforementioned item (16), the divided bit line system is adopted as the memory array so that the structure of the memory array can be optimized to speed up the reading operations of the semiconductor memory device.

(20) in the aforementioned item (19), two pairs of write common I/O lines and read common I/O lines are provided for each memory array so that the layout pitches of the column switches and the Y-decoder unit circuits can be matched to reduce the area necessary for the layout.

(21) In the aforementioned item (19), the memory arrays are paired and arranged symmetrically across the X-selection circuit disposed at the center of the semiconductor substrate, and the aforementioned write and read common I/O lines are shared by and through the paired memory arrays. As a result, there can be attained an effect that the structure of the memory array unit of the semiconductor memory device can be simplified to reduce the area necessary for the layout.

(22) In the aforementioned item (21), the ground potential supply lines or the like having the shielding action are arranged at the two sides of the read common I/O lines. As a result, there can be attained an effect that the noise margin of the read common I/O lines to be coupled to the highly sensitive read amplifiers can be enlarged to stabilize the reading operations of the semiconductor memory device.

(23) In the aforementioned item (21), the plural shared common I/O lines shared by the two paired memory arrays are used as the write common I/O lines at one of the paired memory arrays and as the read common I/O lines at the other so that their predetermined number can be reduced to reduce the area necessary for the layout of the memory array units of the semiconductor memory device.

(24) The input circuit made receptive of the input signals through its external terminals includes: a CMOS logic gate circuit having its input terminals made receptive of the aforementioned input signals; and the Bi.CMOS logical gate circuit having its input terminals made receptive of the output signals of the aforementioned CMOS logical gate circuit. As a result, there can be attained an effect that the input circuit can have its transmission delay time reduced while reducing its input capacity to enlarge its driving ability.

(25) In the aforementioned item (24), between the input terminals of the aforementioned Bi.CMOS logical gate circuit and the power voltage of the circuit, there is connected the positive feedback circuit which includes a p-channel MOSFET having its gates made receptive of the output signals of the aforementioned Bi.CMOS logical gate circuit. As a result, there can be attained an effect that the input circuit can have its noise margin enlarged to stabilize its operation.

(26) The CMOS logical gate circuit is added in parallel with the Bi.CMOS logical gate circuit so that the output signal amplitude of the Bi.CMOS logical gate circuit can be enlarged to fully swing between the power voltage and the ground potential of the circuit.

(27) To the output terminals of the Bi.CMOS logical gate circuit, there is added the latch which is constructed of the CMOS logical gate circuit and has its one-side input/output nodes coupled to the output terminals of the aforementioned Bi.CMOS logical gate circuit. As a result, there can be attained an effect that the output signal amplitude of the Bi.CMOS logical gate circuit can be enlarged to fully swing between the power voltage and the ground potential of the circuit.

(28) The test mode set cycle for setting the test mode is executed under the condition that the start control signals are in a predetermined combination, and the designated test cycle is executed under the condition that a predetermined external terminal is fed with a high voltage having a larger absolute value larger than that of the power voltage of the circuit. As a result, there can be attained an effect that the semiconductor memory device can have its test logic clarified to enhance the additional value.

(29) The read amplifiers of the semiconductor memory device are temporarily brought into the operative states in accordance with the predetermined timing signals so that their current consumption in the long cycle can be reduced.

(30) In the aforementioned item (29), the current-voltage conversion circuit and the differential amplifier of the read amplifier are composed basically of the bipolar transistors, and the latch is composed basically of the MOSFETs. Between the complementary input/output nodes of the aforementioned latch and the power voltage of the circuit, there is connected a pair of load means which are selectively coupled in accordance with the predetermined timing signals for latching the potentials of the aforementioned input/output nodes at the ECL level. As a result, there can be attained an effect that the read amplifiers can have their operations stabilized to reduce the power consumption.

(31) In the aforementioned item (30), at the complementary input or output terminals or predetermined internal nodes of the current-voltage conversion circuits, differential amplifiers and latches of the read amplifiers, there are disposed the equalize circuits which are selectively validated in accordance with the predetermined timing signals so that the residual charges of the individual nodes can be discharged to stabilize and speed up the operations of the read amplifiers.

(32) In the aforementioned item (30), between the emitters of the paired current sensing bipolar transistors constituting the current-voltage conversion circuit and the ground potential of the circuit, there are connected a pair of load means which are adapted to be connected selectively and temporarily with the current-voltage conversion circuits at the beginning of the operative states. As a result, there can be attained an effect that the potential of the aforementioned emitters are enabled to follow the power fluctuations thereby to speed up the operations of the current-voltage conversion circuits.

(33) The predetermined capacity means is added in parallel with the current source which is operative to feed a predetermined operation current selectively to the differential amplifier composed basically of the differential bipolar transistors, so that the rise of the operations of the aforementioned differential amplifiers can be speeded up.

(34) Between the internal circuit, which is selectively brought into the operative state in accordance with the predetermined internal control signals, and the ground potential of the circuit, there are connected in parallel: a first current source for feeding a relatively small operation current selectively to the internal circuit when the internal circuit is in its standby state; and a second current source for feeding a relatively large operation current selectively to the internal circuit when the internal circuit is in its operative state, so that the internal circuit may be brought into the so-called warmed-up state. As a result, there can be attained an effect that the rise of the operations of the aforementioned internal circuit can be speeded up.

(35) In the aforementioned item (34), in case the internal circuit is paired differential circuits, the aforementioned first current source is shared between the two internal circuits constituting the differential circuits so that the level difference caused by the layout dispersion can be eliminated to stabilize the operations of the aforementioned differential circuits.

(36) There are provided a plurality of read amplifiers which are equipped with the latches to be simultaneously brought into the operative states for latching the read signals amplified, so that their output signals are transmitted sequentially and selectively to the data output buffers in accordance with the predetermined output selection signals. As a result, there can be attained an effect that the high-speed continuous reading operations of the semiconductor memory device can be realized.

(37) In the aforementioned item (36), a relatively high operation current is selectively fed to the read amplifier which has its output signal transmitted at first. As a result, there can be attained an effect that the rise of the aforementioned high-speed continuous reading operations of the semiconductor memory device can be speeded up.

(38) The semiconductor memory device comprises: a plurality of write amplifiers; a plurality of latches provided for those write amplifiers for latching the corresponding write data; and an input selection circuit for selectively transmitting the write data from the predetermined external terminals to the corresponding latches in accordance with the predetermined address signals, so that the write data inputted through the aforementioned external terminals are sequentially latched. At an instant after lapse of a predetermined time period, the plural write amplifiers are brought altogether into the operative states. As a result, there can be attained an effect that the high-speed continuous writing operations of the memory cells to be simultaneously brought into the selected states can be realized.

(39) In the semiconductor memory device equipped with the plural memory mats which are dispersed over the surface of the semiconductor substrate and a predetermined number of which are simultaneously brought into operative states, the memory mats of the predetermined number to be simultaneously brought into the operative states are selected in the zigzag form, for example. As a result, there can be attained an effect that the exothermic distribution of the semiconductor substrate can be made uniform to enhance the reliability of the semiconductor memory device.

(40) The plural voltage generators for forming the plural internal voltages having different polarities and voltage values are operated in accordance with the predetermined pulse signals which are formed by the common oscillator, so that the circuit structure of the power unit can be simplified.

(41) When either of the voltage generators is selectively brought into the operative state in accordance with the predetermined start control signal, the aforementioned pulse signals are formed at first, when the aforementioned start control signals are valid, and then periodically for a predetermined period so that the operations of the voltage generator at the continuous start can be stabilized to stabilize the corresponding internal voltages.

(42) The fuse means provided for the redundancy circuit or the like of the semiconductor memory device are cut by the bipolar transistors which are selectively turned on in accordance with the corresponding selection signals. As a result, there can be attained an effect that the fuse cutting operation in the redundancy circuit or the like can be accomplished with a low power consumption but without fail to enhance the reliability of the semiconductor memory device.

(43) The threshold voltage of the MOSFETs composing the CMOS logical gate circuit is selectively increased when the distance from the output to input terminals of the preceding circuit is relatively long or when the preceding circuit is constructed of the Bi.C-MOS logical gate circuit. As a result, there can be attained an effect that the through current of the logical circuit including the CMOS and Bi.CMOS logical circuits can be suppressed to drop the power consumption.

(44) The positions for forming the contacts and P+ or N+ diffusion layer for coupling the diffusion layer constituting the diffusion resistor and the corresponding metallic wiring layer such as the aluminum wiring layer are selectively changed by changing a portion of the photo mask so that the trimming of the resistance means can be efficiently executed.

(45) In the semiconductor memory device taking the address non-multiplex system and having the auto-refresh mode, the operations of the Y-selection circuit, the read circuit and the write circuit are selectively stopped so that the current consumption of the semiconductor memory device in the auto-refresh mode can be reduced.

(46) The precharge control signal to be fed to the gates of the precharge MOSFETs connected between the non-inverted and inverted signal lines of the complementary bit lines is temporarily made higher than the power voltage of the circuit at the beginning when it is validated. As a result, there can be attained an effect that the size of the aforementioned MOSFETs can be reduced to reduce the area necessary for the layout of the memory array.

(47) In the clamp circuit composed of a plurality of diodes connected in series, the nodes connected in series with the plural diodes are equipped with the predetermined equalize circuits. As a result, there can be attained an effect that the residual charges at the aforementioned individual nodes can be discharged to stabilize the level changes of the clamp circuit.

(48) When the signal lines made of the metallic wiring layers of aluminum or the like are cross-connected with the power supply lines or the like made of the same metallic wiring layer, the power supply lines are arranged by way of the second metallic wiring layer formed thereover or therebelow. In this case the aforementioned signal lines are intersected so generally obliquely that the transverse distance from the power supply lines in the intersecting section may become as long as possible. As a result, there can be attained an effect that the impedance increase in the intersection section of the power supply lines can be eliminated to suppress the power noises.

(49) The main signal lines such as the clock signal lines arranged over a relatively long distance of the semiconductor substrate across the internal circuit such as the memory array are exemplified by a pair of signal lines which are arranged from the output nodes across one and the other of the aforementioned internal circuit and coupled commonly to each other through the input or predetermined nodes. As a result, there can be attained an effect that the impedance of the main signal lines can be suppressed to enlarge the noise margin of the semiconductor memory device.

(50) The electrostatic protection circuit provided for the input pad or the like of the semiconductor memory device comprises: an input diffusion layer coupled to the pad through a metallic wiring layer of aluminum or the like; a first diffusion layer of large depth formed to face the input diffusion layer and coupled to the power voltage of the circuit through the metallic wiring layer; a protection resistor connected between the aforementioned pad and the predetermined internal node; and a clamp MOSFET connected between the aforementioned internal node and the ground potential of the circuit and having its source and drain regions made of second and third diffusion layers of large depth. As a result, there can be attained an effect that the protection characteristics of the electrostatic protection circuit can be enhanced to enhance the reliability of the semiconductor memory device and so on.

Although our invention has been specifically described in connection with the embodiments thereof, it should not be limited to those embodiments but can naturally be modified in various manners without departing from the gist thereof. For example, the combination of the peripheral circuit nodes of the Bi.CMOS dynamic RAM should not be limited by those embodiments but can be partially changed in the internal signal type. Moreover, the polarities and voltage values of the power voltage are arbitrary so that the polarities and voltage values of the word line selection voltages can also be changed. The specific structures of the word line drive circuits provided for the individual word lines can be conceived in various manners. Also arbitrary are the numbers of division or disposition of the memory mats or memory arrays, and the numbers of disposition of the word lines, the data lines, the redundancy word lines, the redundancy data lines and the common I/O lines composing each memory array. The bit number and application of the individual address signals can be changed at will in accordance with the structure of the memory array. A variety of combinations can be conceived for the specific test content of the test modes. The metallic wiring layers should not be limited to those made of aluminum or its alloy, and its number is arbitrary. Moreover, the specific circuit structures shown in the individual circuit diagrams, the specific layouts shown in the individual arrangement charts, and the combination and logical levels of the start control signals, address signals and internal control signals can take a variety of modes of embodiment.

In the description thus far made, our invention has been directed to the Bi.CMOS dynamic RAM which provides the background of the field of application, but should not be limited thereto. For example, the invention directed to the layouts and test methods of the peripheral circuit and the memory arrays can be applied other various semiconductor memory devices. The invention directed to the resistance means, the logical circuit, the input circuit, the fuse cutting circuit, the drive circuit, the power circuit and the electrostatic protection circuit can be applied to other various semiconductor memory devices. These invention can be widely applied to a variety of semiconductor memory devices or semiconductor integrated circuit devices including at least the corresponding circuits and so on.

The effects obtainable from the representatives of the invention disclosed hereinbefore will be briefly described in the following. Specifically, the so-called Bi.CMOS dynamic RAM is constructed by composing the memory array of the semiconductor memory device basically of the dynamic memory cells and by composing the peripheral circuit basically of the Bi.CMOS logical gate circuits. At this time, the word line selection system is of the so-called static selection type, in which the word line selection voltage having an absolute value larger than that of the signal amplitude of the data lines in the writing operation is alternatively transmitted to the word line designated. As the common I/O lines, moreover, there are provided; the write common I/O lines which are connected directly with the designated data lines through the corresponding switch MOSFETs; and the read common I/O lines which are connected indirectly with the designated data lines through the gates of the corresponding MOSFETs. At the same time, the read signals, which are to be transmitted from the selected memory cell through the aforementioned data lines and read common I/O lines, are the current signals and are converted into the voltage signals and amplified by the read amplifiers which are composed basically of the differential bipolar transistors. These are further provided a plurality of memory mats which include the paired memory arrays and their direct peripheral circuits for accomplishing a series of selection operations in the self-control manner in accordance with the corresponding array selection signals. These memory mats are arranged symmetrically and in tandem across the X-selection circuit which is arranged along the center line in parallel with the shorter side of the semiconductor substrate. This makes it possible to increase the degree of integration of the memory arrays and to shorten the signal transmission delay time of the peripheral circuits. Moreover, the reading operations can be speeded up by separating the common I/O lines in accordance with the applications and transmitting the read signals as the current signals. Still moreover, the word line selection system is of the so-called static selection type, and the memory mats are formed into units and arranged in tandem across the X-selection circuit to speed up the selecting operations of the word lines and the data lines. As a result, it is possible to realize a semiconductor memory device which has succeeded in increasing the speed and capacity and reducing the power consumption.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor memory device comprising:
a first terminal to which a first supply voltage is to be applied;
a second terminal to which a second supply voltage is to be applied, the second supply voltage being lower than the first supply voltage;
a plurality of word lines;
a plurality of data lines;
a plurality of memory cells coupled to the plurality of word and data lines so that each memory cell is coupled to one word line and one data line, each of the plurality of memory cells including a capacitor and a selecting MOSFET, the selecting MOSFET having a gate coupled to the corresponding one word line and a source-drain path coupled between the corresponding one data line and the capacitor;
an oscillator circuit for providing pulse signals;
a voltage generator, coupled to receive the first and second supply voltages and responsive to the pulse signals provided by said oscillator circuit, for generating a third voltage higher than the second voltage; and
selecting means, responsive to selection signals applied to said semiconductor memory device, for selecting at least one of the plurality of memory cells by selecting one word line and one data line, the selecting means further including word driver circuits, coupled to the plurality of word lines and to the voltage generator and responsive to a word line selection signal generator and responsive to a word line selection signal generated according to the selection signals, for providing the third voltage to the selected word line.

2. A semiconductor memory device according to claim 1, wherein the word driver circuits each includes;

P channel MOSFET having a source-drain path coupled between the corresponding one word line and the voltage generator, and a gate coupled to a signal responding to the word line selection signal; and a switching MOSFET having a source-drain path coupled between the corresponding one word line and the second terminal, and a gate coupled to the signal responding to the word line selection signal, wherein the P channel MOSFET and the switching MOSFET are operated complementary to each other in response to the signal responding to the word line selection signal.

3. A semiconductor memory device according to claim 2, wherein the switching MOSFET is of an N channel type.

4. A semiconductor memory device according to claim 2, wherein the P channel MOSFET has a back gate coupled to receive the third voltage.

5. A semiconductor memory device according to claim 1, further comprising:

read-out means for selectively reading out information stored in the selected memory cell; and write-in means responsive to data to be written into the selected memory cell for selectively providing a fourth voltage to the selected data line when the data is of a first level, and providing a fifth voltage lower than the fourth voltage to the selected data line when the data is of a second level, wherein a potential difference between the third voltage and the second supply voltage is greater than a potential difference between the fourth voltage and the fifth voltage.

6. A semiconductor memory device according to claim 5, wherein the fourth voltage is substantially equal to the first supply voltage, and wherein the fifth voltage is substantially equal to the second supply voltage.

7. A semiconductor memory device according to claim 5, wherein the read-out means includes differentially connected bipolar transistors responding to information stored in the selected memory cell.

8. A semiconductor memory device according to claim 7, wherein the selecting means includes:

a buffer circuit coupled to receive the selection signals for providing internal complementary selection signals; and a decoder circuit coupled to the buffer circuit for providing the word line selection signal and a data line selecting signal, wherein the buffer circuit and the decoder circuit are comprised of N and P channel MOSFETs.

9. A semiconductor memory device according to claim 8, wherein the selection signals are of an ECL level, and wherein the buffer circuit further includes bipolar differential circuits coupled to receive the selection signals, respectively.

10. A semiconductor memory device according to claim 1, further comprising:

external terminals for receiving the selection signals, respectively.

11. A dynamic random access memory device having a first terminal for receiving a first supply voltage and a second terminal for receiving a second supply voltage lower than the first supply voltage, the dynamic random access memory device comprising:

a plurality of word lines;

a plurality of data lines;

a plurality of memory cells coupled to the plurality of word and data lines so that each memory cell is coupled to one word line and one data line;

an oscillator circuit for providing pulse signals;

a voltage generator, coupled to receive the first and second supply voltages and responsive to the pulse signals provided by said oscillator circuit, for generating a third voltage higher than the second voltage; and selecting means, responsive to selection signals applied to said dynamic random access memory device, for selecting at least one of the plurality of memory cells by selecting one word line and one data line, the selecting means further including word driver circuits, coupled to the plurality of word lines and to the voltage generator and responsive to a word line selection signal generated according to the selection signals, for providing the third voltage to the selected word line.

12. A dynamic random access memory device according to claim 11, wherein each of the plurality of memory cells includes a capacitor for storing information therein and a selecting MOSFET for coupling the capacitor to the corresponding one data line, the selecting MOSFET having a gate coupled to the corresponding one word line and a source-drain path coupled between the corresponding one data line and the capacitor.

13. A dynamic random access memory device according to claim 12, wherein the word driver circuits each includes:

a first P channel MOSFET having a source-drain path coupled between the corresponding one word line and the voltage generator, and a gate coupled to a signal responding to the word line selection signal; and a first switching MOSFET having a source-drain path coupled between the corresponding one word line and the second terminal, and a gate coupled to the signal responding to the word line selection signal, wherein the first P channel MOSFET and the first switching MOSFET are operated complementary to each other in response to the signal responding to the word line selection signal.

14. A dynamic random access memory device according to claim 13, wherein the first switching MOSFET is of an N channel type.

15. A dynamic random access memory device according to claim 13, wherein the first P channel MOSFET has a back gate coupled to receive the third voltage.

16. A dynamic random access memory device according to claim 11, further comprising:

read-out means for selectively reading out information stored in the selected memory cell; and write-in means responsive to data to be written into the selected memory cell for selectively providing a fourth voltage to the selected data line when the data is of a first level, and providing a fifth voltage lower than the fourth voltage to the selected data line when the data is of a second level, wherein a potential difference between the third voltage and the second supply voltage is greater than a potential difference between the fourth voltage and the fifth voltage.

17. A dynamic random access memory device according to claim 16, wherein the fourth voltage is substantially equal to the first supply voltage, and wherein the fifth voltage is substantially equal to the second supply voltage.

18. A dynamic random access memory device according to claim 16, wherein the read-out means includes differentially connected bipolar transistors responding to information stored in the selected memory cell.

19. A dynamic random access memory device according to claim 11, wherein the selecting means includes:
 a buffer circuit coupled to receive the selection signals for providing internal complementary selection signals; and
 a decoder circuit coupled to the buffer circuit for providing the word line selecting signal and a data line selecting signal,
 wherein the buffer circuit and the decoder circuit are comprised of N and P channel MOSFETs.

20. A dynamic random access memory device according to claim 19, wherein the selection signals are of an ECL level, and wherein the buffer circuit further includes bipolar differential circuits coupled to receive the selection signals, respectively.

21. A dynamic random access memory device according to claim 11, further comprising:
external terminals for receiving the selection signals, respectively.

22. A dynamic random access memory device according to claim 13, wherein each of the word driver circuits further includes:
 a second P channel MOSFET having a source-drain path coupled between the voltage generator and the gate of the first P channel MOSFET and a gate coupled to receive a predetermined precharge control signal; and
 a second switching MOSFET having a source-drain path coupled between the gate of the first P channel MOSFET and the second supply voltage and a gate coupled to the corresponding word line selection signal.

23. A dynamic random access memory device according to claim 22, wherein each of the word driver circuits further includes:
 a third P channel MOSFET having a source-drain path coupled between the voltage generator and the gate of the first P channel MOSFET and a gate coupled to the corresponding word line.

24. A dynamic random access memory device according to claim 22, wherein the second switching MOSFET Is of an N channel type.

25. A semiconductor memory device according to claim 1, wherein the voltage generator continuously generates said third voltage in accordance with said pulse signals, while the word driver circuits selectively provide said third voltage to the selected word line.

26. A dynamic random access memory device according to claim 11, wherein the voltage generator continuously generates said third voltage in accordance with said pulse signals, while the word driver circuits selectively provide said third voltage to the selected word line.

* * * * *

UNITED STATES PATENT AND TRADEMARK OFFICE
CERTIFICATE OF CORRECTION

PATENT NO. : 5,150,325
DATED : September 22, 1992
INVENTOR(S) : K. Yanagisawa, et al.

It is certified that error appears in the above-identified patent and that said Letters Patent is hereby corrected as shown below:

Column 75,

In line 4, delete "generator and responsive to a";
In line 5, delete "word line selection signal";
In line 9, delete ";" and insert therefor --:--;
In line 10, before "P channel MOSFET" insert --a--.

Column 78,

In line 25, delete "Is" and insert therefor --is--.

Signed and Sealed this

Sixth Day of September, 1994

Attest:

BRUCE LEHMAN

*Attesting Officer*  Commissioner of Patents and Trademarks